United States Patent
Al-Bayati et al.

(10) Patent No.: US 7,294,563 B2
(45) Date of Patent: *Nov. 13, 2007

(54) SEMICONDUCTOR ON INSULATOR VERTICAL TRANSISTOR FABRICATION AND DOPING PROCESS

(75) Inventors: Amir Al-Bayati, San Jose, CA (US); Kenneth S. Collins, San Jose, CA (US); Hiroji Hanawa, Sunnyvale, CA (US); Kartik Ramaswamy, San Jose, CA (US); Biagio Gallo, Palo Alto, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 422 days.

This patent is subject to a terminal disclaimer.

(21) Appl. No.: 11/002,965

(22) Filed: Dec. 1, 2004

(65) Prior Publication Data

US 2005/0136604 A1 Jun. 23, 2005

Related U.S. Application Data

(63) Continuation-in-part of application No. 10/838,052, filed on May 3, 2004, now Pat. No. 7,223,676, which is a continuation-in-part of application No. 10/786,410, filed on Feb. 24, 2004, now Pat. No. 6,893,907, which is a continuation-in-part of application No. 10/646,533, filed on Aug. 22, 2003, which is a continuation-in-part of application No. 10/164,327, filed on Jun. 5, 2002, now Pat. No. 6,939,434, which is a continuation-in-part of application No. 09/636,327, filed on Aug. 10, 2000, now Pat. No. 6,292,150.

(51) Int. Cl.
*H01L 21/44* (2006.01)

(52) U.S. Cl. .................. 438/513; 438/156; 438/513

(58) Field of Classification Search ................ 438/149, 438/156, 510, 513
See application file for complete search history.

(56) References Cited

U.S. PATENT DOCUMENTS 2,344,138 A 3/1944 Drummond .............. 117/107

(Continued)

FOREIGN PATENT DOCUMENTS

EP 0 546 852 A1 6/1993

(Continued)

OTHER PUBLICATIONS

Chediak, A., Scott, K. and Zhang, P., "SIMOX—The 'Winner' for 300 mm SOI Wafer Fabrication", *TICS %*, University of Berkley, California, pp. 1-6, Apr. 2002.

(Continued)

*Primary Examiner*—Alexander Ghyka
(74) *Attorney, Agent, or Firm*—Law Office of Robert M. Wallace

(57) ABSTRACT

A process for conformally doping through the vertical and horizontal surfaces of a 3-dimensional vertical transistor in a semiconductor-on-insulator structure employs an RF oscillating torroidal plasma current to perform either conformal ion implantation, or conformal deposition of a dopant-containing film which can then be heated to drive the dopants into the transistor. Some embodiments employ both conformal ion implantation and conformal deposition of dopant containing films, and in those embodiments in which the dopant containing film is a pure dopant, the ion implantation and film deposition can be performed simultaneously.

24 Claims, 106 Drawing Sheets

U.S. PATENT DOCUMENTS

| | | | |
|---|---|---|---|
| 3,109,100 A | 10/1963 | Gecewicz | 250/219 |
| 3,576,685 A | 4/1971 | Swann et al. | 148/187 |
| 3,907,616 A | 9/1975 | Wiemer | 148/188 |
| 4,116,791 A | 9/1978 | Zega | 204/192 |
| 4,176,003 A | 11/1979 | Brower et al. | 430/313 |
| 4,382,099 A | 5/1983 | Legge et al. | 427/34 |
| 4,385,946 A | 5/1983 | Finegan et al. | 148/175 |
| 4,434,036 A | 2/1984 | Hoerschelmann et al. | 204/164 |
| 4,465,529 A | 8/1984 | Arima et al. | 148/188 |
| 4,481,229 A | 11/1984 | Suzuki et al. | 427/38 |
| 4,500,563 A | 2/1985 | Ellenberger et al. | 427/38 |
| 4,510,672 A | 4/1985 | Yakura | 29/574 |
| 4,521,441 A | 6/1985 | Flowers | 427/38 |
| 4,539,217 A | 9/1985 | Farley | 427/10 |
| 4,565,588 A | 1/1986 | Seki et al. | 148/186 |
| 4,579,618 A | 4/1986 | Celestino et al. | 156/345 |
| 4,584,026 A | 4/1986 | Wu et al. | 148/1.5 |
| 4,698,104 A | 10/1987 | Barker et al. | 437/141 |
| 4,764,394 A | 8/1988 | Conrad | 427/38 |
| 4,778,561 A | 10/1988 | Ghanbari | 156/643 |
| 4,837,172 A | 6/1989 | Mizuno et al. | 438/475 |
| 4,867,859 A | 9/1989 | Harada et al. | 304/298 |
| 4,871,421 A | 10/1989 | Ogle et al. | 156/643 |
| 4,892,753 A | 1/1990 | Weng et al. | 427/38 |
| 4,912,065 A | 3/1990 | Mizuno et al. | 437/141 |
| 4,914,500 A | 4/1990 | Liu et al. | 357/67 |
| 4,937,205 A | 6/1990 | Nakayama et al. | 437/165 |
| 4,948,458 A | 8/1990 | Ogle | 156/643 |
| 5,040,046 A | 8/1991 | Chhabra et al. | 357/54 |
| 5,061,838 A | 10/1991 | Lane et al. | 219/121.59 |
| 5,074,456 A | 12/1991 | Degner et al. | 228/121 |
| 5,106,827 A | 4/1992 | Borden et al. | 505/1 |
| 5,107,201 A | 4/1992 | Ogle | 324/72.5 |
| 5,136,969 A | 8/1992 | Chapman | 118/305 |
| 5,229,305 A | 7/1993 | Baker | 437/11 |
| 5,270,250 A | 12/1993 | Murai et al. | 437/165 |
| 5,277,751 A | 1/1994 | Ogle | 156/643 |
| 5,288,650 A | 2/1994 | Sandow | 437/24 |
| 5,290,382 A | 3/1994 | Zarowin et al. | 156/345 |
| 5,312,778 A | 5/1994 | Collins et al. | 437/225 |
| 5,354,381 A | 10/1994 | Sheng | 118/723 |
| 5,423,945 A | 6/1995 | Marks et al. | 156/662.1 |
| 5,435,881 A | 7/1995 | Ogle | 156/345 |
| 5,505,780 A | 4/1996 | Dalvie et al. | 118/723 |
| 5,510,011 A | 4/1996 | Okamura et al. | 204/192.3 |
| 5,514,603 A | 5/1996 | Sato | 437/16 |
| 5,520,209 A | 5/1996 | Goins et al. | 137/246 |
| 5,542,559 A | 8/1996 | Kawakami et al. | 216/67 |
| 5,561,072 A | 10/1996 | Saito | 437/24 |
| 5,569,363 A | 10/1996 | Bayer et al. | 204/192.32 |
| 5,572,038 A | 11/1996 | Sheng et al. | 250/492.21 |
| 5,587,038 A | 12/1996 | Cecchi et al. | 156/345 |
| 5,627,435 A | 5/1997 | Jansen et al. | 315/111.21 |
| 5,643,838 A | 7/1997 | Dean et al. | 437/238 |
| 5,648,701 A | 7/1997 | Hooke et al. | 315/111.21 |
| 5,653,811 A | 8/1997 | Chan | 118/723 |
| 5,654,043 A | 8/1997 | Shao et al. | 427/527 |
| 5,660,895 A | 8/1997 | Lee et al. | 427/579 |
| 5,665,640 A | 9/1997 | Foster et al. | 438/680 |
| 5,674,321 A | 10/1997 | Pu et al. | 118/723 |
| 5,683,517 A | 11/1997 | Shan | 118/723 |
| 5,711,812 A | 1/1998 | Chapek et al. | 118/723 |
| 5,718,798 A | 2/1998 | Deregibus | 156/429 |
| 5,770,982 A | 6/1998 | Moore | 333/32 |
| 5,840,589 A | 11/1998 | Warner, Jr. et al. | 437/128 |
| 5,885,358 A | 3/1999 | Maydan et al. | 118/723 |
| 5,888,413 A | 3/1999 | Okumura et al. | 216/68 |
| 5,897,713 A | 4/1999 | Tomioka et al. | 118/723 |
| 5,897,752 A | 4/1999 | Hong et al. | 204/192.12 |
| 5,911,832 A | 6/1999 | Denholm et al. | 118/723 |
| 5,918,140 A | 6/1999 | Wickboldt et al. | 438/535 |
| 5,935,077 A | 8/1999 | Ogle | 600/504 |
| 5,944,942 A | 8/1999 | Ogle | 156/345 |
| 5,948,168 A | 9/1999 | Shan et al. | 118/723 |
| 5,958,140 A | 9/1999 | Arami et al. | 118/725 |
| 5,985,742 A | 11/1999 | Henley et al. | 438/515 |
| 5,994,207 A | 11/1999 | Henley et al. | 438/515 |
| 5,994,236 A | 11/1999 | Ogle | 48/728 |
| 5,998,933 A | 12/1999 | Shun'ko | 315/11.51 |
| 6,000,360 A | 12/1999 | Koshimuzu | 118/723 |
| 6,013,567 A | 1/2000 | Henley et al. | 438/515 |
| 6,020,592 A | 2/2000 | Liebert et al. | 250/492.21 |
| 6,041,735 A | 3/2000 | Murzin et al. | 118/723 |
| 6,050,218 A | 4/2000 | Chen et al. | 118/723 |
| 6,076,483 A | 6/2000 | Shintani et al. | 118/723 |
| 6,083,324 A | 7/2000 | Henley et al. | 148/33.2 |
| 6,096,661 A | 8/2000 | Ngo et al. | 438/788 |
| 6,101,971 A | 8/2000 | Denholm et al. | 118/723 |
| 6,103,599 A | 8/2000 | Henley et al. | 438/459 |
| 6,121,161 A | 9/2000 | Rossman et al. | 438/783 |
| 6,132,552 A | 10/2000 | Donohoe et al. | 156/345 |
| 6,139,697 A | 10/2000 | Chen et al. | 204/192.15 |
| 6,150,628 A | 11/2000 | Smith et al. | 219/121.54 |
| 6,153,524 A | 11/2000 | Henley et al. | 438/691 |
| 6,155,090 A | 12/2000 | Rubenson | 70/367 |
| 6,164,241 A | 12/2000 | Chen et al. | 118/723 |
| 6,165,376 A | 12/2000 | Miyake et al. | 216/67 |
| 6,174,450 B1 | 1/2001 | Patrick et al. | 216/61 |
| 6,174,743 B1 | 1/2001 | Pangrle et al. | 438/14 |
| 6,180,496 B1 | 1/2001 | Farrens et al. | 438/455 |
| 6,182,604 B1 | 2/2001 | Goeckner et al. | 118/723 |
| 6,187,110 B1 | 2/2001 | Henley et al. | 148/33.2 |
| 6,190,979 B1 | 2/2001 | Radens et al. | 438/301 |
| 6,207,005 B1 | 3/2001 | Henley et al. | 156/345 |
| 6,237,527 B1 | 5/2001 | Kellerman et al. | 118/723 |
| 6,239,553 B1 | 5/2001 | Barnes et al. | 315/111.51 |
| 6,248,642 B1 | 6/2001 | Donlan et al. | 438/407 |
| 6,265,328 B1 | 7/2001 | Henley et al. | 438/782 |
| 6,291,313 B1 | 9/2001 | Henley et al. | 438/458 |
| 6,291,939 B1 | 9/2001 | Nishida | 438/407 |
| 6,300,643 B1 | 10/2001 | Fang et al. | 250/492.21 |
| 6,303,519 B1 | 10/2001 | Hsiao et al. | 438/758 |
| 6,305,316 B1 | 10/2001 | DiVergilio et al. | 118/723 |
| 6,312,999 B1 | 11/2001 | Chivukula et al. | 438/303 |
| 6,335,536 B1 | 1/2002 | Goeckner et al. | 250/492.3 |
| 6,339,297 B1 | 1/2002 | Sugai et al. | 315/111.21 |
| 6,341,574 B1 | 1/2002 | Bailey, III et al. | 118/723 |
| 6,344,404 B1 | 2/2002 | Cheung et al. | 438/513 |
| 6,348,126 B1 | 2/2002 | Hanwa et al. | 156/345 |
| 6,350,697 B1 | 2/2002 | Richardson et al. | 438/710 |
| 6,375,790 B1 | 4/2002 | Fenner | 156/345 |
| 6,387,719 B1 | 5/2002 | Mrvos et al. | 438/21 |
| 6,392,351 B1 | 5/2002 | Shun'ko | 315/111.51 |
| 6,395,150 B1 | 5/2002 | Can Cleemput et al. | 204/192.37 |
| 6,403,453 B1 | 6/2002 | Ono et al. | 438/513 |
| 6,410,449 B1 | 6/2002 | Hanawa et al. | 438/706 |
| 6,413,321 B1 | 7/2002 | Kim et al. | 118/725 |
| 6,417,078 B1 | 7/2002 | Dolan et al. | 438/480 |
| 6,418,874 B1 | 7/2002 | Cox et al. | 118/723 |
| 6,426,015 B1 | 7/2002 | Xia et al. | 216/62 |
| 6,432,260 B1 | 8/2002 | Mahoney et al. | 156/345.35 |
| 6,433,553 B1 | 8/2002 | Goeckner et al. | 324/464 |
| 6,453,842 B1 | 9/2002 | Hanawa et al. | 118/723 |
| 6,461,933 B2 | 10/2002 | Houston | 438/423 |
| 6,461,972 B1 | 10/2002 | Kabansky | 438/710 |
| 6,468,388 B1 | 10/2002 | Hanawa et al. | 156/345.48 |
| 6,475,859 B1 | 11/2002 | Tews et al. | 438/243 |
| 6,492,612 B1 | 12/2002 | Taguchi et al. | 219/121.43 |
| 6,494,986 B1 | 12/2002 | Hanawa et al. | 156/345.35 |
| 6,500,741 B2 | 12/2002 | Buchanan et al. | 438/558 |
| 6,506,653 B1 | 1/2003 | Furukawa et al. | 438/305 |
| 6,511,899 B1 | 1/2003 | Henley et al. | 438/515 |
| 6,513,538 B2 | 2/2003 | Chung et al. | 134/1.2 |

| | | | |
|---|---|---|---|
| 6,514,838 B2 | 2/2003 | Chan | 438/513 |
| 6,528,391 B1 | 3/2003 | Henley et al. | 438/459 |
| 6,551,446 B1 | 4/2003 | Hanwa et al. | 156/345.48 |
| 6,559,408 B2 | 5/2003 | Smith et al. | 219/121.57 |
| 6,566,192 B2 | 5/2003 | Lin | 438/243 |
| 6,579,805 B1 | 6/2003 | Bar-Gadda | 438/710 |
| 6,582,999 B2 | 6/2003 | Henley et al. | 438/221 |
| 6,593,173 B1 | 7/2003 | Anc et al. | 438/149 |
| 6,632,324 B2 | 10/2003 | Chan | 156/345.48 |
| 6,643,557 B1 | 11/2003 | Miller et al. | 700/110 |
| 6,645,828 B1 | 11/2003 | Farrens et al. | 438/455 |
| 6,679,981 B1 | 1/2004 | Pan et al. | 204/298.06 |
| 6,747,243 B1 | 6/2004 | Reinhardt | 219/121.69 |
| 6,762,443 B2 * | 7/2004 | Weis | 257/242 |
| 6,780,759 B2 | 8/2004 | Farrens et al. | 438/635 |
| 6,800,559 B2 | 10/2004 | Bar-Gadda | 438/710 |
| 6,811,448 B1 | 11/2004 | Paton et al. | 439/706 |
| 6,838,695 B2 | 1/2005 | Doris et al. | 257/55 |
| 6,887,341 B2 | 5/2005 | Strang et al. | 156/345.48 |
| 7,037,813 B2 * | 5/2006 | Collins et al. | 438/510 |
| 2001/0017109 A1 | 8/2001 | Liu et al. | 118/723.001 |
| 2001/0042827 A1 | 11/2001 | Fang et al. | |
| 2002/0047543 A1 | 4/2002 | Sugai et al. | 315/111.21 |
| 2002/0126993 A1 | 9/2002 | Chan et al. | 438/455 |
| 2002/1098706 | 12/2002 | Furukawa et al. | 438/305 |
| 2003/0013260 A1 | 1/2003 | Gossman et al. | 438/301 |
| 2003/0013314 A1 | 1/2003 | Ying et al. | 438/710 |
| 2003/0029567 A1 | 2/2003 | Dhindsa et al. | 156/345.47 |
| 2003/0085205 A1 | 5/2003 | Lai et al. | 219/121.43 |
| 2003/0134469 A1 | 7/2003 | Horzel et al. | 438/249 |
| 2003/0211705 A1 | 11/2003 | Tong et al. | 438/455 |
| 2004/0036038 A1 | 2/2004 | Okumura et al. | 250/492.2 |
| 2004/0077157 A1 | 4/2004 | Chakravarthi et al. | 438/510 |
| 2004/0092084 A1 | 5/2004 | Rayssac | 438/455 |
| 2004/0126993 A1 | 7/2004 | Chan et al. | 438/455 |

FOREIGN PATENT DOCUMENTS

| | | |
|---|---|---|
| EP | 0 836 218 A2 | 4/1998 |
| EP | 0 964 074 A2 | 12/1999 |
| EP | 1 054 433 A1 | 11/2000 |
| EP | 1 111 084 A1 | 6/2001 |
| EP | 1 158 071 A2 | 11/2001 |
| EP | 1 191 121 A1 | 3/2002 |
| JP | 59-86214 | 5/1984 |
| JP | 59-218728 | 12/1984 |
| JP | 62-120041 | 6/1987 |
| JP | 62290885 A | 12/1987 |
| JP | 04318168 A | 9/1992 |
| JP | 070455542 | 2/1995 |
| JP | 07130496 A | 5/1995 |
| JP | 09186337 A | 7/1997 |
| JP | 2000150908 | 5/2000 |
| WO | WO 99/00832 | 1/1999 |
| WO | WO 01/11650 A1 | 2/2001 |
| WO | WO 02/25694 A2 | 3/2002 |
| WO | WO 93/18201 | 9/2003 |

OTHER PUBLICATIONS

Huff, Howard R., and Zeitzoff, Peter M., "An analytical look at vertical transistor structures", *Solid State Technology*, pp. 59-72, Aug. 2004.

Van de Ven, Evert P., Connick, I-Wen, and Harrus, Alain S., "Advantages of Dual Frequency PECVD for Deposition of ILD and Passivation Films", *IEEE*, Proceedings of VMIC Conference, Jun. 12-13, 1990, pp. 194-201.

Zhang, B.C., and Cross, R.C., "A high power radio frequency transformer for plasma production," *Rev. Sci. Instrum.*, vol. 69, No. 1, pp. 101-108, Jan. 1998.

U.S. Appl. No. 09/638,075, filed Aug. 11, 2000, entitled, "Externally Excited Torroidal Plasma Source," By Hanwa, et al.

Wolf, Stanley and Taubner, Richard, "Silicon Processing for the VLSI Era", 2000, Lattice Press, vol. 1, pp. 303-308.

Chediak, Alex, et al., "SIMOX—The "Winner" for 300 mm SOI Wafer Fabrication", *TICS 5*, Apr. 26, 2002, pp. 1-6.

Hu, C.-K., et al., "A process for improved Al(cu) reactive ion etching", Journal of Vacuum Science and Technology, May 1, 1989, pp. 682-685, vol. 7, No. 3, American Institute of Physics, New York, U.S.

* cited by examiner

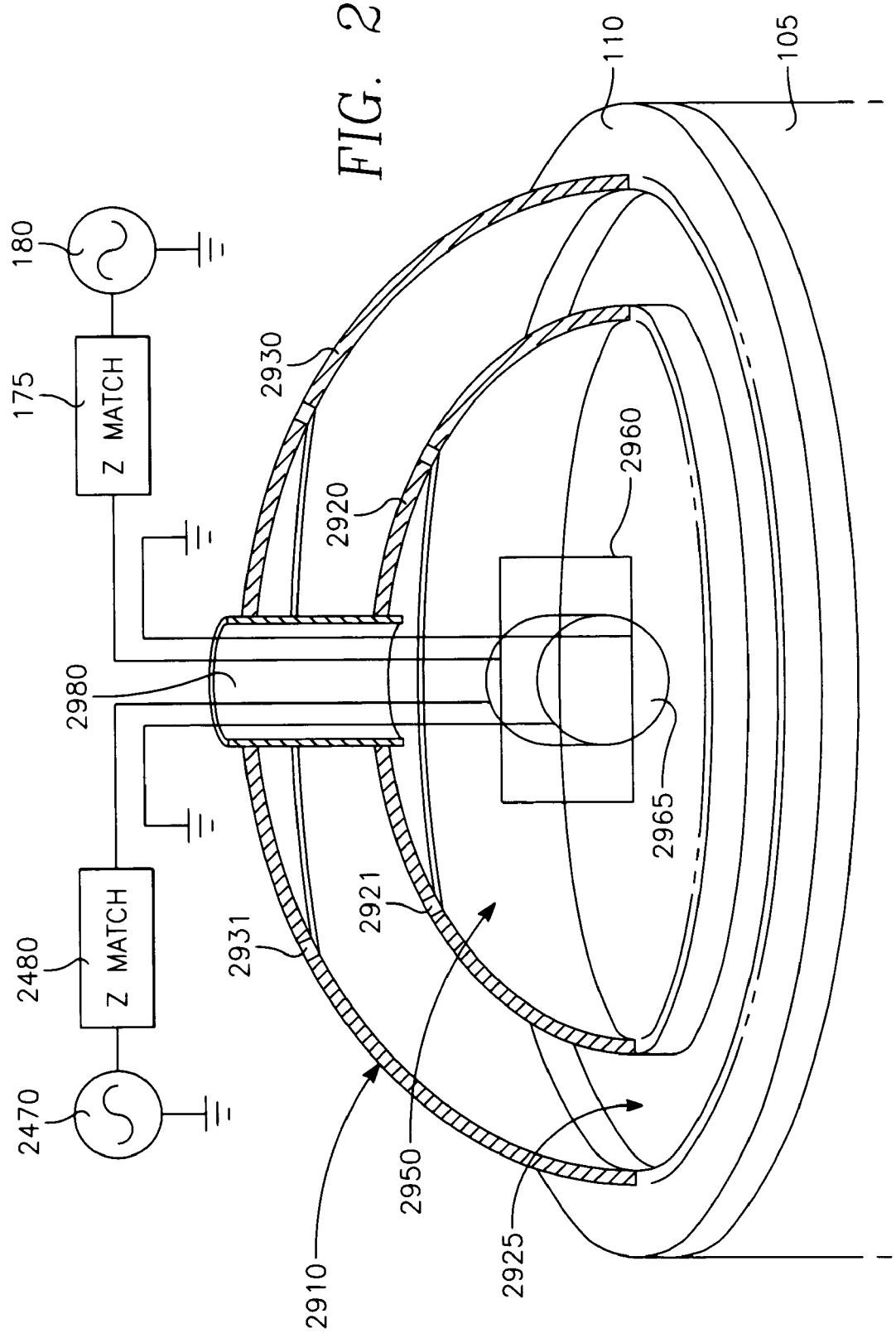

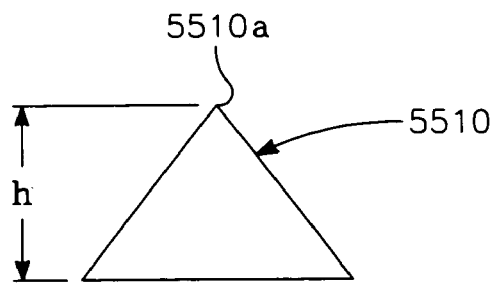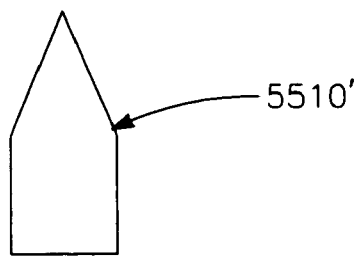
FIG. 57    FIG. 58
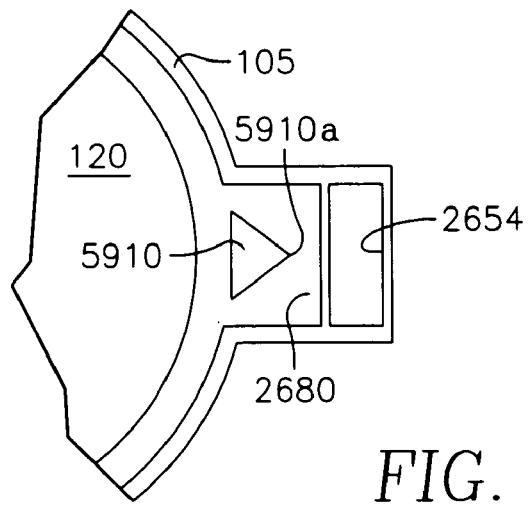
FIG. 59A
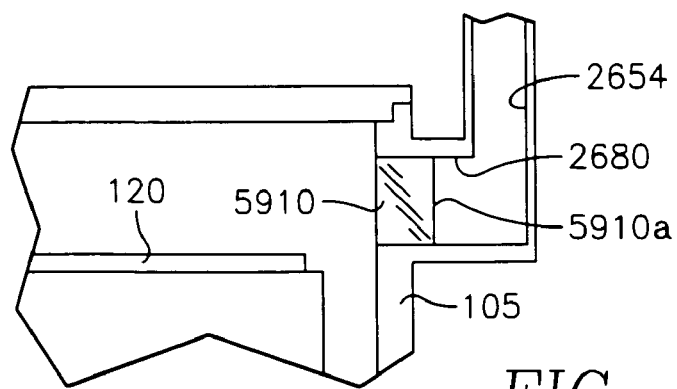
FIG. 59B

PUSH PULL

PUSH PULL

IN SYNC

IN SYNC

SYMMETRIC

SYMMETRIC

NON-SYMMETRIC

NON-SYMMETRIC

SEMICONDUCTOR ON INSULATOR VERTICAL TRANSISTOR FABRICATION AND DOPING PROCESS

CROSS-REFERENCE TO RELATED APPLICATIONS

This application is a continuation-in-part of U.S. application Ser. No. 10/838,052 filed May 3, 2004 now U.S Pat. No. 7,223,676 entitled LOW TEMPERATURE CVD PROCESS WITH CONFORMALITY, STRESS AND COMPOSITION by Hiroji Hanawa, et al., which is a continuation-in-part of U.S. patent application Ser. No. 10/786,410 filed Feb. 24, 2004 now U.S. Pat. No. 6,893,907 entitled FABRICATION OF SILICON-ON-INSULATOR STRUCTURE USING PLASMA IMMERSION ION IMPLANTATION by Dan Maydan et al., which is a continuation-in-part of U.S. patent application Ser. No. 10/646,533 filed Aug. 22, 2003 entitled PLASMA IMMERSION ION IMPLANTATION PROCESS USING A PLASMA SOURCE HAVING LOW DISSOCIATION AND LOW MINIMUM PLASMA VOLTAGE by Kenneth Collins et al., which is a continuation-in-part of U.S. patent application Ser. No. 10/164,327 filed Jun. 5, 2002 now U.S. Pat. No. 6,939,434 entitled EXTERNALLY EXCITED TORROIDAL PLASMA SOURCE WITH MAGNETIC CONTROL OF ION DISTRIBUTION by Kenneth Collins et al., which is a continuation-in-part of U.S. patent application Ser. No. 09/636,327 filed Aug. 10, 2000 now U.S. Pat. No. 6,292,150 entitled EXTERNALLY EXCITED MULTIPLE TORROIDAL PLASMA SOURCE by Kenneth Collins et al., all of which are assigned to the present assignee.

BACKGROUND

High performance transistors can be implemented as silicon-on-insulator (SOI) semiconductor structures. The advantages of SOI technology follow from the ideal isolation between devices that are formed in separate semiconductor active layers that are islands on a common insulator (silicon dioxide) layer. Planar transistor structures formed in an SOI island are still limited in their performance by the presence of a PN junction between the source or drain and the surrounding semiconductor material. This last disadvantage is removed by the source-channel-drain structure as a three-dimensional monolithic membrane resting on the insulator layer and otherwise not touching any other semiconductor material. All the semiconductor (silicon) material is removed (etched away) except for the source-channel-drain elements. Because of the vertical protrusion of the source, channel, drain and gate of such three-dimensional devices above the insulator layer, such a structure can be referred to as a vertical transistor, and is described in Huff et al., "An Analytical Look at Vertical Transistor Structures", *Solid State Technology*, August 2004, pages 59-72. The height of such a structure above the insulator layer is equal to the thickness of the SOI silicon layer overlying the insulator layer. A gate is formed around the vertical sides and the top surface of the channel as an elongate 3-dimensional membrane transverse to the channel. Thus, each transistor principally consists of an elongate source-channel-drain membrane and an elongate gate membrane transverse to the channel membrane and essentially surrounding (on three sides) a portion of the channel membrane.

Because the vertical height of a vertical transistor is so great relative to its length and width, the source, drain and gate must be doped in such a manner that dopants are introduced through top surface and through the vertical side walls of the source-channel-drain membrane and the gate membrane. One way of accomplishing this may be to perform a dopant ion implantation step in three dimensions by tilting (rotating) the wafer during ion implantation about several axes so that the ions impinge on every vertical face of the vertical transistor structure. However, this technique is not ideal because nearby or neighboring vertical transistor structures may shadow some of the surfaces during ion implantation.

What is needed is a way of doping the source, drain and gate of a vertical transistor that avoids shadowing effects while providing a uniform distribution of dopant atoms throughout the source, drain and gate at high dopant concentrations.

SUMMARY OF THE INVENTION

A process is disclosed for fabricating a vertical transistor on a semiconductor-on-insulator wafer consisting of an underlying substrate, an intermediate insulator layer and a top crystalline semiconductor active layer. The process includes sculpting from the active layer a 3-dimensional source-channel-drain structure having horizontal and vertical surfaces and comprising a channel with a source and drain at either end of the channel, and forming a conformal thin gate oxide layer over a section of the channel. A 3-dimensional gate structure is formed over of said thin gate oxide layer. While supporting the wafer in a torroidal source plasma reactor chamber having at least one external reentrant hollow conduit, a dopant-containing process gas is introduced into the chamber while RF plasma source power is applied into the conduit to generate from the process gas an RF oscillating torroidal plasma current over the wafer. In one embodiment dopant atoms are ion implanted into the vertical transistor by applying RF plasma bias power to the wafer to draw ions from the plasma current toward the wafer across a plasma sheath at a sufficient energy to implant the ions in the source-drain-channel structure. In this case, the bias power is set at a sufficiently high level to attain a threshold conformality of ion implant dose on the horizontal and vertical surfaces of the source-channel-drain structure.

In another embodiment, dopant-containing layer (either a pure dopant layer or a dielectric layer to which dopant atoms have been added) is deposited from the torroidal plasma current onto the surfaces of the vertical transistor. In this case, sufficient plasma source power is applied to attain a conformal deposition. If the deposited layer is a dielectric material containing the dopant atoms, then the process gas includes a dielectric material precursor gas in addition to the dopant containing gas. The film deposition is followed by a heating step in which dopant atoms are driven from the film into the vertical transistor.

In a related embodiment, the RF bias power may be reduced sufficiently so that, during ion implantation of dopant atoms, a pure or predominantly dopant film is deposited on the surfaces of the vertical transistor.

In a further embodiment, the conformal dopant ion implantation process and the dopant-containing dielectric film deposition process may be performed on the same wafer at separate times.

BRIEF DESCRIPTION OF THE DRAWINGS

FIG. 29 illustrates a preferred case of the invention in which a continuous circular plenum is provided to enclose the torroidal plasma current.

FIGS. 57 and 58 illustrate different shapes for a splitter.

FIGS. 59A and 59B illustrate use of splitters where the torroidal plasma current enters the chamber radially.

FIG. 124 is a block diagram of the process steps corresponding to the result illustrated in FIGS. 123A through 123H.

FIG. 125 is a block diagram illustrating a low temperature CVD process for filling high aspect ratio openings that can employ the torroidal source reactor of FIG. 1.

FIG. 126 is a graph depicting the gas flow rates of oxygen (solid line) and nitrogen (dashed line) as a function of time over the duration of time required to fill the openings in the process of FIG. 125.

FIG. 127 is a graph illustrating the oxygen content profile in the deposited layer as a function of depth in the process of FIG. 125.

FIGS. 128A through 128E depict successive fabrication stages in a process for fabricating a vertical transistor using conformal ion implantation doping.

FIGS. 129A and 129B depict alternative steps for doping in the process of FIGS. 128A through 128D, using a conformal doped dielectric film.

FIGS. 130A and 130B depict alternative steps for doping in the process of FIGS. 128A through 128D using a conformal pure dopant film.

FIGS. 131A through 131C depict alternative steps for doping in the process of FIGS. 128A through 128D using simultaneous ion implantation and deposition of a dopant species.

FIGS. 132A through 132C depict alternative steps for doping in the process of FIGS. 128A through 128D in which the processes of FIGS. 128A and 129A are performed at different times on the same wafer.

FIG. 133 depicts a torroidal source plasma reactor corresponding to that of FIG. 85 but configured particularly to perform the processes of FIGS. 128-112.

FIG. 134 illustrates ion scattering collisions in a plasma sheath produced in the reactor of FIG. 133.

FIG. 135 is a flow diagram corresponding to the process of FIG. 128E.

Figure 129A:
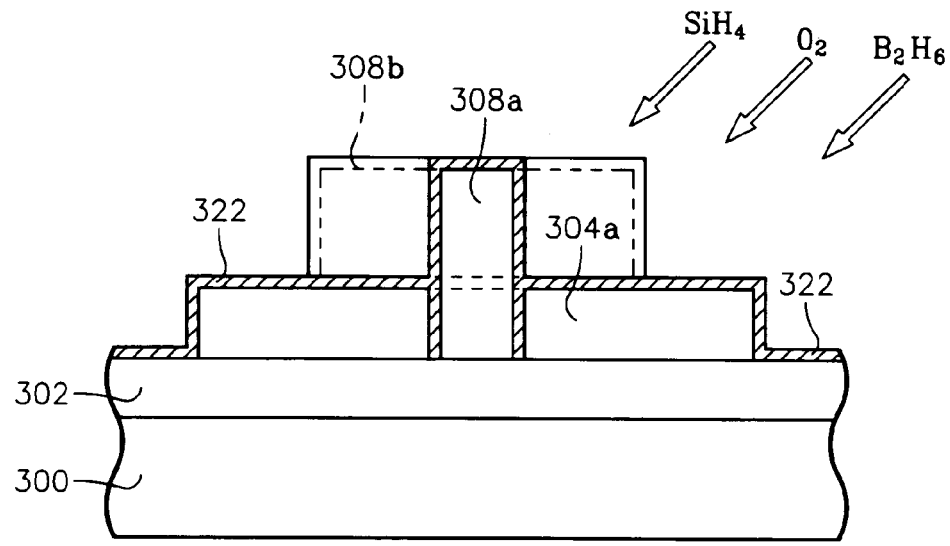
Figure 129B:
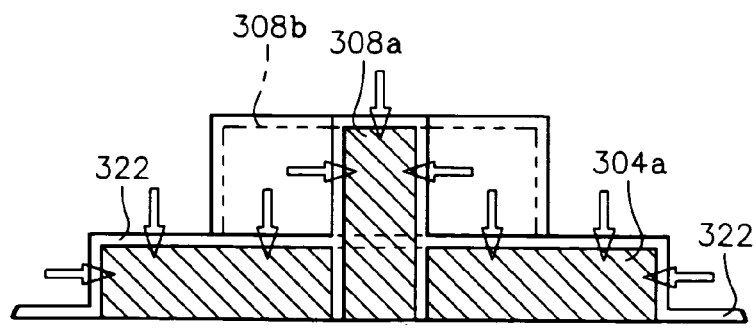
Figure 136:
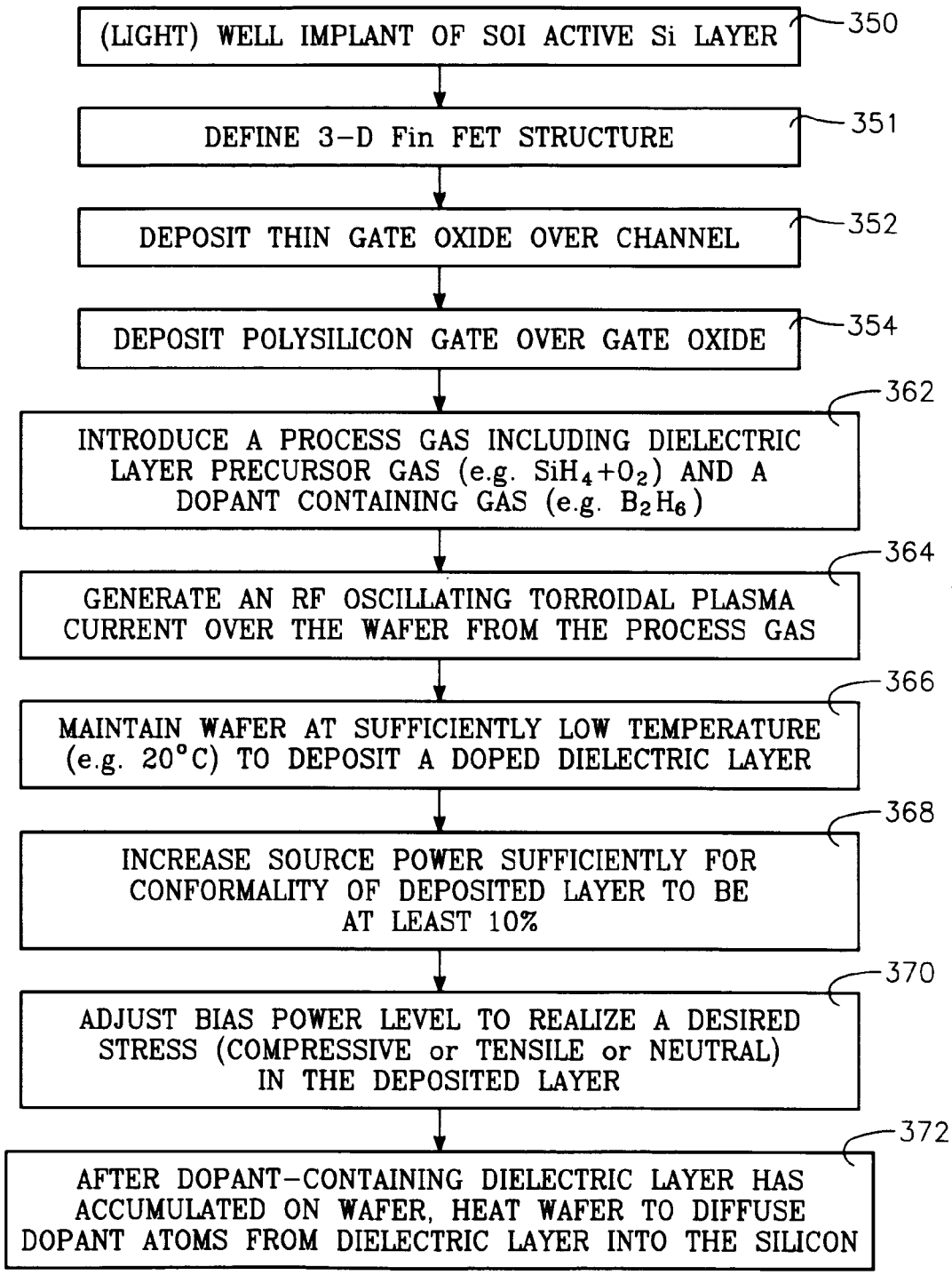

FIG. 136 is a flow diagram corresponding to the process of FIGS. 129A and 129B.

Figure 130A:
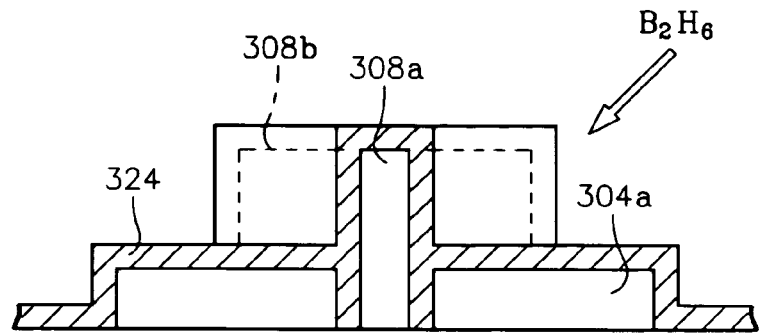
Figure 130B:
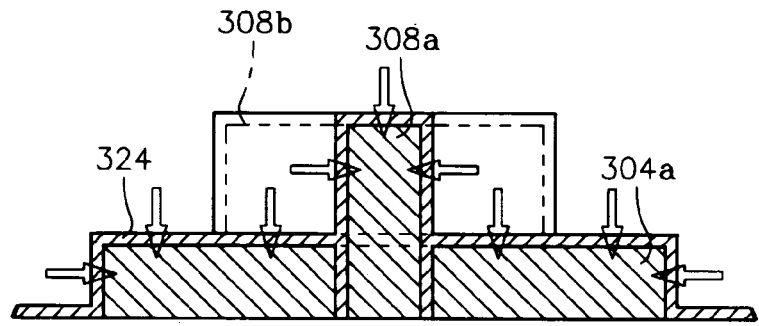
Figure 137:
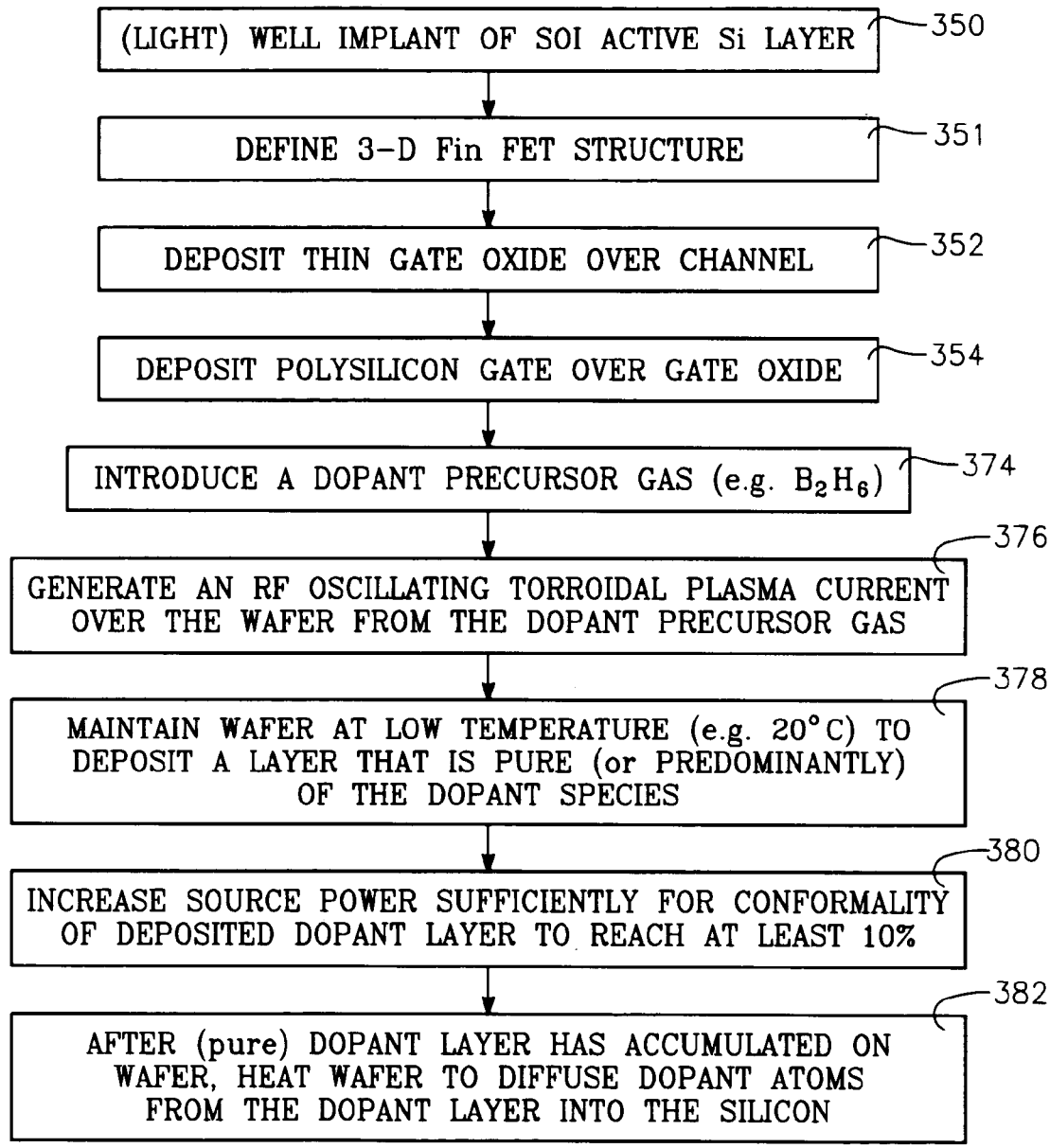

FIG. 137 is a flow diagram corresponding to the process of FIGS. 130A and 130B.

Figure 131A:
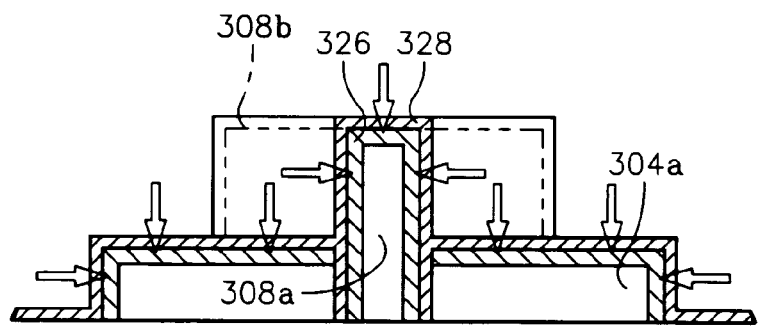
Figure 131B:
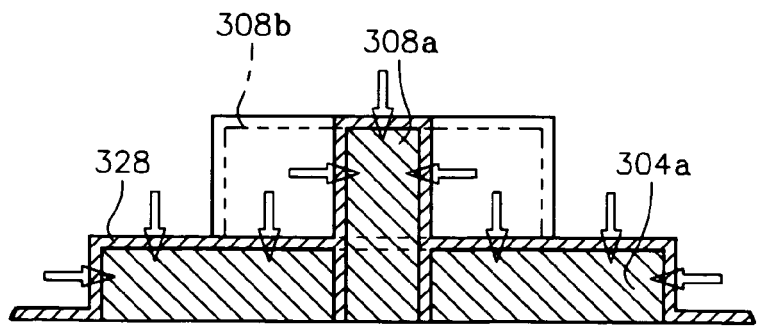
Figure 138:
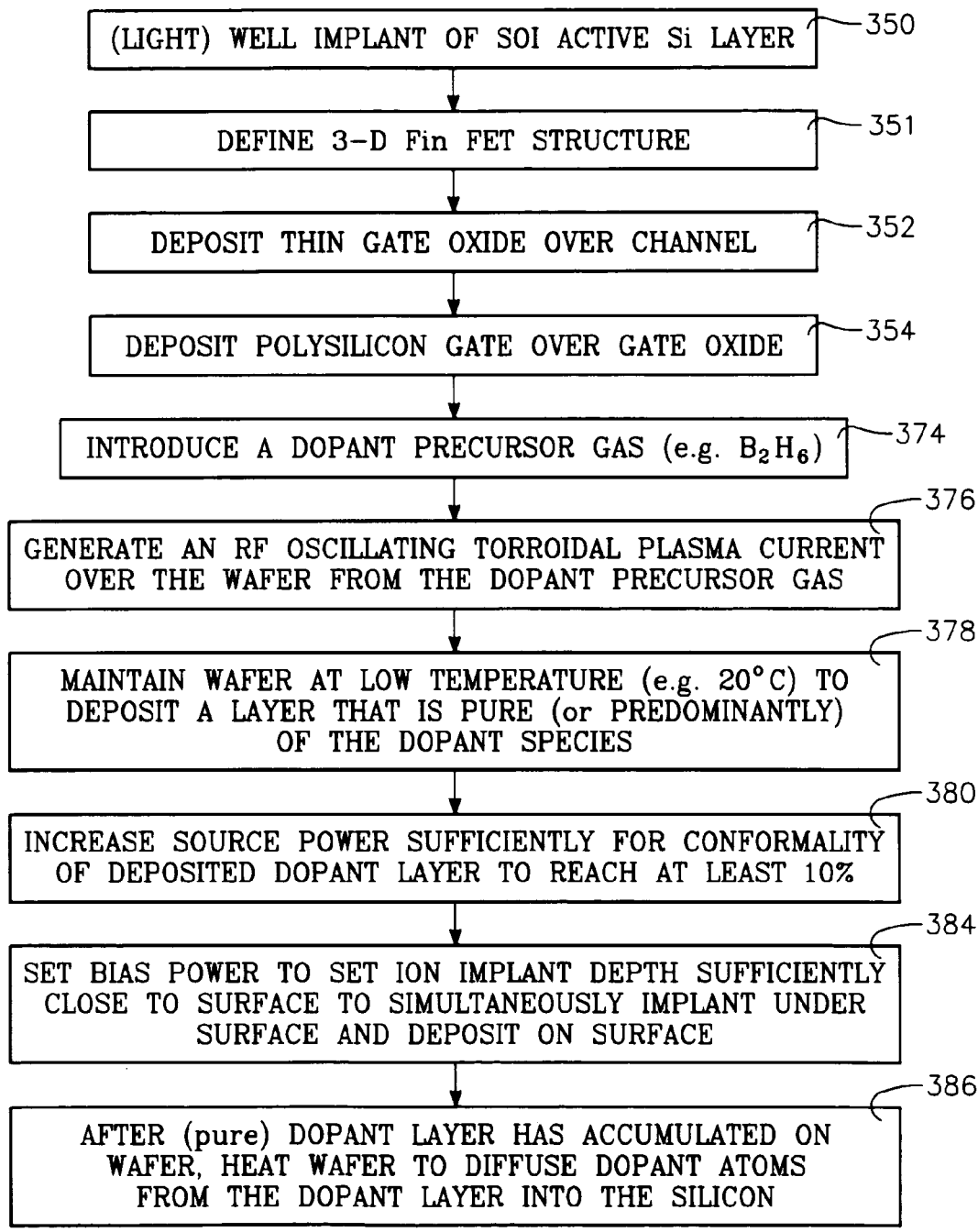

FIG. 138 is a flow diagram corresponding to the process of FIGS. 131A and 131B.

Figure 132A:
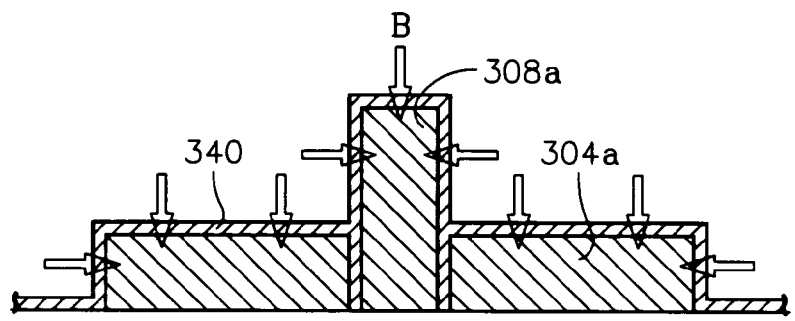
Figure 132B:
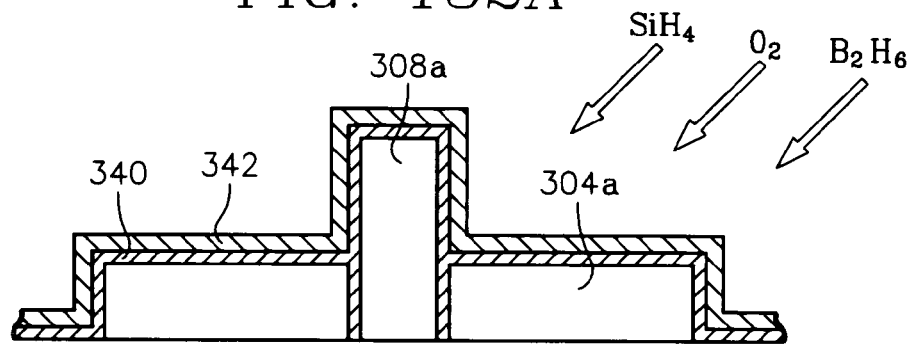
Figure 132C:
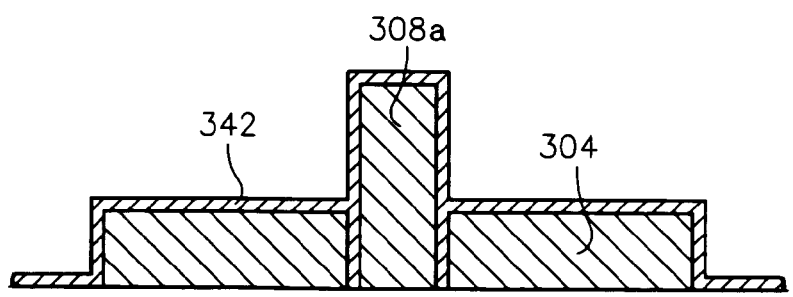
Figure 139:
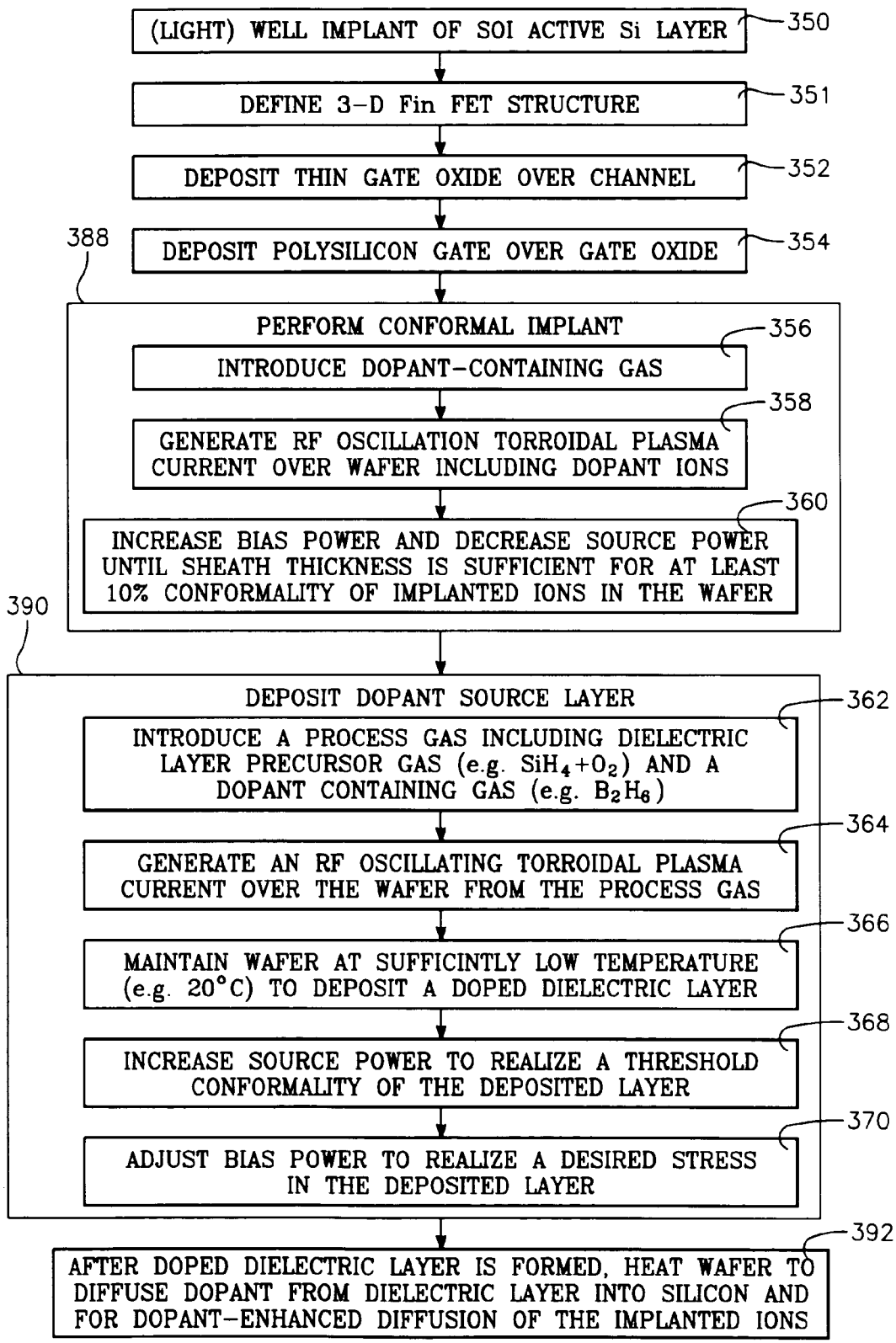

FIG. 139 is a flow diagram corresponding to the process of FIGS. 132A-132C.

Figure 140:
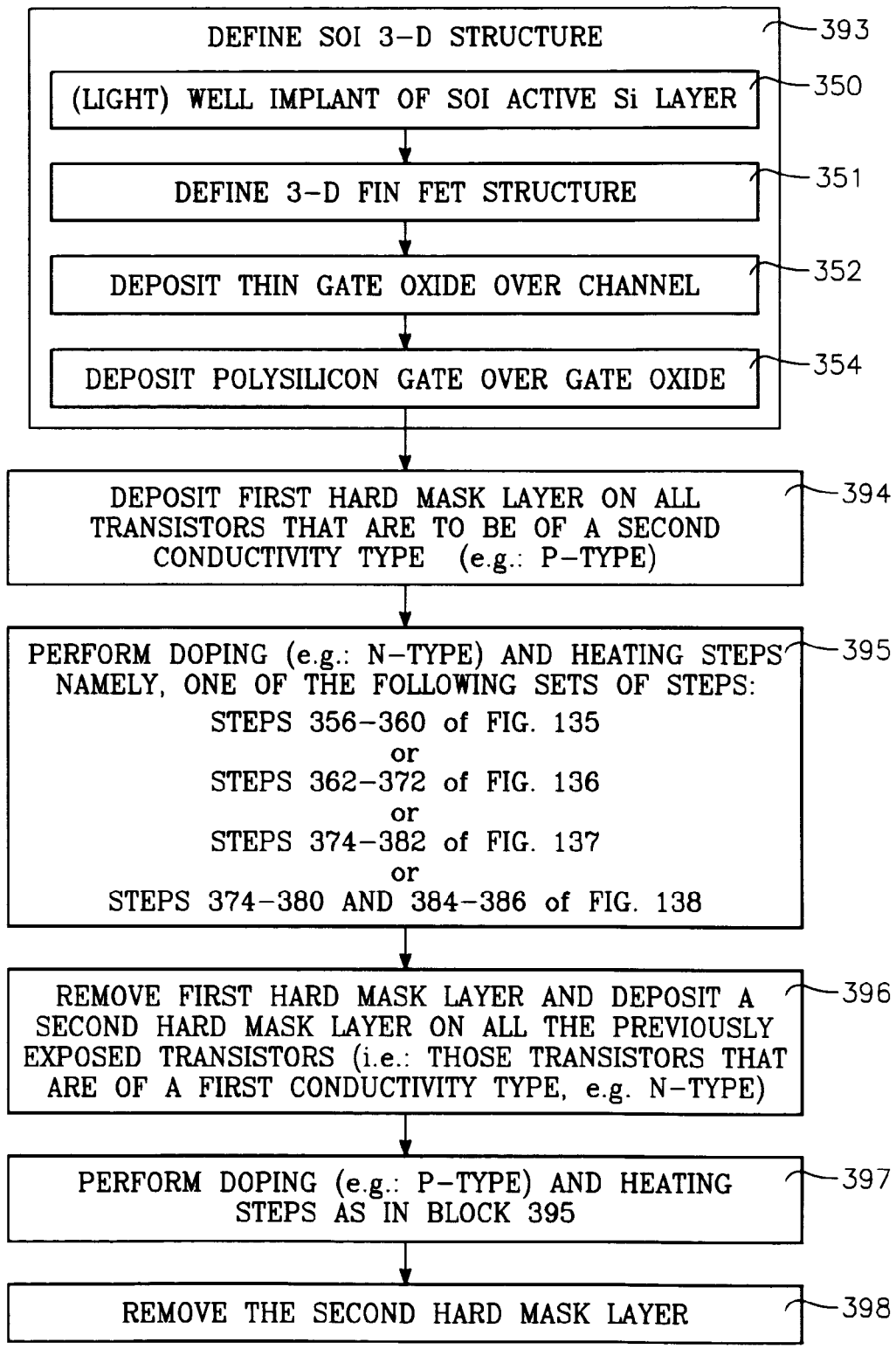

FIG. 140 is a flow diagram depicting how any of the foregoing processes may be adapted for fabrication of both PFET and NFET devices on the same wafer.

DETAILED DESCRIPTION OF THE INVENTION

Figure 1:
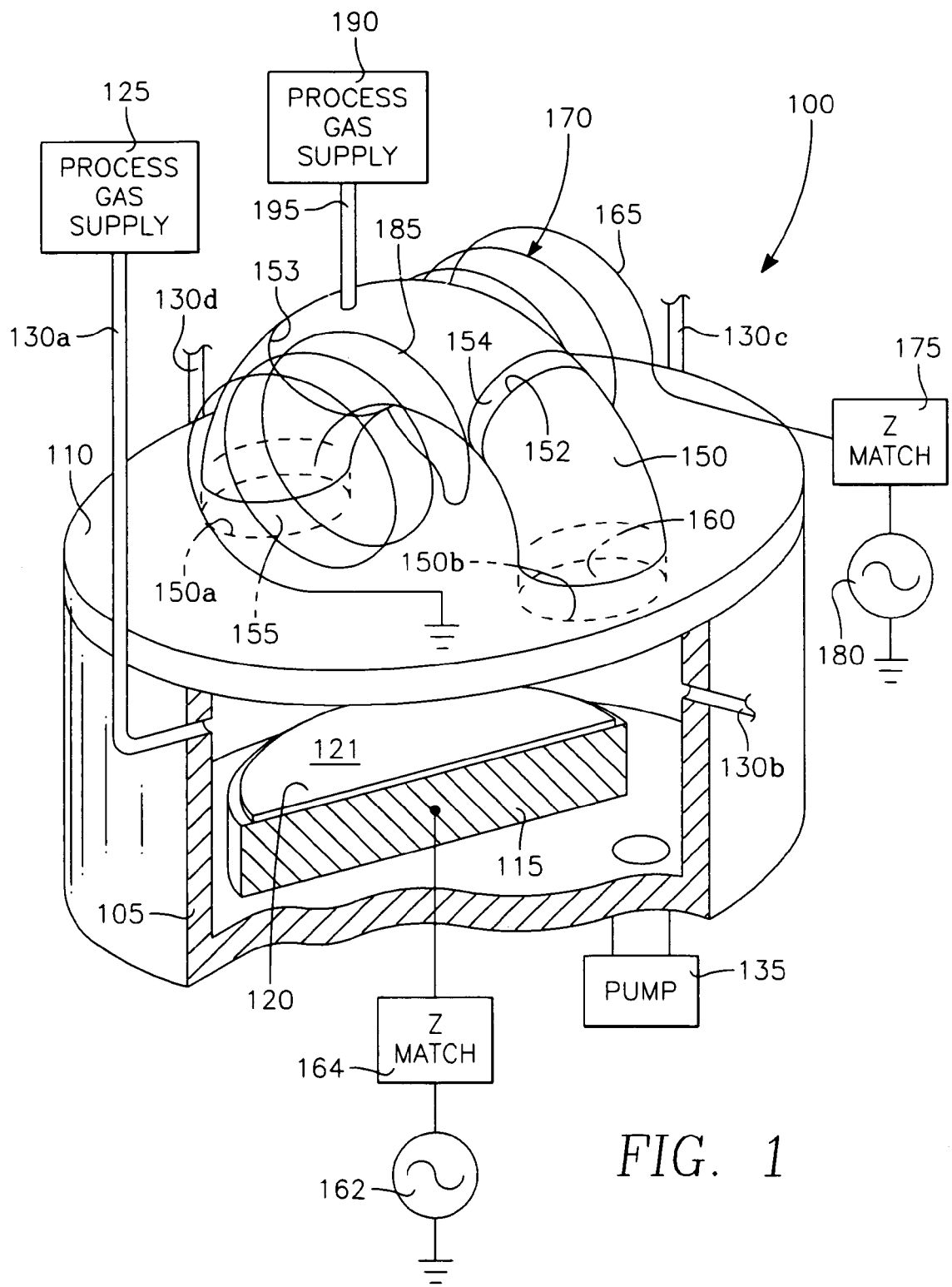
FIG. 1 illustrates a first case that maintains an overhead torroidal plasma current path.

Description of a Torroidal Source Reactor:

Referring to FIG. 1, a plasma reactor chamber 100 enclosed by a cylindrical sidewall 105 and a ceiling 110 houses a wafer pedestal 115 for supporting a semiconductor wafer or workpiece 120. A process gas supply 125 furnishes process gas into the chamber 100 through gas inlet nozzles 130a-130d extending through the sidewall 105. A vacuum pump 135 controls the pressure within the chamber 100, typically holding the pressure below 0.5 milliTorr (mT). A half-torroidal hollow tube enclosure or conduit 150 extends above the ceiling 110 in a half circle. The conduit 150, although extending externally outwardly from ceiling 110, is nevertheless part of the reactor and forms a wall of the chamber. Internally it shares the same evacuated atmosphere as exists elsewhere in the reactor. In fact, the vacuum pump 135, instead of being coupled to the bottom of the main part of the chamber as illustrated in FIG. 1, may instead be coupled to the conduit 150. The conduit 150 has one open end 150a sealed around a first opening 155 in the reactor ceiling 110 and its other end 150b sealed around a second opening 160 in the reactor ceiling 110. The two openings or ports 150, 160 are located on generally opposite sides of the wafer support pedestal 115. The hollow conduit 150 is reentrant in that it provides a flow path which exits the main portion of the chamber at one opening and re-enters at the other opening. In this specification, the conduit 150 may be described as being half-torroidal, in that the conduit is hollow and provides a portion of a closed path in which plasma may flow, the entire path being completed by flowing across the entire process region overlying the wafer support pedestal 115. Notwithstanding the use of the term torroidal, the trajectory of the path as well as the cross-sectional shape of the path or conduit 150 may be circular or non-circular, and may be square, rectangular or any other shape either a regular shape or irregular.

The external conduit 150 may be formed of a relatively thin conductor such as sheet metal, but sufficiently strong to withstand the vacuum within the chamber. In order to suppress eddy currents in the sheet metal of the hollow conduit 150 (and thereby facilitate coupling of an RF inductive field into the interior of the conduit 150), an insulating gap 152 extends across and through the hollow conduit 150 so as to separate it into two tubular sections. The gap 152 is filled by a ring 154 of insulating material such as an insulator in lieu of the sheet metal skin, so that the gap is vacuum tight. A second insulating gap 153 may be provided, so that one section of the conduit 150 is electrically floating. A bias RF generator 162 applies RF bias power to the wafer pedestal 115 and wafer 120 through an impedance match element 164.

The hollow conduit 150 may be formed of a machined metal, such as aluminum or aluminum alloy. Passages for liquid cooling or heating may be incorporated in the walls of the hollow conduit.

Alternatively, the hollow conduit 150 may be formed of a non-conductive material instead of the conductive sheet metal. The non-conductive material may be an insulator, for example. In such an alternative case, neither gap 152 or 153 is required.

An antenna 170 such as a winding or coil 165 disposed on one side of the hollow conduit 150 and wound around an axis parallel to the axis of symmetry of the half-torroidal tube is connected through an impedance match element 175 to an RF power source 180. The antenna 170 may further include a second winding 185 disposed on the opposite side of the hollow conduit 150 and wound in the same direction as the first winding 165 so that the magnetic fields from both windings add constructively.

Process gases from the chamber 100 fill the hollow conduit 150. In addition, a separate process gas supply 190 may supply process gases directly in to the hollow conduit 150 through a gas inlet 195. The RF field in the external hollow conduit 150 ionizes the gases in the tube to produce a plasma. The RF field induced by the circular coil antenna 170 is such that the plasma formed in the tube 150 reaches through the region between the wafer 120 and the ceiling 110 to complete a torroidal path that includes the half-torroidal hollow conduit 150. As employed herein, the term torroidal refers to the closed and solid nature of the path, but does not refer or limit its cross-sectional shape or trajectory, either of which may be circular or non-circular or square or otherwise. Plasma circulates (oscillates) through the complete torroidal path or region which may be thought of as a closed plasma circuit. The torroidal region extends across the diameter of the wafer 120 and, in certain cases, has a sufficient width in the plane of the wafer so that it overlies the entire wafer surface.

The RF inductive field from the coil antenna 170 includes a magnetic field which itself is closed (as are all magnetic fields), and therefore induces a plasma current along the closed torroidal path described here. It is believed that power from the RF inductive field is absorbed at generally every location along the closed path, so that plasma ions are generated all along the path. The RF power absorption and rate of plasma ion generation may vary among different locations along the closed path depending upon a number of factors. However, the current is generally uniform along the closed path length, although the current density may vary. This current alternates at the frequency of the RF signal applied to the antenna 170. However, since the current induced by the RF magnetic field is closed, the current must be conserved around the circuit of the closed path, so that the amount of current flowing in any portion of the closed path is generally the same as in any other portion of the path. As will be described below, this fact is exploited in the invention to great advantage.

The closed torroidal path through which the plasma current flows is bounded by plasma sheaths formed at the various conductive surfaces bounding the path. These conductive surfaces include the sheet metal of the hollow conduit 150, the wafer (and/or the wafer support pedestal) and the ceiling overlying the wafer. The plasma sheaths formed on these conductive surfaces are charge-depleted regions produced as the result of the charge imbalance due to the greater mobility of the low-mass negative electrons and the lesser mobility of the heavy-mass positive ions. Such a plasma sheath has an electric field perpendicular to the local surface underlying the sheath. Thus, the RF plasma current that passes through the process region overlying the wafer is constricted by and passes between the two electric fields perpendicular to the surface of the ceiling facing the wafer and the surface of the wafer facing the gas distribution plate. The thickness of the sheath (with RF bias applied to the workpiece or other electrode) is greater where the electric field is concentrated over a small area, such as the wafer, and is less in other locations such as the sheath covering the ceiling and the large adjoining chamber wall surfaces. Thus, the plasma sheath overlying the wafer is much thicker. The electric fields of the wafer and ceiling/gas distribution plate sheaths are generally parallel to each other and perpendicular to the direction of the RF plasma current flow in the process region.

When RF power is first applied to the coil antenna 170, a discharge occurs across the gap 152 to ignite a capacitively coupled plasma from gases within the hollow conduit 150. Above a threshold power level, the discharge and plasma current become spatially continuous through the length of the hollow conduit 150 and along the entire torroidal path. Thereafter, as the plasma current through the hollow conduit 150 increases, the inductive coupling of the RF field becomes more dominant so that the plasma becomes an inductively coupled plasma. Alternatively, plasma may be initiated by other means, such as by RF bias applied to the workpiece support or other electrode or by a spark or ultraviolet light source.

In order to avoid edge effects at the wafer periphery, the ports 150, 160 are separated by a distance that exceeds the diameter of the wafer. For example, for a 12 inch diameter wafer, the ports 150, 160 are about 14 to 22 inches apart. For an 8 inch diameter wafer, the ports 150, 160 are about 9 to 16 inches apart.

Notwithstanding the use of the term "wafer", the workpiece may be any shape, such as rectangular. The workpiece material may be a semiconductor, insulator, or conductor, or a combination of various materials. The workpiece may have 2-dimensional or 3-dimensional structure, as well.

Advantages:

A significant advantage is that power from the RF inductive field is absorbed throughout the relatively long closed torroidal path (i.e., long relative to the gap length between the wafer and the reactor ceiling), so that RF power absorption is distributed over a large area. As a result, the RF power density in the vicinity of the wafer-to-ceiling gap (i.e., the process region 121 best shown in FIG. 2, not to be confused with the insulating gap 152) is relatively low, thus reducing the likelihood of device damage from RF fields. In contrast, in prior inductively coupled reactors, all of the RF power is absorbed within the narrow wafer-to-ceiling gap, so that it is greatly concentrated in that region. Moreover, this fact often limits the ability to narrow the wafer-to-ceiling gap (in the quest of other advantages) or, alternatively, requires greater concentration of RF power in the region of the wafer. Thus, the invention overcomes a limitation of long standing in the art. This aspect enhances process performance for some applications by reducing residency time of the reactive gases through a dramatic reduction in volume of the process region or process zone overlying the wafer, as discussed previously herein.

A related and even more important advantage is that the plasma density at the wafer surface can be dramatically increased without increasing the RF power applied to the coil antenna 170 (leading to greater efficiency). This is accomplished by reducing the cross-sectional area of the torroidal path in the vicinity of the pedestal surface and wafer 120 relative to the remainder of the torroidal path. By so constricting the torroidal path of the plasma current near the wafer only, the density of the plasma near the wafer surface is increased proportionately. This is because the torroidal path plasma current through the hollow conduit 150 must be at least nearly the same as the plasma current through the pedestal-to-ceiling (wafer-to-ceiling) gap.

A significant difference over the prior art is that not only is the RF field remote from the workpiece, and not only can ion density be increased at the wafer surface without increasing the applied RF field, but the plasma ion density and/or the applied RF field may be increased without increasing the minimum wafer-to-ceiling gap length. Formerly, such an increase in plasma density necessitated an increase in the wafer-to-ceiling gap to avoid strong fields at the wafer surface. In contrast, in the present invention the enhanced plasma density is realized without requiring any increase in the wafer-to-ceiling gap to avoid a concomitant increase in RF magnetic fields at the wafer surface. This is because the RF field is applied remotely from the wafer and moreover need not be increased to realize an increase in plasma density at the wafer surface. As a result, the wafer-to-ceiling gap can be reduced down to a fundamental limit to achieve numerous advantages. For example, if the ceiling surface above the wafer is conductive, then reducing the wafer-to-ceiling gap improves the electrical or ground reference provided by the conductive ceiling surface. A fundamental limit on the minimum wafer-to-ceiling gap length is the sum of the thicknesses of the plasma sheaths on the wafer surface and on the ceiling surface.

A further advantage of the invention is that because the RF inductive field is applied along the entire torroidal path of the RF plasma current (so that its absorption is distributed as discussed above), the chamber ceiling 110, unlike with most other inductively powered reactors, need not function as a window to an inductive field and therefore may be formed of any desired material, such as a highly conductive and thick metal, and therefore may comprise a conductive gas distribution plate as will be described below, for example. As a result, the ceiling 110 readily provides a reliable electric potential or ground reference across the entire plane of the pedestal or wafer 120.

Figure 2:
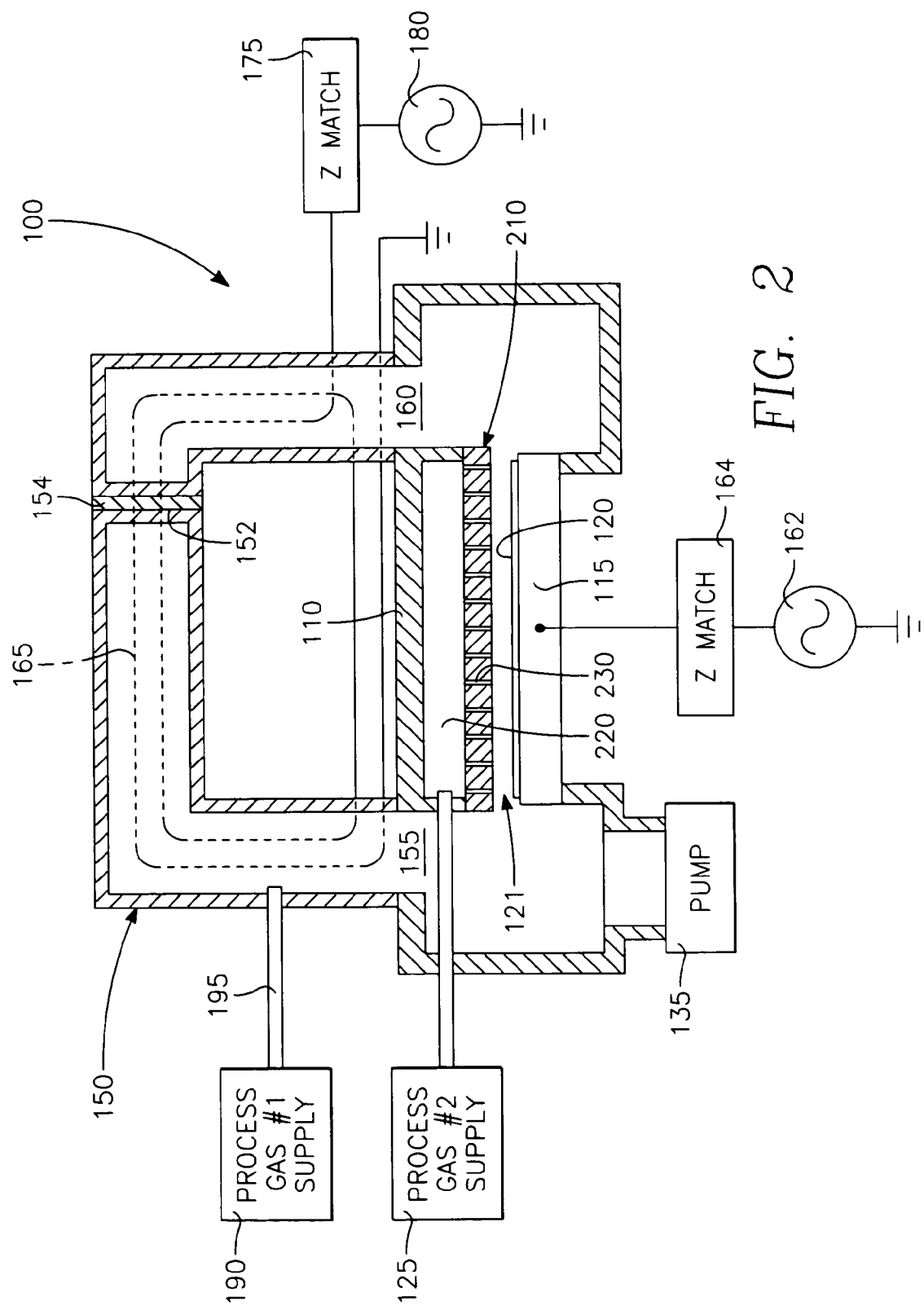
FIG. 2 is a side view of a case corresponding to the case of FIG. 1.

Increasing the Plasma Ion Density:

One way of realizing higher plasma density near the wafer surface by reducing plasma path cross-sectional area over the wafer is to reduce the wafer-to-ceiling gap length. This may be accomplished by simply reducing the ceiling height or by introducing a conductive gas distribution plate or showerhead over the wafer, as illustrated in FIG. 2. The gas distribution showerhead 210 of FIG. 2 consists of a gas distribution plenum 220 connected to the gas supply 125 and communicating with the process region over the wafer 120 through plural gas nozzle openings 230. The advantage of the conductive showerhead 210 is two-fold: First, by virtue of its close location to the wafer, it constricts the plasma path over the wafer surface and thereby increases the density of the plasma current in that vicinity. Second, it provides a uniform electrical potential reference or ground plane close to and across the entire wafer surface.

In order to avoid arcing across the openings 230, each opening 230 may be relatively small, on the order of a millimeter (e.g., hole diameter is approximately 0.5 mm). The spacing between adjacent openings may be on the order of a several millimeters.

The conductive showerhead 210 constricts the plasma current path rather than providing a short circuit through itself because a plasma sheath is formed around the portion of the showerhead surface immersed in the plasma. The sheath has a greater impedance to the plasma current than the space between the wafer 120 and the showerhead 210, and therefore virtually all the plasma current goes around the conductive showerhead 210.

It is not necessary to employ a showerhead (e.g., the showerhead 210) in order to constrict the torroidal plasma current or path in the vicinity of the process region overlying the wafer. The path constriction and consequent increase in plasma ion density in the process region may be achieved without the showerhead 210 by similarly reducing the wafer-to-ceiling height. If the showerhead 210 is eliminated in this manner, then the process gases may be supplied into the chamber interior by means of conventional gas inlet nozzles, gas diffusers, or gas slots (not shown).

One advantage of the showerhead 210 is that different mixtures of reactive and inert process gas ratios may be introduced through different orifices 230 at different radii, in order to finely adjust the uniformity of plasma effects on photoresist, for example. Thus, for example, a greater proportion of inert gas to reactive gas may be supplied to the orifices 230 lying outside a median radius while a greater proportion of reactive gas to inert gas may be supplied to the orifices 230 within that median radius.

As will be described below, another way in which the toroidal plasma current path may be constricted in the process region overlying the wafer (in order to increase plasma ion density over the wafer) is to increase the plasma sheath thickness on the wafer by increasing the RF bias power applied to the wafer support pedestal. Since as described previously the plasma current across the process region is confined between the plasma sheath at the wafer surface and the plasma sheath at the ceiling (or showerhead) surface, increasing the plasma sheath thickness at the wafer surface necessarily decreases the cross-section of the portion of the toroidal plasma current within process region, thereby increasing the plasma ion density in the process region. Thus, as will be described more fully later in this specification, as RF bias power on the wafer support pedestal is increased, plasma ion density near the wafer surface is increased accordingly.

High Etch Selectivity at High Etch Rates:

The invention solves the problem of poor etch selectivity which sometimes occurs with a high density plasma. The reactor of FIGS. 1 and 2 has a silicon dioxide-to-photoresist etch selectivity as high as that of a capacitively coupled plasma reactor (about 7:1) while providing high etch rates approaching that of a high density inductively coupled plasma reactor. It is believed that the reason for this success is that the reactor structure of FIGS. 1 and 2 reduces the degree of dissociation of the reactive process gas, typically a fluorocarbon gas, so as to reduce the incidence of free fluorine in the plasma region over the wafer 120. Thus, the proportion of free fluorine in the plasma relative to other species dissociated from the fluorocarbon gas is desirably reduced. Such other species include the protective carbon-rich polymer precursor species formed in the plasma from the fluorocarbon process gas and deposited on the photoresist as a protective polymer coating. They further include less reactive etchant species such as CF and $CF_2$ formed in the plasma from the fluorocarbon process gas. Free fluorine tends to attack photoresist and the protective polymer coating formed thereover as vigorously as it attacks silicon dioxide, thus reducing oxide-to-photoresist etch selectivity. On the other hand, the less reactive etch species such as $CF_2$ or CF tend to attack photoresist and the protective polymer coating formed thereover more slowly and therefore provide superior etch selectivity.

It is believed that the reduction in the dissociation of the plasma species to free fluorine is accomplished in the invention by reducing the residency time of the reactive gas in the plasma. This is because the more complex species initially dissociated in the plasma from the fluorocarbon process gas, such as $CF_2$ and CF are themselves ultimately dissociated into simpler species including free fluorine, the extent of this final step of dissociation depending upon the residency time of the gas in the plasma. The term "residency time" or "residence time" as employed in this specification corresponds generally to the average time that a process gas molecule and the species dissociated from the that molecule are present in the process region overlying the workpiece or wafer. This time or duration extends from the initial injection of the molecule into the process region until the molecule and/or its dissociated progeny are pass out of the process region along the closed toroidal path described above that extends through the processing zone.

It is also believed that the reduction in the dissociation of the plasma species to free fluorine is accomplished by reducing the power density of the applied plasma source power as compared to conventional inductively coupled plasma sources. As stated above, power from the RF inductive field is absorbed throughout the relatively long closed toroidal path (i.e., long relative to the gap length between the wafer and the reactor ceiling), so that RF power absorption is distributed over a large area. As a result, the RF power density in the vicinity of the wafer-to-ceiling gap (i.e., the process region 121 best shown in FIG. 2, not to be confused with the insulating gap 152) is relatively low, thus reducing the dissociation of molecular gases.

As stated above, the invention enhances etch selectivity by reducing the residency time in the process region of the fluorocarbon process gas. The reduction in residency time is achieved by constricting the plasma volume between the wafer 120 and the ceiling 110.

The reduction in the wafer-to-ceiling gap or volume has certain beneficial effects. First, it increases plasma density over the wafer, enhancing etch rate. Second, residency time falls as the volume is decreased. As referred to above, the small volume is made possible in the present invention because, unlike conventional inductively coupled reactors, the RF source power is not deposited within the confines of the process region overlying the wafer but rather power deposition is distributed along the entire closed toroidal path of the plasma current. Therefore, the wafer-to-ceiling gap can be less than a skin depth of the RF inductive field, and in fact can be so small as to significantly reduce the residency time of the reactive gases introduced into the process region, a significant advantage.

There are two ways of reducing the plasma path cross-section and therefore the volume over the wafer 120. One is to reduce the wafer-to-showerhead gap distance. The other is to increase the plasma sheath thickness over the wafer by increasing the bias RF power applied to the wafer pedestal 115 by the RF bias power generator 162, as briefly mentioned above. Either method results in a reduction in free fluorine content of the plasma in the vicinity of the wafer 120 (and consequent increase in dielectric-to-photoresist etch selectivity) as observed using optical emission spectroscopy (OES) techniques.

There are three additional methods of the invention for reducing free fluorine content to improve etch selectivity. One method is to introduce a non-chemically reactive diluent gas such as argon into the plasma. The argon gas may be introduced outside and above the process region by injecting it directly into the hollow conduit 150 from the second process gas supply 190, while the chemically reactive process gases (fluorocarbon gases) enter the chamber only through the showerhead 210. With this advantageous arrangement, the argon ions, neutrals, and excited neutrals propagate within the toroidal path plasma current and through the process region across the wafer surface to dilute the newly introduced reactive (e.g., fluorocarbon) gases and thereby effectively reduce their residency time over the wafer. Another method of reducing plasma free fluorine content is to reduce the chamber pressure. A further method is to reduce the RF source power applied to the coil antenna 170.

Figure 3:
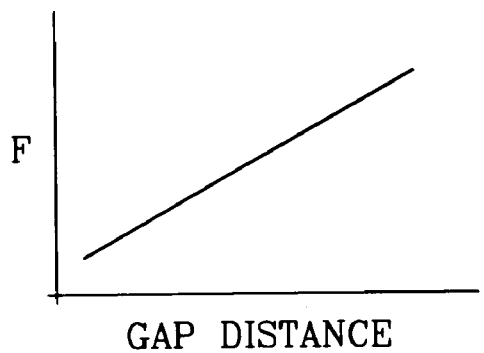
FIG. 3 is a graph illustrating the behavior of free fluorine concentration in the plasma with variations in wafer-to-ceiling gap distance.
Figure 4:
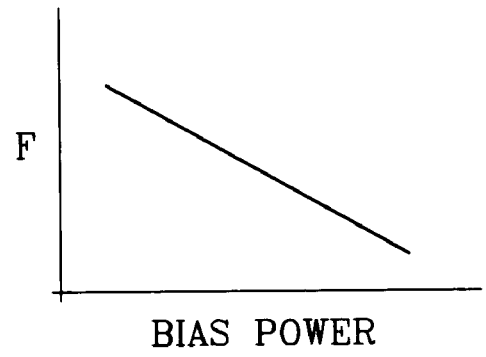
FIG. 4 is a graph illustrating the behavior of free fluorine concentration in the plasma with variations in RF bias power applied to the workpiece.
Figure 5:
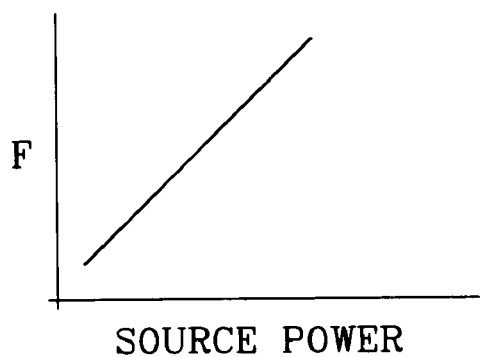
FIG. 5 is a graph illustrating the behavior of free fluorine concentration in the plasma with variations in RF source power applied to the coil antenna.

FIG. 3 is a graph illustrating a trend observed in the invention in which the free fluorine content of the plasma decreases as the wafer-to-showerhead gap distance is decreased. FIG. 4 is a graph illustrating that the free fluorine content of the plasma is decreased by decreasing the plasma bias power applied to the wafer pedestal 115. FIG. 5 is a graph illustrating that plasma free fluorine content is reduced by reducing the RF source power applied to the coil antenna

Figure 6:
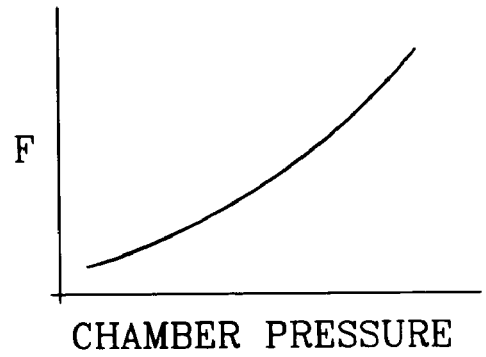
FIG. 6 is a graph illustrating the behavior of free fluorine concentration in the plasma with variations in reactor chamber pressure.
Figure 7:
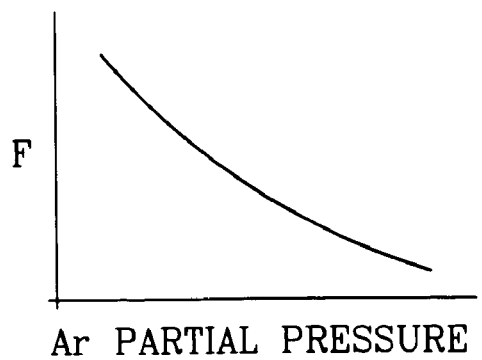
FIG. 7 is a graph illustrating the behavior of free fluorine concentration in the plasma with variations in partial pressure of an inert diluent gas such as argon.

170. FIG. 6 is a graph illustrating that the free fluorine content is reduced by reducing chamber pressure. FIG. 7 is a graph illustrating that plasma free fluorine content is reduced by increasing the diluent (argon gas) flow rate into the tubular enclosure 150. The graphs of FIGS. 3-7 are merely illustrative of plasma behavioral trends inferred from numerous OES observations and do not depict actual data.

Wide Process Window:

The chamber pressure is generally less than 0.5 T and can be as low as 1 mT. The process gas may be $C_4F_8$ injected into the chamber 100 through the gas distribution showerhead at a flow rate of about 15 cc/m with 150 cc/m of argon, with the chamber pressure being maintained at about 20 mT. Alternatively, the argon gas flow rate may be increased to 650 cc/m and the chamber pressure to 60 mT. The antenna 170 may be excited with about 500 Watts of RF power at 13 MHz. The wafer-to-showerhead gap may be about 0.3 inches to 2 inches. The bias RF power applied to the wafer pedestal may be 13 MHz at 2000 Watts. Other selections of frequency may be made. The source power applied to the coil antenna 170 may be as low as 50 kHz or as high as several times 13 MHz or higher. The same is true of the bias power applied to the wafer pedestal.

Figure 8:
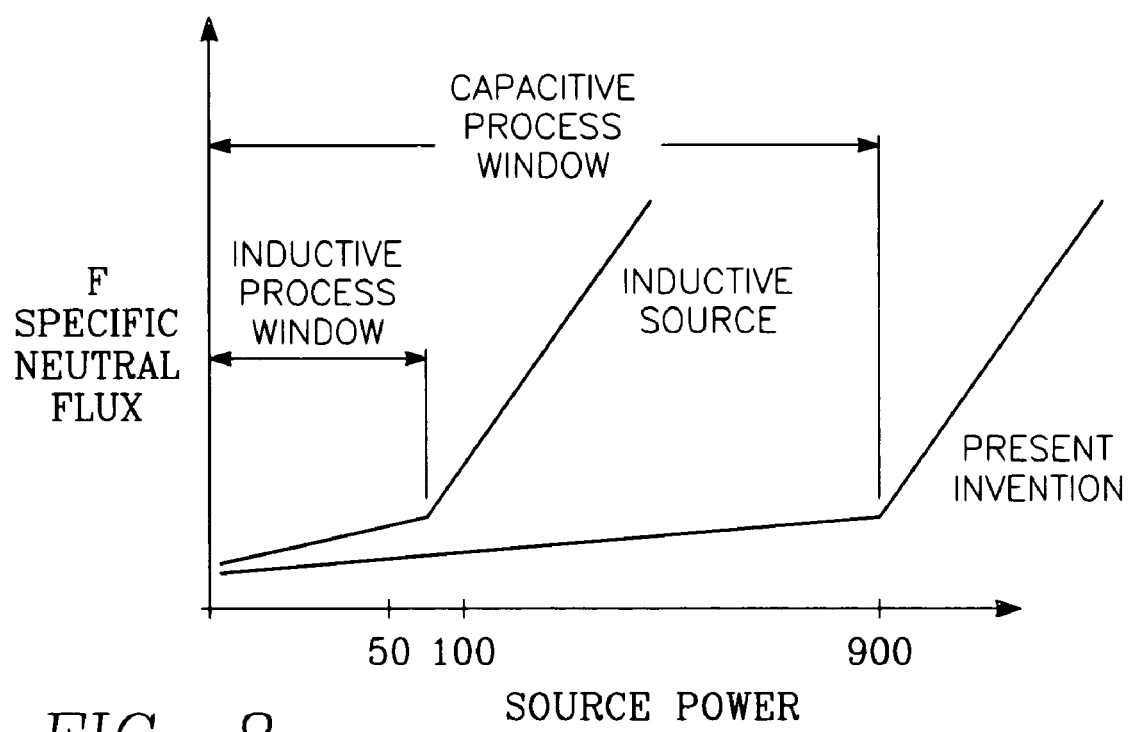
FIG. 8 is a graph illustrating the degree of dissociation of process gas as a function of source power for an inductively coupled reactor and for a reactor according to an embodiment of the present invention.

The process window for the reactor of FIGS. 1 and 2 is far wider than the process window for a conventional inductively coupled reactor. This is illustrated in the graph of FIG. 8, showing the specific neutral flux of free fluorine as a function of RF source power for a conventional inductive reactor and for the reactor of FIGS. 1 and 2. For the conventional inductively coupled reactor, FIG. 8 shows that the free fluorine specific flux begins to rapidly increase as the source power exceeds between 50 and 100 Watts. In contrast, the reactor of FIGS. 1 and 2 can accept source power levels approaching 1000 Watts before the free fluorine specific flux begins to increase rapidly. Therefore, the source power process window in the invention is nearly an order of magnitude wider than that of a conventional inductively coupled reactor, a significant advantage.

Dual Advantages:

The constriction of the torroidal plasma current path in the vicinity of the wafer or workpiece produces two independent advantages without any significant tradeoffs of other performance criteria: (1) the plasma density over the wafer is increased without requiring any increase in plasma source power, and (2) the etch selectivity to photoresist or other materials is increased, as explained above. It is believed that in prior plasma reactors it has been impractical if not impossible to increase the plasma ion density by the same step that increases etch selectivity. Thus, the dual advantages realized with the torroidal plasma source of the present invention appear to be a revolutionary departure from the prior art.

Other Embodiments

Figure 9:
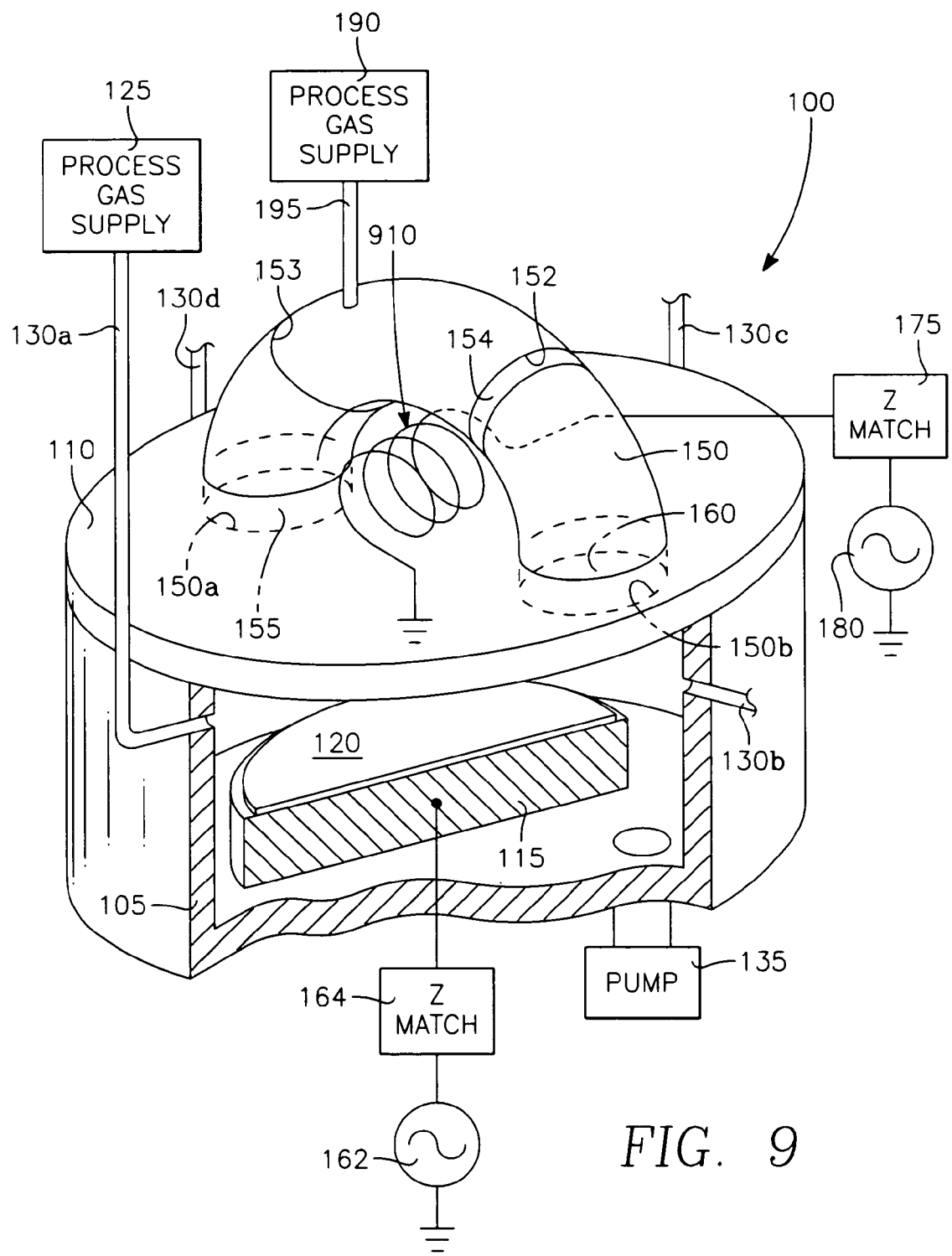
FIG. 9 illustrates a variation of the case of FIG. 1.

FIG. 9 illustrates a modification of the case of FIG. 1 in which the side antenna 170 is replaced by a smaller antenna 910 that fits inside the empty space between the ceiling 110 and the hollow conduit 150. The antenna 910 is a single coil winding centered with respect to the hollow conduit 150.

Figure 10:
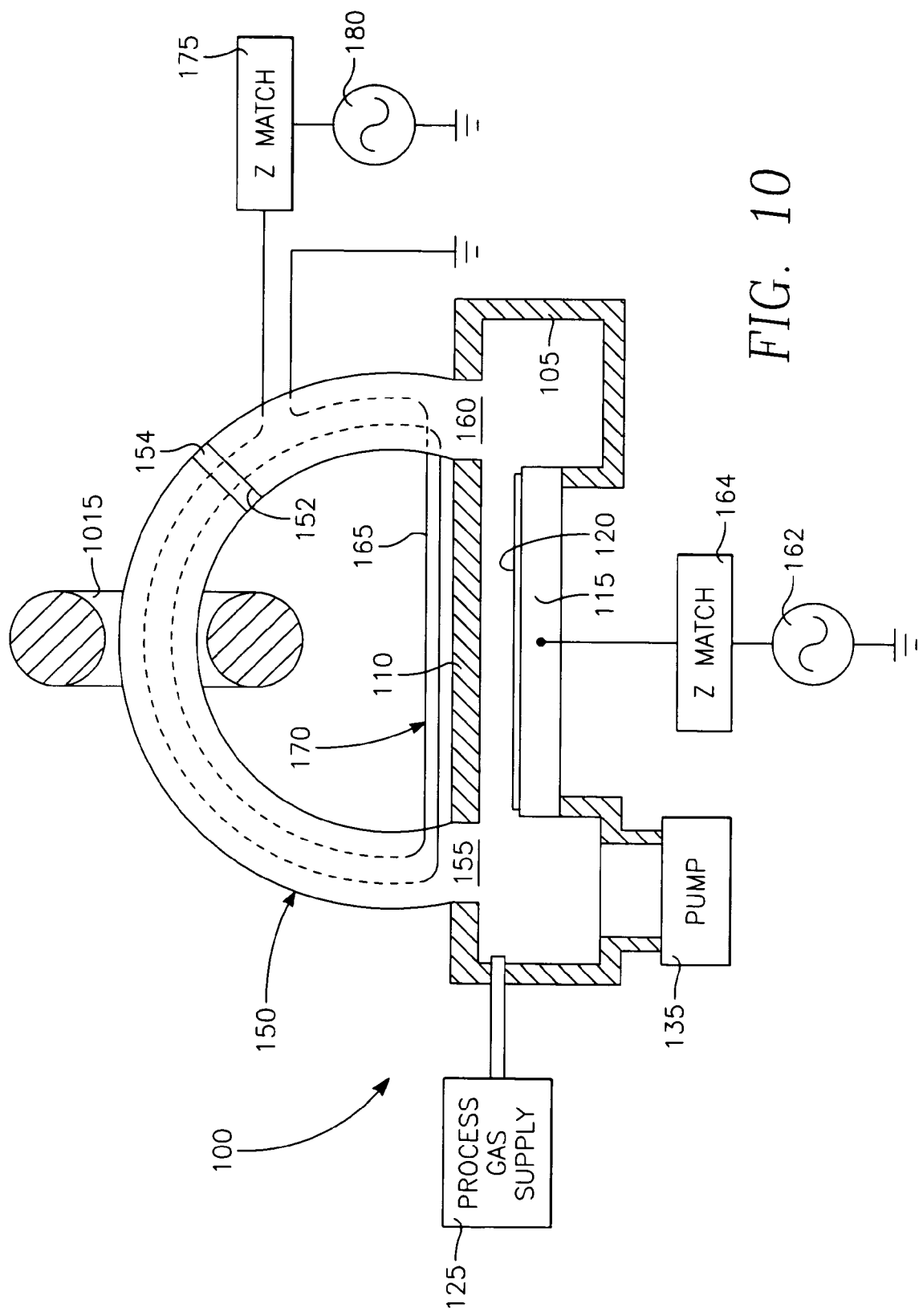
FIGS. 10 and 11 illustrate a variation of the case of FIG. 1 in which a closed magnetic core is employed.
Figure 11:
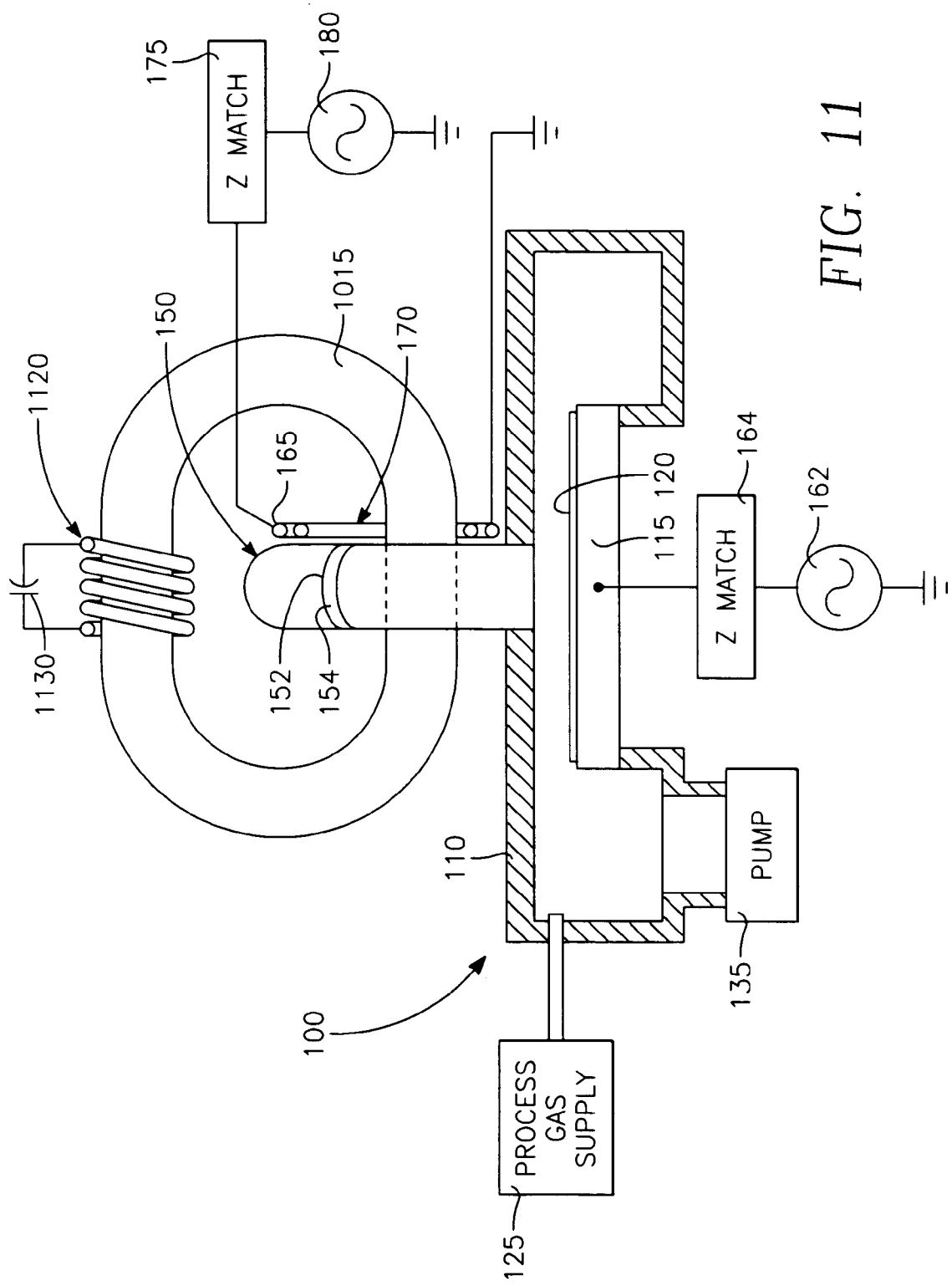

FIGS. 10 and 11 illustrate how the case of FIG. 1 may be enhanced by the addition of a closed magnetically permeable core 1015 that extends through the space between the ceiling 110 and the hollow conduit 150. The core 1015 improves the inductive coupling from the antenna 170 to the plasma inside the hollow conduit 150.

Impedance match may be achieved without the impedance match circuit 175 by using, instead, a secondary winding 1120 around the core 1015 connected across a tuning capacitor 1130. The capacitance of the tuning capacitor 1130 is selected to resonate the secondary winding 1120 at the frequency of the RF power source 180. For a fixed tuning capacitor 1130, dynamic impedance matching may be provided by frequency tuning and/or by forward power servoing.

Figure 12:
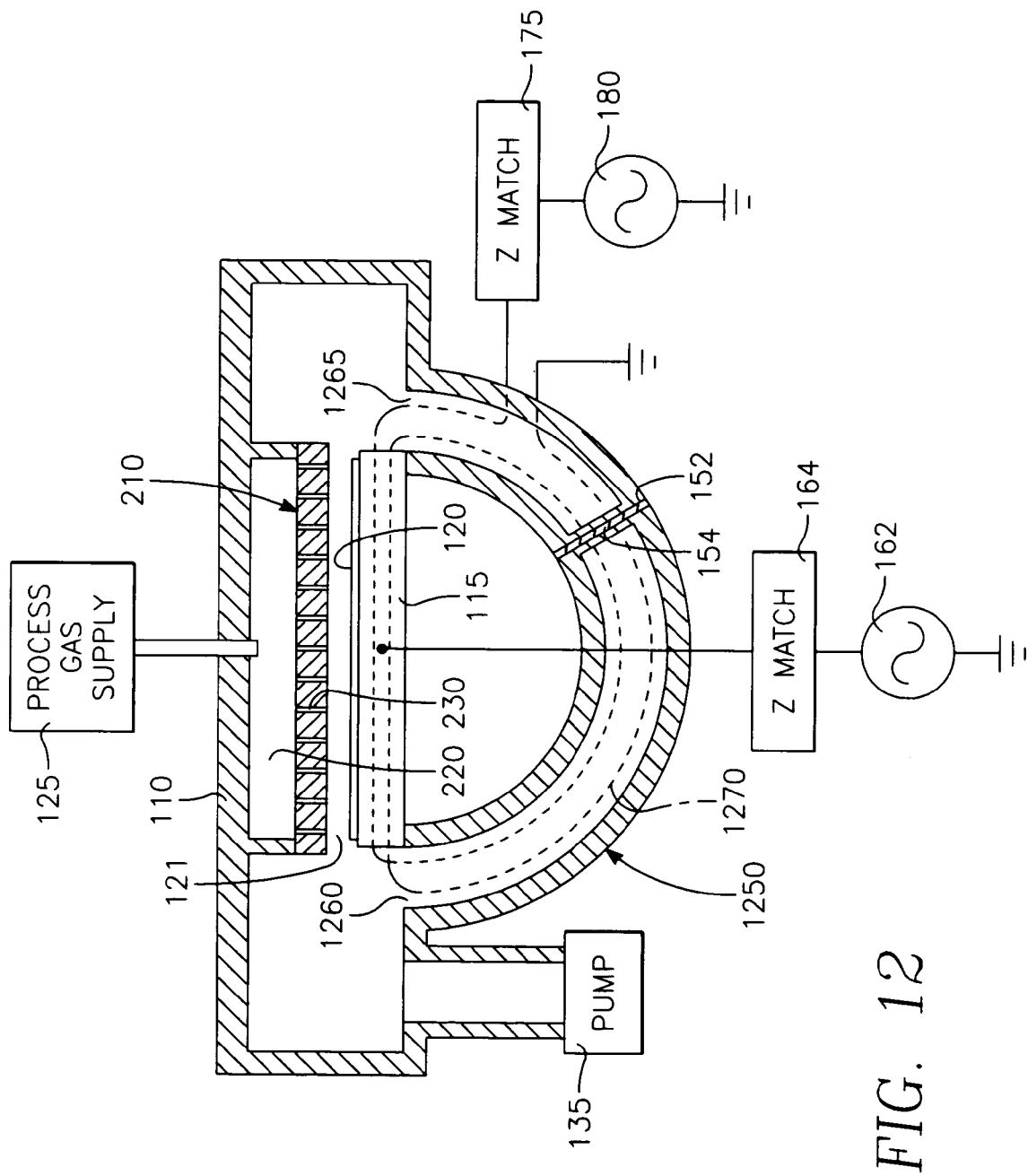
FIG. 12 illustrates another case of the invention in which a torroidal plasma current path passes beneath the reactor chamber.

FIG. 12 illustrates a case of the invention in which a hollow tube enclosure 1250 extends around the bottom of the reactor and communicates with the interior of the chamber through a pair of openings 1260, 1265 in the bottom floor of the chamber. A coil antenna 1270 follows along side the torroidal path provided by the hollow tube enclosure 1250 in the manner of the case of FIG. 1. While FIG. 12 shows the vacuum pump 135 coupled to the bottom of the main chamber, it may just as well be coupled instead to the underlying conduit 1250.

Figure 13:
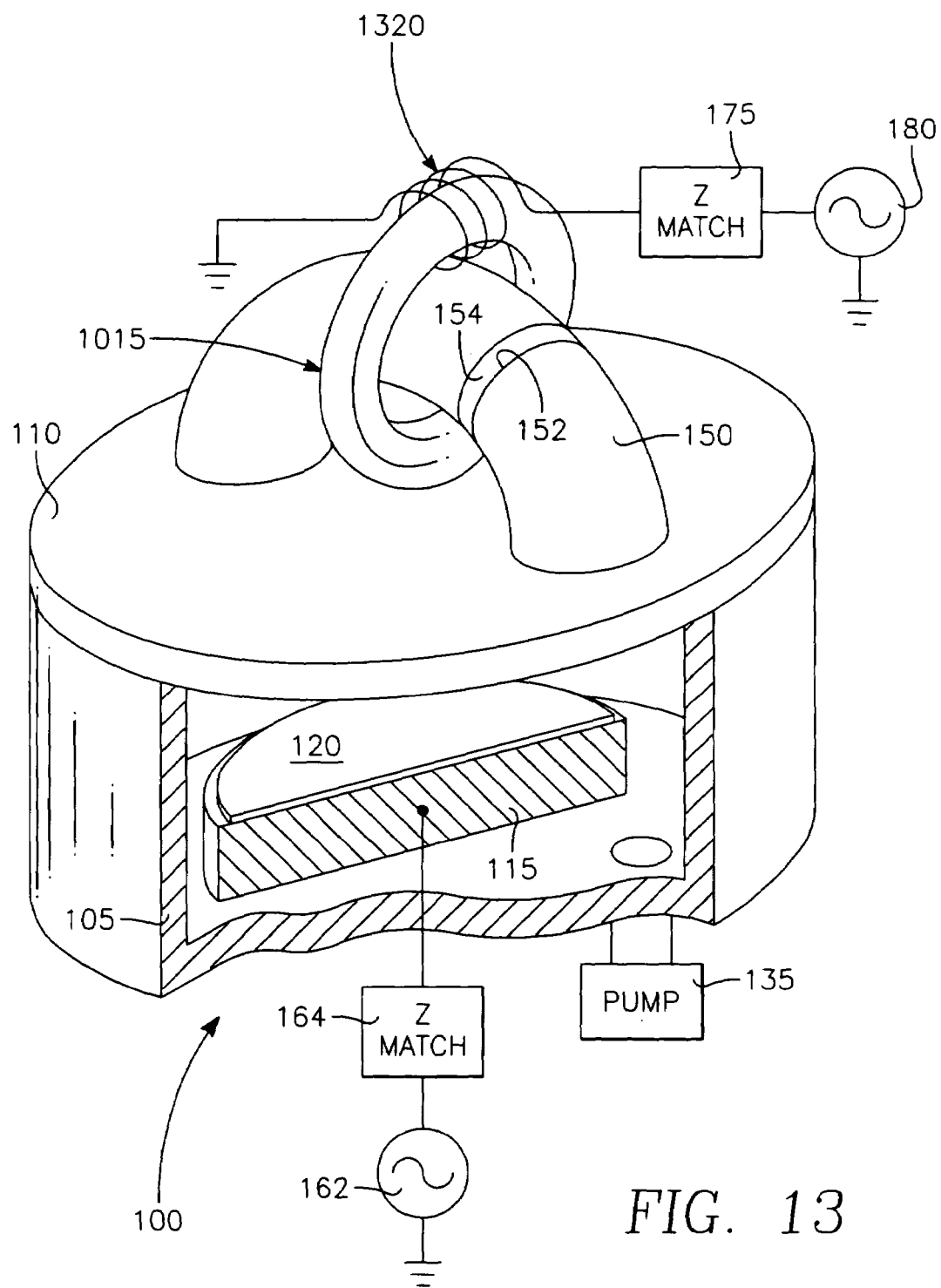
FIG. 13 illustrates a variation of the case of FIG. 10 in which plasma source power is applied to a coil wound around a distal portion the closed magnetic core.

FIG. 13 illustrates a variation of the case of FIGS. 10 and 11, in which the antenna 170 is replaced by an inductive winding 1320 surrounding an upper section of the core 1015. Conveniently, the winding 1320 surrounds a section of the core 1015 that is above the conduit 150 (rather than below it). However, the winding 1320 can surround any section of the core 1015.

Figure 14:
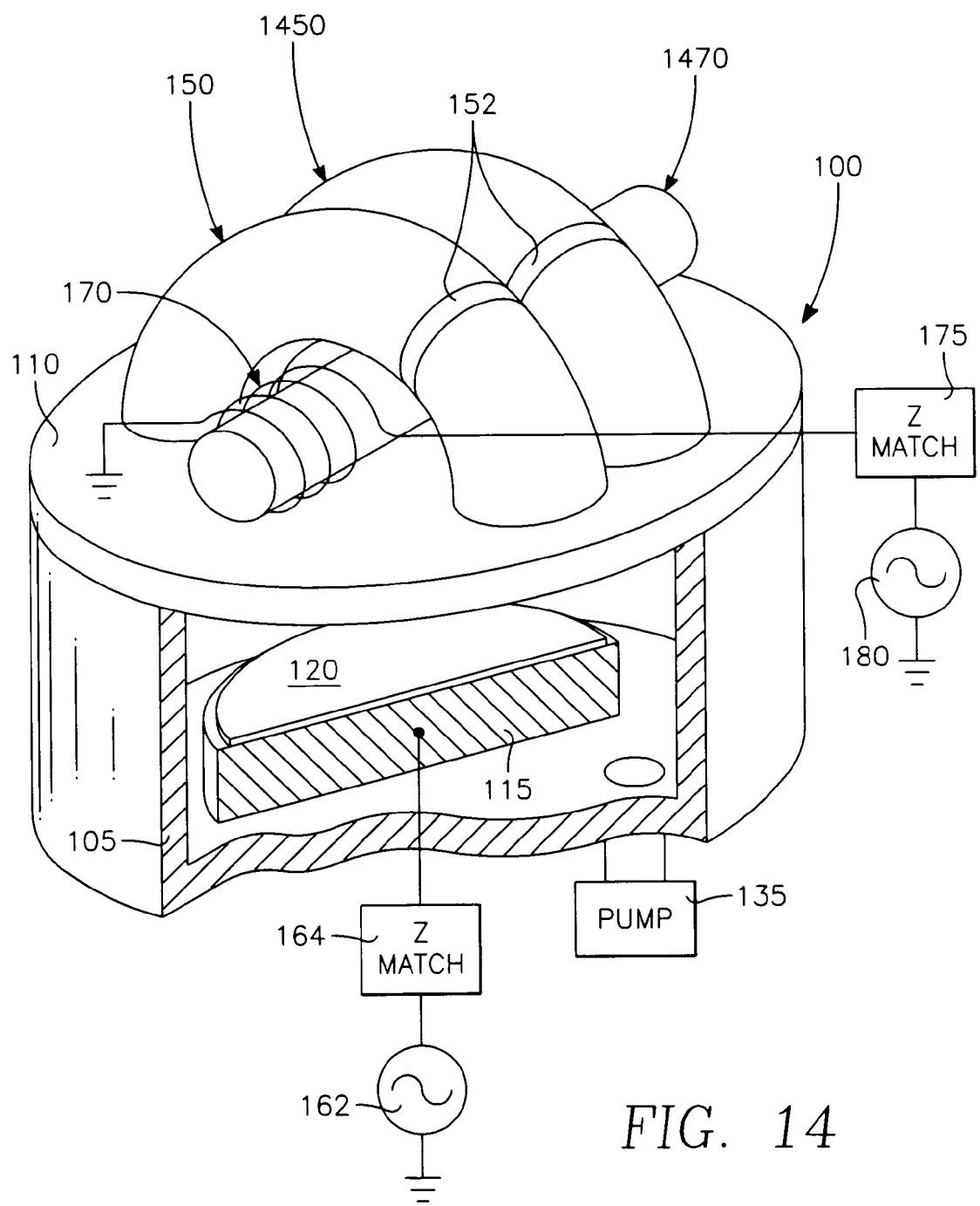
FIG. 14 illustrates a case that establishes two parallel torroidal plasma currents.

FIG. 14 illustrates an extension of the concept of FIG. 13 in which a second hollow tube enclosure 1450 runs parallel to the first hollow conduit 150 and provides a parallel torroidal path for a second torroidal plasma current. The tube enclosure 1450 communicates with the chamber interior at each of its ends through respective openings in the ceiling 110. A magnetic core 1470 extends under both tube enclosures 150, 1450 and through the coil antenna 170.

Figure 15:
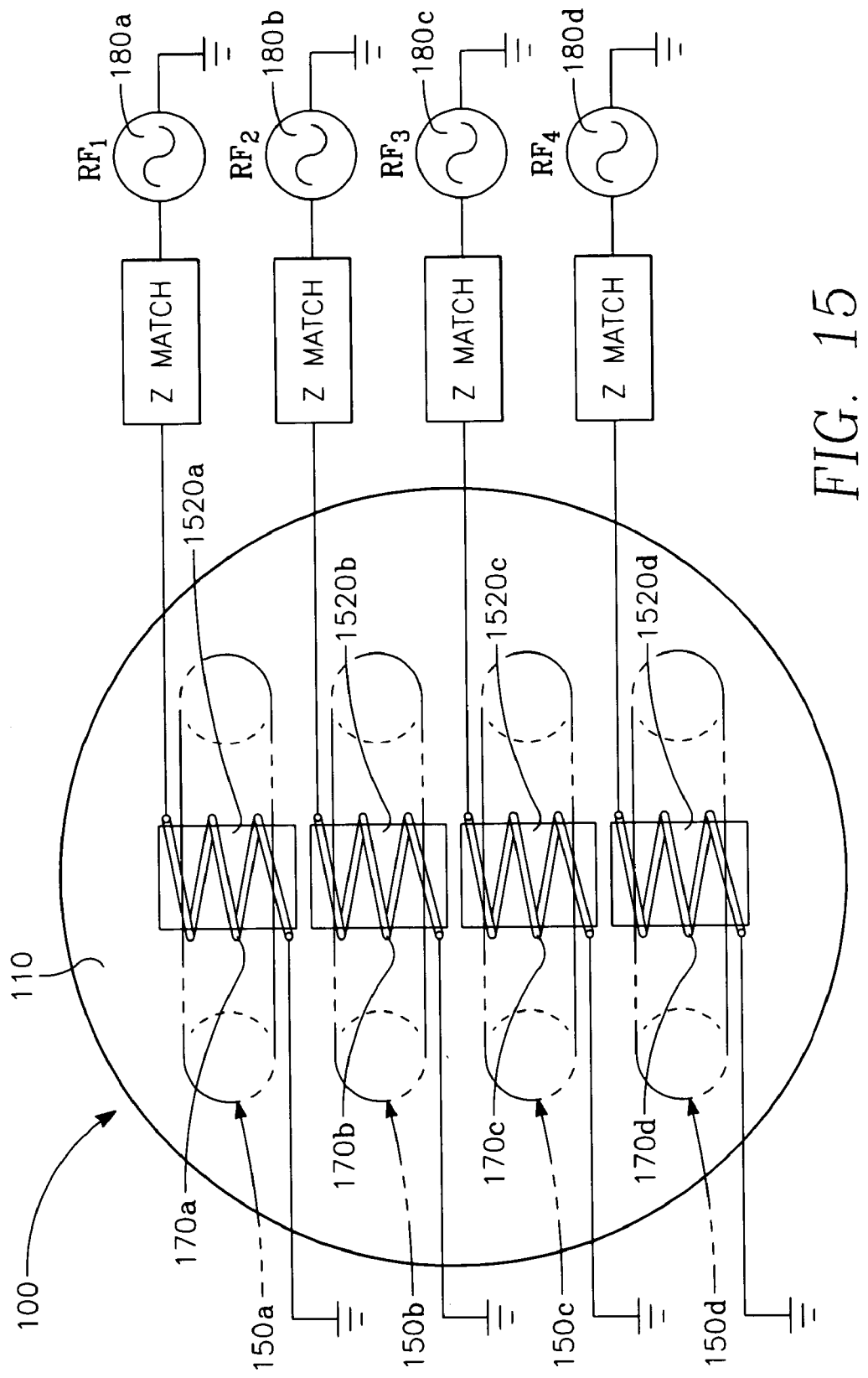
FIG. 15 illustrates a case that establishes a plurality of individually controlled parallel torroidal plasma currents.

FIG. 15 illustrates an extension of the concept of FIG. 14 in which an array of parallel hollow tube enclosures 1250*a*, 1250*b*, 1250*c*, 1250*d* provide plural torroidal plasma current paths through the reactor chamber. In the case of FIG. 15, the plasma ion density is controlled independently in each individual hollow conduit 1250*a-d* by an individual coil antenna 170*a-d*, respectively, driven by an independent RF power source 180*a-d*, respectively. Individual cylindrical open cores 1520*a-*1520*d* may be separately inserted within the respective coil antennas 170*a-d*. In this case, the relative center-to-edge ion density distribution may be adjusted by separately adjusting the power levels of the individual RF power sources 180*a-d*.

Figure 16:
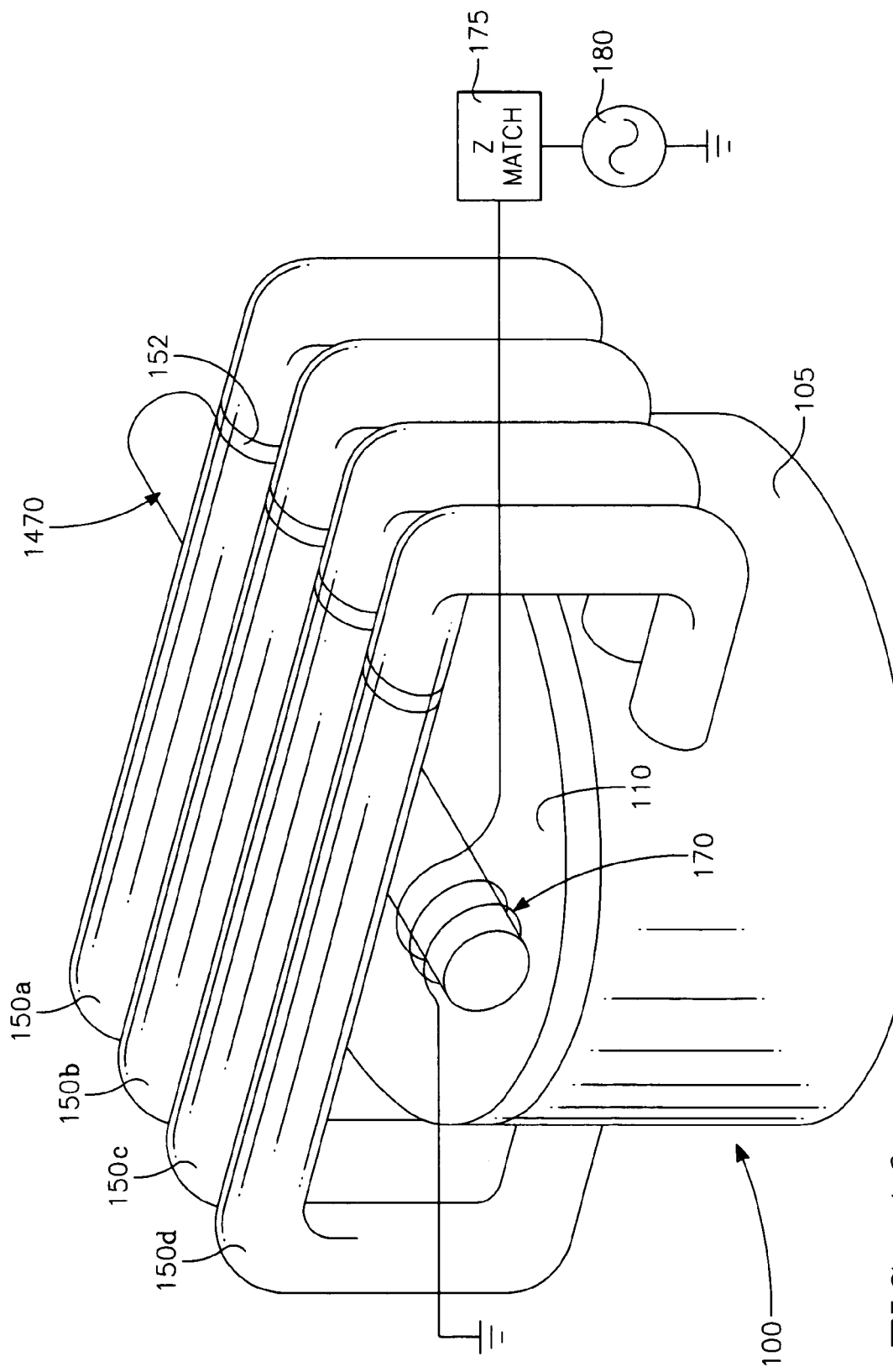
FIG. 16 illustrates a variation of the case of FIG. 15 in which the parallel torroidal plasma currents enter and exit the plasma chamber through the vertical sidewall rather than the ceiling.

FIG. 16 illustrates a modification of the case of FIG. 15 in which the array of tube enclosures 1250*a-d* extend through the sidewall of the reactor rather than through the ceiling 110. Another modification illustrated in FIG. 16 is the use of a single common magnetic core 1470 adjacent all of the tube enclosures 1250*a-d* and having the antenna 170 wrapped around it so that a single RF source excites the plasma in all of the tube enclosures 1250*a-d*.

Figure 17A:
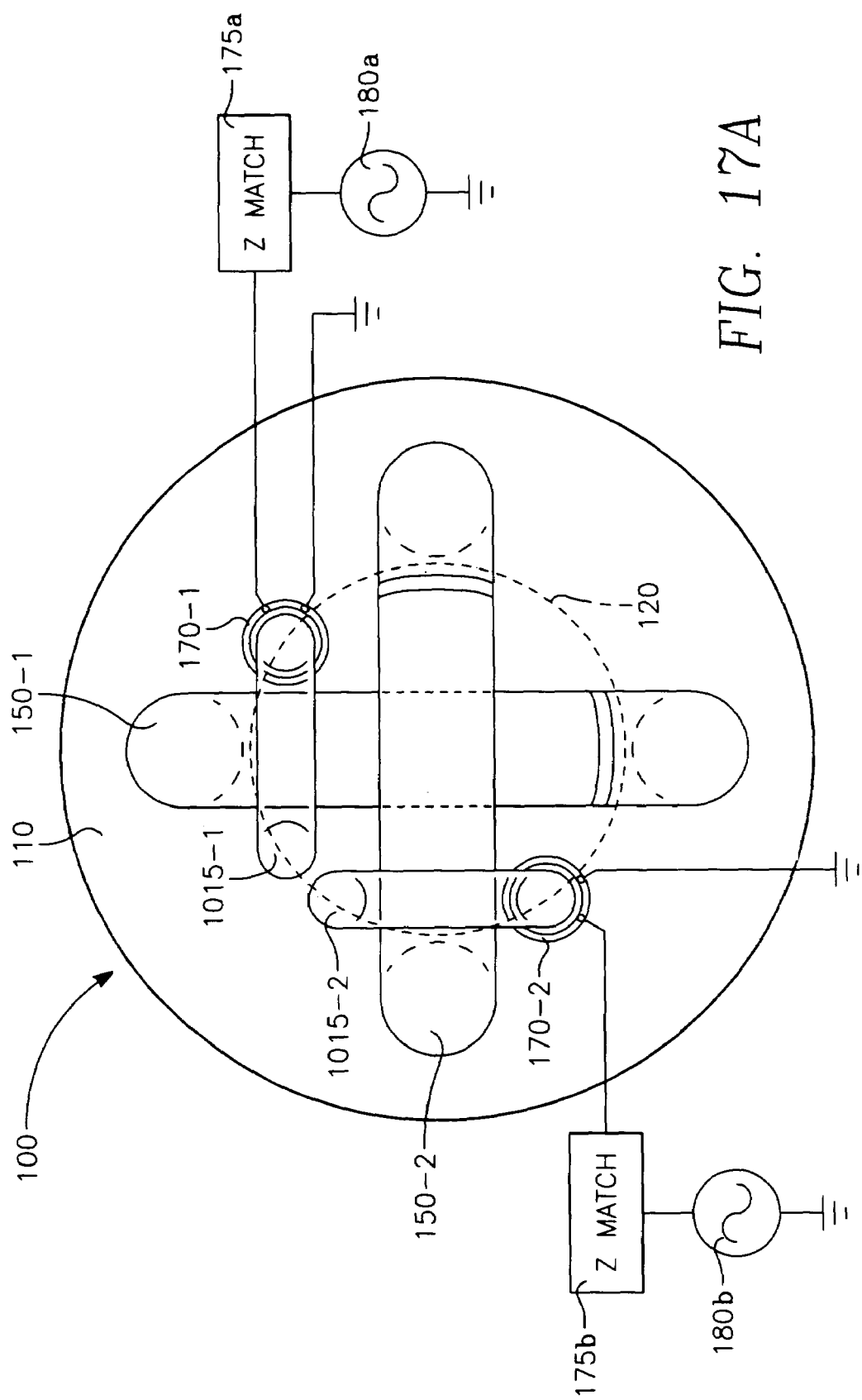
FIG. 17A illustrates a case that maintains a pair of mutually orthogonal torroidal plasma currents across the surface of the workpiece.

FIG. 17A illustrates a pair of orthogonal tube enclosures 150-1 and 150-2 extending through respective ports in the ceiling 110 and excited by respective coil antennas 170-1 and 170-2. Individual cores 1015-1 and 1015-2 are within the respective coil antennas 170-1 and 170-2. This case creates two mutually orthogonal torroidal plasma current paths over the wafer 120 for enhanced uniformity. The two orthogonal torroidal or closed paths are separate and independently powered as illustrated, but intersect in the process region overlying the wafer, and otherwise do not interact. In order to assure separate control of the plasma source power applied to each one of the orthogonal paths, the frequency of the respective RF generators 180*a*, 180*b* of FIG. 17 are different, so that the operation of the impedance match circuits 175*a*, 175*b* is decoupled. For example, the RF generator 180*a* may produce an RF signal at 11 MHz while the RF generator 180*b* may produce an RF signal at 12 MHz. Alternatively, independent operation may be achieved by offsetting the phases of the two RF generators 180*a*, 180*b*.

Figure 17B:
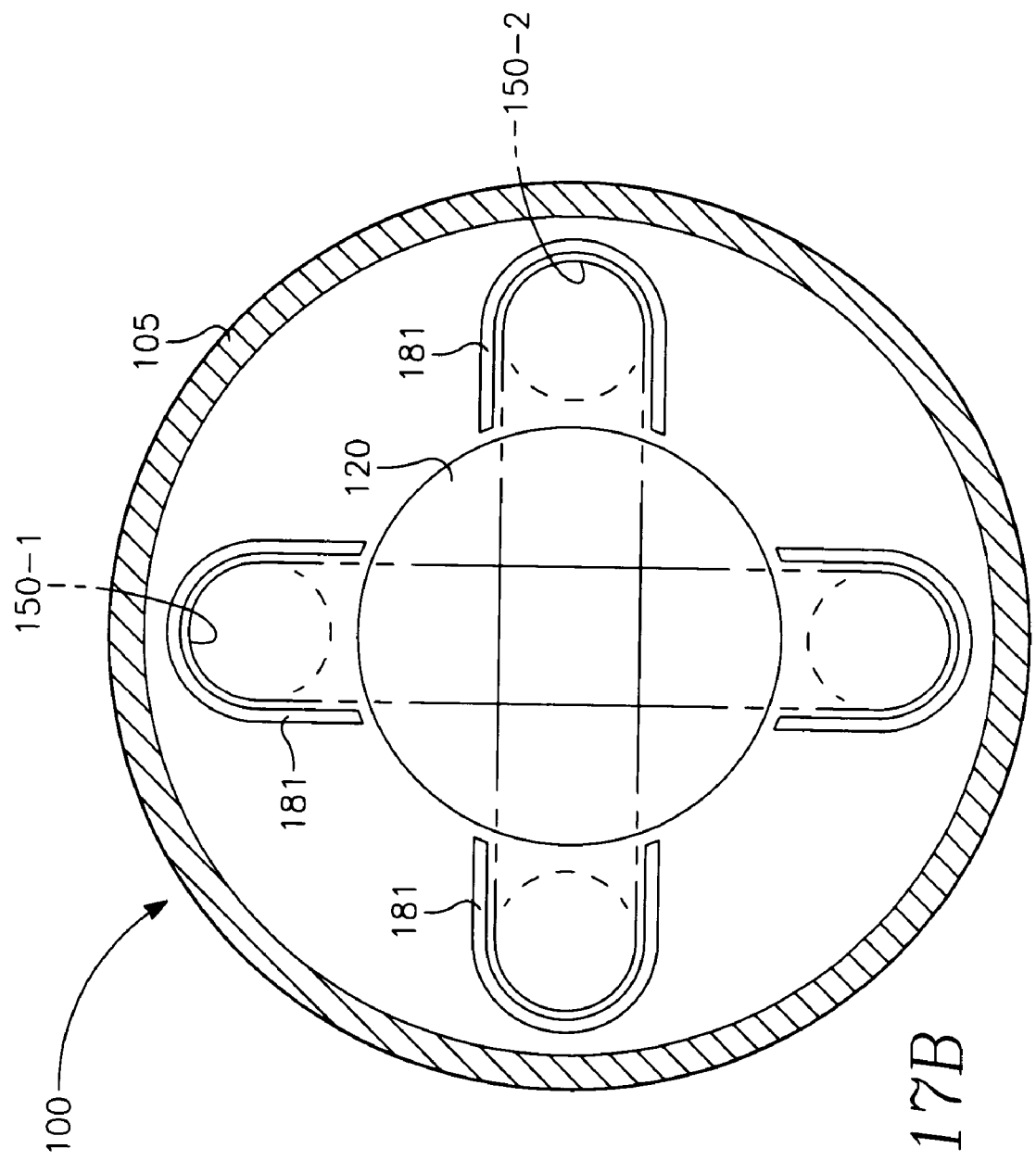
FIG. 17B illustrates the use of plural radial vanes in the case of FIG. 17A.

FIG. 17B illustrates how radial vanes 181 may be employed to guide the torroidal plasma currents of each of the two conduits 150-1, 150-2 through the processing region overlying the wafer support. The radial vanes 181 extend between the openings of each conduit near the sides of the chamber up to the edge of the wafer support. The radial vanes 181 prevent diversion of plasma from one torroidal path to the other torroidal path, so that the two plasma currents only intersect within the processing region overlying the wafer support.

Cases Suitable for Large Diameter Wafers:

In addition to the recent industry trends toward smaller device sizes and higher device densities, another trend is toward greater wafer diameters. For example, 12-inch diameter wafers are currently entering production, and perhaps larger diameter wafers will be in the future. The advantage is greater throughput because of the large number of integrated circuit die per wafer. The disadvantage is that in plasma processing it is more difficult to maintain a uniform plasma across a large diameter wafer. The following cases of the present invention are particularly adapted for providing a uniform plasma ion density distribution across the entire surface of a large diameter wafer, such as a 12-inch diameter wafer.

Figure 18:
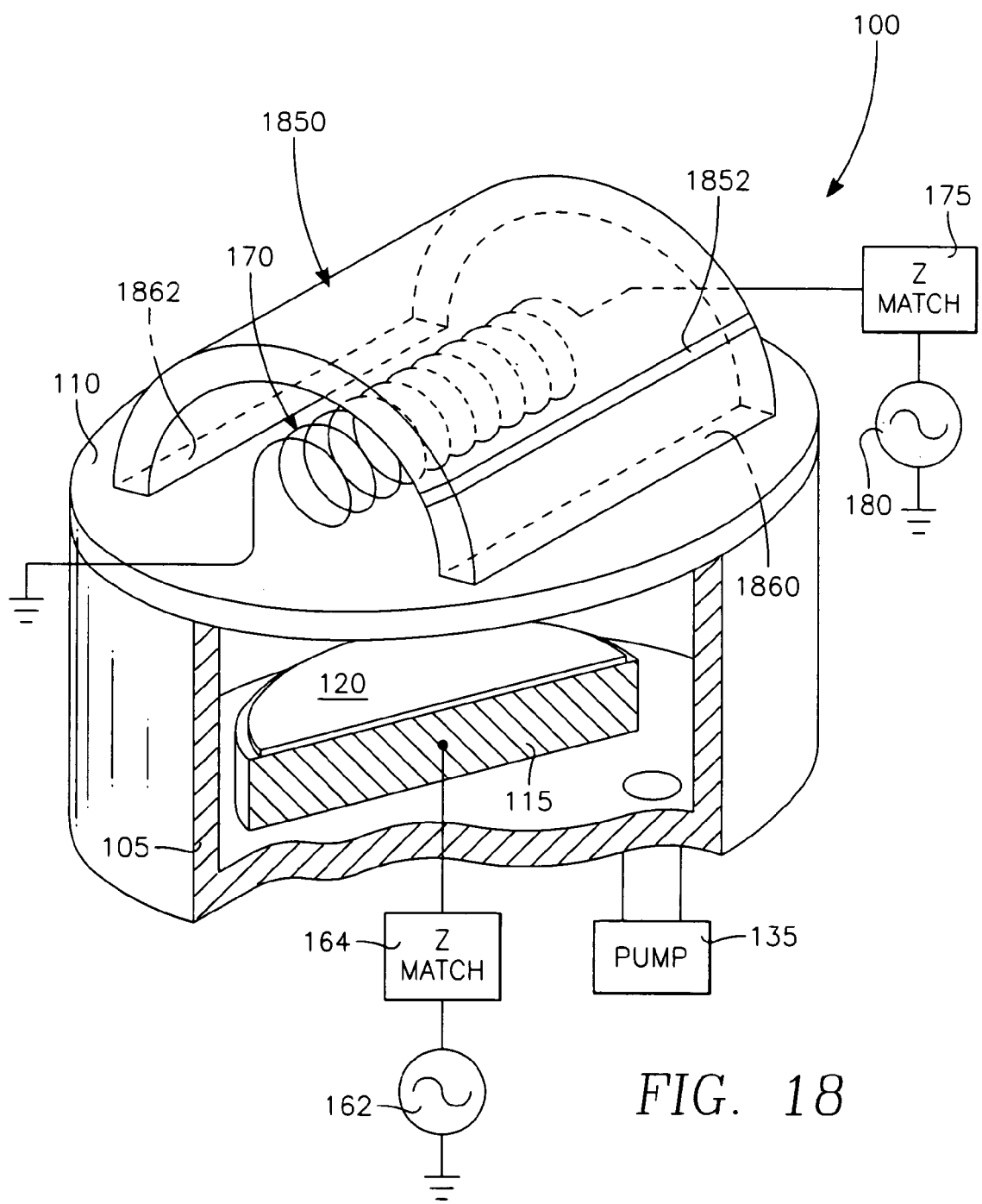
FIGS. 18 and 19 illustrate an case of the invention in which the torroidal plasma current is a broad belt that extends across a wide path suitable for processing large wafers.
Figure 19:
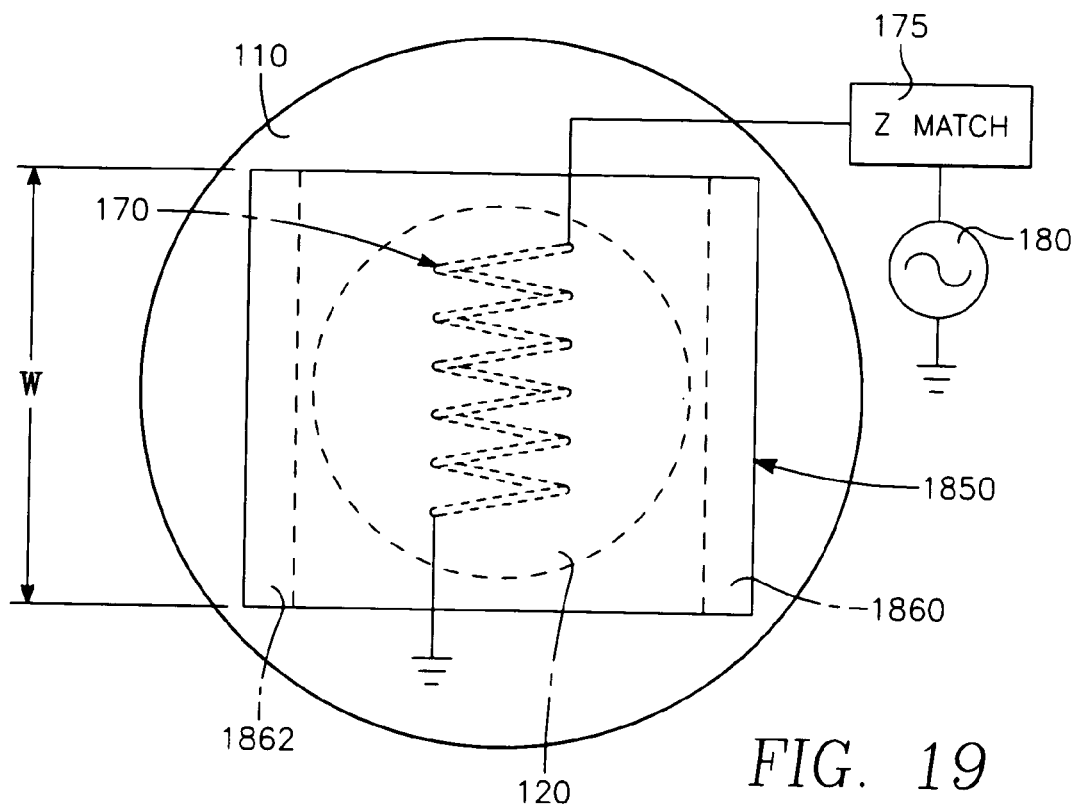
Figure 20:
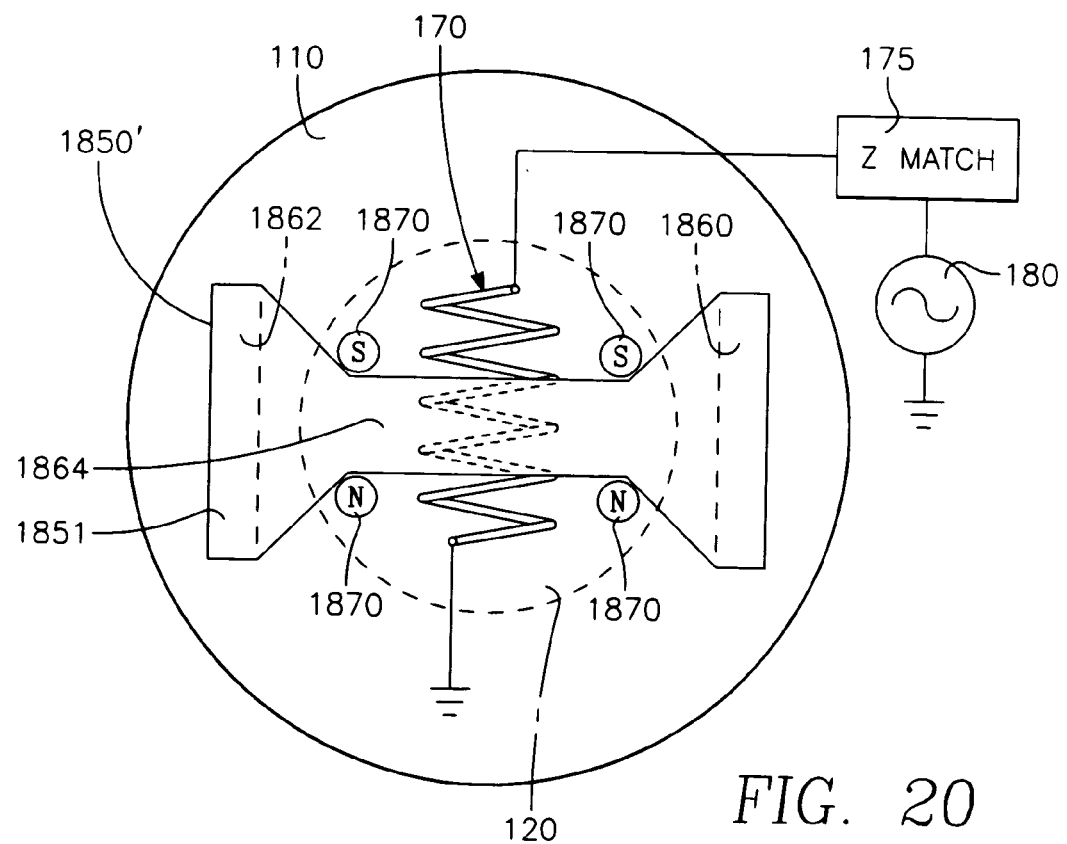
FIG. 20 illustrates a variation of the case of FIG. 18 in which an external section of the torroidal plasma current path is constricted.

FIGS. 18 and 19 illustrate a hollow tube enclosure 1810 which is a wide flattened rectangular version 1850 of the hollow conduit 150 of FIG. 1 that includes an insulating gap 1852. This version produces a wide "belt" of plasma that is better suited for uniformly covering a large diameter wafer such as a 12-inch diameter wafer or workpiece. The width W of the tube enclosure and of the pair of openings 1860, 1862 in the ceiling 110 may exceed the wafer by about 5% or more. For example, if the wafer diameter is 10 inches, then the width W of the rectangular tube enclosure 1850 and of the openings 1860, 1862 is about 11 inches. FIG. 20 illustrates a modified version 1850' of the rectangular tube enclosure 1850 of FIGS. 18 and 19 in which a portion 1864 of the exterior tube enclosure 1850 is constricted.

FIG. 20 further illustrates the optional use of focusing magnets 1870 at the transitions between the constricted and unconstricted portions of the enclosure 1850. The focusing magnets 1870 promote a better movement of the plasma between the constricted and unconstricted portions of the enclosure 1850, and specifically promote a more uniform spreading out of the plasma as it moves across the transition between the constricted portion 1864 and the unconstricted portion of the tube enclosure 1850.

Figure 21:
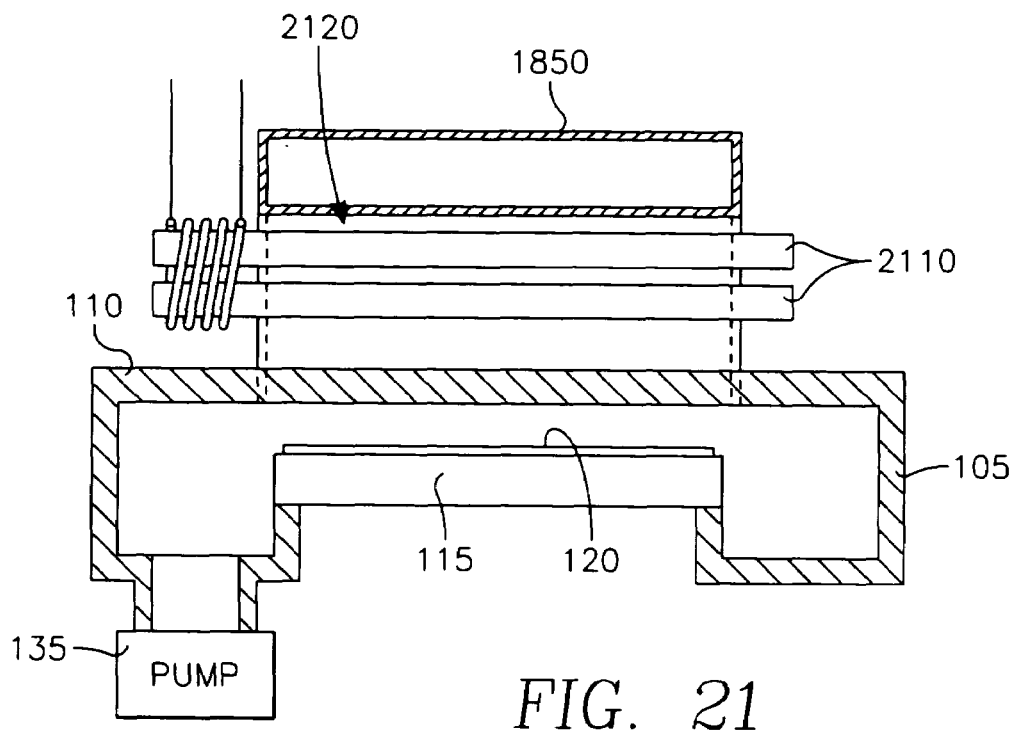
FIG. 21 illustrates a variation of the case of FIG. 18 employing cylindrical magnetic cores whose axial positions may be adjusted to adjust ion density distribution across the wafer surface.
Figure 22:
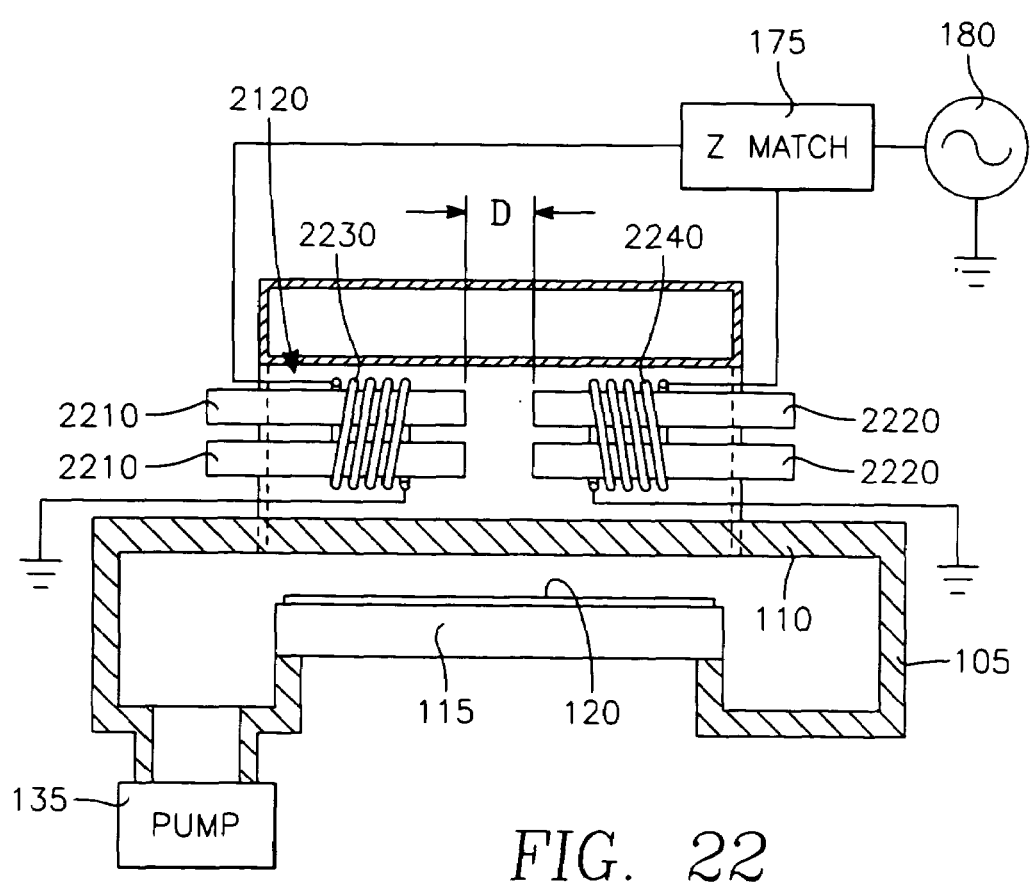
FIG. 22 illustrates a variation of FIG. 21 in which a pair of windings are wound around a pair of groups of cylindrical magnetic cores.
Figure 23:
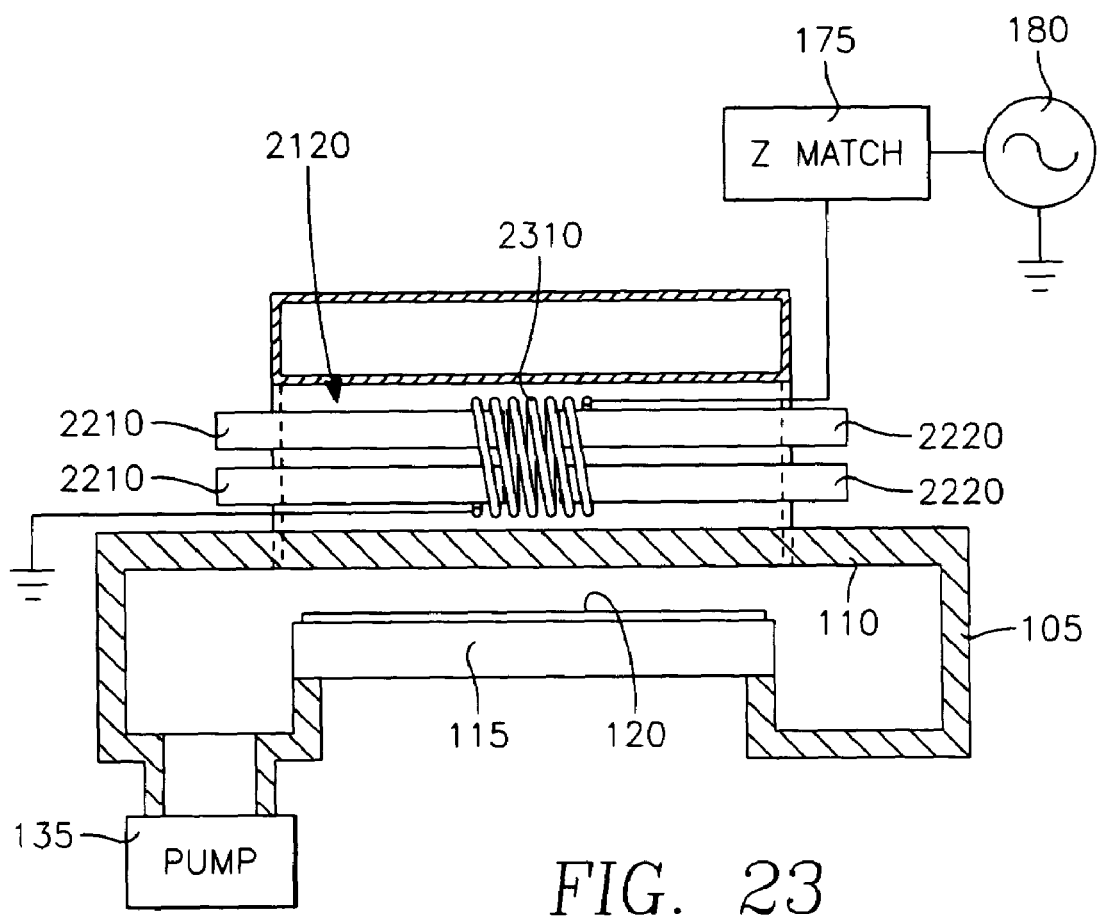
FIG. 23 illustrates a variation of FIG. 22 in which a single common winding is wound around both groups of cores.

FIG. 21 illustrates how plural cylindrical magnetic cores 2110 may be inserted through the exterior region 2120 circumscribed by the tube enclosure 1850. The cylindrical cores 2110 are generally parallel to the axis of symmetry of the tube enclosure 1850. FIG. 22 illustrates a modification of the case of FIG. 21 in which the cores 2110 extend completely through the exterior region 2120 surrounded by the tube enclosure 1850 are replaced by pairs of shortened cores 2210, 2220 in respective halves of the exterior region 2120. The side coils 165, 185 are replaced by a pair of coil windings 2230, 2240 surrounding the respective core pairs 2210, 2220. In this case, the displacement D between the core pairs 2210, 2220 may be changed to adjust the ion density near the wafer center relative to the ion density at the wafer circumference. A wider displacement D reduces the inductive coupling near the wafer center and therefore reduces the plasma ion density at the wafer center. Thus, an additional control element is provided for precisely adjusting ion density spatial distribution across the wafer surface. FIG. 23 illustrates a variation of the case of FIG. 22 in which the separate windings 2230, 2240 are replaced by a single center winding 2310 centered with respect to the core pairs 2210, 2220.

Figure 24:
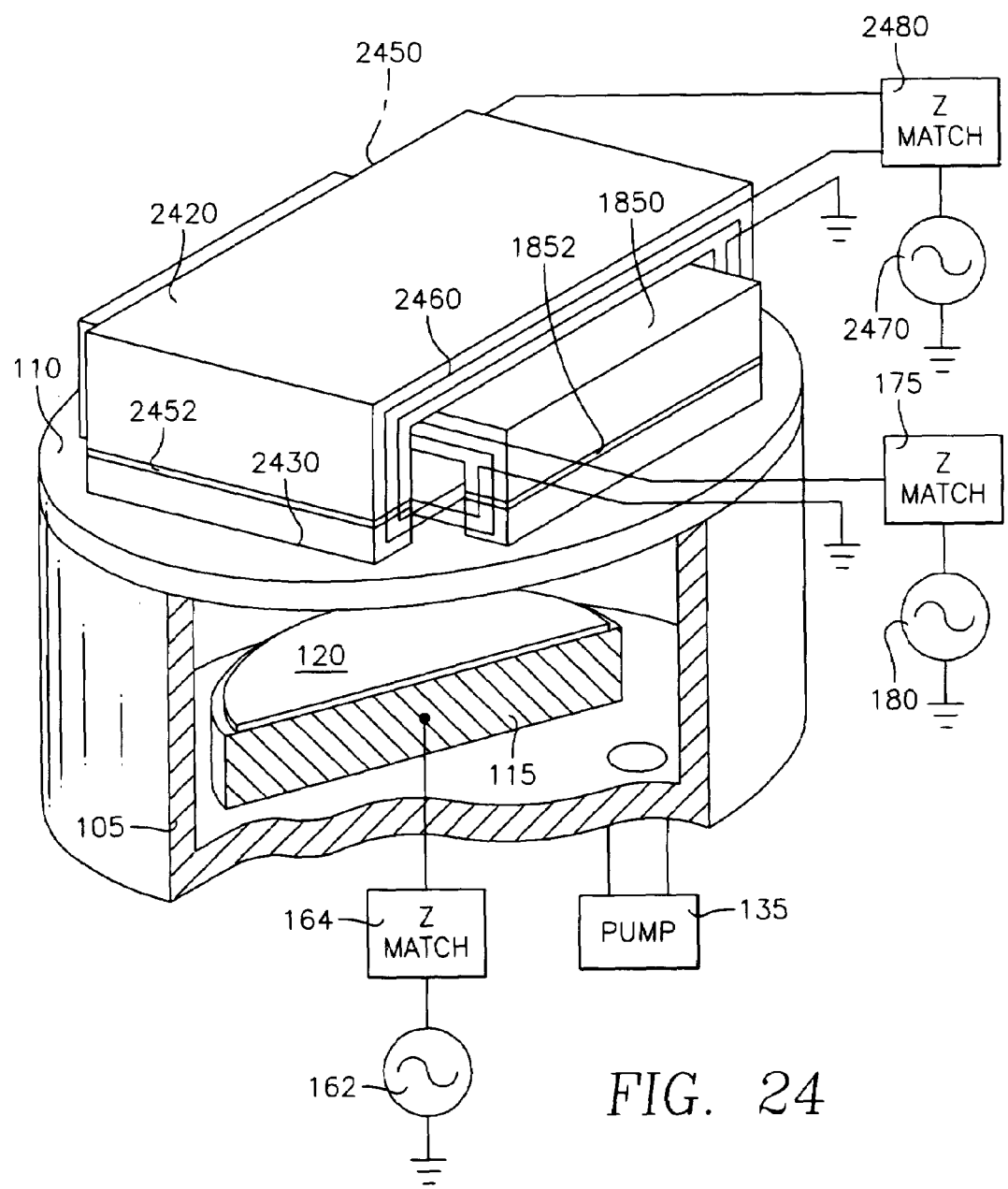
FIGS. 24 and 25 illustrate an case that maintains a pair of mutually orthogonal torroidal plasma currents which are wide belts suitable for processing large wafers.
Figure 25:
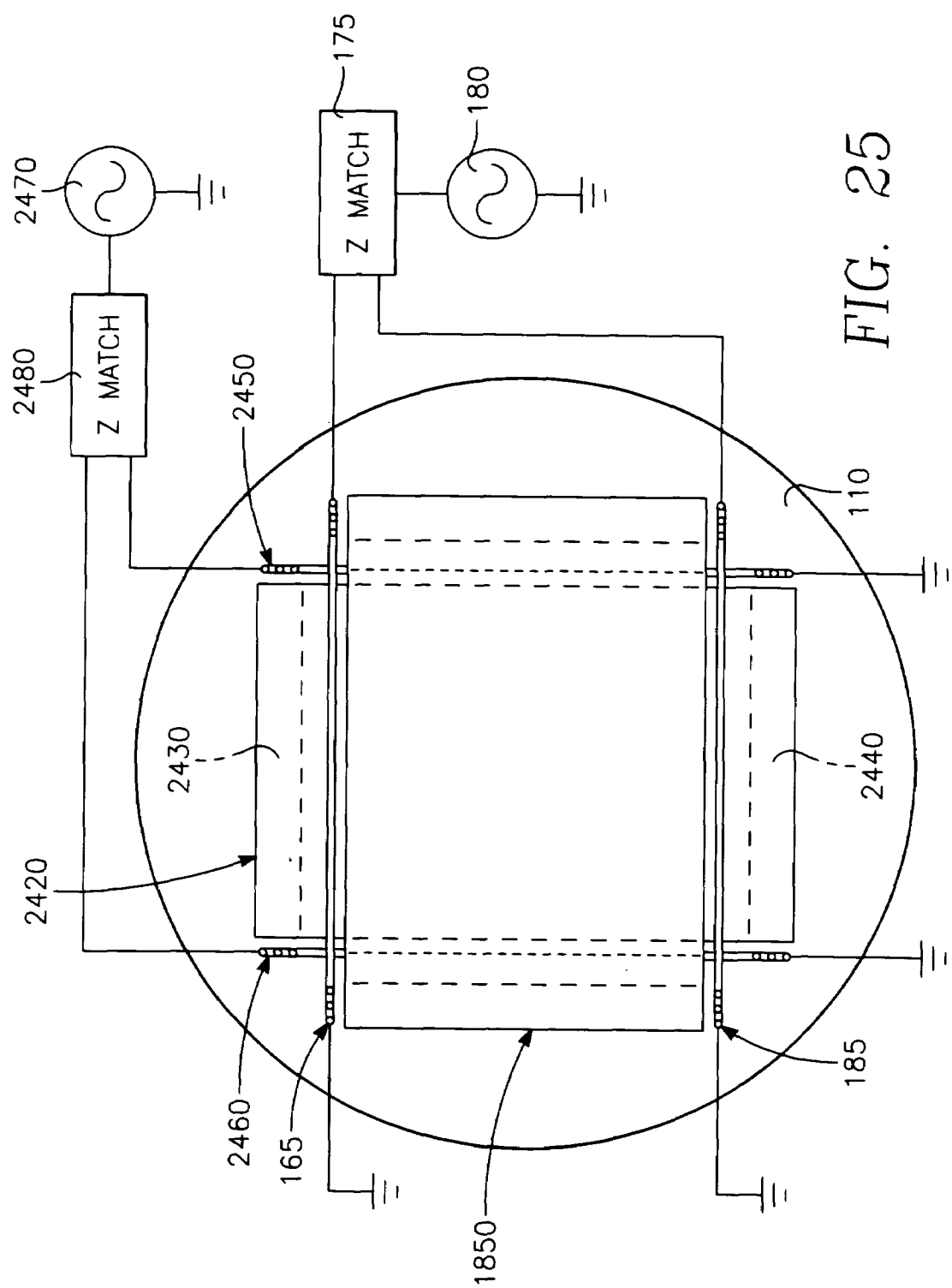

FIGS. 24 and 25 illustrate a case providing even greater uniformity of plasma ion density distribution across the wafer surface. In the case of FIGS. 24 and 25, two torroidal plasma current paths are established that are transverse to one another and are mutually orthogonal. This is accomplished by providing a second wide rectangular hollow enclosure 2420 extending transversely and orthogonally relative to the first tube enclosure 1850. The second tube enclosure 2420 communicates with the chamber interior through a pair of openings 2430, 2440 through the ceiling 110 and includes an insulating gap 2452. A pair of side coil windings 2450, 2460 along the sides of the second tube enclosure 2420 maintain a plasma therein and are driven by a second RF power supply 2470 through an impedance match circuit 2480. As indicated in FIG. 24, the two orthogonal plasma currents coincide over the wafer surface and provide more uniform coverage of plasma over the wafer surface. This case is expected to find particularly advantageous use for processing large wafers of diameters of 10 inches and greater.

As in the case of FIG. 17, the case of FIG. 24 creates two mutually orthogonal torroidal plasma current paths over the wafer 120 for enhanced uniformity. The two orthogonal torroidal or closed paths are separate and independently powered as illustrated, but intersect in the process region overlying the wafer, and otherwise do not interact or otherwise divert or diffuse one another. In order to assure separate control of the plasma source power applied to each one of the orthogonal paths, the frequency of the respective RF generators 180, 2470 of FIG. 24 are different, so that the operation of the impedance match circuits 175, 2480 is decoupled. For example, the RF generator 180 may produce an RF signal at 11 MHz while the RF generator 2470 may produce an RF signal at 12 MHz. Alternatively, independent operation may be achieved by offsetting the phases of the two RF generators 180, 2470.

Figure 26:
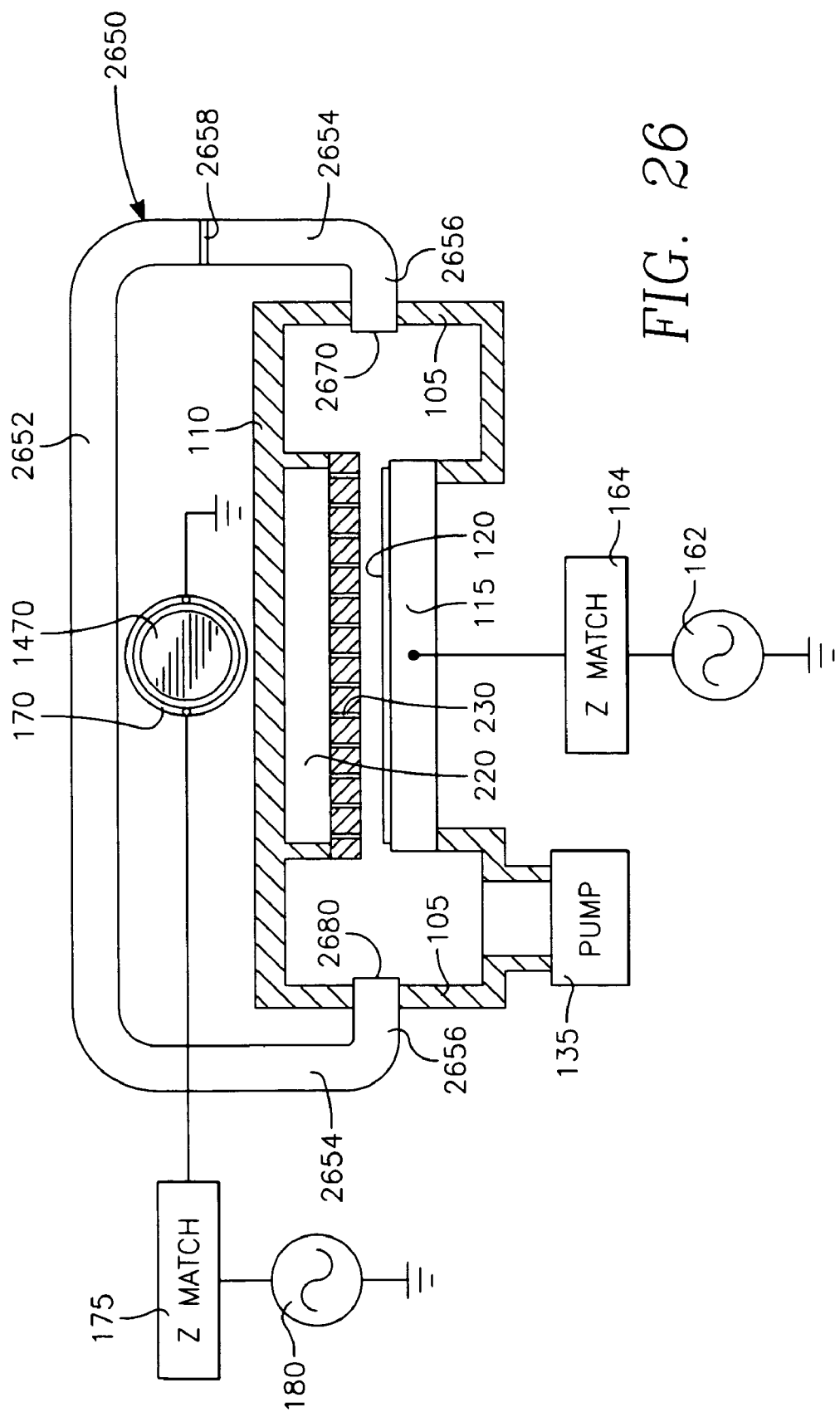
FIG. 26 illustrates a variation of the case of FIG. 25 in which magnetic cores are employed to enhance inductive coupling.

FIG. 26 illustrates a variation of the case of FIG. 18 in which a modified rectangular enclosure 2650 that includes an insulating gap 2658 communicates with the chamber interior through the chamber sidewall 105 rather than through the ceiling 110. For this purpose, the rectangular enclosure 2650 has a horizontal top section 2652, a pair of downwardly extending legs 2654 at respective ends of the top section 2652 and a pair of horizontal inwardly extending legs 2656 each extending from the bottom end of a respective one of the downwardly extending legs 2654 to a respective opening 2670, 2680 in the sidewall 105.

Figure 27:
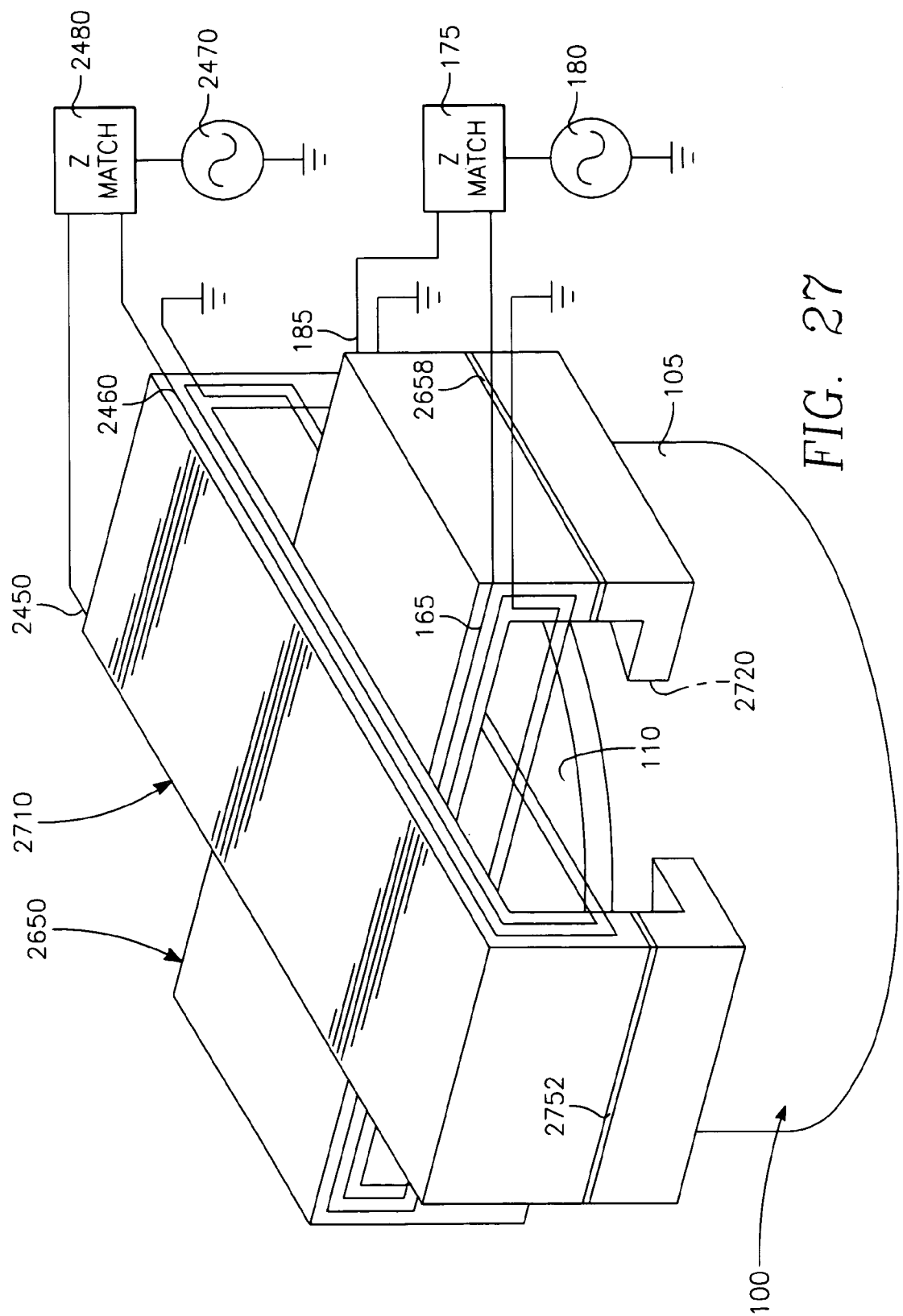
FIG. 27 illustrates a modification of the case of FIG. 24 in which the orthogonal plasma belts enter and exit the reactor chamber through the vertical sidewall rather than through the horizontal ceiling.

FIG. 27 illustrates how a second rectangular tube enclosure 2710 including an insulating gap 2752 may be added to the case of FIG. 26, the second tube enclosure 2710 being identical to the rectangular tube enclosure 2650 of FIG. 26 except that the rectangular tube enclosures 2650, 2710 are mutually orthogonal (or at least transverse to one another). The second rectangular tube enclosure communicates with the chamber interior through respective openings through the sidewall 105, including the opening 2720. Like the case of FIG. 25, the tube enclosures 2650 and 2710 produce mutually orthogonal torroidal plasma currents that coincide over the wafer surface to provide superior uniformity over a broader wafer diameter. Plasma source power is applied to the interior of the tube enclosures through the respective pairs of side coil windings 165, 185 and 2450, 2460.

Figure 28A:
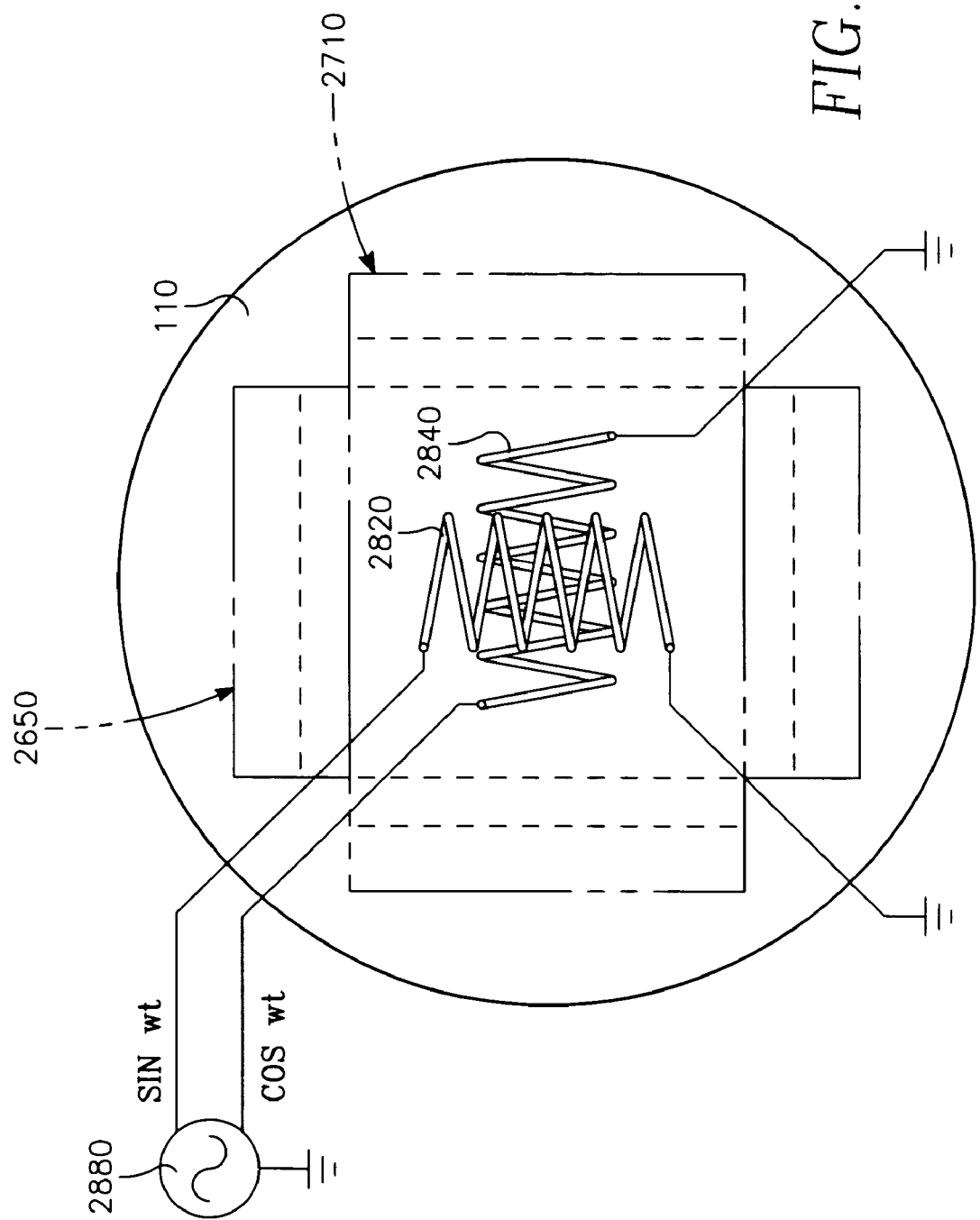
FIG. 28A illustrates an implementation of the case of FIG. 24 which produces a rotating torroidal plasma current.

FIG. 28A illustrates how the side coils 165, 185, 2450, 2460 may be replaced (or supplemented) by a pair of mutually orthogonal interior coils 2820, 2840 lying within the external region 2860 surrounded by the two rectangular tube enclosures 2650, 2710. Each one of the coils 2820, 2840 produces the torroidal plasma current in a corresponding one of the rectangular tube enclosures 2650, 2710. The coils 2820, 2840 may be driven completely independently at different frequencies or at the same frequency with the same or a different phase. Or, they may be driven at the same frequency but with a phase difference (i.e., 90 degrees) that causes the combined torroidal plasma current to rotate at the source power frequency. In this case the coils 2820, 2840 are driven with the sin and cosine components, respectively, of a common signal generator 2880, as indicated in FIG. 28A. The advantage is that the plasma current path rotates azimuthally across the wafer surface at a rotational frequency that exceeds the plasma ion frequency so that non-uniformities are better suppressed than in prior art methods such as MERIE reactors in which the rotation is at a much lower frequency.

Figure 28B:
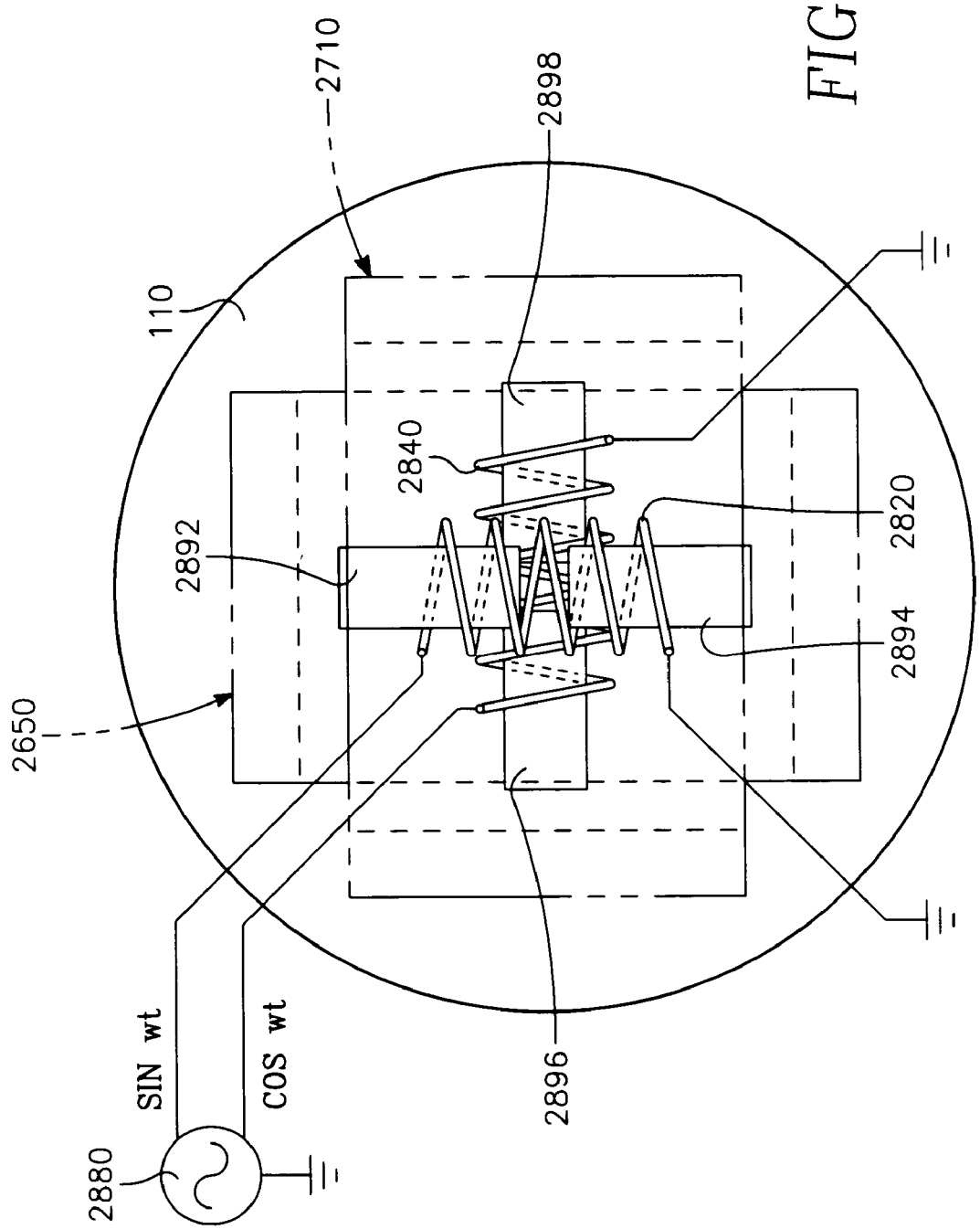
FIG. 28B illustrates a version of the case of FIG. 28A that includes magnetic cores.

Referring now to FIG. 28B, radial adjustment of plasma ion density may be generally provided by provision of a pair of magnetic cylindrical cores 2892, 2894 that may be axially moved toward or away from one another within the coil 2820 and a pair of magnetic cylindrical cores 2896, 2898 that may be axially moved toward or away from one another within the coil 2840. As each pair of cores is moved toward one another, inductive coupling near the center of each of the orthogonal plasma currents is enhanced relative to the edge of the current, so that plasma density at the wafer center is generally enhanced. Thus, the center-to-edge plasma ion density may be controlled by moving the cores 2892, 2894, 2896, 2898.

FIG. 29 illustrates an alternative case of the invention in which the two tube enclosures 2650, 2710 are merged together into a single enclosure 2910 that extends 360 degrees around the center axis of the reactor that constitutes a single plenum. In the case of FIG. 29, the plenum 2910 has a half-dome lower wall 2920 and a half-dome upper wall 2930 generally congruent with the lower wall 2920. The plenum 2910 is therefore the space between the upper and lower half-dome walls 2920, 2930. An insulating gap 2921 may extend around the upper dome wall 2920 and/or an insulating gap 2931 may extend around the lower dome wall 2930. The plenum 2910 communicates with the chamber interior through an annular opening 2925 in the ceiling 110 that extends 360 degrees around the axis of symmetry of the chamber.

Figure 30:
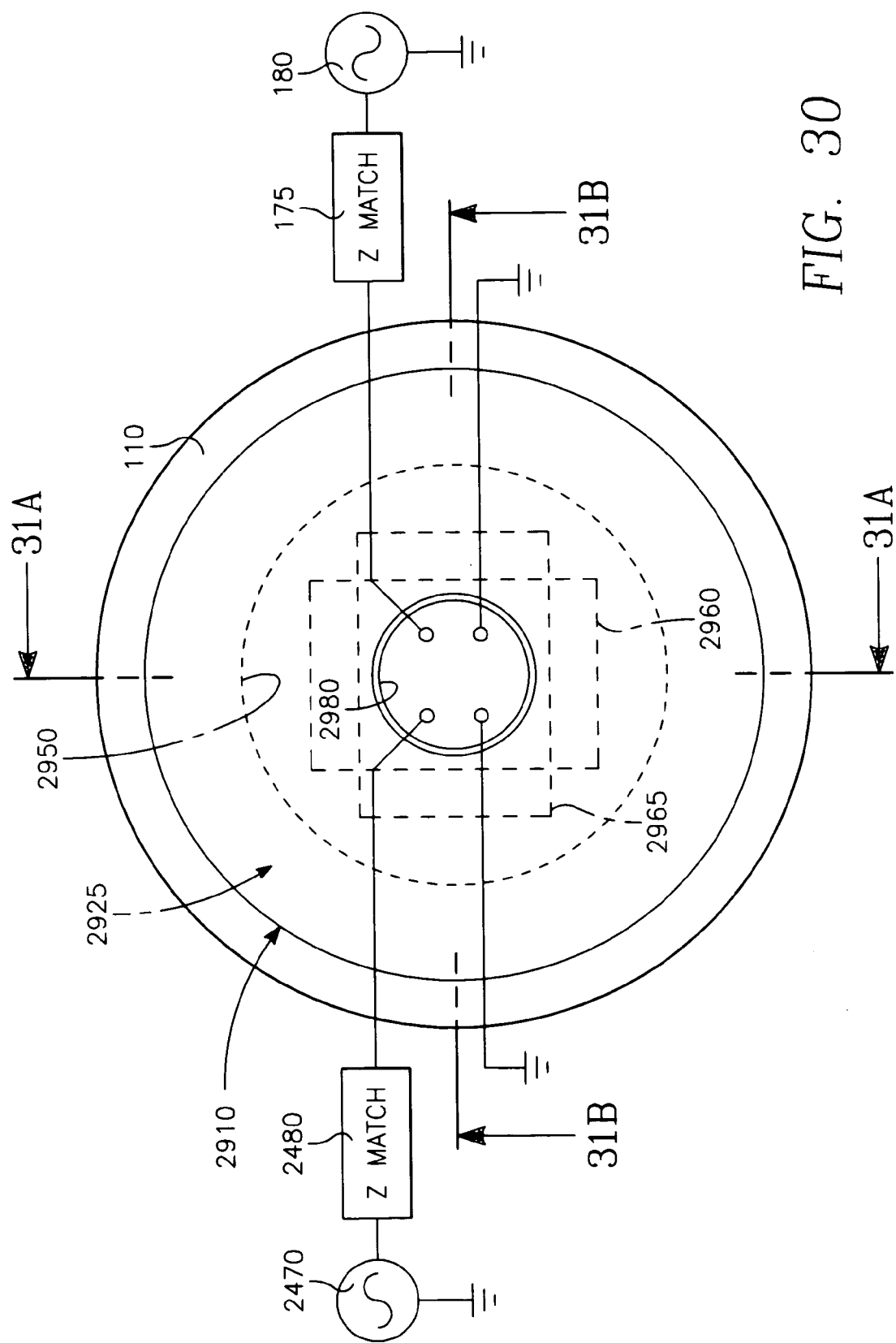
FIG. 30 is a top sectional view corresponding to FIG. 29.
Figure 31A:
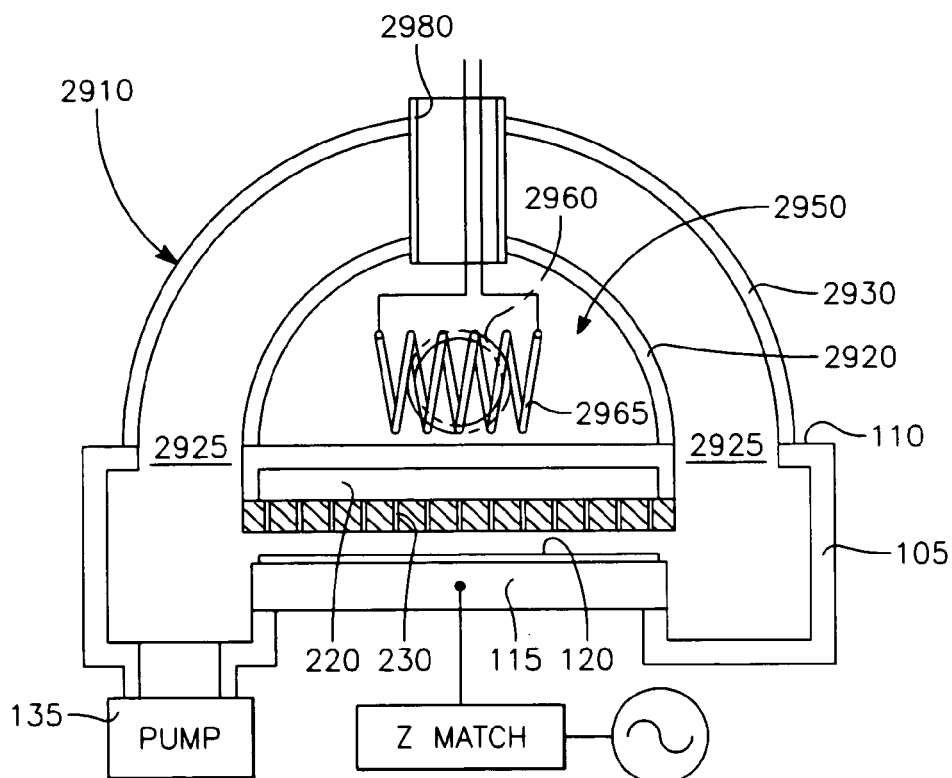
FIGS. 31A and 31B are front and side sectional views corresponding to FIG. 30.
Figure 31B:
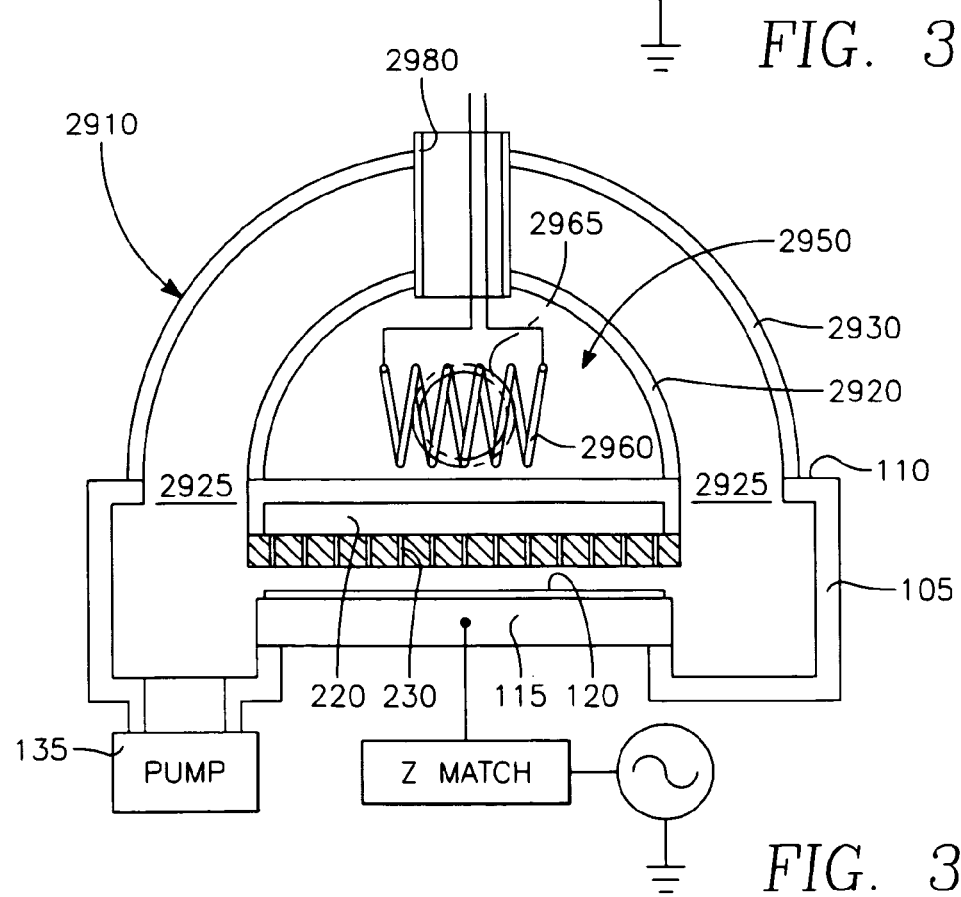

The plenum 2910 completely encloses a region 2950 above the ceiling 110. In the case of FIG. 29, plasma source power is coupled into the interior of the plenum 2910 by a pair of mutually orthogonal coils 2960, 2965. Access to the coils 2960, 2965 is provided through a vertical conduit 2980 passing through the center of the plenum 2910. Preferably, the coils 2960, 2965 are driven in quadrature as in the case of FIG. 28 to achieve an azimuthally circulating torroidal plasma current (i.e., a plasma current circulating within the plane of the wafer. The rotation frequency is the frequency of the applied RF power. Alternatively, the coils 2960, 2965 may be driven separately at different frequencies. FIG. 30 is a top sectional view of the case of FIG. 29. FIGS. 31A and 31B are front and side sectional views, respectively, corresponding to FIG. 30.

Figure 32:
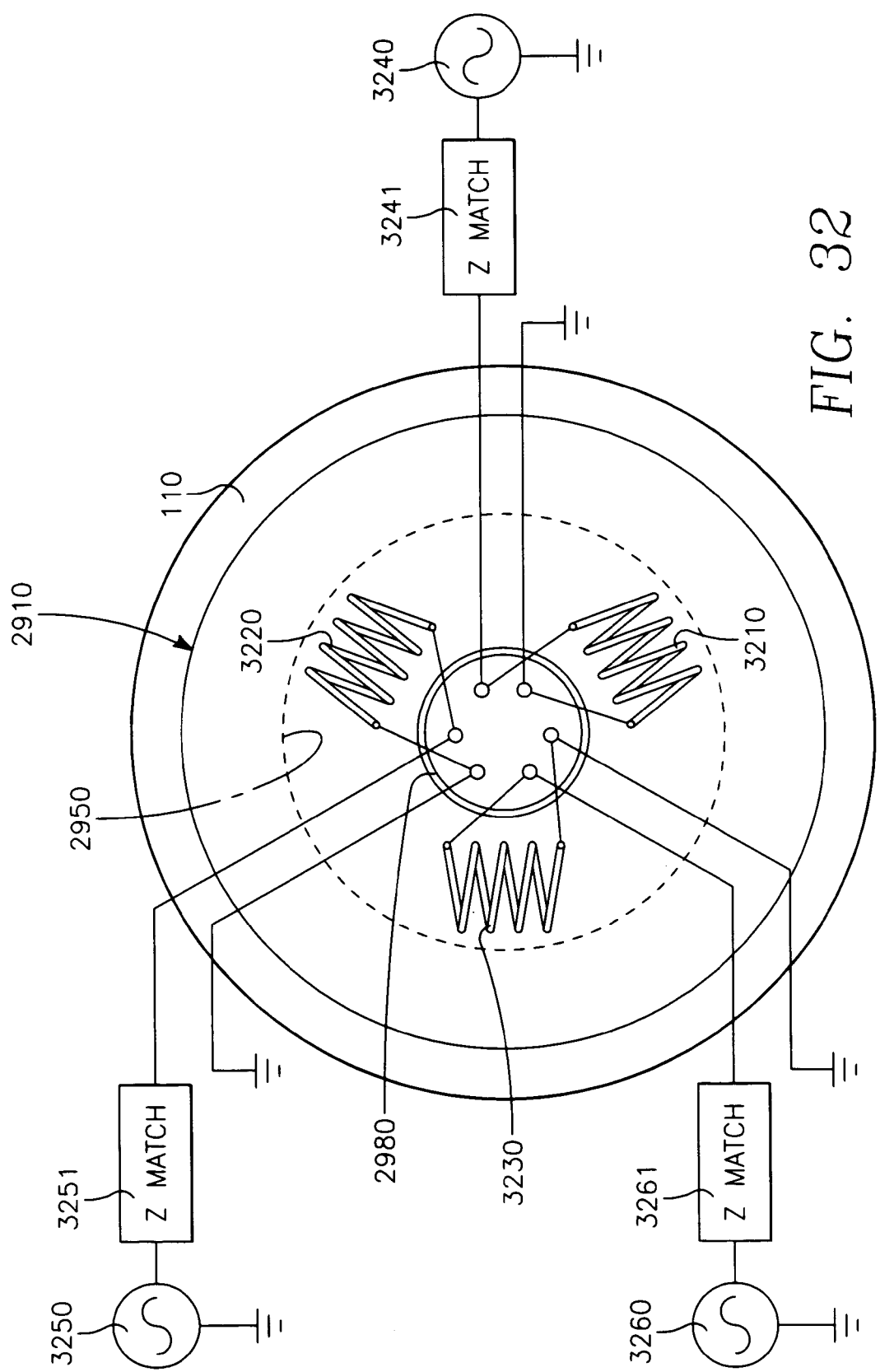
FIG. 32 illustrates a variation of the case 29 employing three independently driven RF coils underneath the continuous plenum facing at 120-degree intervals.
Figure 33:
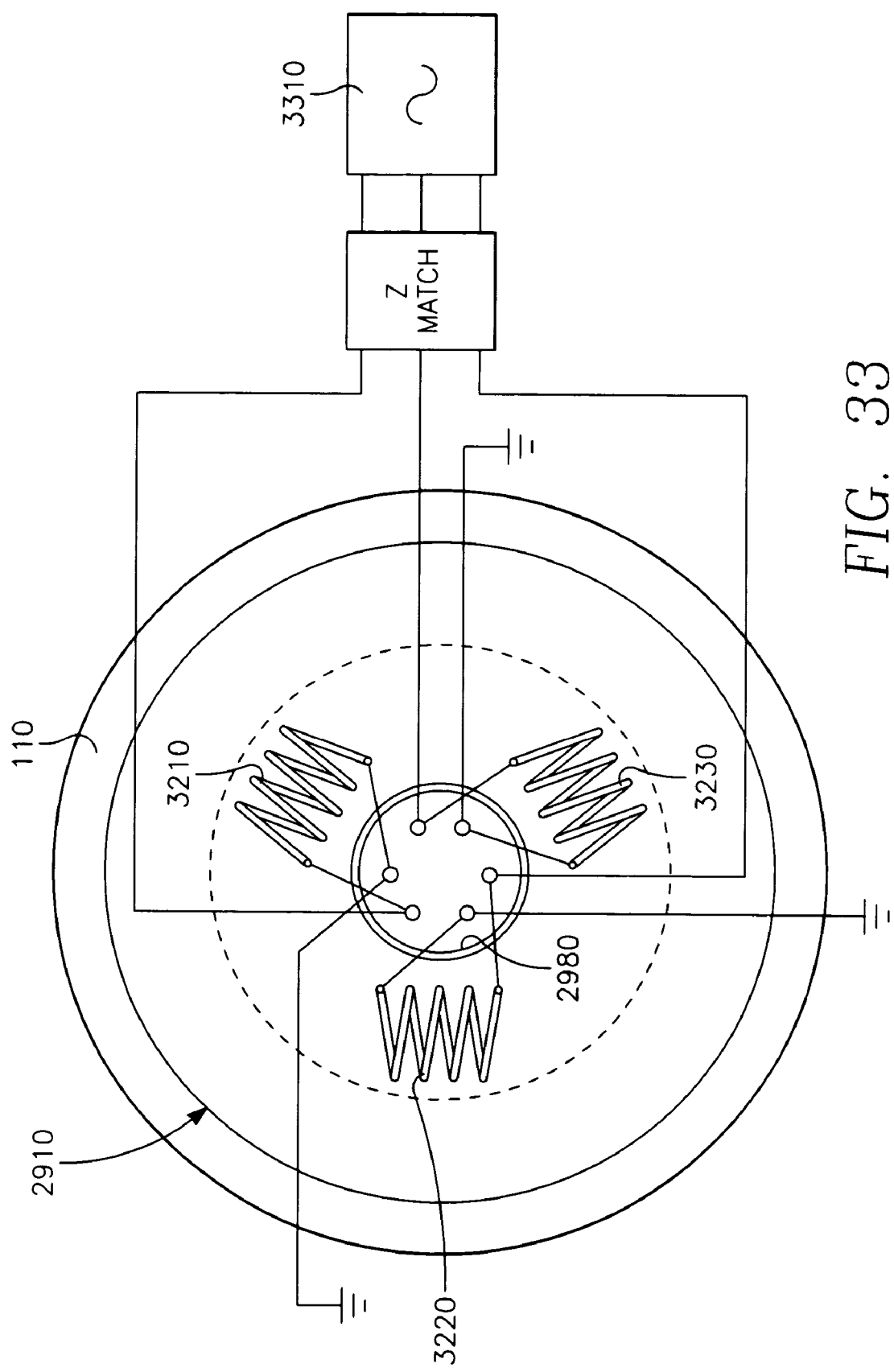
FIG. 33 illustrates a variation of the case of FIG. 32 in which the three RF coils are driven at 120-degree phase to provide an azimuthally rotating plasma.

The pair of mutually orthogonal coils 2960, 2965 may be replaced by any number n of separately driven coils with their winding axes disposed at 360/n degrees apart. For example, FIG. 32 illustrates the case where the two coils 2960, 2965 are replace by three coils 3210, 3220, 3230 with winding axes placed at 120 degree intervals and driven by three respective RF supplies 3240, 3250, 3260 through respective impedance match circuits 3241, 3251, 3261. In order to produce a rotating torroidal plasma current, the three windings 3210, 3220, 3230 are driven 120 degrees out of phase from a common power source 3310 as illustrated in FIG. 33. The cases of FIGS. 32 and 33 are preferred over the case of FIG. 29 having only two coils, since it is felt much of the mutual coupling between coils would be around rather than through the vertical conduit 2980.

Figure 34:
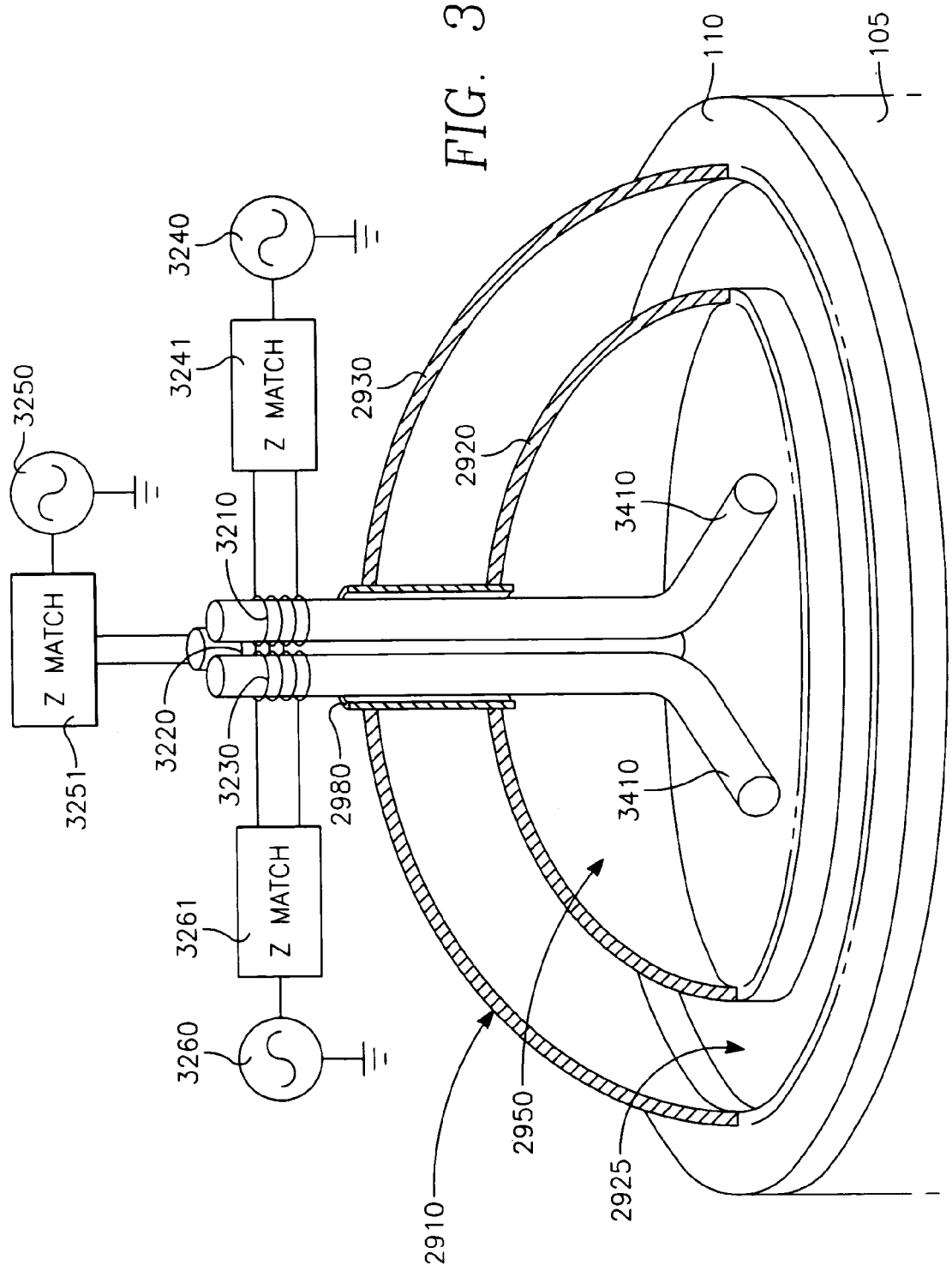
FIG. 34 illustrates a variation of the case of FIG. 33 in which RF drive coils are wound around vertical external ends of respective magnetic cores whose opposite ends extend horizontally under the plenum at symmetrically distributed angles.

FIG. 34 illustrates a case in which the three coils are outside of the enclosed region 2950, while their inductances are coupled into the enclosed region 2950 by respective vertical magnetic cores 3410 extending through the conduit 2980. Each core 3410 has one end extending above the conduit 2980 around which a respective one of the coils 3210, 3220, 3230 is wound. The bottom of each core 3410 is inside the enclosed region 2950 and has a horizontal leg. The horizontal legs of the three cores 3410 are oriented at 120 degree intervals to provide inductive coupling to the interior of the plenum 2910 similar to that provided by the three coils inside the enclosed region as in FIG. 32.

The advantage of the flattened rectangular tube enclosures of the cases of FIGS. 18-28 is that the broad width and relatively low height of the tube enclosure forces the torroidal plasma current to be a wide thin belt of plasma that more readily covers the entire surface of a large diameter wafer. The entirety of the tube enclosure need not be of the maximum width. Instead the outer section of the tube enclosure farthest from the chamber interior may be necked down, as discussed above with reference to the case of FIG. 20. In this case, it is preferable to provide focusing magnets 1870 at the transition corners between the wide portion 1851 and the narrow section 1852 to force the plasma current exiting the narrow portion 1852 to spread entirely across the entire width of the wide section 1851. If it is desired to maximize plasma ion density at the wafer surface, then it is preferred that the cross-sectional area of the narrow portion 1852 be at least nearly as great as the cross-sectional area of the wide portion 1851. For example, the narrow portion 1852 may be a passageway whose height and width are about the same while the wide portion 1851 may have a height that is less than its width.

The various cases described herein with air-core coils (i.e., coils without a magnetic core) may instead employ magnetic-cores, which can be the open-magnetic-path type or the closed-magnetic-core type illustrated in the accompanying drawings. Furthermore, the various cases described herein having two or more torroidal paths driven with different RF frequencies may instead be driven with same frequency, and with the same or different phases.

Figure 35:
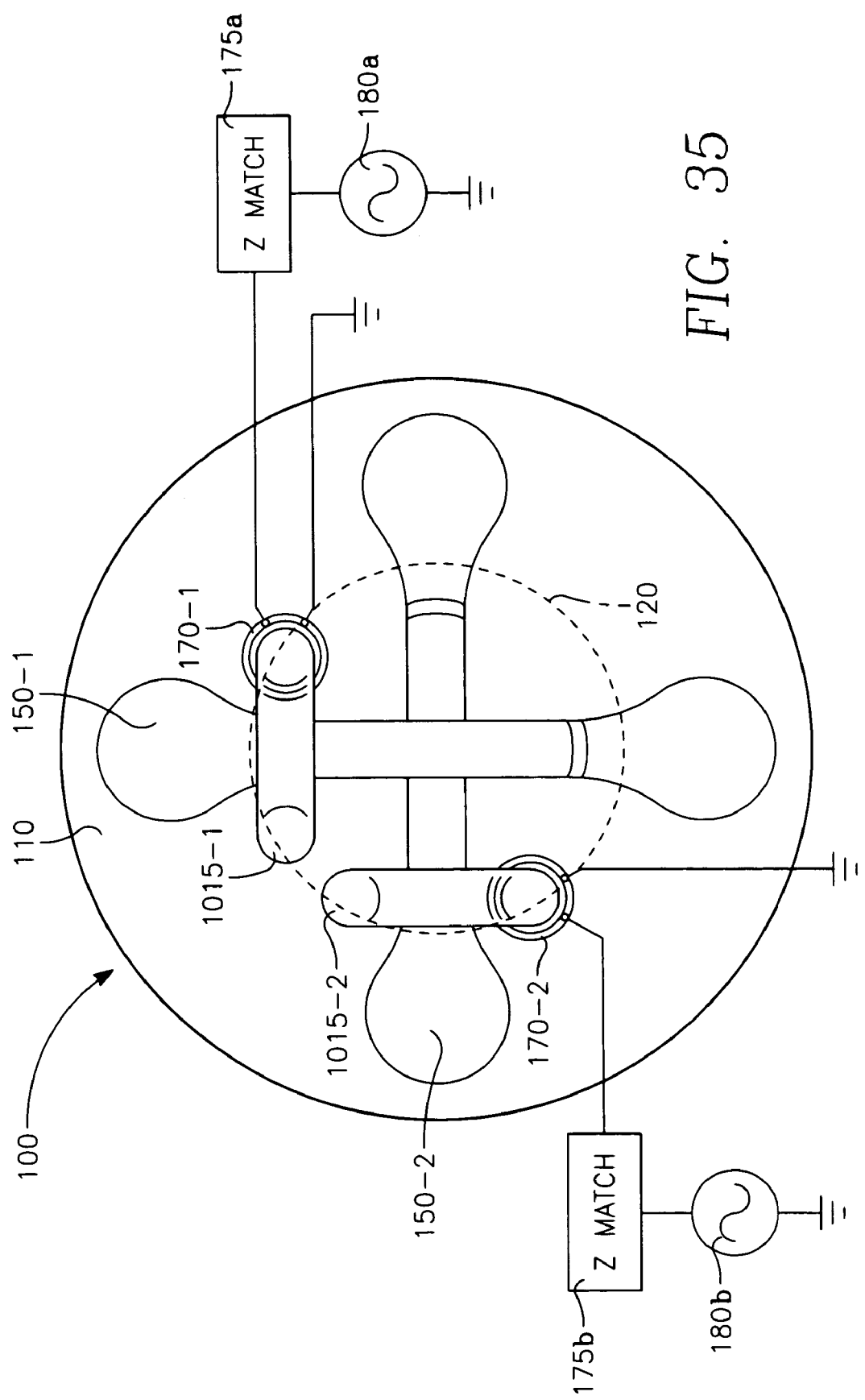
FIG. 35 is a version of the case of FIG. 17 in which the mutually transverse hollow conduits are narrowed as in the case of FIG. 20.

FIG. 35 is a version of the case of FIG. 17 in which the mutually transverse hollow conduits are narrowed as in the case of FIG. 20.

Figure 36:
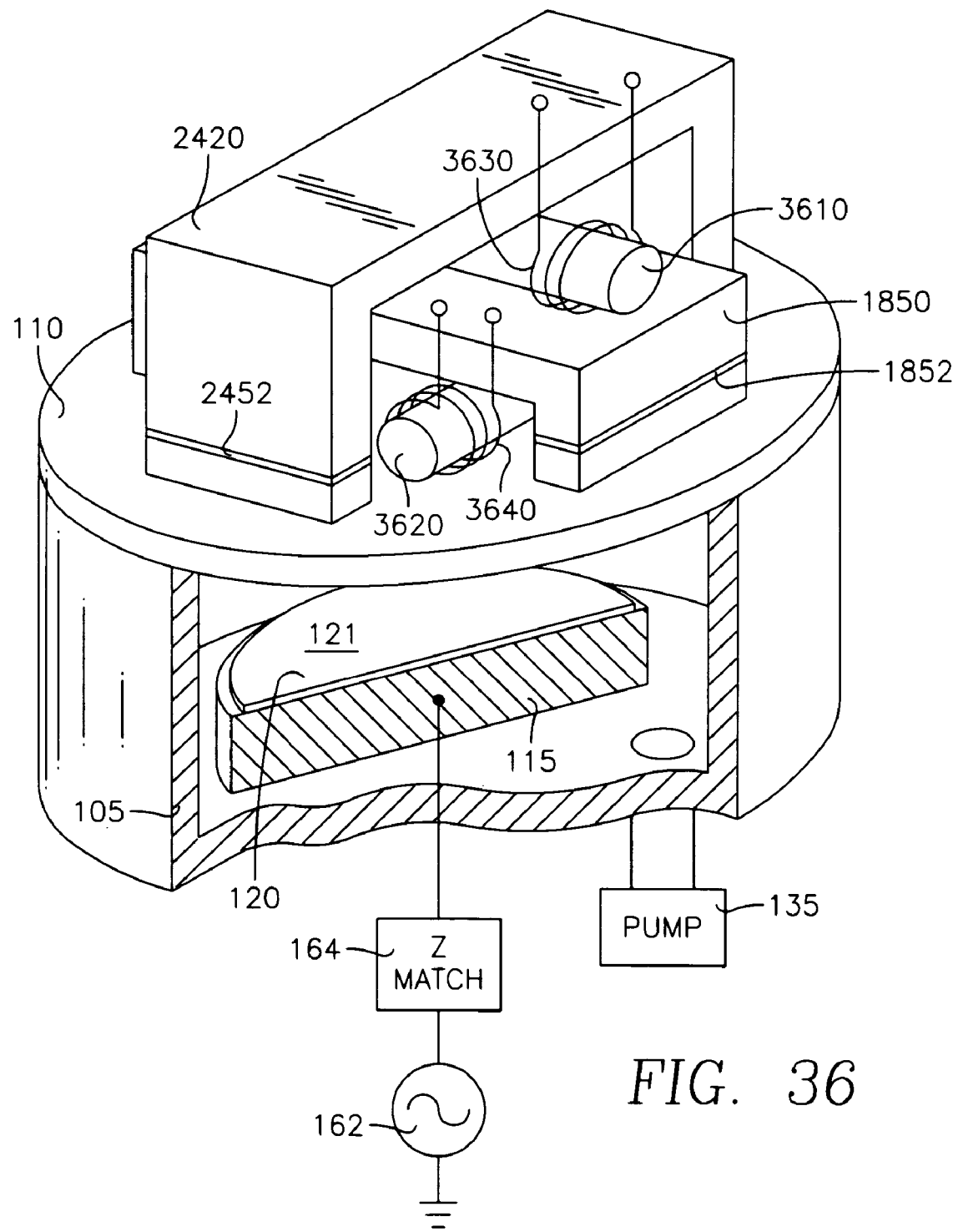
FIG. 36 is a version of the case of FIG. 24 but employing a pair of magnetic cores 3610, 3620 with respective windings 3630, 3640 therearound for connection to respective RF power sources.

FIG. 36 is a version of the case of FIG. 24 but employing a pair of magnetic cores 3610, 3620 with respective windings 3630, 3640 therearound for connection to respective RF power sources.

Figure 37:
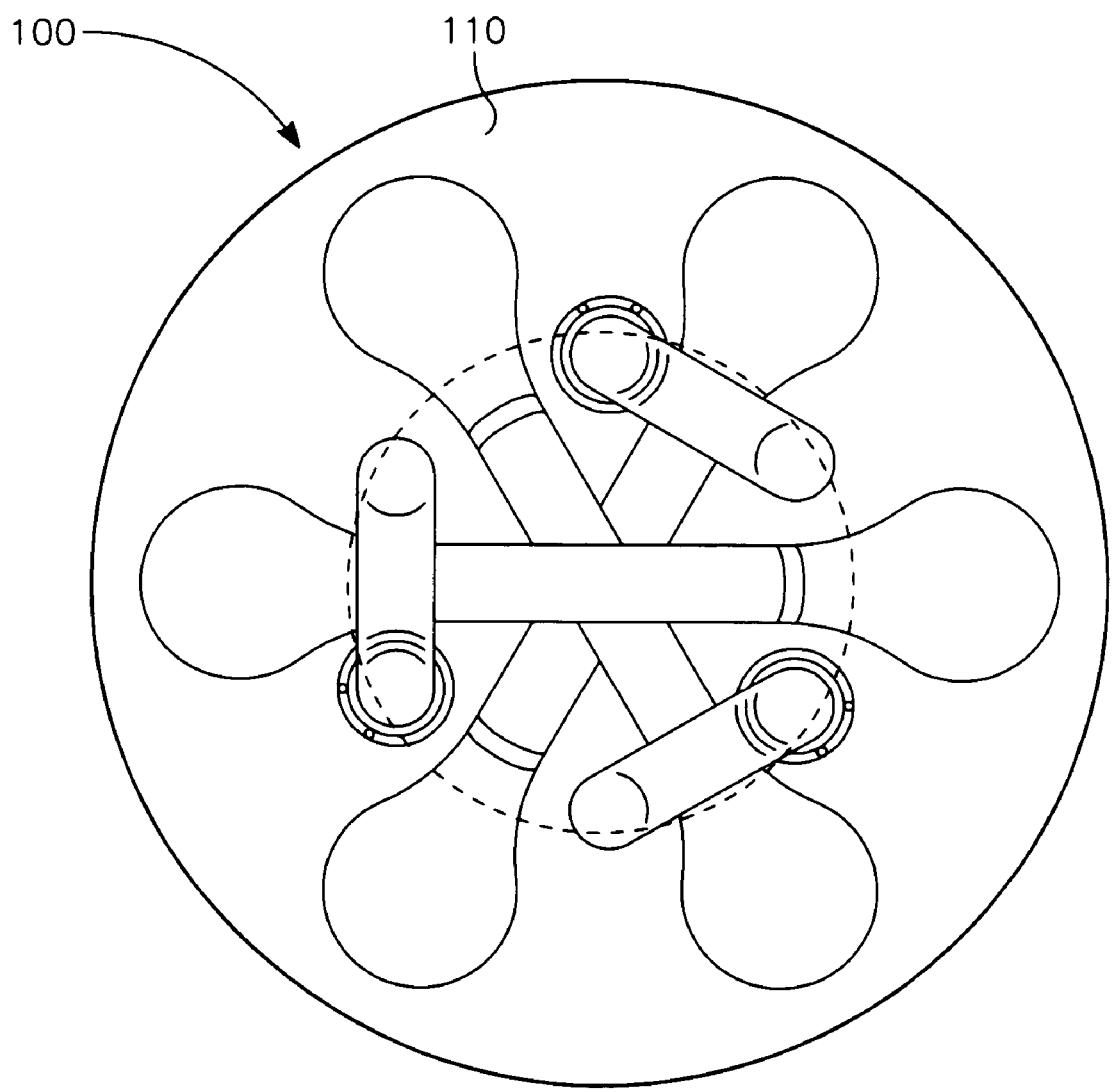
FIG. 37 is a case corresponding to that of FIG. 35 but having three instead of two reentrant conduits with a total of six reentrant ports to the chamber.

FIG. 37 is a case corresponding to that of FIG. 35 but having three instead of two reentrant conduits with a total of six reentrant ports to the chamber. Having a number of symmetrically disposed conduits and reentrant ports greater than two (as in the case of FIG. 37) is believed to be particularly advantageous for processing wafers of diameter of 300 mm and greater.

Figure 38:
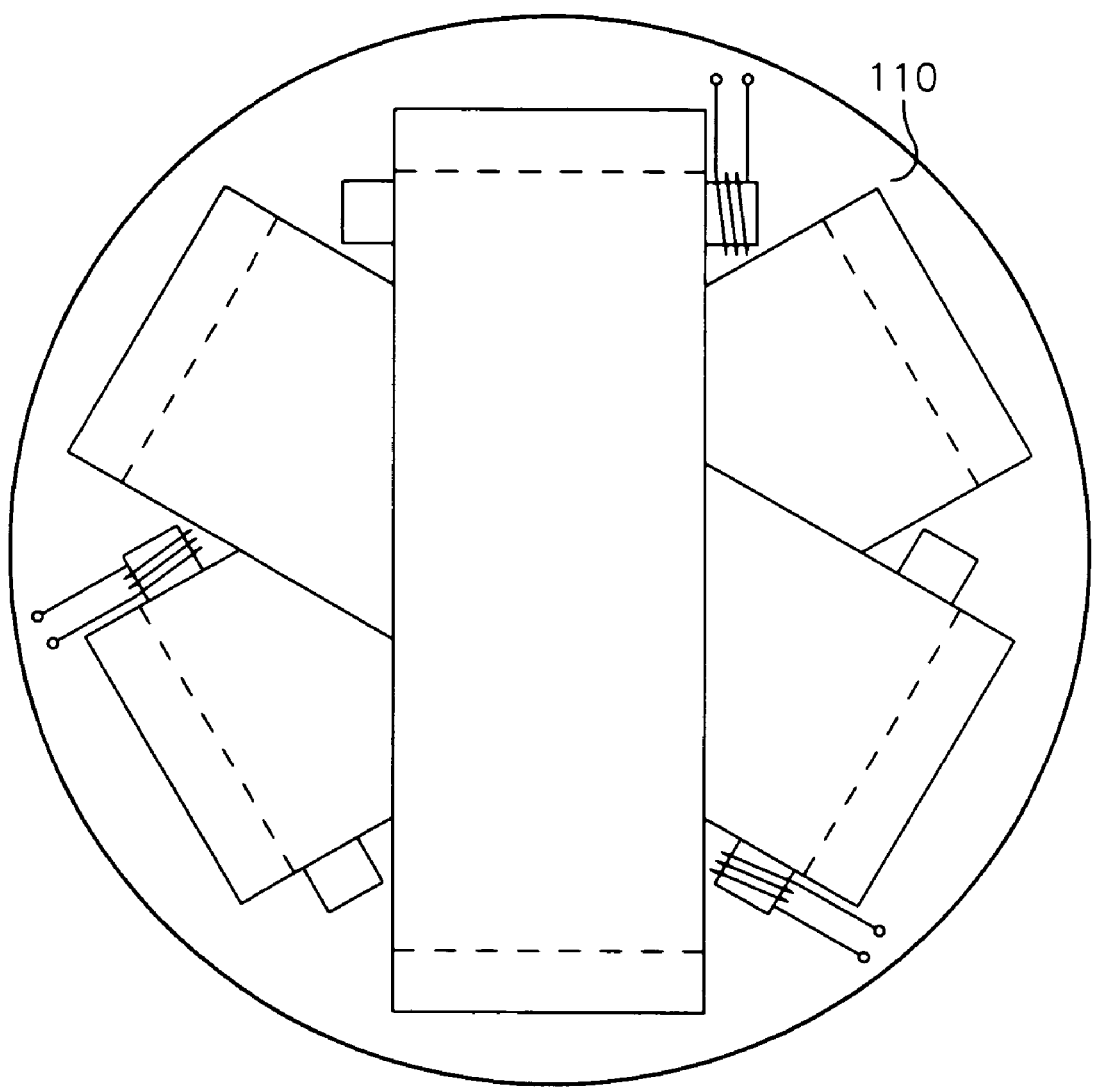
FIG. 38 is a case corresponding to that of FIG. 38 but having three instead of two reentrant conduits with a total of six reentrant ports to the chamber.

FIG. 38 is a case corresponding to that of FIG. 38 but having three instead of two reentrant conduits with a total of six reentrant ports to the chamber.

Figure 39:
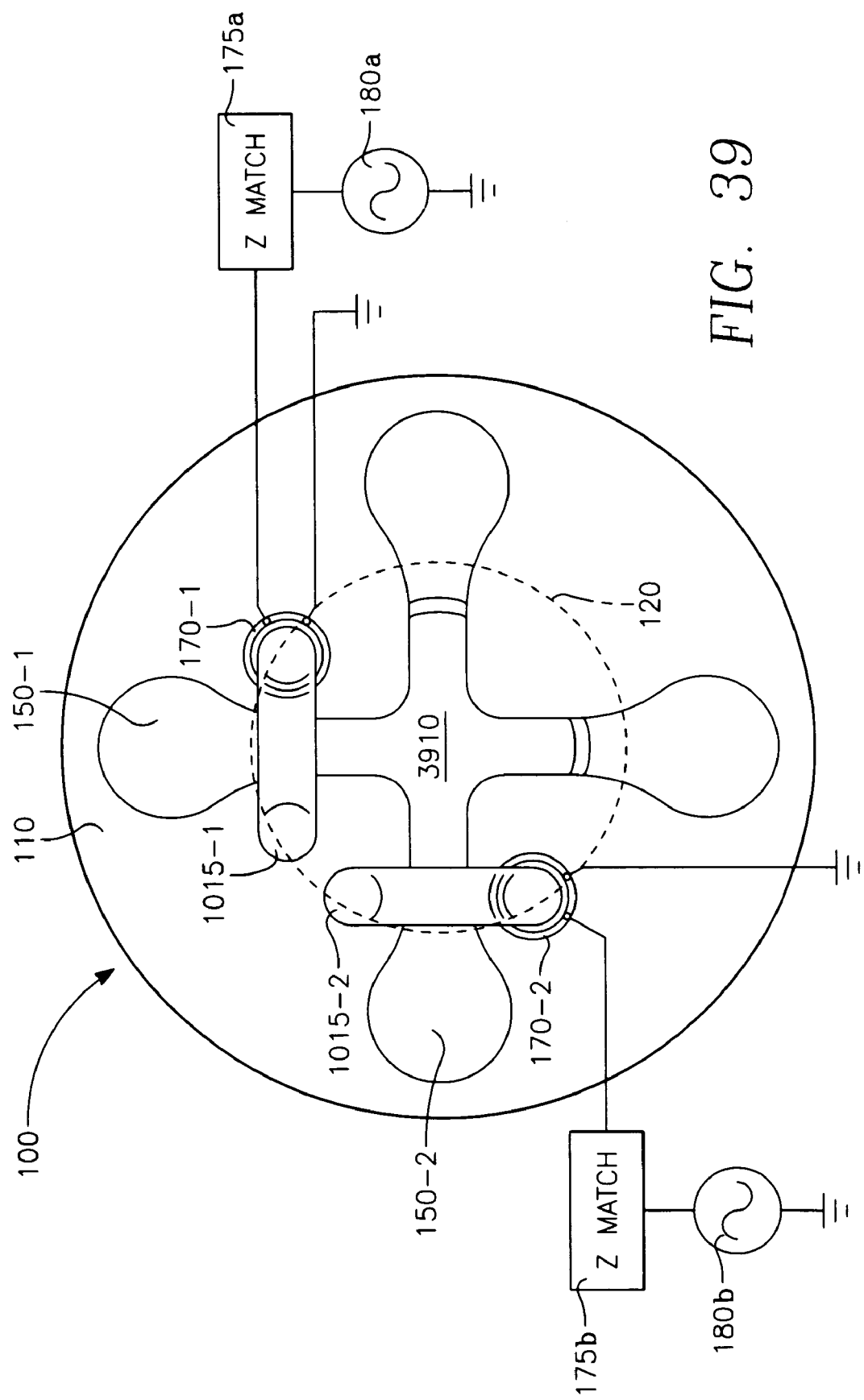
FIG. 39 is a case corresponding to that of FIG. 35 in which the external conduits join together in a common plenum 3910.

FIG. 39 is a case corresponding to that of FIG. 35 in which the external conduits join together in a common plenum 3910.

Figure 40:
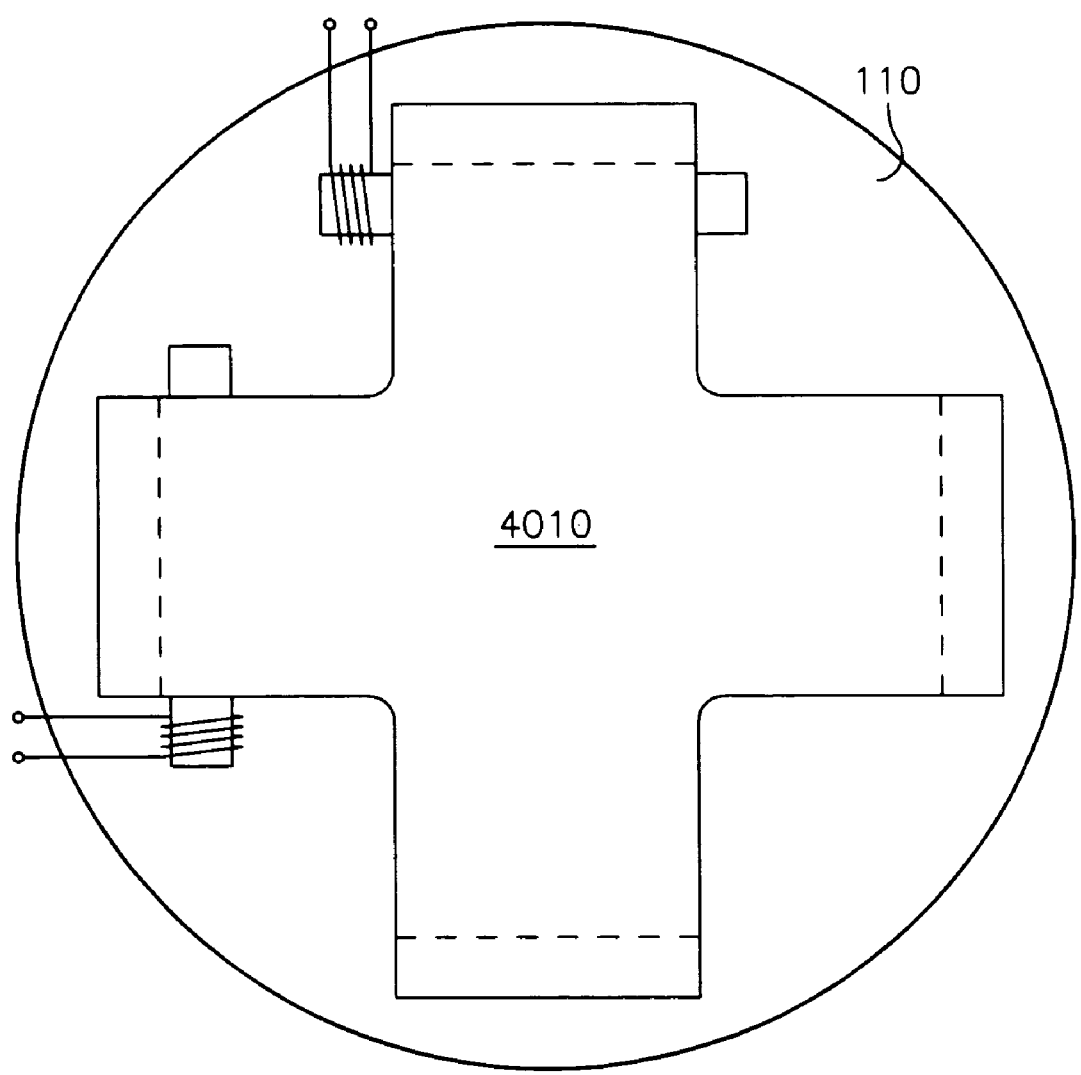
FIG. 40 is a case corresponding to that of FIG. 36 in which the external conduits join together in a common plenum 4010.

FIG. 40 is a case corresponding to that of FIG. 36 in which the external conduits join together in a common plenum 4010.

Figure 41:
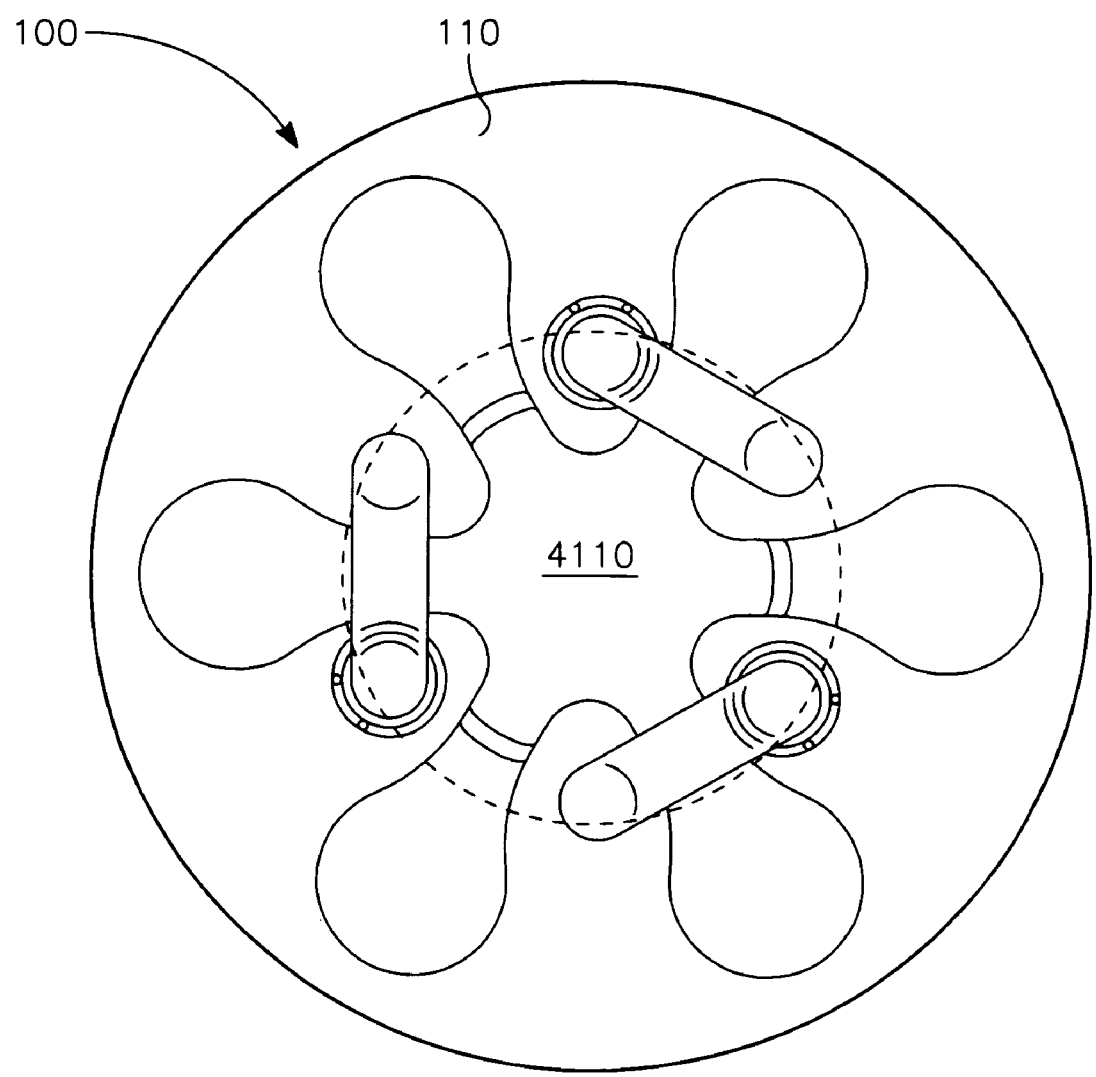
FIG. 41 is a case corresponding to that of FIG. 37 in which the external conduits join together in a common plenum 4110.

FIG. 41 is a case corresponding to that of FIG. 37 in which the external conduits join together in a common plenum 4110.

Figure 42:
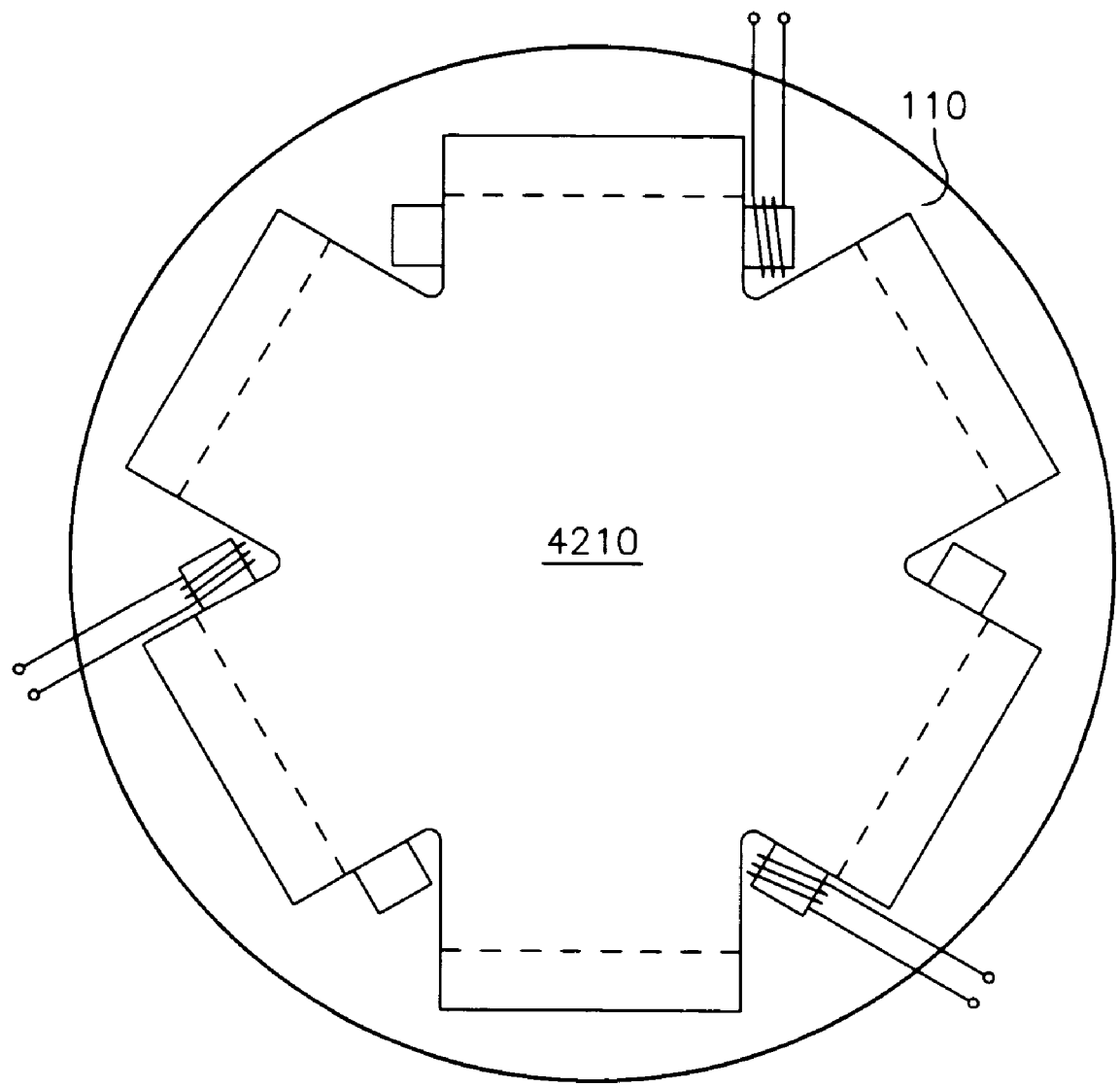
FIG. 42 is a case corresponding to that of FIG. 38 in which the external conduits join together in a common plenum 4210.

FIG. 42 is a case corresponding to that of FIG. 38 in which the external conduits join together in a common plenum 4210.

Figure 43:
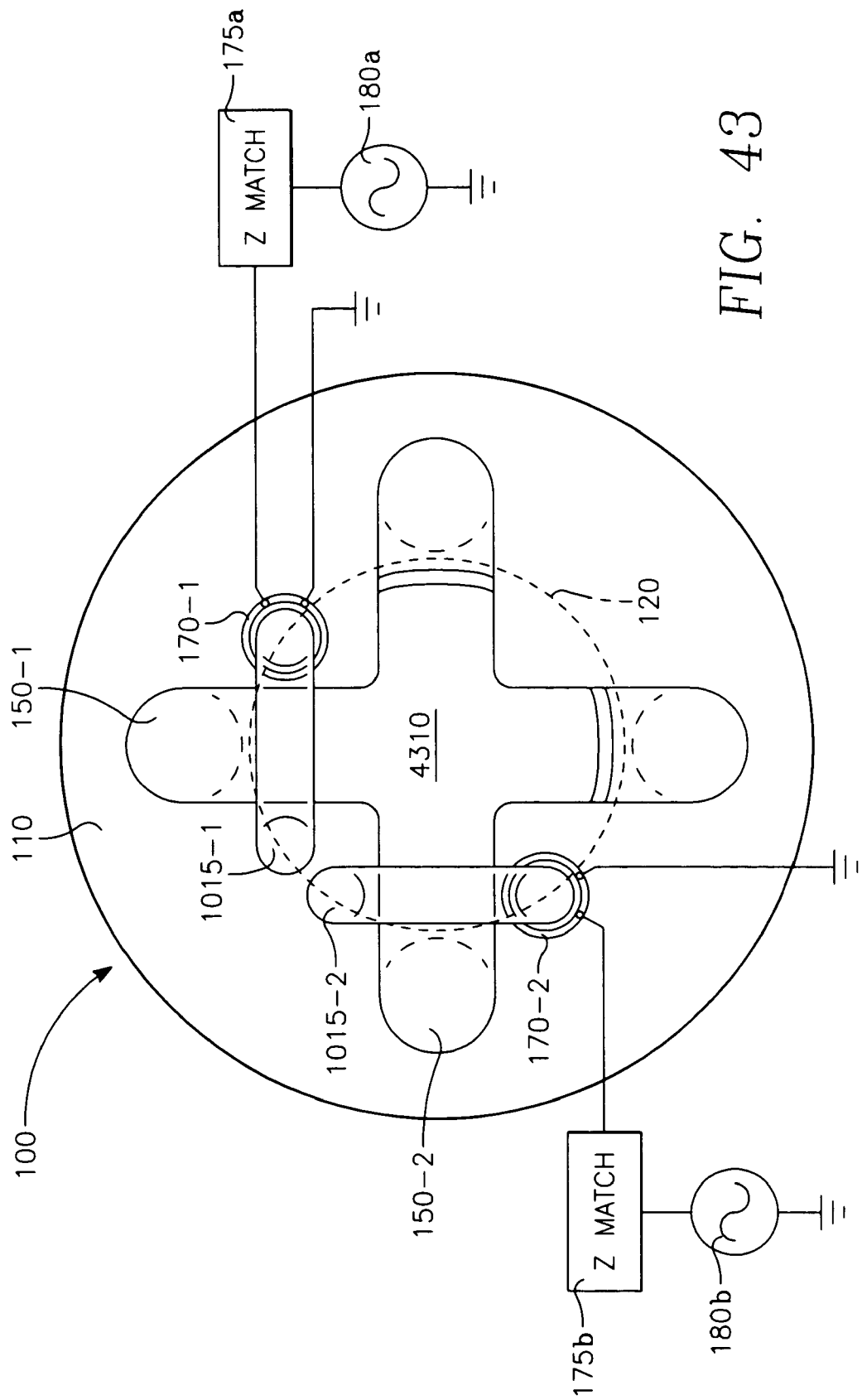
FIG. 43 is a case corresponding to that of FIG. 17 in which the external conduits join together in a common plenum 4310.

FIG. 43 is a case corresponding to that of FIG. 17 in which the external conduits join together in a common plenum 4310.

Advantageous Features:

Constricting the torroidal plasma current in the vicinity of the wafer not only improves etch selectivity but at the same time increases the etch rate by increasing the plasma ion density. It is believed no prior reactor has increased etch selectivity by the same mechanism that increases etch rate or plasma ion density over the workpiece.

Improving etch selectivity by constricting the torroidal plasma current in the vicinity of the wafer or workpiece can be achieved in the invention in any one of several ways. One way is to reduce the pedestal-to-ceiling or wafer-to-ceiling height. Another is to introduce a gas distribution plate or showerhead over the wafer that constricts the path of the torroidal plasma ion current. Another way is to increase the RF bias power applied to the wafer or workpiece. Any one or any combination of the foregoing ways of improving etch selectivity may be chosen by the skilled worker in carrying out the invention.

Etch selectivity may be further improved in the invention by injecting the reactive process gases locally (i.e., near the wafer or workpiece) while injecting an inert diluent gas (e.g., argon) remotely (i.e., into the conduit or plenum). This may be accomplished by providing a gas distribution plate or showerhead directly over and facing the workpiece support and introducing the reactive process gas exclusively (or at least predominantly) through the showerhead. Concurrently, the diluent gas is injected into the conduit well away from the process region overlying the wafer or workpiece. The torroidal plasma current thus becomes not only a source of plasma ions for reactive ion etching of materials on the wafer but, in addition, becomes an agent for sweeping away the reactive process gas species and their plasma-dissociated progeny before the plasma-induced dissociation process is carried out to the point of creating an undesirable amount of free fluorine. This reduction in the residence time of the reactive process gas species enhances the etch selectivity relative to photoresist and other materials, a significant advantage.

Great flexibility is provided in the application of RF plasma source power to the torroidal plasma current. As discussed above, power is typically inductively coupled to the torroidal plasma current by an antenna. In many cases, the antenna predominantly is coupled to the external conduit or plenum by being close or next to it. For example, a coil antenna may extend alongside the conduit or plenum. However, in other cases the antenna is confined to the region enclosed between the conduit or plenum and the main reactor enclosure (e.g., the ceiling). In the latter case, the antenna may be considered to be "under" the conduit rather than alongside of it. Even greater flexibility is afford by cases having a magnetic core (or cores) extending through the enclosed region (between the conduit and the main chamber enclosure) and having an extension beyond the enclosed region, the antenna being wound around the core's extension. In this case the antenna is inductively coupled via the magnetic core and therefore need not be adjacent the torroidal plasma current in the conduit. In one such case, a closed magnetic core is employed and the antenna is wrapped around the section of the core that is furthest away from the torroidal plasma current or the conduit. Therefore, in effect, the antenna may be located almost anywhere, such as a location entirely remote from the plasma chamber, by remotely coupling it to the torroidal plasma current via a magnetic core.

Finally, plasma distribution over the surface of a very large diameter wafer or workpiece is uniform. This is accomplished in one case by shaping the torroidal plasma current as a broad plasma belt having a width preferably exceeding that of the wafer. In another case, uniformity of plasma ion density across the wafer surface is achieved by providing two or more mutually transverse or orthogonal torroidal plasma currents that intersect in the process region over the wafer. The torroidal plasma currents flow in directions mutually offset from one another by 360/n. Each of the torroidal plasma currents may be shaped as a broad belt of plasma to cover a very large diameter wafer. Each one of the torroidal plasma currents may be powered by a separate coil antenna aligned along the direction of the one torroidal plasma current. In one preferred case, uniformity is enhanced by applying RF signals of different phases to the respective coil antennas so as to achieve a rotating torroidal plasma current in the process region overlying the wafer. In this preferred case, the optimum structure is one in which the torroidal plasma current flows in a circularly continuous plenum communicating with the main chamber portion through a circularly continuous annular opening in the ceiling or sidewall. This latter feature allows the entire torroidal plasma current to rotate azimuthally in a continuous manner.

Figure 44:
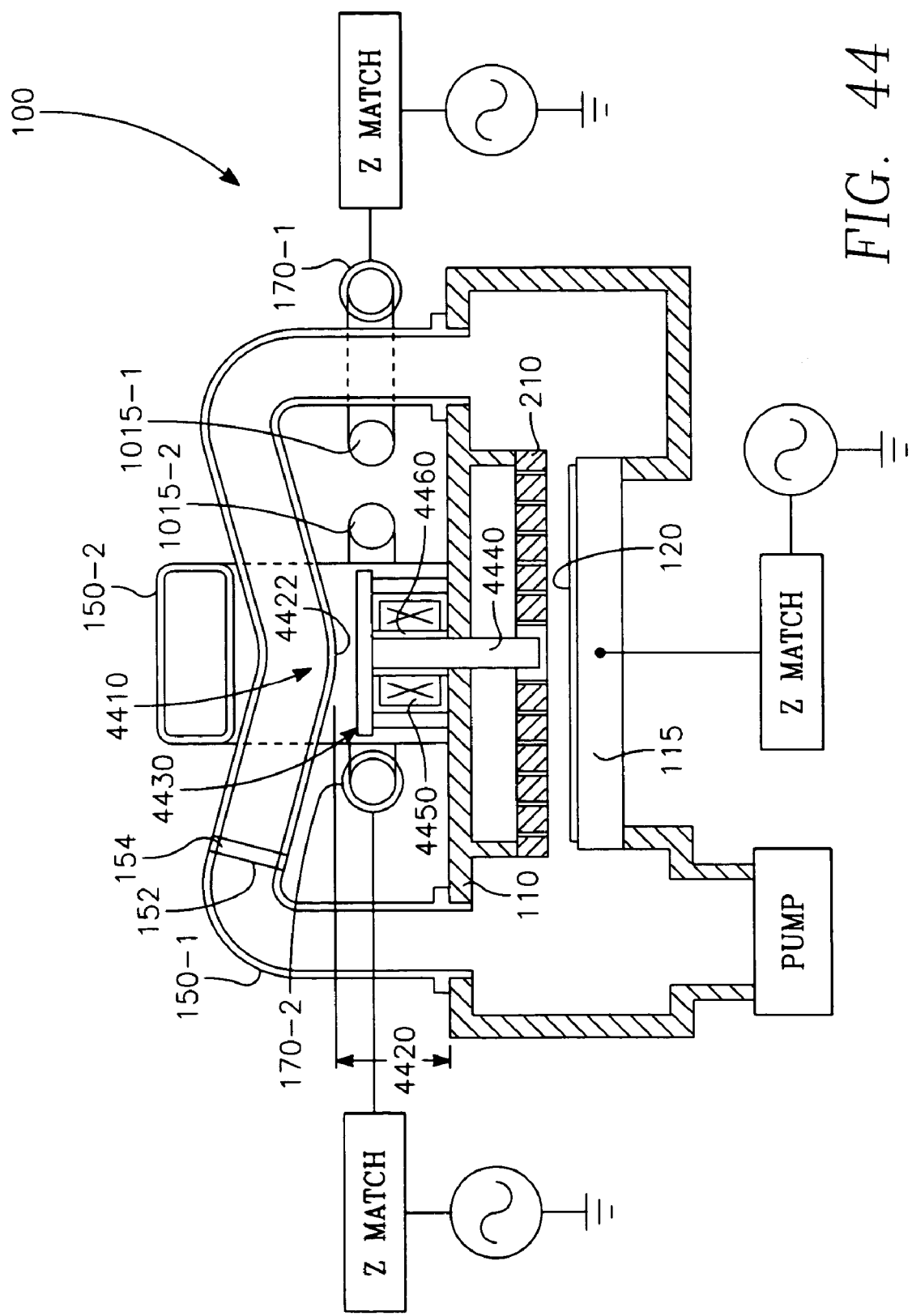
FIG. 44 illustrates cases a reactor similar to that of FIG. 1 and having a magnetic pole piece for controlling plasma ion density uniformity.

Controlling Radial Distribution of Plasma Ion Density:

FIG. 44 illustrates a plasma reactor similar to that illustrated in FIG. 17A having a pair of orthogonal external reentrant tubes 150-1, 150B2. RF power is coupled into the tubes by respective annular magnetic cores 1015-1, 1015-2 excited by respective RF-driven coils 170-1, 170-2, as described above with reference to FIG. 17A. However, in FIG. 44 the external tubes 150-1, 150-2 are rectangular as in FIG. 24 rather than being round in cross-sectional shape. Moreover, the horizontal section of the lower tube 150-1 is not flat but rather has a dip 4410 at its middle. The dip 4410 permits the upper external tube 150-2 to nest closer to the reactor ceiling 110. This feature shortens the path length in the upper tube 150-2, thereby reducing plasma losses in the upper tube 150-2. In fact, the shape of the dip 4410 may be selected to at least nearly equalize the path length through the upper and lower external tubes 150-1, 150-2. The reactor of FIG. 44, like the reactors of FIGS. 2 and 26, has a gas distribution plate 210 on the ceiling 110 (or forming the ceiling 110 itself) and overlying the wafer 120.

Figure 45:
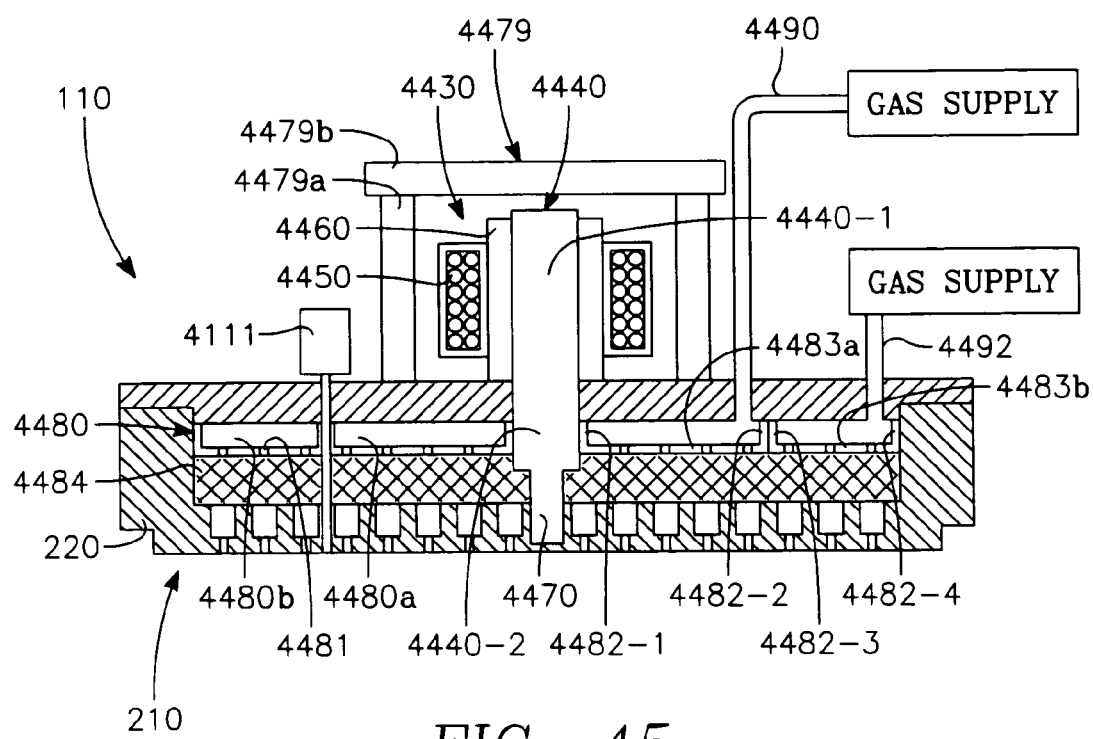
FIG. 45 illustrates a reactor like that of FIG. 44 in which the magnetic pole piece has a reduced diameter near the ceiling surface, and the ceiling is a dual zone gas distribution plate.

The dip 4410 is limited in that a vertical space remains between the top surface of the ceiling 110 and a bottom corner 4422 formed on the lower tube 150-1 at the apex of the dip 4410. The vertical space accommodates an electromagnet assembly 4430 that enhances plasma ion density over the center of the wafer 120. The electromagnet assembly 4430 includes a narrow elongate cylindrical pole piece 4440 formed of a magnetizable metal such as iron or steel (for example) and a coil 4450 of insulated conductive wire (e.g., copper wire) wrapped around the pole piece 4440. The cylindrical axis of the pole piece 4440 coincides with the axis of symmetry of the cylindrical chamber 100, so that the axis of the pole piece 4440 intersects the center of the wafer 120. The coil 4450 may be wrapped directly on the pole piece 4440 or, as illustrated in FIG. 45, may be wrapped around a mandrel 4460 encircling the pole piece 4440. FIG. 45 shows that the coil 4450 may be wrapped around a section 4440-1 of the pole piece 4440 that extends above the ceiling 110. The lower section 4440-2 of the pole piece 4440 that is inside the ceiling 110 terminates within the gas manifold 220 of the gas distribution plate 210.

For efficiency, it is desirable to place the source of the plasma-confining magnetic field as close to the plasma as practical without disturbing gas flow within the gas distribution plate 210. For this purpose, the portion of the lower pole piece section 4440-2 that is inside the gas manifold 220 is a very narrow cylindrical end piece 4470 that terminates the pole piece 4440. The end piece 4470 extends the magnetic field lines of the pole piece 4440 near the bottom of the gas distribution plate to enhance the effect of the magnetic field on the plasma. The diameter of the end piece 4470 is sufficiently reduced so that it does not appreciably interfere with gas flow within the gas manifold 210. Moreover, such a reduced diameter brings the peak of the radial component of the magnetic field nearer the center axis.

Figure 46:
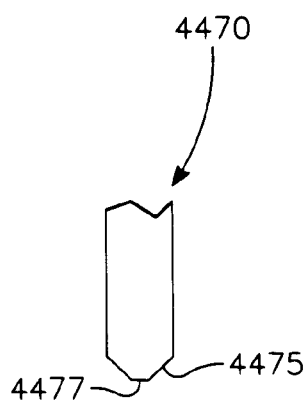
FIGS. 46, 47 and 48 illustrate different shapes for the pole piece.
Figure 47:
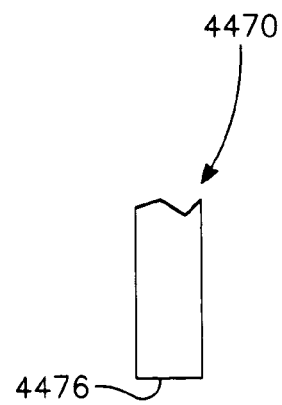
Figure 48:
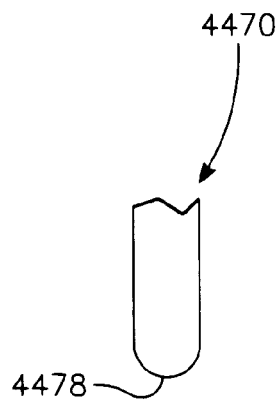

FIG. 46 illustrates one case of the end piece 4470 having a tapered bottom 4475 terminated in a nipple 4477. FIG. 47 illustrates a case of the end piece 4470 in which the bottom 4476 is flat. FIG. 48 illustrates a case of the end piece 4470 in which the bottom 4478 is round.

In one implementation, pole piece 4440 has a diameter of about 3.5 cm (such that the diameter of the approximately 60 turn coil 4450 is about 6 cm) and is about 12 cm long. The pole piece 4440 is extended about 2 cm (to a total of about 14 cm) with a smaller diameter extension of about 1 cm diameter. The bottom of the extension region of the pole piece 4440 is about 1.5 cm from the top of the plasma region. The material composition of pole piece 4440 is selected to have sufficiently high permeability (e.g., $\mu r >$ or $=100$) and high saturation flux density (e.g. Bsat>1000 gauss) to maximize the magnetic flux density in the region below the pole piece 4440 with minimum magnetizing force and current. Note that because the magnetic path is "open" with pole piece 4440 (not closed within the pole piece), the effective permeability is reduced relative to the material permeability. Depending on the length/diameter ratio of the pole piece 4440, the $\mu r$ "effective" is typically reduced to on the order of 10.

An optional shield 4479 of magnetic material such as iron shields plasma in the pair of tubes 150-1, 150-2 from the D.C. magnetic field of the electromagnet assembly 4430. The shield 4479 includes an overhead plate 4479a and a cylindrical skirt 4479b.

In the case of the gas distribution plate 210 illustrated in FIG. 45, a top plate 4480 is divided into radially inner and outer sections 4480a, 4480b, each having many small gas flow holes 4481 extending through it, the inner and outer sections having annular flanges 4482-1, 4482-2, 4482-3, 4482-4, forming vertical walls supporting the bottom surface of the ceiling 210 and forming therewith inner and outer gas manifolds 4483a, 4483b separated by a wall formed by the annular flanges 4482-2, 4482-3. In one case, there is no wall between the inner and outer gas manifolds, so as to avoid any discontinuity in gas distribution within the chamber that such a wall may cause. A gas mixing layer 4484 below the top plate 4480 diverts gas flow from a purely vertical flow direction and thereby induces multi-directional (or turbulent) gas flow that improves uniform mixing of gases of different molecular weights. Such diverting of the gas flow from a purely downward flow direction has the added benefit of suppressing high velocity gas flow effects, in which high velocity gas flow through gas distribution plate orifices directly over the wafer would form localized concentrations of process gas on the wafer surface that disrupt process uniformity. Suppression of high velocity gas flow effects enhances uniformity.

Figure 49:
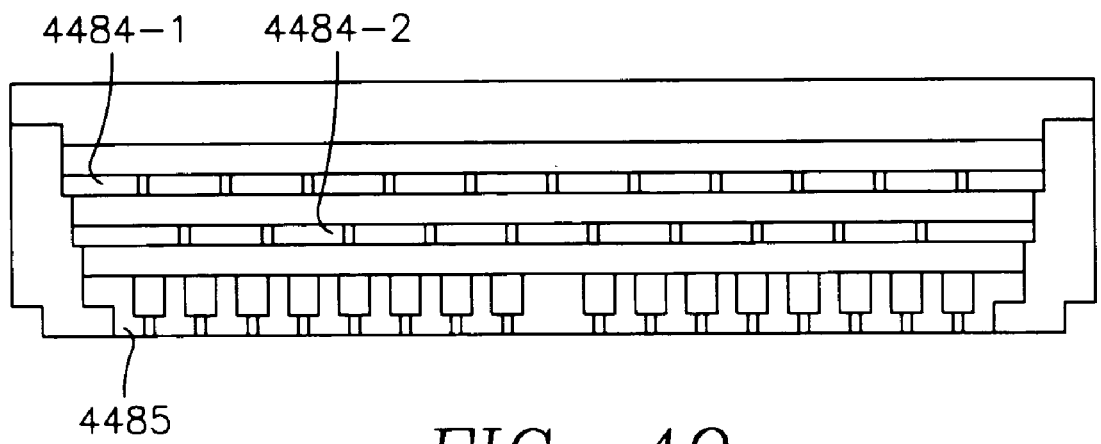
FIG. 49 illustrates one implementation of the gas distribution plate.
Figure 50:
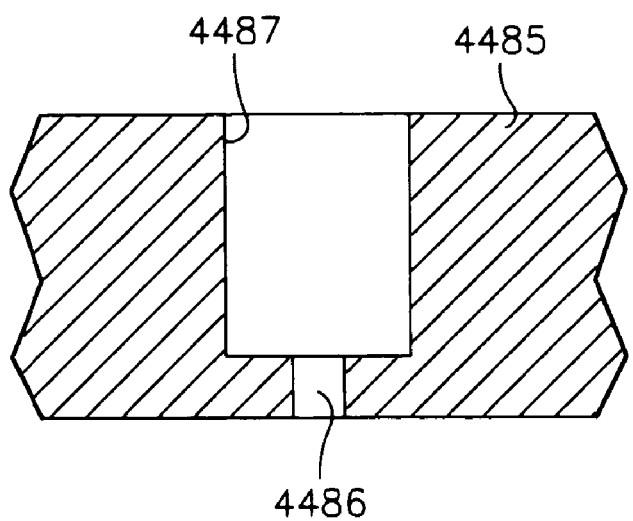
FIG. 50 is a detailed view of a gas injection orifice in FIG. 49.

The gas mixing layer 4484 may consist of metal or foam of the type well-known in the art. Or, as shown in FIG. 49, the gas mixture layer 4484 may consist of plural perforation plates 4484-1, 4484-2 each having many small gas orifices drilled through it, the holes in one perforation plate being offset from the holes in the other perforation plate. A bottom plate 4485 of the gas distribution plate 210 has many sub-millimeter gas injection holes 4486 (FIG. 50) drilled through it with large counterbored holes 4487 at the top of the bottom plate 4485. In one example, the sub-millimeter holes were between 10 and 30 mils in diameter, the counterbored holes were about 0.06 inch in diameter and the bottom plate 4485 had a thickness of about 0.4 inch. Inner and outer gas feed lines 4490, 4492 through the ceiling 110 furnish gas to the inner and outer top plates 4480a, 4480b, so that gas flow in radially inner and outer zones of the chamber may be controlled independently as a way of adjusting process uniformity.

Figure 51:
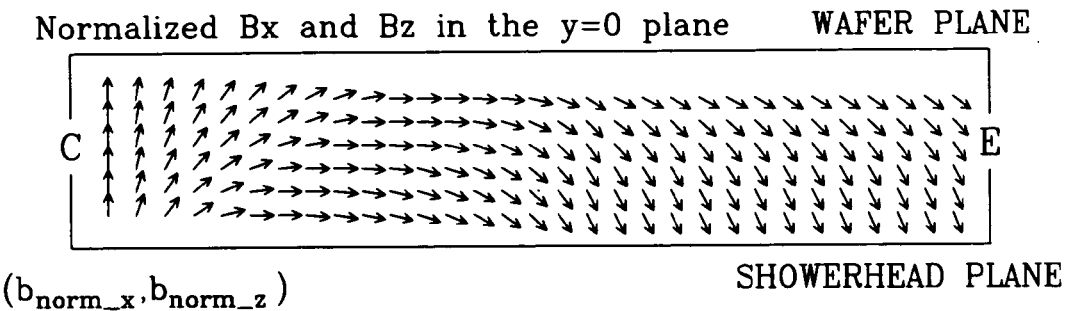
FIG. 51 is a graph depicting the magnetic field that the magnetic pole piece can generate.
Figure 52:
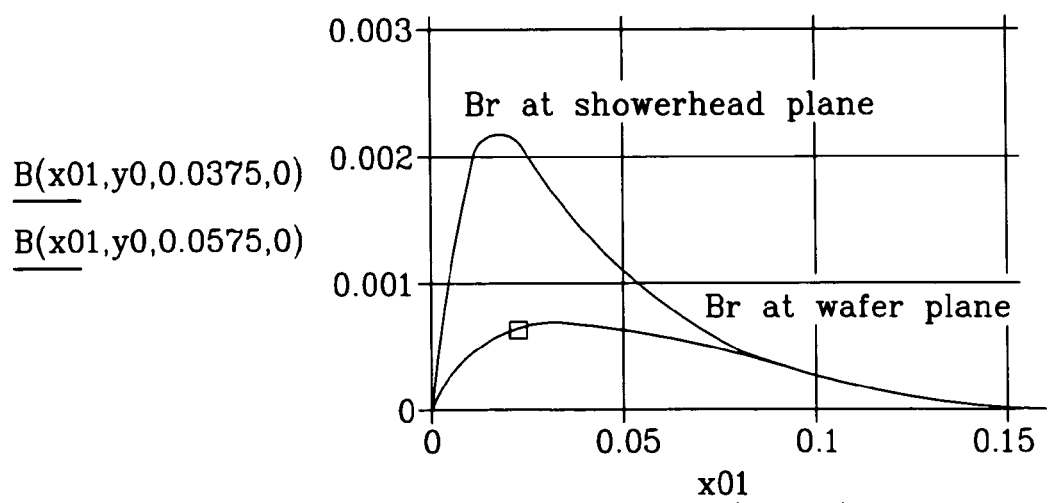
FIG. 52 is a graph of the magnetic field magnitude as a function of radius.

It is believed that the radial component of the D.C. magnetic field produced by the electromagnet assembly 4430 affects the radial distribution of plasma ion density, and that it is this radial component of the magnetic field that can be exploited to enhance plasma ion density near the center of the chamber. It is believed that such enhancement of plasma ion density over the wafer center arises from the interaction of the D.C. magnetic field radial component with the plasma sheath electric field at the wafer surface producing azimuthal plasma currents tending to confine plasma near the wafer center. In absence of the D.C. magnetic field, the phenomenon of a reduced plasma ion density at the center of the chamber extends over a very small circular zone confined closely to the center of the wafer 120, because in general the reactor of FIG. 44 tends to have an exceptionally uniform plasma ion density even in absence of a correcting magnetic field. Therefore, correction of the center-low plasma ion density distribution requires a D.C. magnetic field having a relatively large radial component very near the center of the chamber or wafer 120. The small diameter of the magnetic pole piece 4440 produces a magnetic field having a large radial component very close to the center of the wafer 120 (or center of the chamber). In accordance with conventional practice, the center is the axis of symmetry of the cylindrical chamber at which the radius is zero. FIG. 51 illustrates the distribution of the magnetic field in an elevational view of the processing region over the wafer 120 between the wafer 120 and the gas distribution plate 210. The vectors in FIG. 51 are normalized vectors representing the direction of the magnetic field at various locations. FIG. 52 illustrates the magnetic flux density of the radial component of the magnetic field as a function of radial location, one curve representing the radial field flux density near the bottom surface of the gas distribution plate 210 and the other curve representing the radial field flux density near the surface of the wafer 120. The peak of the flux density of the radial magnetic field component is very close to the center, namely at about a radius of only one inch both at the ceiling and at the wafer. Thus, the radial component of the magnetic field is tightly concentrated near the very small diameter region within which the plasma ion density tends to be lowest. Thus, the distribution of the radial component of the D.C. magnetic field produced by the electromagnet assembly 4430 generally coincides with the region of low plasma ion density near the center of the chamber.

As mentioned above, it is felt that the radial component of the D.C. magnetic field interacts with the vertically oriented electric field of the plasma sheath near the wafer center to produce an azimuthally directed force that generally opposes radial travel of plasma. As a result, plasma near the center of the wafer is confined to enhance processing within that region.

A basic approach of using the electromagnet assembly 4430 in an etch reactor is to find a D.C. current flow in the coil that produces the most uniform etch rate radial distribution across the wafer surface, typically by enhancing plasma ion density at the center. This is the likeliest approach in cases in which the wafer-to-ceiling gap is relatively small (e.g., one inch), since such a small gap typically results in a center-low etch rate distribution on the wafer. For reactors having a larger gap (e.g., two inches or more), the etch rate distribution may not be center low, so that a different D.C. current may be needed. Of course, the electromagnet assembly 4430 is not confined to applications requiring improved uniformity of plasma ion density across the wafer surface. Some applications of the electromagnet assembly may require an electromagnet coil current that renders the plasma ion density less uniform. Such applications may involve, for example, cases in which a field oxide thin film layer to be etched has a non-uniform thickness distribution, so that uniform results can be obtained only by providing nonuniform plasma ion density distribution that compensates for the nonuniform field oxide thickness distribution. In such a case, the D.C. current in the electromagnet assembly can be selected to provide the requisite nonuniform plasma ion distribution.

As shown in FIG. 45, the plasma reactor may include a set of integrated rate monitors 4111 that can observe the etch rate distribution across the wafer 120 during the etch process. Each monitor 4111 observes the interference fringes in light reflected from the bottom of contact holes while the holes are being etched. The light can be from a laser or may be the luminescence of the plasma. Such real time observation can make it possible to determine changes in etch rate distribution across the wafer that can be instantly compensated by changing the D.C. current applied to the electromagnet assembly 4430.

Figure 53:
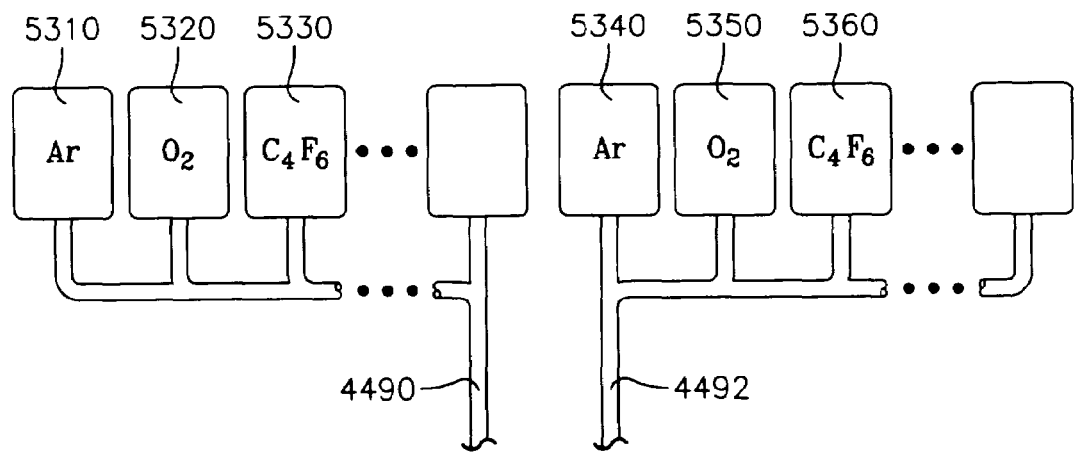
FIGS. 53 and 54 illustrate different ways of controlling process gas flow.
Figure 54:
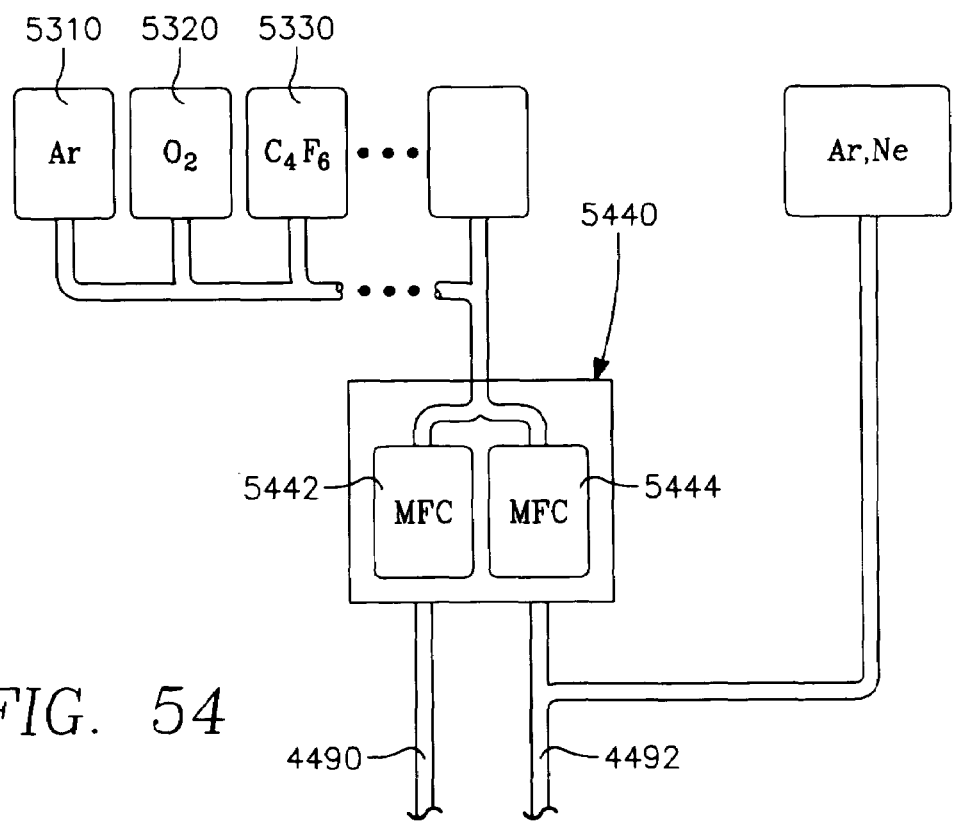

FIG. 53 shows one way of independently controlling process gas flow to the inner and outer gas feed lines 4490, 4492. In FIG. 53, one set of gas flow controllers 5310, 5320, 5330 connected to the inner gas feed line 4490 furnish, respectively, argon, oxygen and a fluoro-carbon gas, such as C4F6, to the inner gas feed line 4490. Another set of gas flow controllers 5340, 5350, 5360 furnish, respectively, argon, oxygen and a fluoro-carbon gas, such as C4F6, to the outer gas feed line 4492. FIG. 54 shows another way of independently controlling process gas flow to the inner and outer gas feed lines 4490, 4492. In FIG. 54, a single set of gas flow controllers 5410, 5420, 5430 furnishes process gases (e.g., argon, oxygen and a fluoro-carbon gas) to a gas splitter 5440. The gas splitter 5440 has a pair of gas or mass flow controllers (MFC's) 5442, 5444 connected, respectively, to the inner and outer gas feed lines 4490, 4492. In addition, optionally another gas flow controller 5446 supplies purge gas such as argon or neon to the outer gas feed line 4492.

Figure 55A:
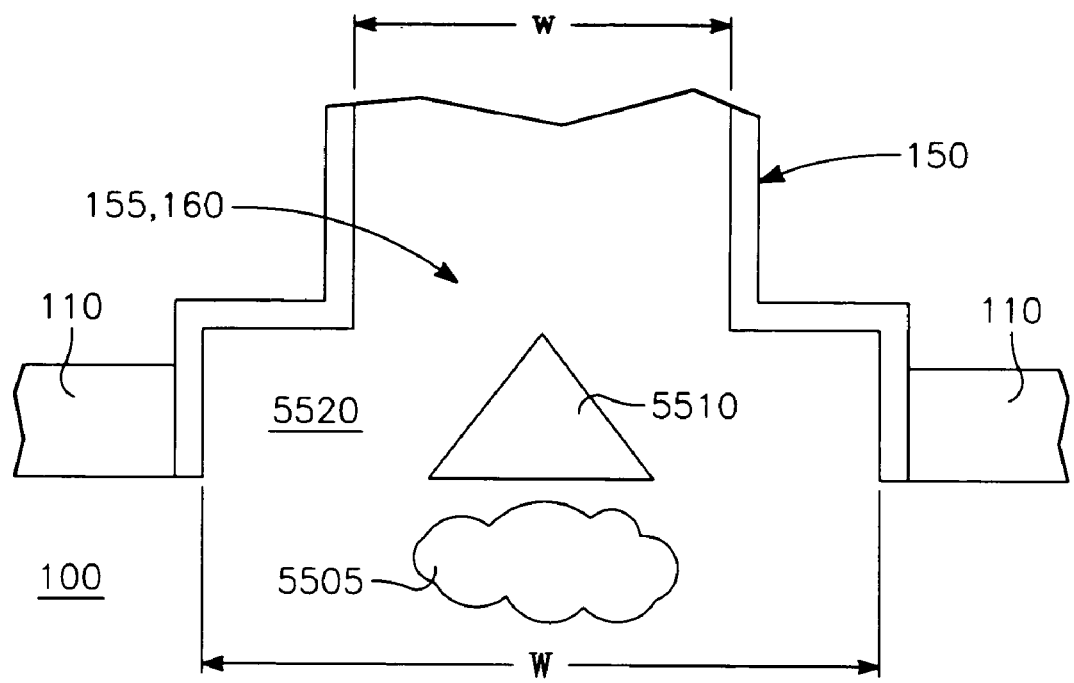
FIGS. 55A and 55B illustrate the use of a splitter in the torroidal plasma path.

One problem in processing a large diameter wafer is that the torroidal or reentrant plasma current must spread out evenly over the wide surface of the wafer. The tubes 150 typically are less wide than the process area. The need then is to broaden the plasma current to better cover a wide process area as it exits a port 155 or 160. As related problem is that the reactor of FIG. 44 (or any of the reactors of FIGS. 1-43) can experience a problem of non-uniform plasma ion density and consequent "hot spot" or small region 5505 of very high plasma ion density near a port 155 or 160 of the reentrant tube 150, as shown in FIG. 55A. Referring to FIGS. 55A-56B, these problems are addressed by the introduction of a plasma current flow splitter 5510 at the mouth of each port (e.g., the port 155 as shown in FIG. 55A). The splitter 5510 tends to force the plasma current to widen while at the same time reducing plasma ion density in the vicinity of the region 5505 where a hot spot might otherwise form. The tube 150 can have a widened termination section 5520 at the port 155, the termination section 5520 having a diameter nearly twice as great as that of the remaining portion of the tube 150. The plasma current flow splitter 5510 of FIG. 55A is triangular in shape, with one apex facing the interior of the tube 150 so as to force the plasma current flowing into the chamber 100 from the tube 150 to spread out so as to better fill the larger diameter of the termination section 5520. This current-spreading result produced by the triangular splitter 5510 tends to widen the plasma current and reduces or eliminates the "hot spot" in the region 5505.

The optimum shape of the splitter 5510 depends at least in part upon the separation distance S between the centers of opposing ports 155, 160. If the splitter is too long in the direction of plasma flow (i.e., the vertical direction in FIG. 55A), then current flow along the divided path tends to be unbalanced, with all current flowing along one side of the splitter 5510. On the other hand, if the splitter 5510 is too short, the two paths recombine before the plasma current appreciably widens.

For example, in a chamber for processing a 12-inch diameter wafer, the separation distance S can be about 20.5 inches, with a tube width w of 5 inches, a tube draft d of 1.75 inches and an expanded termination section width W of 8 inches. In this case, the juxtaposition of the port 155 relative to the 12 inch wafer would be as shown in the plan view of FIG. 56C. In this particular example, the height h of the splitter 5510 should be about 2.5 inches, with the angle of the splitter's apex 5510a being about 75 degrees, as shown in FIG. 57. In addition, the length L of the termination section 5520 should equal the height h of the splitter 5510.

On the other hand, for a separation distance S of 16.5 inches, an optimum splitter 5510' is illustrated in FIG. 58. The angle of the splitter apex in this case is preferably about 45 degrees, the triangular portion being terminated in a rectangular portion having a width of 1.2 inches and a length such that the splitter 5510' has a height h of 2.5 inches. The height and apex angle of the splitter 5510 or 5510' must be sufficient to reduce plasma density in the region 5505 to prevent formation of a hot spot there. However, the height h must be limited in order to avoid depleting plasma ion density at the wafer center.

FIGS. 59A and 59B illustrate splitters for solving the problem of plasma ion density non-uniformity near the entrance ports of a reentrant tube 2654 in which plasma current flow through each port is in a horizontal direction through the chamber sidewall 105, as in the reactor of FIG. 26. Each splitter 5910 has its apex 5910a facing the port 2680.

Figure 60:
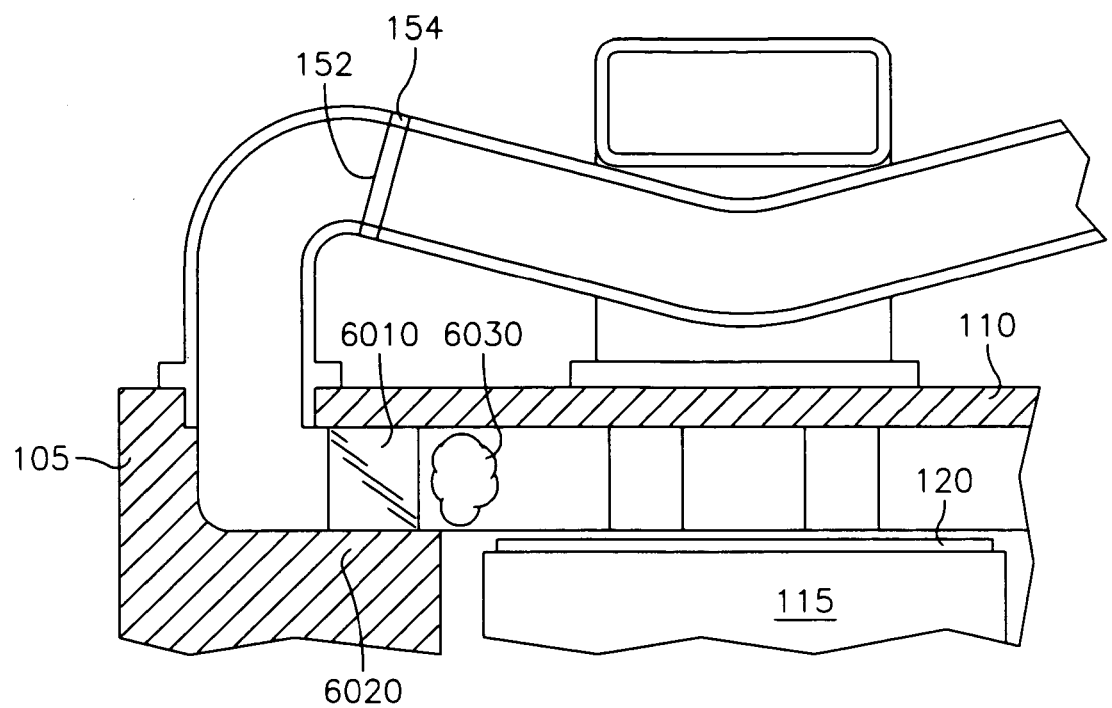
FIGS. 60, 61, 62 and 63 illustrate the use of splitters where the torroidal plasma current is introduced vertically at a corner of the chamber.
Figure 61:
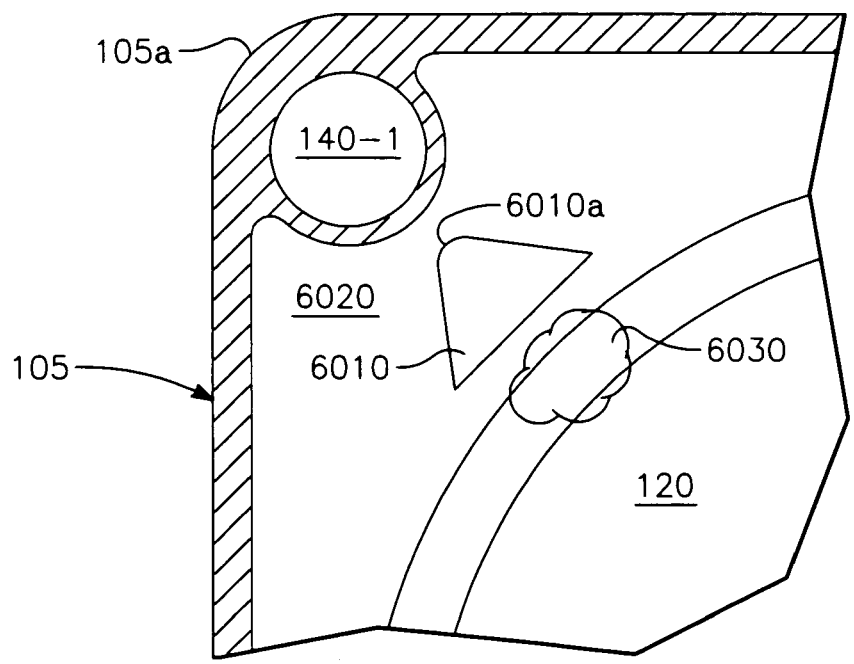
Figure 62:
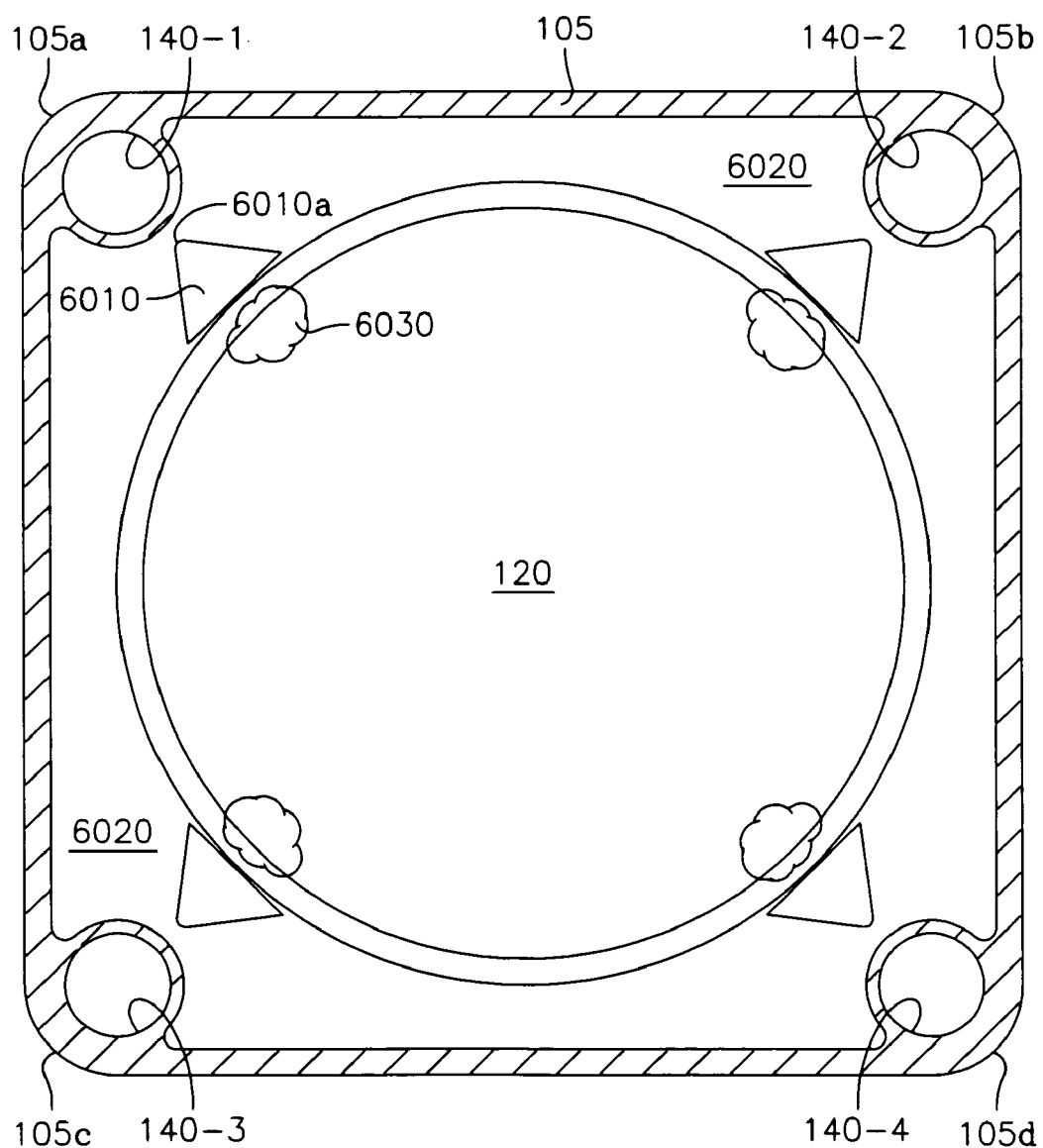
Figure 63:
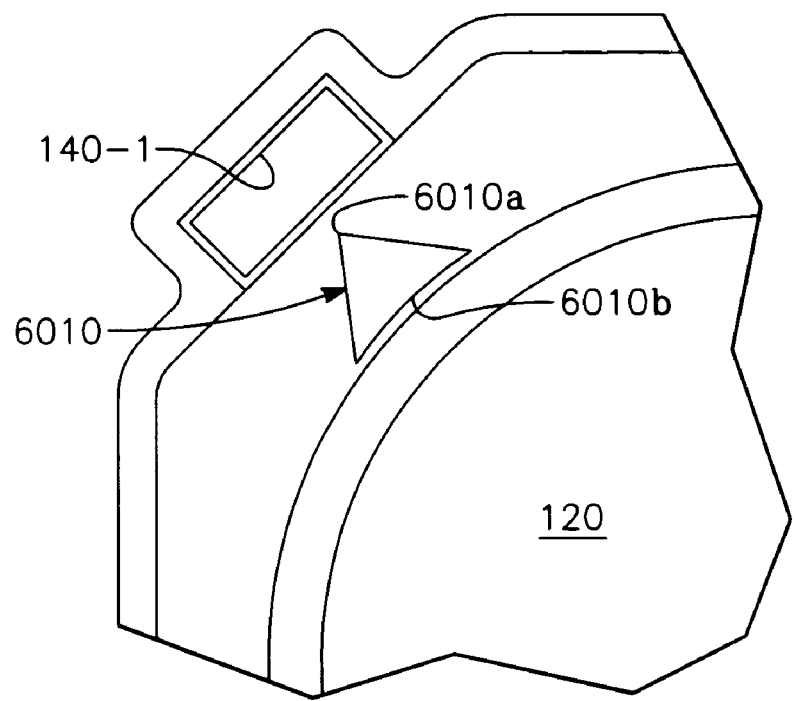
Figure 64:
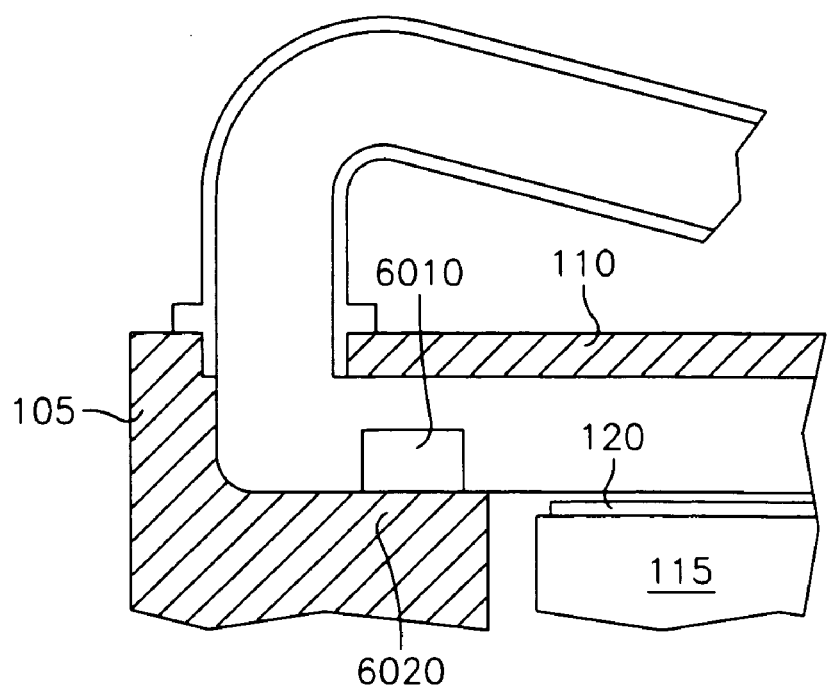
FIG. 64 illustrates how a splitter may extend only part of the process region height.

FIGS. 60, 61 and 62 illustrate an implementation like that of FIG. 17A, except that the chamber sidewall 105 is rectangular or square and the vertically facing ports 140-1, 140-2, 140-3 and 140-4 through the ceiling 110 are located over respective corners 105a, 105b, etc. of the rectangular or square sidewall 105. A floor 6020 in the plane of the wafer 120 faces each port and, together with the corner-forming sections of the rectangular sidewall 105, forces incoming plasma current to turn toward the processing region overlying the wafer 120. In order to reduce or eliminate a hot spot in plasma ion density in the region 6030, a triangular plasma current flow splitter 6010 is placed near each respective corner 105a, 105b, etc., with its apex 6010a facing that corner. In the implementation of FIG. 61, the splitter apex 6010a is rounded, but in other implementations it may be less rounded or actually may be a sharp edge. FIG. 63 illustrates a portion of the same arrangement but in which the edge 6010b of the splitter 6010 facing the wafer 120 is located very close to the wafer 120 and is arcuately shaped to be congruent with the circular edge of the wafer 120. While the splitter 6010 of FIG. 60 extends from the floor 6020 to the ceiling 110, FIG. 64 illustrates that the height of the splitter 6010 may be less, so as to allow some plasma current to pass over the splitter 6010.

As will be discussed in greater detail below with respect to certain working examples, the total path length traversed by the reentrant plasma current affects plasma ion density at the wafer surface. This is because shorter path length places a higher proportion of the plasma within the processing region overlying the wafer, reduces path length-dependent losses of plasma ions and reduces surface area losses due to plasma interaction with the reentrant tube surface. Therefore, the shorter length tubes (corresponding to a shorter port separation distance S) are more efficient. On the other hand, a shorter separation distance S affords less opportunity for plasma current flow separated at its center by the triangular splitter 5510 to reenter the center region after passing the splitter 5510 and avoid a low plasma ion density at the wafer center. Thus, there would appear to be a tradeoff between the higher efficiency of a smaller port separation distance S and the risk of depressing plasma ion density at the wafer center in the effort to avoid a plasma hot spot near each reentrant tube port.

Figure 65A:
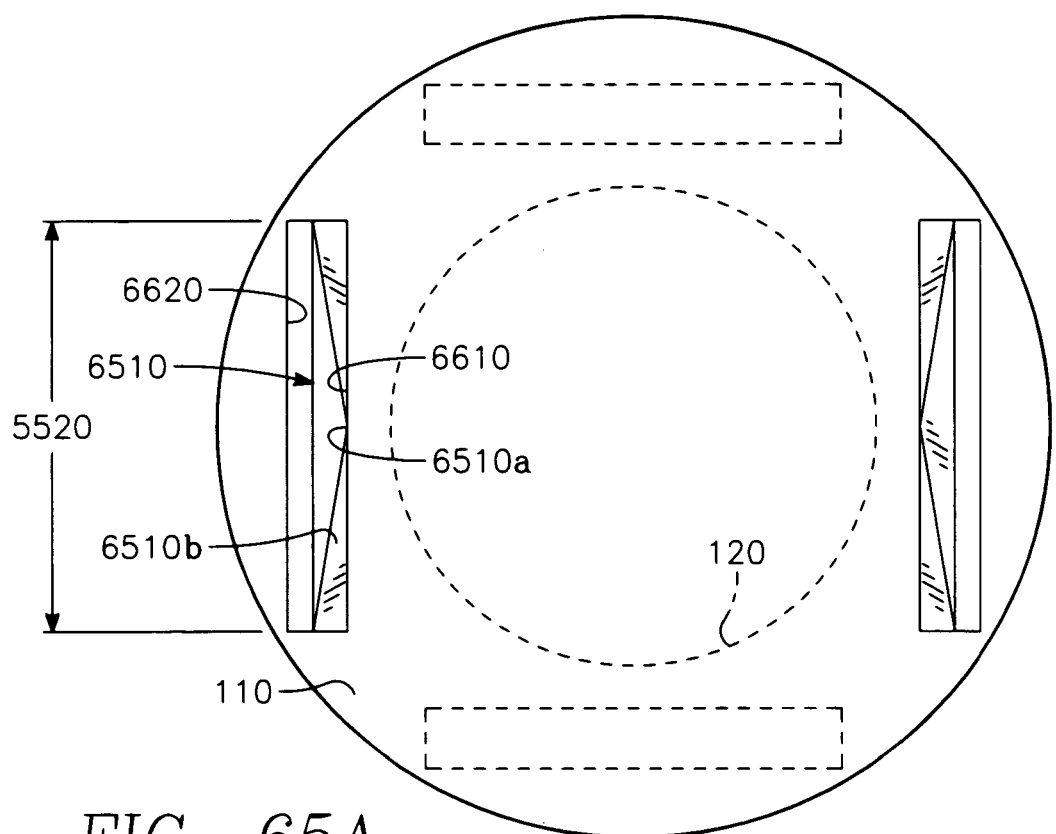
FIGS. 65A, 65B and 66 illustrate a splitter design adapted to increase the effective radial path length of the torroidal plasma current inside the chamber for a given chamber diameter.
Figure 65B:
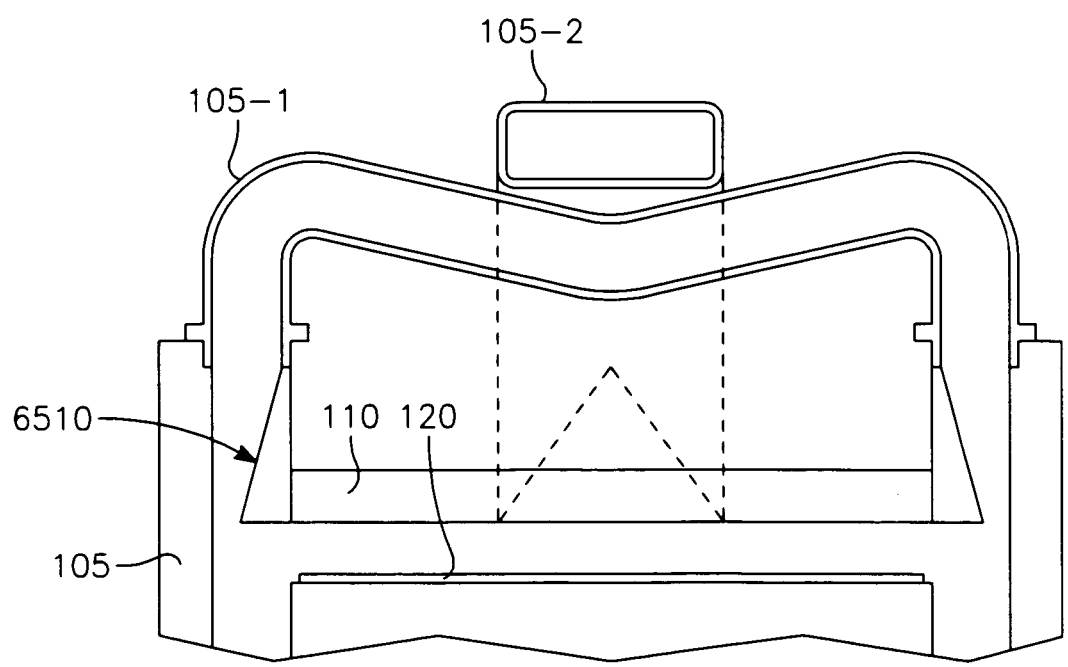
Figure 66:
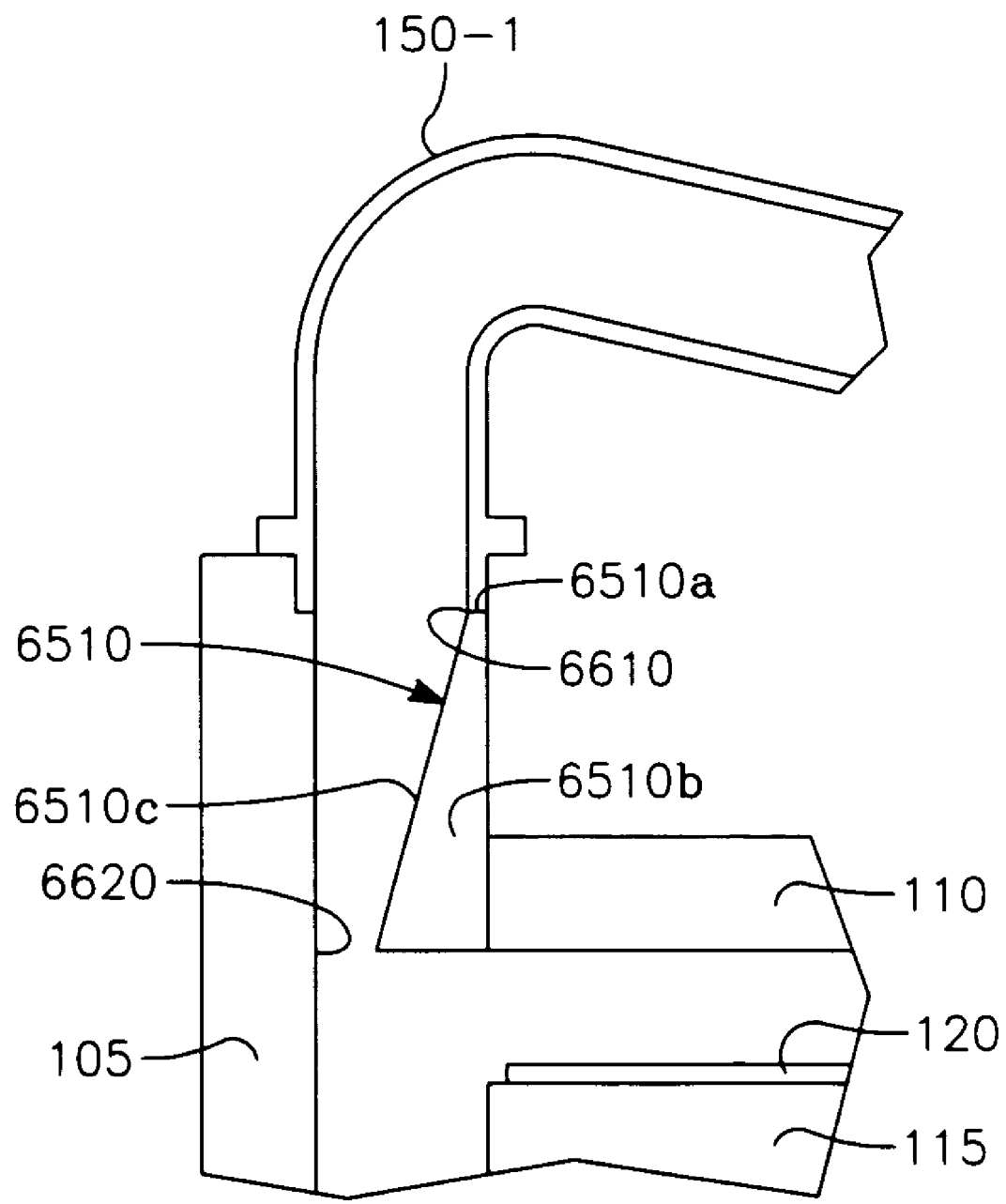

This tradeoff is ameliorated or eliminated in the case of FIGS. 65A, 65B and 66, by using a triangular splitter 6510 that extends at least nearly across the entire width W of the termination section 5520 of the port and is shaped to force plasma current flow away from the inner edge 6610 of the port and toward the outer edge 6620 of the port. This feature leaves the port separation distance S unchanged (so that it may be as short as desired), but in effect lengthens the plasma current path from the apex 6510a of the splitter to the center of the wafer 120. This affords a greater opportunity for the plasma current flow split by the splitter 6510 to rejoin at its center before reaching the wafer or center of the wafer. This feature better avoids depressing plasma ion density at the wafer center while suppressing formation of plasma hot spots at the reentrant tube ports.

As illustrated in FIGS. 65A, 65B and 66, each splitter 6510 presents an isoceles triangular shape in elevation (FIG. 65B) and a rectangular shape from the top (FIG. 65A). The side view of FIG. 66 reveals the sloping back surface 6610c that extends downwardly toward the outer edge 6620 of the port. It is the sloping back surface 6610c that forces the plasma current toward the back edge 6620 thereby effectively lengthening the path from the top of the apex 6510a to the wafer center, which is the desired feature as set forth above. The rectangular opening of the port 150 is narrowed in the radial direction (the short dimension) by the sloped wall or sloping back surface 6610b from about 2" at top to about ¾" at the bottom. This pushes the inner port edge about 1-¼" radially farther from the wafer (thus achieving the desired increase in effective port separation distance). In addition, the port 150 has the full triangular splitter 6510 in the azimuthal direction (the long or 8" wide dimension of the opening 150).

The plasma current splitter 5510 or 6510 may have coolant passages extending within it with coolant ports coupled to similar ports in the reactor body to regulate the temperature of the splitter. For this purpose, the plasma current splitter 5510 or 6510 is formed of metal, since it easily cooled and is readily machined to form internal coolant passages. However, the splitter 5510 or 6510 may instead be formed of another material such as quartz, for example.

Figure 67:
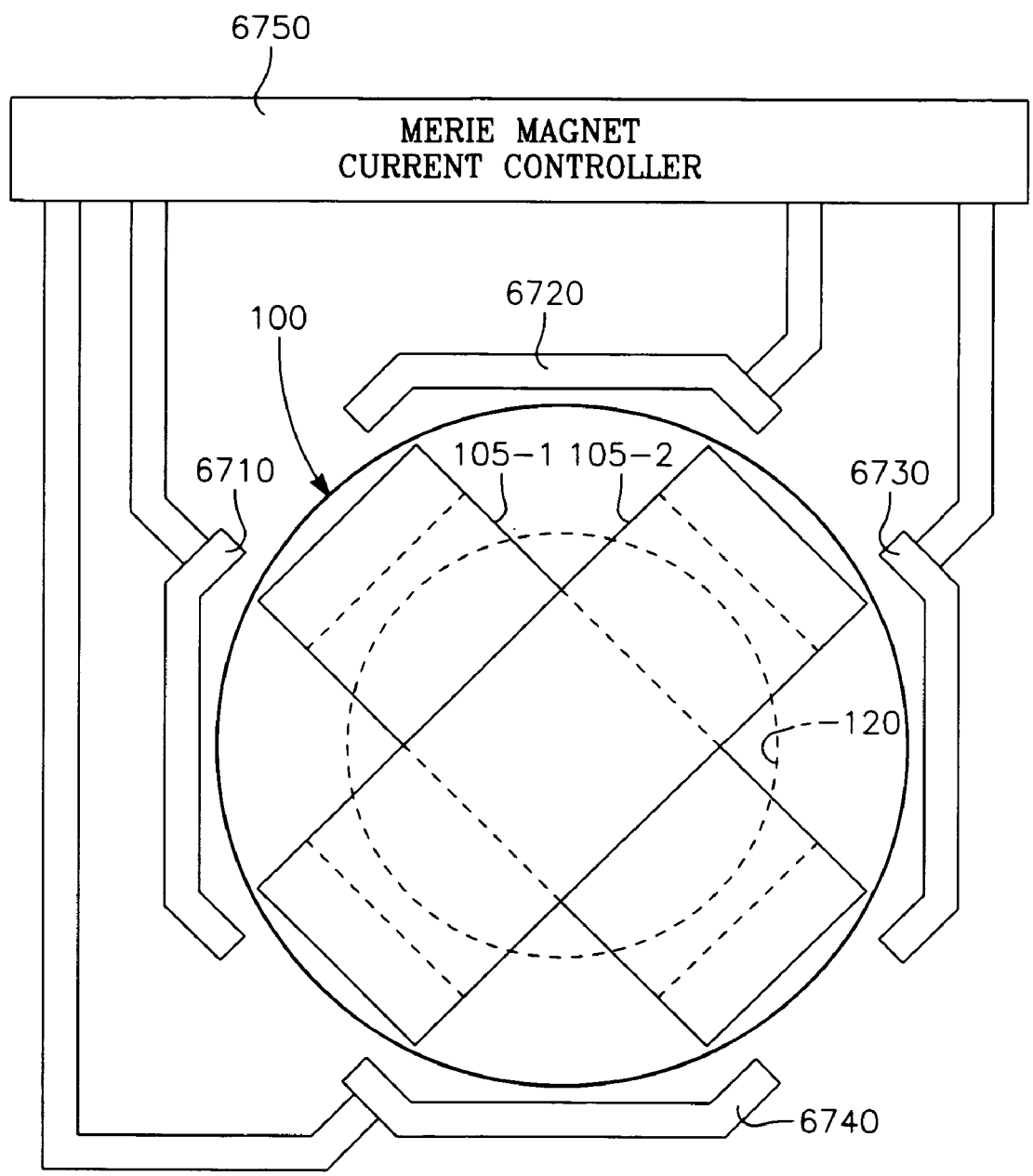
FIG. 67 illustrates the use of MERIE magnets with the torroidal plasma current source of FIG. 1.

FIG. 67 illustrates another way of improving plasma uniformity in the torroidal source reactor of FIG. 24 by introducing a set of four annular electromagnets 6710, 6720, 6730, 6740 along the periphery of the reactor, the windings of each electromagnet being controlled by a magnet current controller 6750. The electric currents in the four electromagnets may be driven in any one of three modes:

in a first mode, a sinusoidal mode, the coils are driven at the same low frequency current in phase quadrature to produce a magnetic field that rotates about the axis of symmetry of the reactor at the low frequency of the source;

in a second mode, a configurable magnetic field mode, the four electromagnets 6710, 6720, 6730, 6740 are grouped into opposing pairs of adjacent electromagnets, and each pair is driven with a different D.C. current to produce a magnetic field gradient extending diagonally between the opposing pairs of adjacent electromagnets, and this grouping is rotated so that the magnetic field gradient is rotated to isotropically distribute its effects over the wafer; in a third mode, the four electromagnets are all driven with the same D.C. current to produce a cusp-shaped magnetic field having an axis of symmetry coinciding generally with the axis of symmetry of the reactor chamber.

Figure 68:
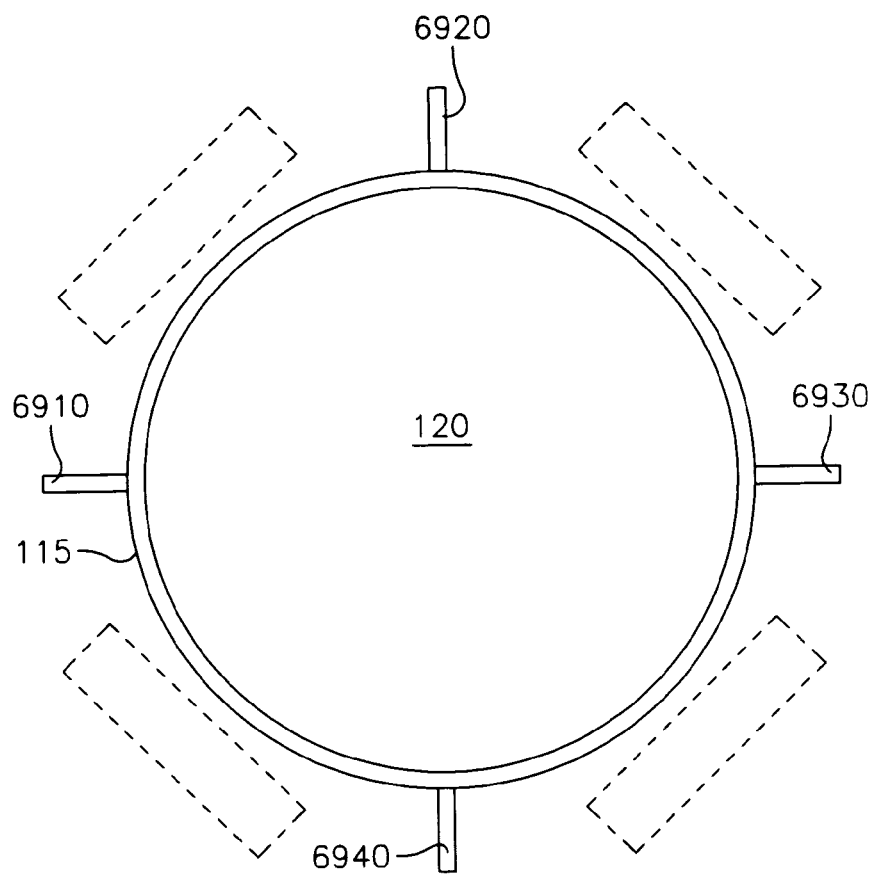
FIGS. 68 and 69 illustrate the use of fins to better confine the torroidal plasma current to the processing region.
Figure 69:
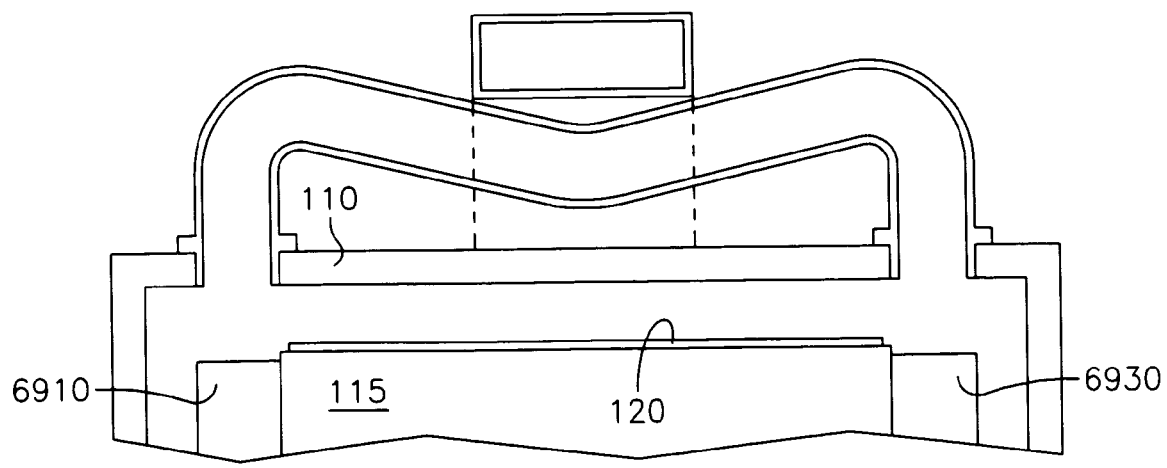

As shown in FIG. 1, a pumping annulus is formed between the cylindrical wafer support pedestal 115 and the cylindrical sidewall 105, gases being evacuated via the pumping annulus by the vacuum pump 135. Plasma current flow between the opposing ports of each reentrant tube 150 can flow through this pumping annulus and thereby avoid flowing through the processing region between the wafer 120 and the gas distribution plate 210. Such diversion of plasma current flow around the process region can occur if the chamber pressure is relatively high and the wafer-to-ceiling gap is relatively small and/or the conductivity of the plasma is relatively low. To the extent this occurs, plasma ion density in the process region is reduced. This problem is solved as shown in FIGS. 68 and 69 by the introduction of radial vanes 6910, 6920, 6930, 6940 blocking azimuthal plasma current flow through the pumping annulus. In one implementation, the vanes 6910, 6920, 6930, 6940 extend up to but not above the plane of the wafer 120, to allow insertion and removal of the wafer 120. However, in another implementation the vanes may retractably extend above the plane of the wafer to better confine the plasma current flow within the processing region overlying the wafer 120. This may be accomplished by enabling the wafer support pedestal 115 to move up and down relative to the vanes, for example. In either case, the vanes 6910, 6920, 6930, 6940 prevent plasma current flow through the pumping annulus, and, if the vanes can be moved above the plane of the wafer 120, they also reduce plasma current flow through the upper region overlying the pumping annulus. By thus preventing diversion of plasma current flow away from the processing region overlying the wafer, not only is plasma ion density improved in that region but process stability is also improved.

As mentioned previously herein, the magnetic core used to couple RF power to each reentrant tube 150 tends to crack or shatter at high RF power levels. It is believed this problem arises because magnetic flux is not distributed uniformly around the core. Generally, one winding around the core has a high current at high RF power levels. This winding can be, for example, a secondary winding that resonates the primary winding connected to the RF generator. The secondary winding is generally confined to a narrow band around the core, magnetic flux and heating being very high within this band and much lower elsewhere in the core. The magnetic core must have a suitable permeability (e.g., a permeability between about 10 and 200) to avoid self-resonance at high frequencies. A good magnetic core tends to be a poor heat conductor (low thermal conductivity) and be readily heated (high specific heat), and is therefore susceptible to localized heating. Since the heating is localized near the high current secondary winding and since the core tends to be brittle, it cracks or shatters at high RF power levels (e.g., 5 kilowatts of continuous power).

Figure 70:
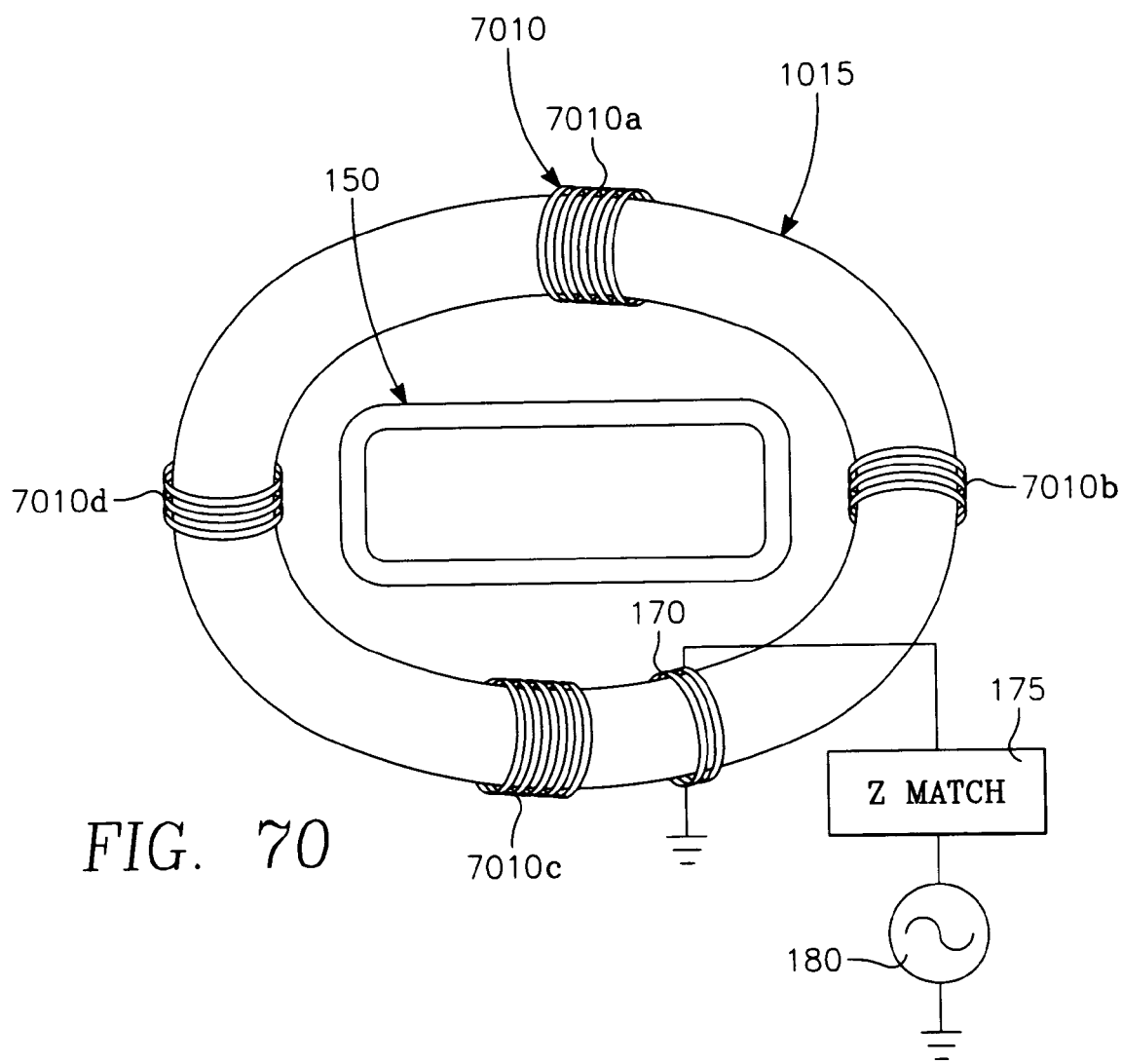
FIGS. 70, 71A and 71B illustrate an RF power applicator having distributed inductances.

This problem is solved in the manner illustrated in FIGS. 70 through 74 by more uniformly distributing RF magnetic flux density around the annular core. FIG. 70 illustrates a typical one of the magnetic cores 1015 of FIG. 17A. The core 1015 is formed of a high magnetic permeability material such as ferrite. The primary winding 170 consists of about two turns of a thin copper band optionally connected through an impedance match device 175 to the RF generator 180. High current flow required for high magnetic flux in the core 1015 occurs in a resonant secondary winding 7010 around the core 1015. Current flow in the secondary winding 7010 is about an order of magnitude greater than current flow in the primary winding. In order to uniformly distribute magnetic flux around the core 1015, the secondary winding 7010 is divided into plural sections 7010*a*, 7010*b*, 7010*c*, etc., that are evenly distributed around the annular core 1015. The secondary winding sections 7010*a*, etc., are connected in parallel. Such parallel connection is facilitated as illustrated in FIGS. 71A and 71B by a pair of circular copper buses 7110, 7120 extending around opposite sides of the magnetic core 1015. Opposing ends of each of the secondary windings 7010*a*, 7010*b*, etc., are connected to opposite ones of the two copper buses 7110, 7120. The copper buses 7110, 7120 are sufficiently thick to provide an extremely high conductance and low inductance, so that the azimuthal location of any particular one of the secondary winding sections 7010*a*, 7010*b*, etc. makes little or no difference, so that all secondary winding sections function as if they were equidistant from the primary winding. In this way, magnetic coupling is uniformly distributed around the entire core 1015.

Because of the uniform distribution of magnetic flux achieved by the foregoing features, the primary winding may be placed at any suitable location, typically near a selected one of the plural distributed secondary winding sections 7110*a*, 7110*b*, 7110*c*, etc. However, in one implementation, the primary winding is wrapped around or on a selected one of the plural distributed secondary winding sections 7110*a*, 7110*b*, 7110*c*, etc.

Figure 72:
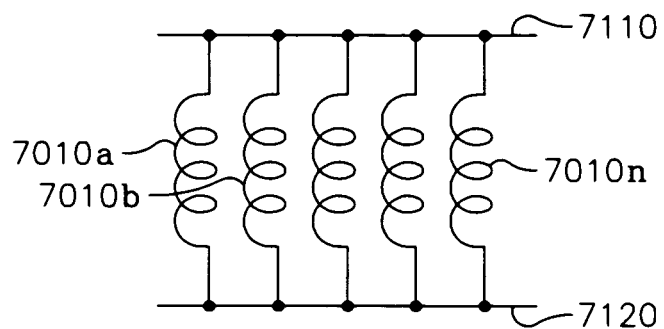
FIG. 72 illustrates distributed inductances corresponding to the FIGS. 70, 71A and 71B.
Figure 73:
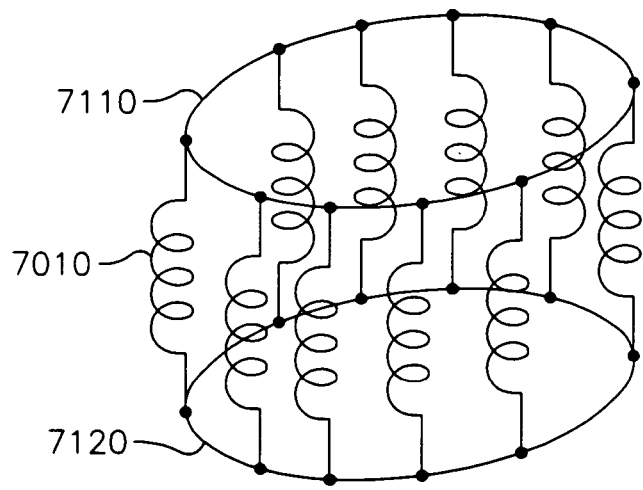
FIG. 73 illustrates a circular arrangement of the distributed inductances of FIG. 72.
Figure 74:
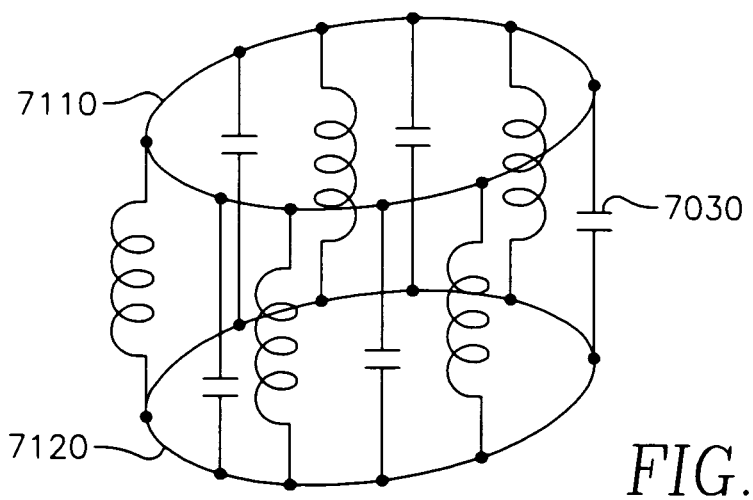
FIG. 74 illustrates distributed inductances and capacitances in an arrangement corresponding to that of FIGS. 71A and 71B.

FIG. 72 is a representation of the distributed parallel inductances formed by the parallel secondary winding sections 7010*a*, 7010*b*, etc., and FIG. 73 shows the circular topology of these distributed inductances. In order to provide resonance at the frequency of the RF generator 180, plural distributed capacitors 7130 are connected in parallel across the two copper buses 7110, 7120. The plural capacitors 7030 are distributed azimuthally around the magnetic core 1015. Each capacitor 7030 in one implementation was about 100 picoFarads. The equivalent circuit of the distributed inductances and capacitances associated with the secondary winding 7010 is illustrated in FIG. 24.

Figure 71A:
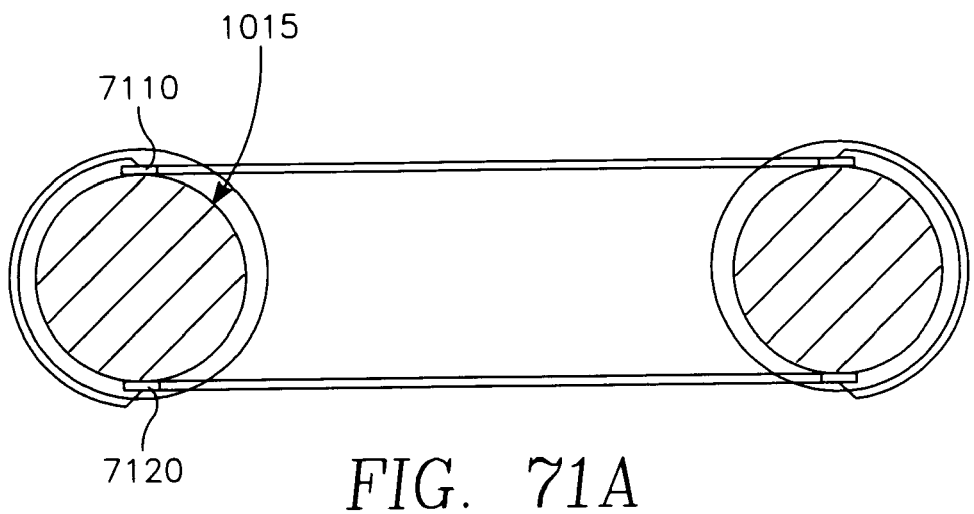
Figure 71B:
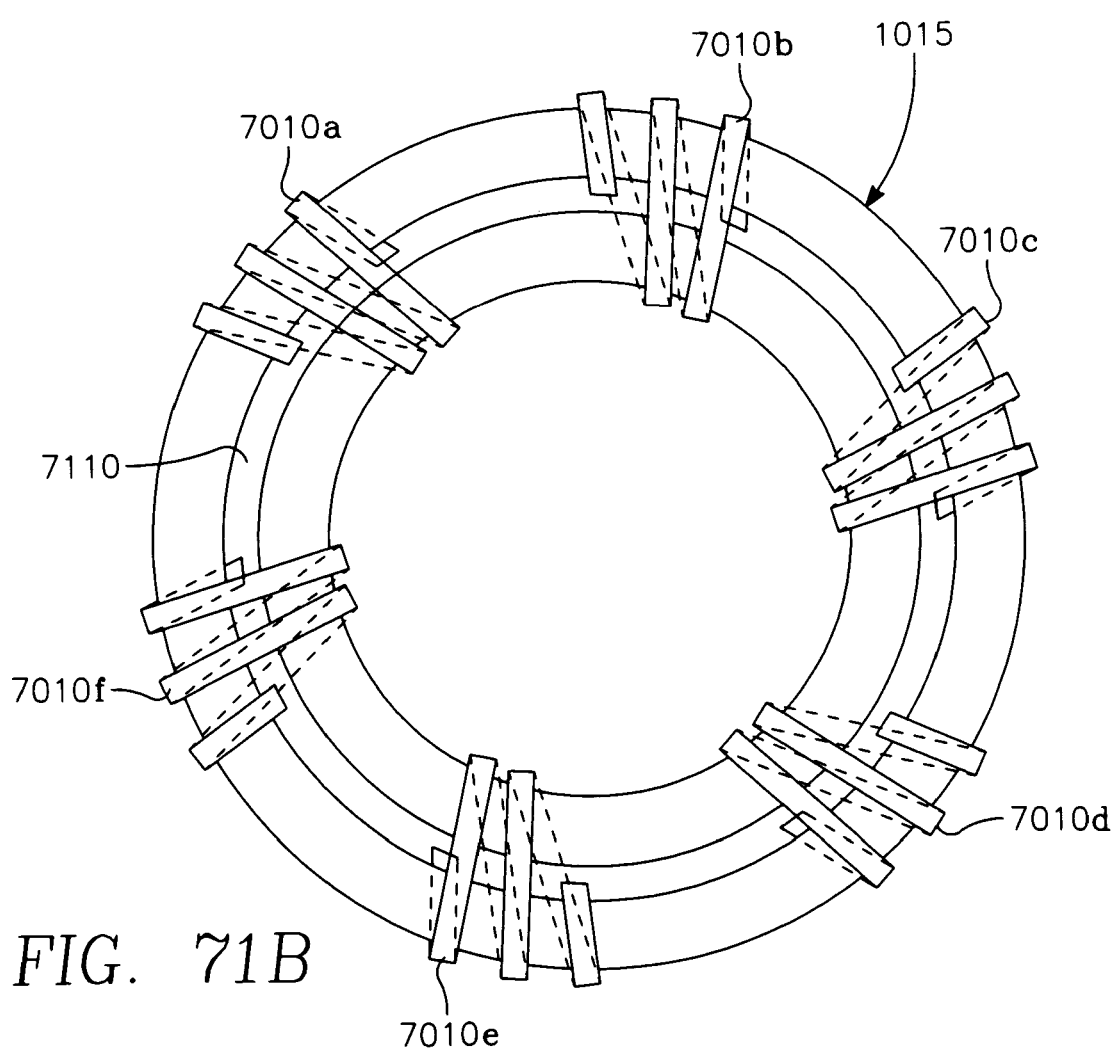

Referring to FIG. 71B, the secondary winding sections 7010*a*, 7010*b*, etc., can have the same number of turns. In the case of FIG. 71B, there are six secondary winding sections 7010*a*-7010*f*, each section having three windings. The skilled worker can readily select the number of secondary winding sections, the number of windings in each section and the capacitance of the distributed capacitors 7030 to achieve resonance at the frequency of the RF generator 180. The copper band stock used to form the primary and secondary windings around the core 1015 can be, for example, 0.5 inch wide and 0.020 inch thick copper stripping. The two copper buses 7110, 7120 are very thick (e.g., from 0.125 inch to 0.25 inch thick) and wide (e.g., 0.5 inch wide) so that they form extremely low resistance, low inductance current paths. The core 1015 may consist of a pair of stacked 1 inch thick ferrite cores with a 10 inch outer diameter and an 8 inch inner diameter. Preferably, the ferrite core 1015 has a magnetic permeability $\mu=40$. The foregoing details are provided by way of example only, and any or all of the foregoing values may require modification for different applications (e.g., where, for example, the frequency of the RF generator is modified).

We have found that the feature of distributed inductances illustrated in FIGS. 71A and 71B solves the problem of breakage of the magnetic core experienced at sustained high RF power levels (e.g., 5 kilowatts).

Figure 75:
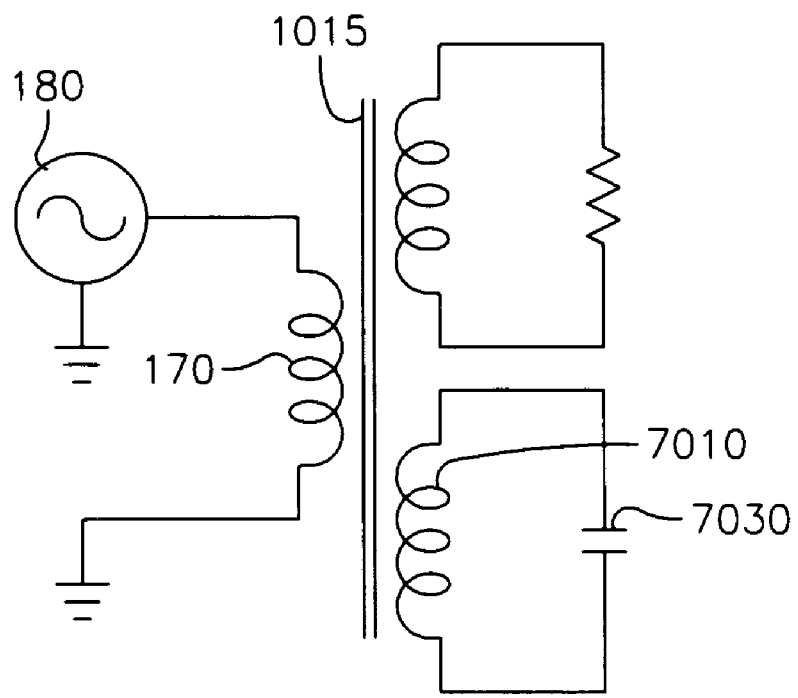
FIGS. 75 and 76 are schematic diagrams illustrating different ways of inductively coupling RF power using the magnetic core of FIGS. 71A and 71B.

FIG. 75 illustrates the equivalent circuit formed by the core and windings of FIGS. 71A and 71B. In addition to the primary and secondary windings 170 and 7010 around the core 1015, FIG. 75 illustrates the equivalent inductive and capacitive load presented by the plasma inductively coupled to the core 1015. The case of FIGS. 70-75 is a transformer coupled circuit. The purpose of the secondary winding 7010 is to provide high electric current flow around the magnetic core 1015 for enhanced power coupling via the core. The secondary winding 7010 achieves this by resonating at the frequency of the RF generator. Thus, the high current flow and power coupling via the magnetic core 1015 occurs in the secondary winding 7010, so that virtually all the heating of the core 1015 occurs at the secondary winding 7010. By thus distributing the secondary winding 7010 around the entire circumference of the core 1015, this heating is similarly distributed around the core to avoid localized heating and thereby prevent shattering the core at high RF power levels.

Figure 76:
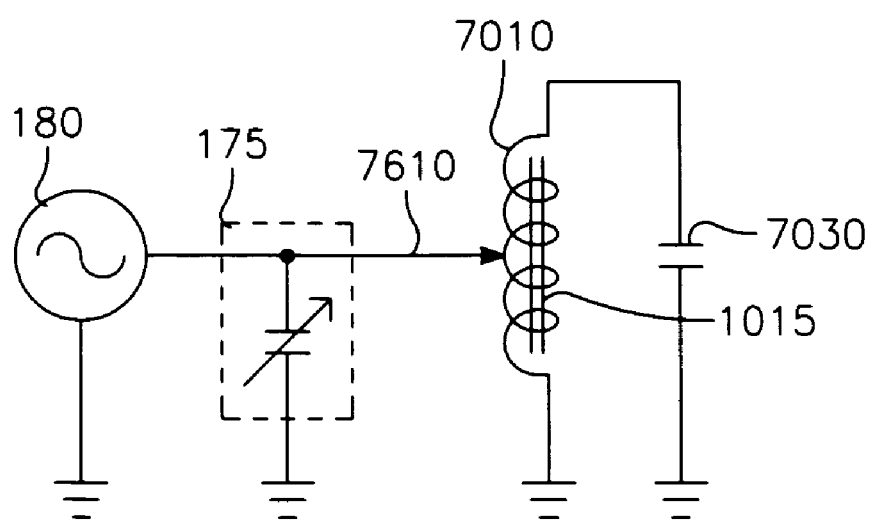

The distributed winding feature of FIGS. 71A and 71B can be used to implement other circuit topologies, such as the auto transformer circuit of FIG. 76. In the auto transformer circuit of FIG. 76, the winding 7010 around the core 1015 is distributed (in the manner discussed above with reference to FIGS. 70-74) and has a tap 7610 connected through the impedance match circuit 175 to the RF generator 180. The distributed capacitors 7030 provide resonance (in the manner discussed above). As in FIG. 70, the core 7010 is wrapped around the reentrant tube 150 so that power is inductively coupled into the interior of the tube 150. The circuit topologies of FIGS. 75 and 76 are only two examples of the various topologies that can employ distributed windings around the magnetic core 1015.

In one implementation, the impedance match circuits 175a, 175b employed frequency tuning in which the frequency of each RF generator 180a, 180b is controlled in a feedback circuit in such a way as to minimize reflected power and maximize forward or delivered power. In such an implementation, the frequency tuning ranges of each of the generators 180a, 180b are exclusive, so that their frequencies always differ, typically on the order of a 0.2 to 2 MHz difference. Moreover, their phase relationship is random. This frequency difference can improve stability. For example, instabilities can arise if the same frequency is used to excite plasma in both of the orthogonal tubes 150-1, 150-2. Such instabilities can cause the plasma current to flow through only three of the four ports 155, 160, for example. This instability may be related to the phase difference between the torroidal plasma currents in the tubes. One factor facilitating plasma stability is isolation between the two plasma currents of the pair of orthogonal tubes 150-1, 150-2. This isolation is provided mainly by the plasma sheaths of the two plasma currents. The D.C. break or gap 152 of each of the reentrant tubes 150-1, 150-2 also enhances plasma stability.

Figure 77:
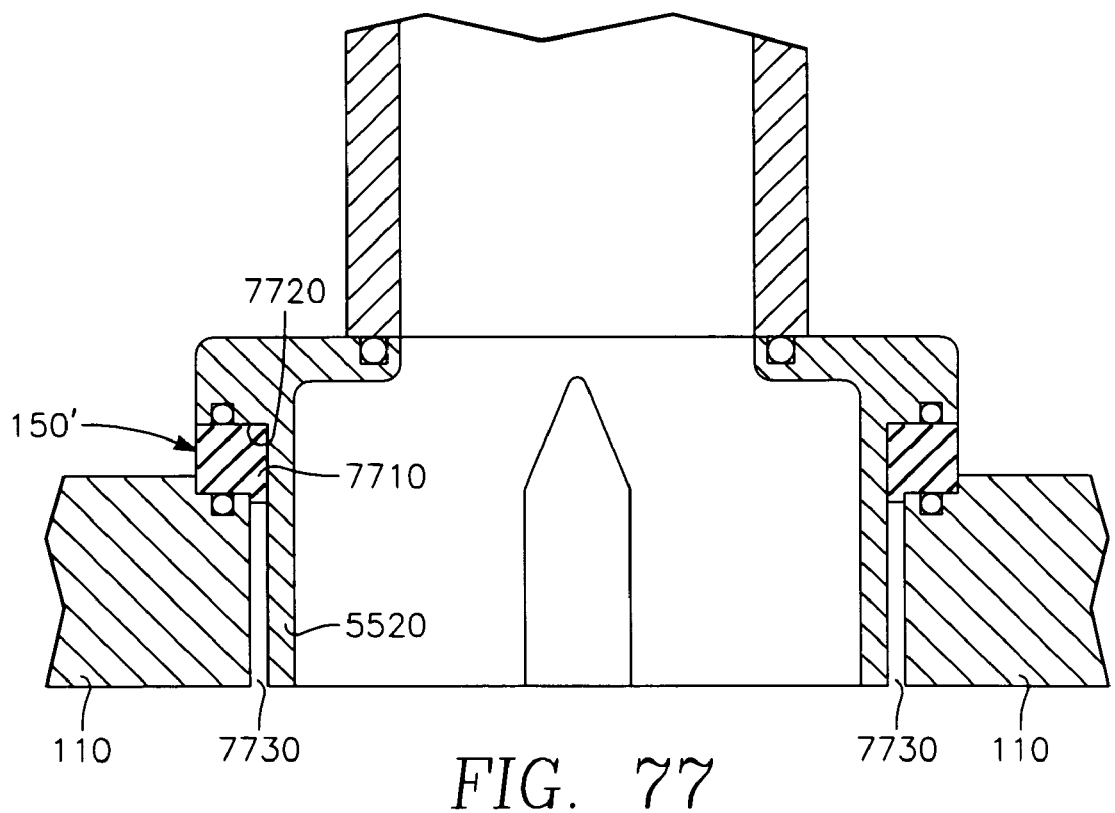
FIG. 77 illustrates the use of an insulator layer to electrically isolate the termination sections and torroidal tubes of FIG. 44.

While the D.C. break or gap 152 in each of the orthogonal tubes is illustrated in FIG. 44 as being well-above the chamber ceiling 110, it may in fact be very close to or adjacent the ceiling. Such an arrangement is employed in the implementation of FIG. 77, in which the case of FIG. 55A is modified so that the termination section 5520 electrically floats so that its potential follows oscillations of the plasma potential. This solves a problem that can be referred to as a "hollow cathode" effect near each of the ports 155, 160 that creates non-uniform plasma distribution. This effect may be referred to as an electron multiplication cavity effect. By permitting all of the conductive material near a port to follow the plasma potential oscillations, the hollow cathode effects are reduced or substantially eliminated. This is achieved by electrically isolating the termination section 5520 from the grounded chamber body by locating a D.C. break or gap 152' at the juncture between the reentrant tube termination section 5520 and the top or external surface of the ceiling 110. (The gap 152' may be in addition to or in lieu of the gap 152 of FIG. 44.) The gap 152' is filled with an insulative annular ring 7710, and the termination section 5520 of FIG. 77 has a shoulder 7720 resting on the top of the insulative ring 7710. Moreover, there is an annular vacuum gap 7730 of about 0.3 to 3 mm width between the ceiling 110 and the termination section 5520. In one implementation, the tube 150 and the termination section 5520 are integrally formed together as a single piece. The termination section 5520 is preferably formed of metal so that internal coolant passages may be formed therein.

Figure 78:
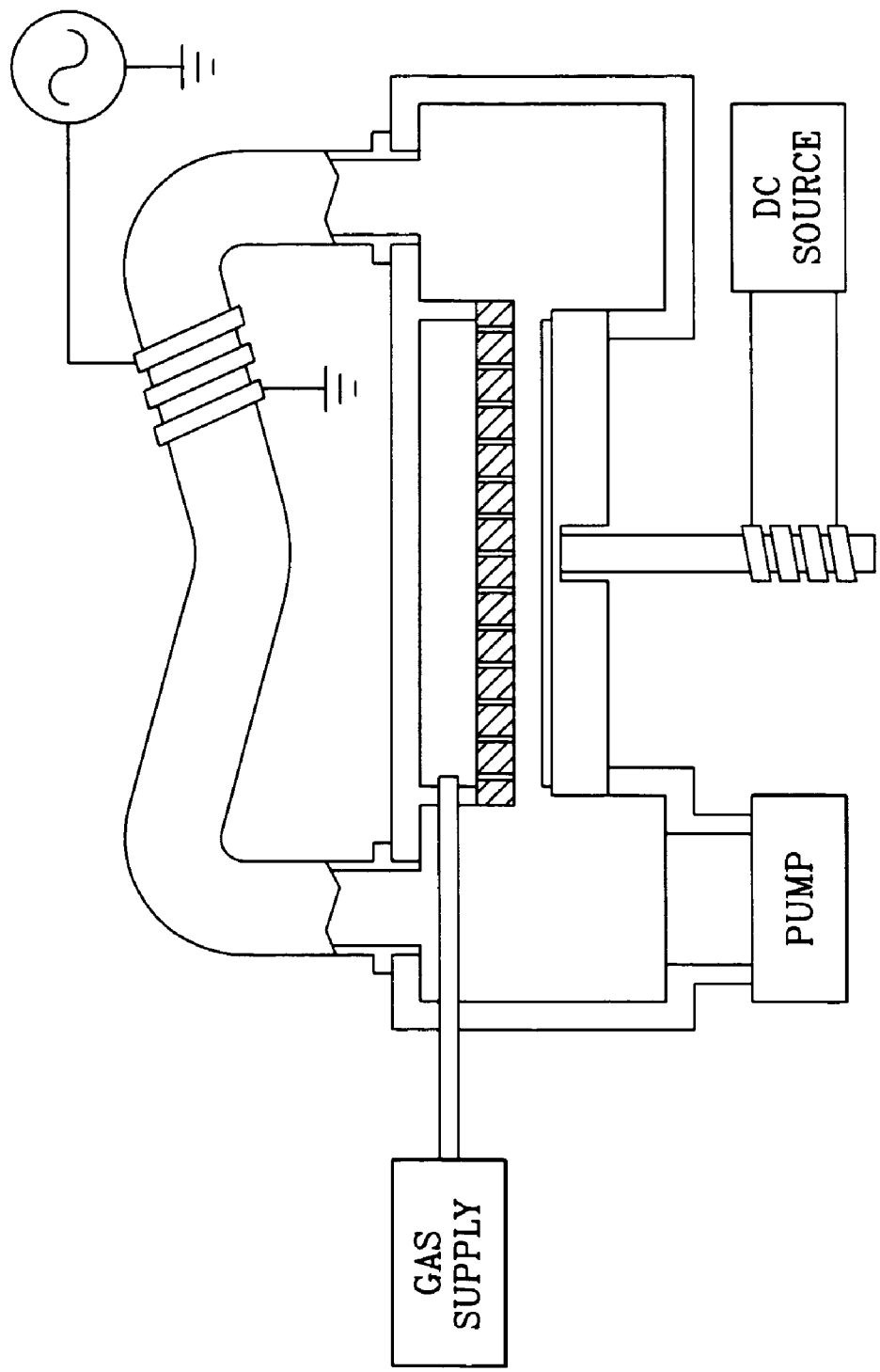
FIG. 78 illustrates how the uniformity control magnet or magnetic pole may be placed under the wafer support pedestal.

FIGS. 44-77 illustrate cases in which the uniformity control magnet is above the processing region. FIG. 78 illustrates that the magnet pole 4440 may be placed below the processing region, or under the wafer support pedestal 115.

Working Examples:

An etch process was conducted on blanket oxide wafers at a chamber pressure of 40 mT, 4800 watts of 13.56 MHz RF bias power on the wafer pedestal and 1800 Watts of RF source power applied to each reentrant tube 150 at 11.5 MHz and 12.5 MHz, respectively. The magnetic field produced by the electromagnet assembly 4430 was set at the following levels in successive steps: (a) zero, (b) 6 Gauss and (c) 18 Gauss (where the more easily measured axial magnetic field component at the wafer center was observed rather than the more relevant radial component). The observed etch rate distribution on the wafer surface was measured, respectively, as (a) center low with a standard deviation of about 2% at zero Gauss, (b) slightly center fast with a standard deviation of about 1.2% at 6 Gauss, and (c) center fast with a standard deviation of 1.4%. These examples demonstrate the ability to provide nearly ideal compensation (step b) and the power to overcompensate (step c).

To test the effective pressure range, the chamber pressure was increased to 160 mT and the electromagnet's field was increased in three steps from (a) zero Gauss, to (b) 28 Gauss and finally to (c) 35 Gauss (where the more easily measured axial magnetic field component at the wafer center was observed rather than the more relevant radial component). The observed etch rate was, respectively, (a) center slow with a standard deviation of about 2.4%, center fast with a standard deviation of about 2.9% and center fast with a standard deviation of about 3.3%. Obviously, the step from zero to 28 Gauss resulted in overcompensation, so that a somewhat smaller magnetic field would have been ideal, while the entire exercise demonstrated the ability of the electromagnet assembly 4430 to easily handle very high chamber pressure ranges. This test was severe because at higher chamber pressures the etch rate distribution tends to be more severely center low while, at the same time, the decreased collision distance or mean free path length of the higher chamber pressure makes it more difficult for a given magnetic field to effect plasma electrons or ions. This is because the magnetic field can have no effect at all unless the corresponding Larmour radius of the plasma electrons or ions (determined by the strength of the magnetic field and the mass of the electron or ion) does not exceed the plasma collision distance. As the collision distance decreases with increasing pressure, the magnetic field strength must be increased to reduce the Larmour radius proportionately. The foregoing examples demonstrate the power of the electromagnet assembly to generate a sufficiently strong magnetic field to meet the requirement of a small Larmour radius.

Another set of etch processes were carried out on oxide wafers patterned with photoresist at 35 mT under similar conditions, and the current applied to the electromagnet assembly 4430 was increased in five steps from (a) 0 amperes, (b) 5 amperes, (c) 6 amperes, (d) 7 amperes and (e) 8 amperes. (In this test, a current of 5 amperes produces about 6 gauss measured axial magnetic field component at the wafer center.) At each step, the etch depths of high aspect ratio contact openings were measured at both the wafer center and the wafer periphery to test center-to-edge etch rate uniformity control. The measured center-to-edge etch rate differences were, respectively, (a) 13.9% center low, (b) 3.3% center low, (c) 0.3% center low, (d) 2.6% center high and (e) 16.3% center high. From the foregoing, it is seen that the ideal electromagnet current for best center-to-edge uniformity is readily ascertained and in this case was about 6 amperes.

A set of etch processes were carried out on blanket oxide wafers to test the efficacy of the dual zone gas distribution plate 210 of FIG. 44. In a first step, the gas flow rates through the two zones were equal, in a second step the inner zone had a gas flow rate four times that of the outer zone and in a third step the outer zone had a gas flow rate four times that of the inner zone. In each of these steps, no current was applied to the electromagnet assembly 4430 so that the measurements taken would reflect only the effect of the dual zone gas distribution plate 210. With gas flow rates of the two zones equal in the first step, the etch rate distribution was slightly center high with a standard deviation of about 2.3%. With the inner zone gas flow rate at four times that of the outer zone, the etch rate distribution was center fast with a standard deviation of about 4%. With the outer zone gas flow rate at four times that of the inner zone, the etch rate distribution was center slow with a standard deviation of about 3.4%. This showed that the dual zone differential gas flow rate feature of the gas distribution plate 210 can be used to make some correction to the etch rate distribution. However, the gas flow rate control directly affects neutral species distribution only, since none of the incoming gas is (or should be) ionized. On the other hand, etch rate is directly affected by plasma ion distribution and is not as strongly affected by neutral distribution, at least not directly. Therefore, the etch rate distribution control afforded by the dual zone gas distribution plate, while exhibiting some effect, is necessarily less effective than the magnetic confinement of the electromagnet assembly 4430 which directly affects plasma electrons and thus ions.

The dependency of the electromagnet assembly 4430 upon the reentrant toroidal plasma current was explored. First a series of etch processes was carried out on blanket oxide wafers with no power applied to the toroidal plasma source, the only power being 3 kiloWatts of RF bias power applied to the wafer pedestal. The electromagnet coil current was increased in four steps of (a) zero amperes, (b) 4 amperes, (c) 6 amperes and (d) 10 amperes. The etch rate distribution was observed in the foregoing steps as (a) center high with a standard deviation of 2.87%, (b) center high with a standard deviation of 3.27%, (c) center high with a standard deviation of 2.93% and (d) center high with a standard deviation of about 4%. Thus, only a small improvement in uniformity was realized for a relatively high D.C. current applied to the electromagnet assembly 4430. Next, a series of etch processes was carried out under similar conditions, except that 1800 Watts was applied to each of the orthogonal tubes 150-1, 150-2. The electromagnet coil current was increased in six steps of (a) zero amperes, (b) 2 amperes, (c) 3 amperes, (d) 4 amperes, (e) 5 amperes and (f) 6 amperes. The etch rate distribution was, respectively, (a) center low with a standard deviation of 1.2%, (b) center low with a standard deviation of 1.56%, (c) center high with a standard deviation of 1.73%, (d) center high with a standard deviation of 2.2%, (e) center high with a standard deviation of 2.85% and (f) center high with a standard deviation of 4.25%. Obviously the most uniform distribution lies somewhere between 2 and 3 amperes where the transition from center low to center high was made. Far greater changes in plasma distribution were made using much smaller coil current with much smaller changes in coil current. Thus, the presence of the reentrant toroidal plasma currents appears to enhance the effects of the magnetic field of the electromagnet assembly 4430. Such enhancement may extend from the increase in bias power that is possible when the toroidal plasma source is activated. In its absence, the plasma is less conductive and the plasma sheath is much thicker, so that the bias RF power applied to the wafer pedestal must necessarily be limited. When the toroidal plasma source is activated (e.g., at 1800 Watts for each of the two orthogonal tubes 150-1, 150-2) the plasma is more conductive, the plasma sheath is thinner and more bias power can be applied. As stated before herein, the effect of the D.C. magnetic field may be dependent upon the interaction between the D.C. magnetic field and the electric field of the plasma sheath, which in turn depends upon the RF bias power applied to the pedestal. Furthermore, the reentrant toroidal plasma currents may be attracted to the central plasma region due to the aforementioned postulated interaction between D.C. magnetic field and the electric field of the plasma sheath, further enhancing the plasma ion density in that region.

The effects of the port-to-port separation distance S of FIG. 55A were explored in another series of etch processes on blanket oxide wafers. The same etch process was carried out in reactors having separation distances S of 16.5 inches and 20.5 inches respectively. The etch rate in the one with smaller separation distance was 31% greater than in the one with the greater separation distance (i.e., 6993 vs 5332 angstroms/minute) with 1800 Watts applied to each one of the orthogonal tubes 150-1, 150-2 with zero current applied to the electromagnet assembly 4300 in each reactor.

Figure 55B:
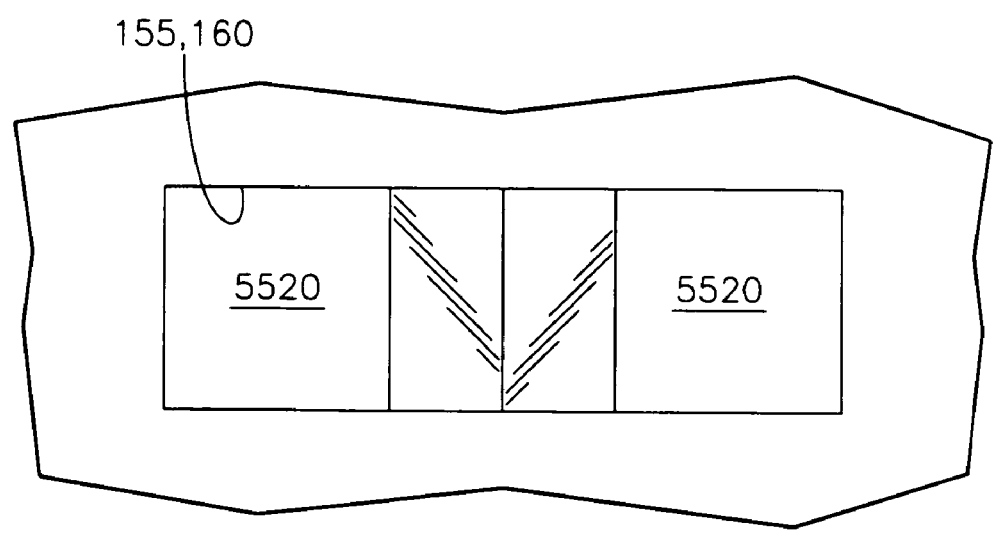
Figure 56A:
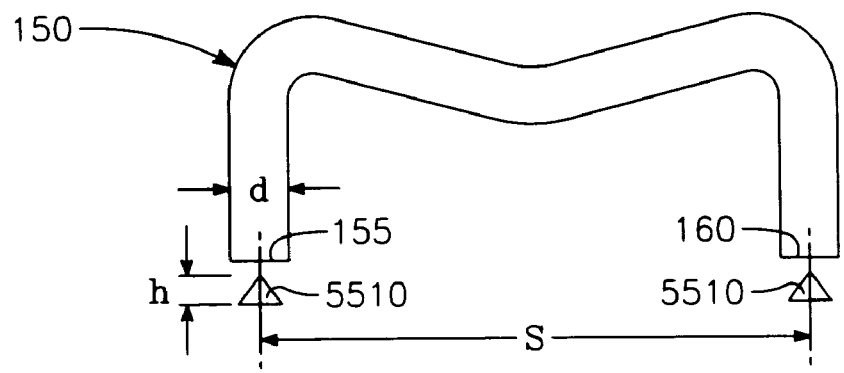
FIGS. 56A, 56B and 56C illustrate use of splitters where the torroidal plasma current enters the chamber vertically.
Figure 56B:
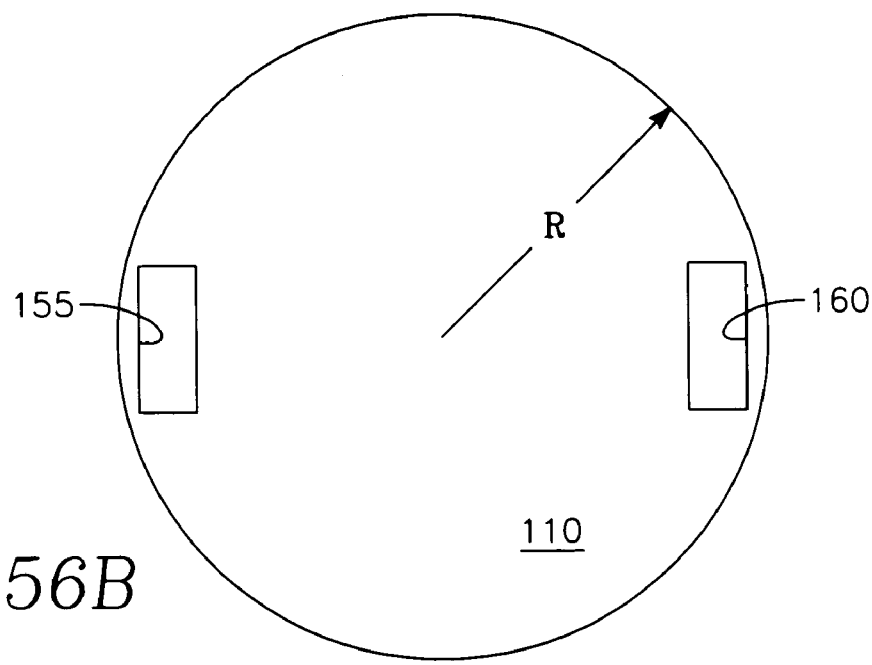
Figure 56C:
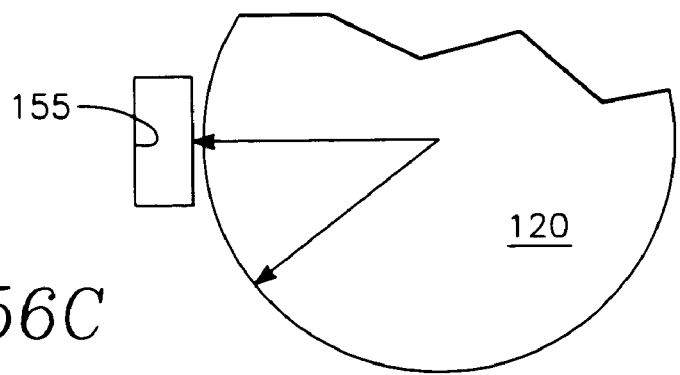

The effects of the port-to-port separation distance S of FIGS. 55-56 were also explored in another series of etch processes on oxide wafers patterned with photoresist. With 3.7 amperes applied to the electromagnet assembly 4300 having the smaller source (16.5 inch) separation distance S, the etch rate was 10450 angstroms/minute vs 7858 angstroms/minute using the larger source (20.5 inch) separation distance S. The effect of increasing power in the reactor having the greater (20.5 inches) separation distance S was explored. Specifically, the same etch process was carried out in that reactor with source power applied to each of the orthogonal tubes 150-1, 150-2 being 1800 Watts and then at 2700 Watts. The etch rate increased proportionately very little, i.e., from 7858 angstroms/minute to 8520 angstroms/minute. Thus, the effect of the port-to-port separation distance S on plasma ion density and etch rate cannot readily be compensated by changing plasma source power. This illustrates the importance of cases such as the case of FIGS. 65A, 65B and 66 in which a relatively short port-to-port separation distance S is accommodated while in effect lengthening the distance over which the plasma current is permitted to equilibrate after being split by the triangular splitters 5440.

The pole piece 4440 has been disclosed a being either a permanent magnet or the core of an electromagnet surrounded by a coil 4450. However, the pole piece 4440 may be eliminated, leaving only the coil 4450 as an air coil inductor that produces a magnetic field having a similar orientation to that produced by the pole piece 4440. The air coil inductor 4450 may thus replace the pole piece 4440. Therefore, in more general terms, what is required to produce the requisite radial magnetic field is an elongate pole-defining member which may be either the pole piece 4440 or an air coil inductor 4450 without the pole piece 4440 or the combination of the two. The diameter of the pole-defining member is relatively narrow to appropriately confine the peak of the radial magnetic field.

Figure 79:
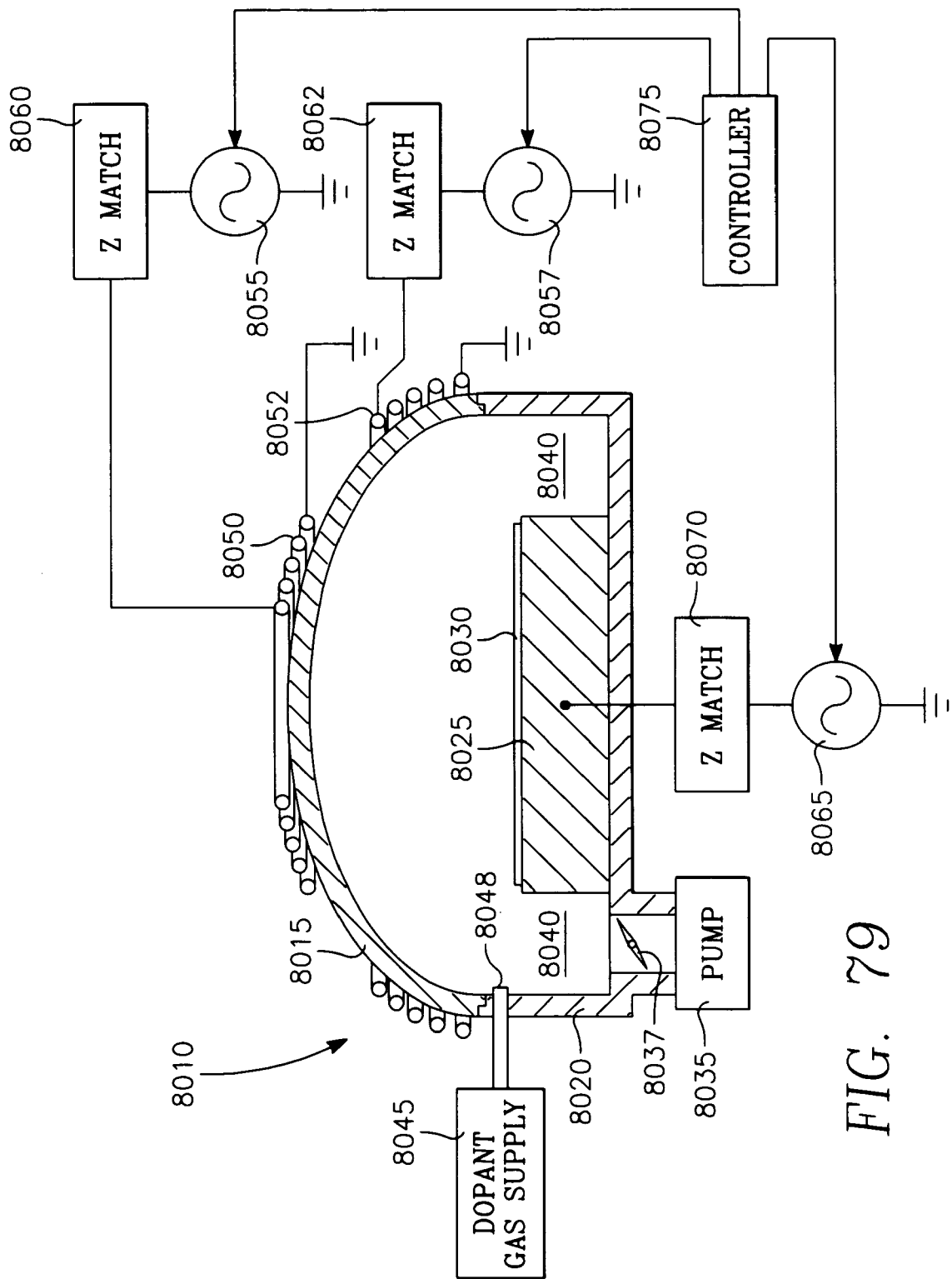
FIG. 79 depicts an inductively coupled plasma immersion ion implantation reactor having an RF bias power applicator.

Plasma Immersion Ion Implantation:

Referring to FIG. 79, a plasma immersion ion implantation reactor in accordance with one aspect of the invention includes a vacuum chamber 8010 having a ceiling 8015 supported on an annular sidewall 8020. A wafer support pedestal 8025 supports a semiconductor (e.g., silicon) wafer or workpiece 8030. A vacuum pump 8035 is coupled to a pumping annulus 8040 defined between the pedestal 8025 and the sidewall 8020. A butterfly valve 8037 regulates gas flow into the intake of the pump 8035 and controls the chamber pressure. A gas supply 8045 furnishes process gas containing a dopant impurity into the chamber 8010 via a system of gas injection ports that includes the injection port 8048 shown in the drawing. For example, if the wafer 8030 is a crystalline silicon wafer a portion of which is to be implanted with a p-type conductivity dopant impurity, then the gas supply 8045 may furnish $BF_3$ and/or $B_2H_6$ gas into the chamber 8010, where boron is the dopant impurity species. Generally, the dopant-containing gas is a chemical consisting of the dopant impurity, such as boron (a p-type conductivity impurity in silicon) or phosphorus (an n-type conductivity impurity in silicon) and a volatile species such as fluorine and/or hydrogen. Thus, fluorides and/or hydrides of boron, phosphorous or other dopant species such as arsenic, antimony, etc., can be dopant gases. In a plasma containing a fluoride and/or hydride of a dopant gas such as $BF_3$, there is a distribution of various ion species, such as $BF_2+$, BF+, B+, F+, F− and others (such as inert additives). All types of species may be accelerated across the sheath and may implant into the wafer surface. The dopant atoms (e.g., boron or phosphorous atoms) typically dissociate from the volatile species atoms (e.g., fluorine or hydrogen atoms) upon impact with the wafer at sufficiently high energy. Although both the dopant ions and volatile species ions are accelerated into the wafer surface, some portion of the volatile species atoms tend to leave the wafer during the annealing process that follows the ion implantation step, leaving the dopant atoms implanted in the wafer.

A plasma is generated from the dopant-containing gas within the chamber 8010 by an inductive RF power applicator including an overhead coil antenna 8050 coupled to an RF plasma source power generator 8055 through an impedance match circuit 8060. An RF bias voltage is applied to the wafer 8030 by an RF plasma bias power generator 8065 coupled to the wafer support pedestal 8025 through an impedance match circuit 8070. A radially outer coil antenna 8052 may be driven independently by a second RF plasma source power generator 8057 through an impedance match circuit 8062.

The RF bias voltage on the wafer 8030 accelerates ions from the plasma across the plasma sheath and into the wafer surface, where they are lodged in generally interstitial sites in the wafer crystal structure. The ion energy, ion mass, ion flux density and total dose may be sufficient to amorphize (damage) the structure of the wafer. The mass and kinetic energy of the dopant (e.g., boron) ions at the wafer surface and the structure of the surface itself determine the depth of the dopant ions below the wafer surface. This is controlled by the magnitude of the RF bias voltage applied to the wafer support pedestal 8025. After the ion implantation process is carried out, the wafer is subjected to an anneal process that causes the implanted dopant atoms to move into substitutional atomic sites in the wafer crystal. The substrate surface may not be crystalline if it has been pre-amorphized prior to the plasma immersion ion implant process, or if the ion energy, ion mass, ion flux density and total dose of plasma immersion ion implant process itself is sufficient to amorphize the structure of the wafer. In such a case, the anneal process causes the amorphous (damaged) layer to recrystallize with the incorporation and activation of implanted dopant. The conductance of the implanted region of the semiconductor is determined by the junction depth and the volume concentration of the activated implanted dopant species after the subsequent anneal process. If, for example, a p-type conductivity dopant such as boron is implanted into a silicon crystal which has been previously doped with an n-type dopant impurity, then a p-n junction is formed along the boundaries of the newly implanted p-type conductivity region, the depth of the p-n junction being the activated implanted depth of the p-type dopant impurities after anneal. The junction depth is determined by the bias voltage on the wafer (and by the anneal process), which is controlled by the power level of the RF plasma bias power generator 8065. The dopant concentration in the implanted region is determined by the dopant ion flux ("dose") at the wafer surface during implantation and the duration of the ion flux. The dopant ion flux is determined by the magnitude of the RF power radiated by the inductive RF power applicator 8050, which is controlled by the RF plasma source power generator 8055. This arrangement enables independent control of the time of implant, the conductivity of the implanted region and the junction depth. Generally, the control parameters such as the power output levels of the bias power RF generator 8065 and the source power RF generator 8055 are chosen to minimize the implant time while meeting the target values for conductivity and junction depth. For more direct control of ion energy, the bias generator may have "voltage" rather than "power" as its output control variable.

An advantage of the inductive RF plasma source power applicator 8050 is that the ion flux (the dopant dose rate) can be increased by increasing the power level of the RF source power generator 8055 without a concomitant increase in plasma potential. The bias voltage level is controlled by the RF bias power generator at a pre-selected value (selected for the desired implant depth) while the inductive RF source power is increased to increase the ion flux (the dopant dose rate) without significantly increasing the plasma potential. This feature minimizes contamination due to sputtering or etching of chamber surfaces. It further reduces the consumption of consumable components within the chamber that wear out over time due to plasma sputtering. Since the plasma potential is not necessarily increased with ion flux, the minimum implant energy is not limited (increased), thereby allowing the user to select a shallower junction depth than would otherwise have been possible. In contrast, it will be recalled that the microwave ECR plasma source was characterized by a relatively high minimum plasma potential, which therefore limited the minimum implant energy and therefore limited the minimum junction depth.

Figure 80A:
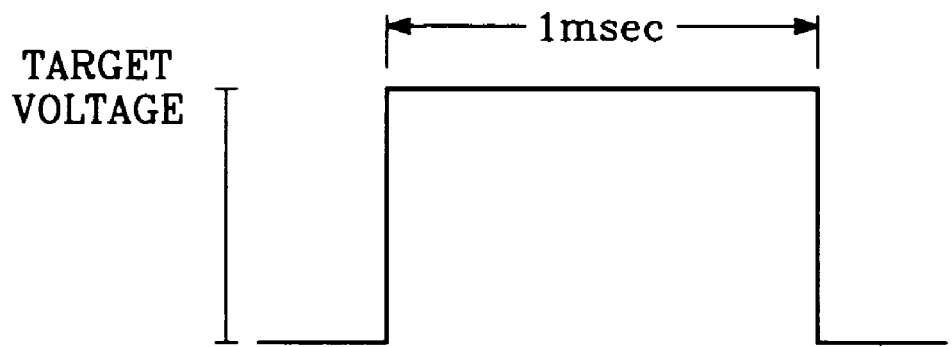
FIGS. 80A, 80B and 80C illustrate, respectively, an applied pulsed D.C. bias voltage, the corresponding sheath voltage behavior and an applied RF bias voltage.
Figure 80B:
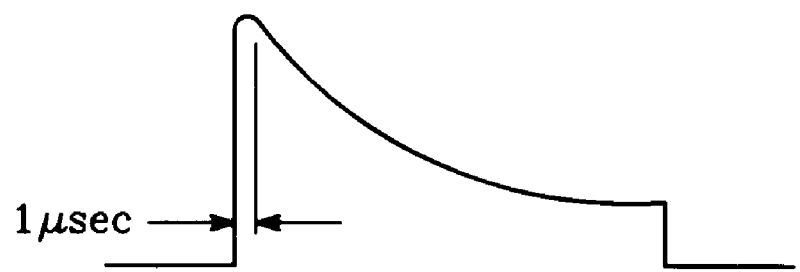
Figure 80C:
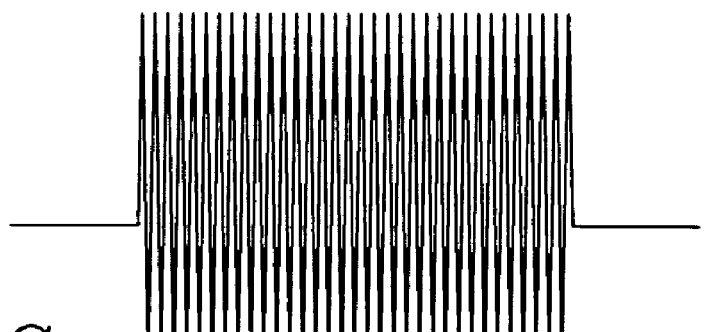

An advantage of applying an RF bias voltage to the wafer (instead of a D.C. bias voltage) is that it is far more efficient (and therefore more productive) for ion implantation, provided the RF bias frequency is suitably chosen. This is illustrated in FIGS. 80A, 80B and 80C. FIG. 80A illustrates a one-millisecond D.C. pulse applied to the wafer in conventional practice, while FIG. 80B illustrates the resulting ion energy at the wafer surface. The D.C. pulse voltage of FIG. 80A is near the target bias voltage at which ions become substitutional upon annealing at the desired implant junction depth. FIG. 80B shows how the ion energy decays from the initial value corresponding to the voltage of the pulse of FIG. 80A, due to resistive-capacitive effects at the wafer surface. As a result, only about the first micro-second (or less) of the one-millisecond D.C. pulse of FIG. 80A is actually useful, because it is only this micro-second portion of the pulse that produces ion energies capable of implanting ions that become substitutional (during annealing) at the desired junction depth. The initial (one microsecond) period of the D.C. pulse may be referred to as the RC time. During the remaining portion of the D.C. pulse, ions fail to attain sufficient energy to reach the desired depth or to become substitutional upon annealing, and may fail to penetrate the wafer surface so as to accumulate in a deposited film that resists further implantation. This problem cannot be solved by increasing the pulse voltage, since this would produce a large number of ions that would be implanted deeper than the desired junction depth. Thus, ions are implanted down to the desired junction depth during only about a tenth of a percent of the time. This increases the time required to reach the target implant density at the desired junction depth. The resulting spread in energy also reduces the abruptness of the junction. In contrast, each RF cycle in a 1 millisecond burst of a 1 MHz RF bias voltage illustrated in FIG. 80C has an RF cycle time not exceeding the so-called RC time of FIG. 80B. As a result, resistive-capacitive effects encountered with a pulsed D.C. bias voltage are generally avoided with an RF bias voltage of a sufficient frequency. Therefore, ions are implanted down to the desired junction depth during a far greater percentage of the time of the 1 MHz RF bias voltage of FIG. 80C. This reduces the amount of time required to reach a target implant density at the desired junction depth. Thus, the use of an RF bias voltage on the wafer results in far greater efficiency and productivity than a D.C. pulse voltage, depending upon the choice of RF frequency.

The frequency of the RF bias is chosen to satisfy the following criteria: The RF bias frequency must be sufficiently high to have a negligible voltage drop across the pedestal (cathode) dielectric layers) and minimize sensitivity to dielectric films on the backside or front side of the wafer and minimize sensitivity to chamber wall surface conditions or deposition of plasma by-products. Moreover, the frequency must be sufficiently high to have a cycle time not significantly exceeding the initial period (e.g., one micro-second) before resistive-capacitive (RC) effects reduce ion energy more than 2% below the target energy, as discussed immediately above. Furthermore, the RF bias frequency must be sufficiently high to couple across insulating capacitances such as films on the wafer surface, dielectric layers on the wafer support pedestal, coatings on the chamber walls, or deposited films on the chamber walls. (An advantage of RF coupling of the bias voltage to the wafer is that such coupling does not rely upon ohmic contact and is less affected by changes or variations in the surface conditions existing between the wafer and the support pedestal.) However, the RF bias frequency should be sufficiently low so as to not generate significant plasma sheath oscillations (leaving that task to the plasma source power applicator). More importantly, the RF bias frequency should be sufficiently low for the ions to respond to the oscillations of the electric field in the plasma sheath overlying the wafer surface. The considerations underlying this last requirement are now discussed with reference to FIGS. 81A through 81D.

Figure 81A:
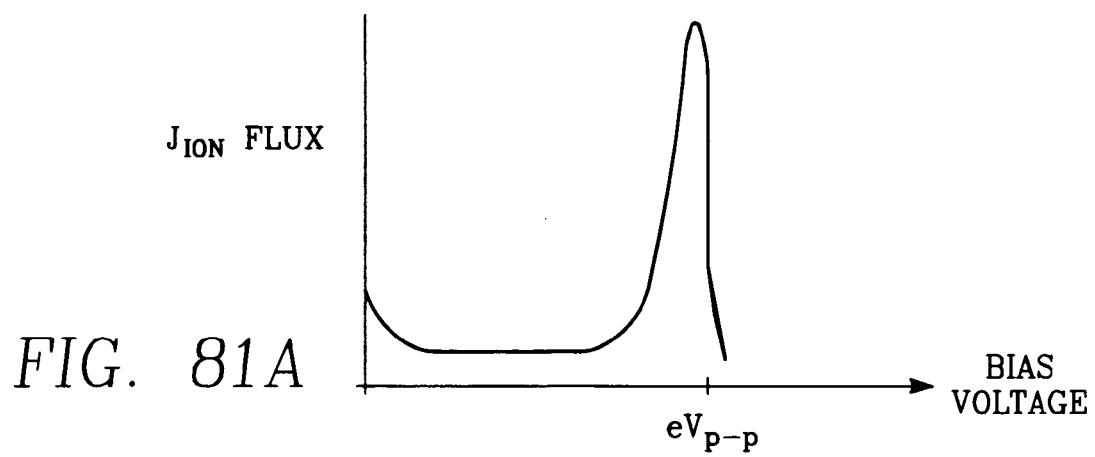
FIGS. 81A, 81B, 81C and 81D illustrate, respectively, an energy distribution of ion flux, a cycle of applied RF bias voltage, ion saturation current as a function of D.C. bias voltage, and energy distribution of ion flux for different frequencies of RF bias voltage.
Figure 81B:
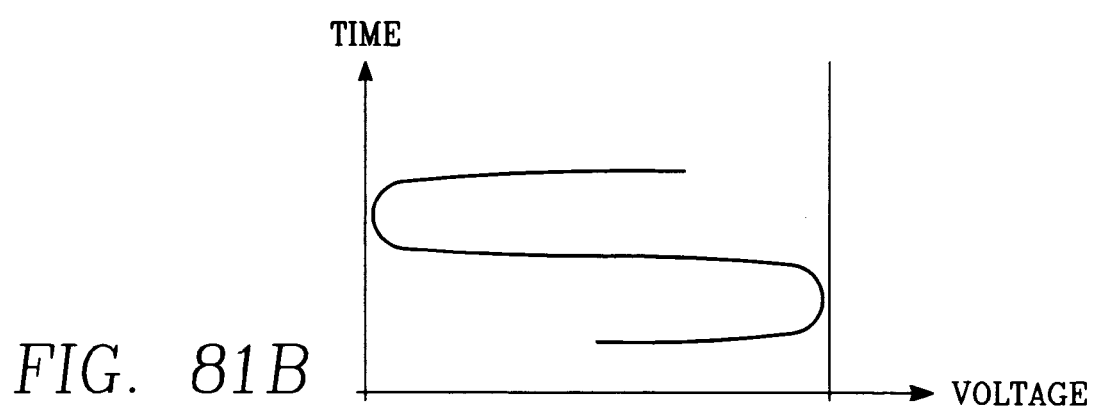
Figure 81C:
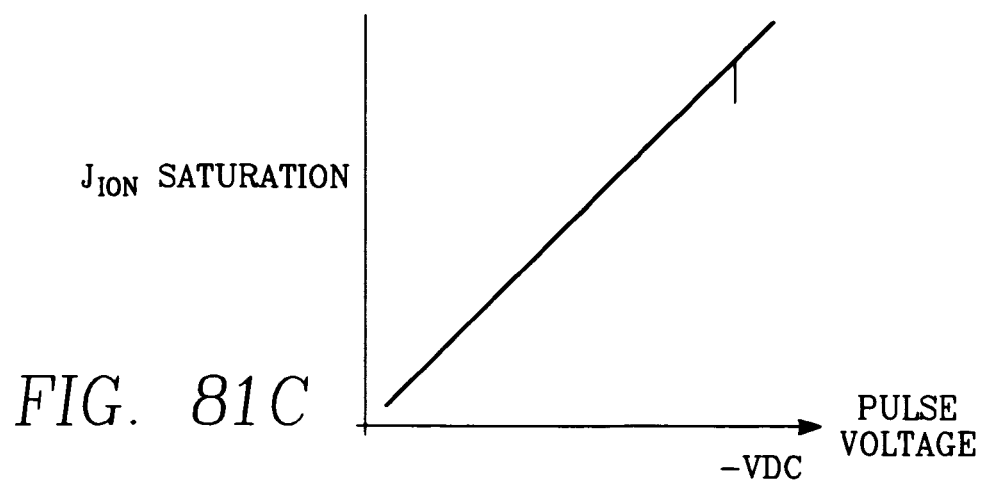
Figure 81D:
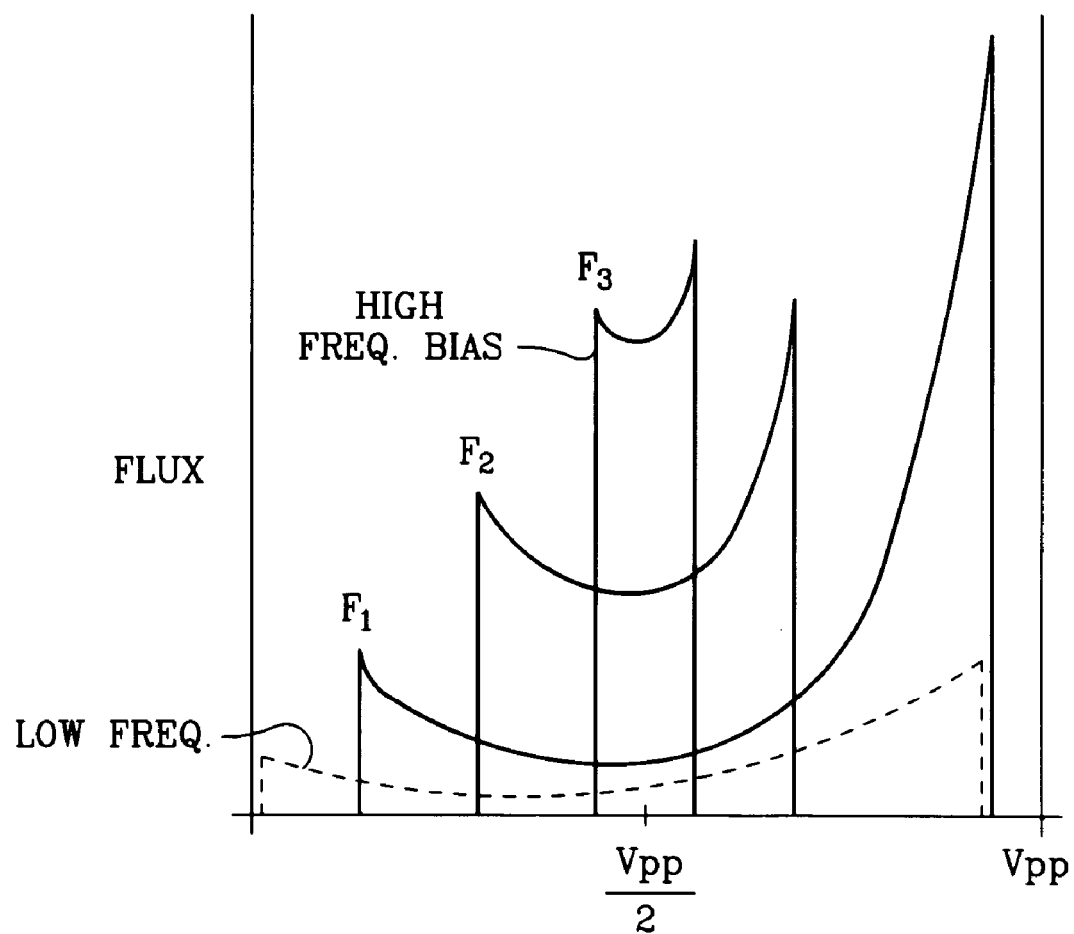

FIG. 81A illustrates the plasma ion saturation current at the wafer surface as a function of D.C. bias voltage applied to the wafer, the current being greatest (skewed toward) the higher voltage region. FIG. 81B illustrates the oscillation of the RF voltage of FIG. 80C. The asymmetry of the ion saturation current illustrated in FIG. 80A causes the ion energy distribution created by the RF bias voltage of FIG. 80B to be skewed in like manner toward the higher energy region, as illustrated in FIG. 80C. The ion energy distribution is concentrated most around an energy corresponding to the peak-to-peak voltage of the RF bias on the wafer. But this is true only if the RF bias frequency is sufficiently low for ions to follow the oscillations of the electric field in the plasma sheath. This frequency is generally a low frequency around 100 kHz to 3 MHz, but depends on sheath thickness and charge-to-mass ratio of the ion. Sheath thickness is a function of plasma electron density at the sheath edge and sheath voltage. Referring to FIG. 81D, as this frequency is increased from the low frequency (denoted F1 in FIG. 81D) to a medium frequency (denoted F2 in FIG. 81D) and finally to a high frequency such as 13 MHz (denoted F3 in FIG. 81D), the ability of the ions to follow the plasma sheath electric field oscillation is diminished, so that the energy distribution is narrower. At the HF frequency (F3) of FIG. 81D, the ions do not follow the sheath electric field oscillations, and instead achieve an energy corresponding to the average voltage of the RF bias voltage, i.e., about half the RF bias peak-to-peak voltage. As a result, the ion energy is cut in half as the RF bias frequency increases to an HF frequency (for a constant RF bias voltage). Furthermore, at the medium frequency, we have found that the plasma behavior is unstable in that it changes sporadically between the low frequency behavior (at which the ions have an energy corresponding to the peak-to-peak RF bias voltage) and the high frequency behavior (at which the ions have an energy corresponding to about half the peak-to-peak RF bias voltage). Therefore, by maintaining the RF bias frequency at a frequency that is sufficiently low (corresponding to the frequency F1 of FIG. 81D) for the ions to follow the plasma sheath electric field oscillations, the RF bias peak-to-peak voltage required to meet a particular ion implant depth requirement is reduced by a factor of nearly two, relative to behavior at a medium frequency (F2) or a high frequency (F3). This is a significant advantage because such a reduction in the required RF bias voltage (e.g., by a factor of two) greatly reduces the risk of high voltage arcing in the wafer support pedestal and the risk of damaging thin film structures on the wafer. This is particularly important because in at least a particular plasma immersion ion implantation source described later in this specification, ion energies match those obtained in a conventional ion beam implanter, provided the plasma RF bias voltage is twice the acceleration voltage of the conventional ion beam implanter. Thus, at a high frequency plasma RF bias voltage, where ion energies tend to be half those obtained at low frequency, the required plasma RF bias voltage is four times the acceleration voltage of the conventional ion beam implanter for a given ion energy level. Therefore, it is important in a plasma immersion ion implantation reactor to exploit the advantages of a low frequency RF bias voltage, to avoid the necessity of excessive RF bias voltages.

Good results are therefore attained by restricting the RF bias power frequency to a low frequency range between 10 kHz and 10 MHz. Better results are obtained by limiting the RF bias power frequency to a narrower range of 50 kHz to 5 MHz. The best results are obtained in the even narrower bias power frequency range of 100 kHz to 3 MHz. We have found optimum results at about 2 MHz plus or minus 5%.

Both the RF source power generator 8055 and the RF bias power generator 8065 may apply continuous RF power to the inductive power applicator 8050 and the wafer pedestal 8025 respectively. However, either or both of the generators 8055, 8065 may be operated in burst modes controlled by a controller 8075. The controller 8075 may also control the generator 8057 in a burst mode as well if the outer coil antenna 8052 is present. Operation in an implementation not including the outer coil antenna 8057 will now be described. The RF signals produced by each of the generators 8055, 8065 may be pulse modulated to produce continuous wave (CW) RF power in bursts lasting, for example, one millisecond with a repetition rate on the order of 0.5 kHz, for example. Either one or both of the RF power generators 8055, 8065 may be operated in this manner. If both are operated in such a burst mode simultaneously, then they may be operated in a push-pull mode, or in an in-synchronism mode, or in a symmetrical mode or in a non-symmetrical mode, as will now be described.

Figure 82A:
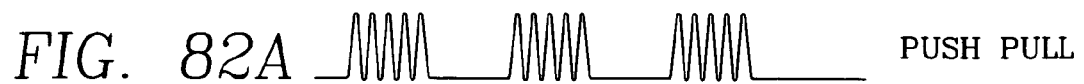
FIGS. 82A and 82B illustrate the temporal relationship between the power output waveforms of the source power generator and the bias power generator in a push-pull mode.
Figure 82B:

A push-pull mode is illustrated in the contemporaneous time domain waveforms of FIGS. 82A and 82B, illustrating the RF power waveforms of the respective RF generators 8055 and 8065, in which the bursts of RF energy from the two generators 8055, 8065 occur during alternate time windows. FIGS. 82A and 82B illustrate the RF power waveforms of the generators 8055 and 8065, respectively, or vice versa.

Figure 82C:
FIGS. 82C and 82D illustrate the temporal relationship between the power output waveforms of the source power generator and the bias power generator in an in-synchronism mode.
Figure 82D:
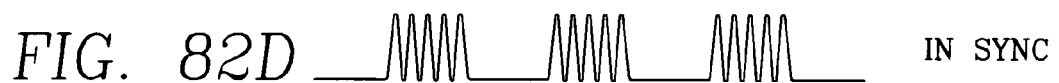

An in-synchronism mode is illustrated in the contemporaneous time domain waveforms of FIGS. 82C and 82D, in which the bursts of RF energy from the two generators 8055, 8065 are simultaneous. They may not be necessarily in phase, however, particularly where the two generators 8055, 8065 produce different RF frequencies. For example, the RF plasma source power generator 8055 may have a frequency of about 13 MHz while the RF plasma bias power generator 8065 may have a frequency of about 2 MHz. FIGS. 82C and 82D illustrate the RF power waveforms of the generators 8055 and 8065, respectively, or vice versa.

Figure 82E:
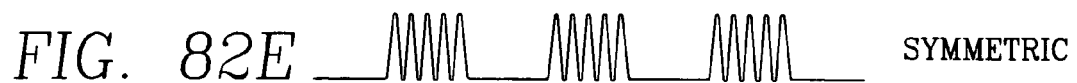
FIGS. 82E and 82F illustrate the temporal relationship between the power output waveforms of the source power generator and the bias power generator in a symmetric mode.
Figure 82F:

In the foregoing examples, the pulse widths and pulse repetition rates of the two RF generators 8055, 8065 may be at least nearly the same. However, if they are different, then the temporal relationship between the bursts of the two generators 8055, 8065 must be selected. In the example of the contemporaneous time domain waveforms of FIGS. 82E and 82F, one of the generators 8055, 8065 produces shorter RF bursts illustrated in FIG. 82F while the other produces longer RF bursts illustrated in FIG. 82E. In this example, the bursts of the two generators 8055, 8065 are symmetrically arranged, with the shorter bursts of FIG. 82F centered with respect to the corresponding longer bursts of FIG. 82E. FIGS. 82E and 82F illustrate the RF power waveforms of the generators 8055 and 8065, respectively, or vice versa.

Figure 82G:
FIGS. 82G and 82H illustrate the temporal relationship between the power output waveforms of the source power generator and the bias power generator in a non-symmetric mode.
Figure 82H:

In another example, illustrated in the contemporaneous time domain waveforms of FIGS. 82G and 82H, the shorter bursts (FIG. 82H) are not centered relative to the corresponding longer bursts (FIG. 82G), so that they are asymmetrically arranged. Specifically, in this example the shorter RF bursts of FIG. 82H coincide with the later portions of corresponding ones of the long bursts of FIG. 82G. Alternatively, as indicated in dashed line in FIG. 82H, the short RF bursts of FIG. 82H may instead coincide with the earlier portions of corresponding ones of the long RF bursts of FIG. 82G. FIGS. 82G and 82H illustrate the RF power waveforms of the generators 8055 and 8065, respectively, or vice versa.

Figure 83A:
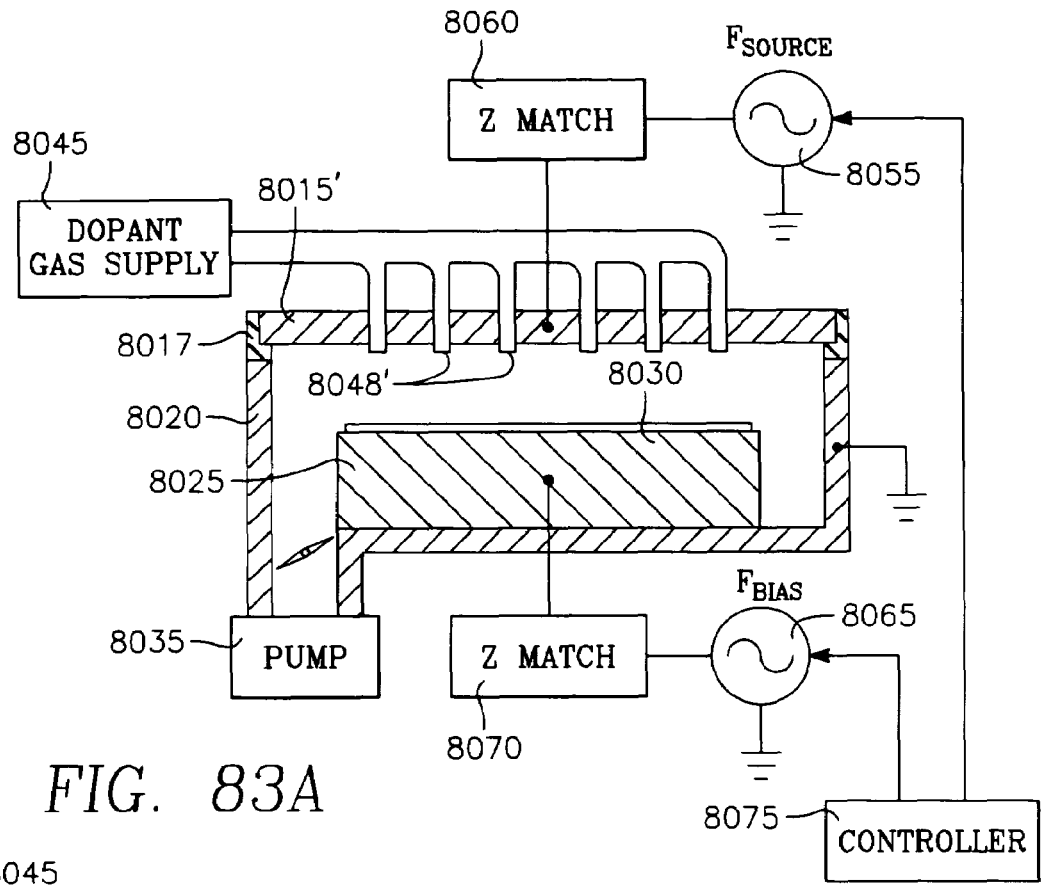
FIGS. 83A and 83B illustrate different versions of a capacitively coupled plasma immersion ion implantation reactor having an RF bias power applicator.

The inductive RF source power applicator 8050 of FIG. 79 tends to exhibit a rapid increase in dissociation of fluorine-containing species in the plasma as plasma source power (and ion flux) is increased, causing undue etching of semiconductor films on the wafer during the implantation process. Such etching is undesirable. A plasma immersion ion implantation reactor that tends to avoid this problem is illustrated in FIG. 83A. The plasma immersion ion implantation reactor of FIG. 83A has a capacitive source power applicator constituting a conductive (metal) or semiconducting ceiling 8015' electrically insulated from the grounded sidewall 8020 by an insulating ring 8017. Alternatively, the ceiling may be metal, conductive, or semiconducting and be coating by an insulating, conducting or semiconducting layer. The RF plasma source power generator 8055 drives the ceiling 8015' through the impedance match circuit 8060 in the manner of a capacitive plate. Plasma is generated by oscillations in the plasma sheath produced by the RF power capacitively coupled from the ceiling 8015'. In order to enhance such plasma generation, the frequency of the plasma RF source power generator 8055 is relatively high, for example within the very high frequency (VHF) range or 30 MHz and above. The wafer pedestal 8025 may serve as a counter electrode to the ceiling 8015'. The ceiling 8015' may serve as a counter electrode to the RF bias voltage applied to the wafer pedestal 8025. Alternatively, the chamber wall may serve as a counter electrode to either or both wafer bias and ceiling bias voltages. In one implementation, the dopant-containing gas is fed through the ceiling 8015' through plural gas injection orifices 8048'.

The capacitively coupled plasma ion immersion implantation reactor of FIG. 83A enjoys the advantages of the inductively coupled reactor of FIG. 79 in that both types of reactors permit the independent adjustment of ion flux (by adjusting power level of the plasma source power generator 8055) and of the ion energy or implant depth (by adjusting the power level of the plasma bias power generator 8065). In addition, when plasma source power or ion flux is increased, the capacitively coupled plasma ion immersion reactor of FIG. 83A exhibits a smaller increase in dissociation of fluorine-containing species in the gas fed from the dopant gas supply 8045 and a smaller increase in reaction by-products which would otherwise lead to excessive etch or deposition problems. The advantage is that ion flux may be increased more freely without causing an unacceptable level of etching or deposition during ion implantation.

The higher frequency RF power of the plasma source power generator 8055 controls plasma density and therefore ion flux at the wafer surface, but does not greatly affect sheath voltage or ion energy. The lower frequency RF power of the bias power generator 8065 controls the sheath voltage and therefore the ion implantation energy and (junction) depth and does not contribute greatly to ion generation or ion flux. The higher the frequency of the plasma source power generator, the less source power is wasted in heating ions in the plasma sheath, so that more of the power is used to generate plasma ions through oscillations of the plasma sheath or by heating electrons in the bulk plasma. The lower frequency of the RF bias power generator 8065 is less than 10 MHz while the higher frequency of the RF plasma source power generator 8055 is greater than 10 MHz. More preferably, the lower frequency is less than 5 MHz while the higher frequency is greater than 15 MHz. Even better results are obtained with the lower frequency being less than 3 MHz and the higher frequency exceeding 30 MHz or even 50 MHz. In some cases the source power frequency may be as high as 160 MHz or over 200 MHz. The greater the separation in frequency between the higher and lower frequencies of the source and bias power generators 8055, 8065, respectively, the more the plasma ion implant flux and the plasma ion implant energy can be separately controlled by the two generators 8055, 8065.

Figure 83B:
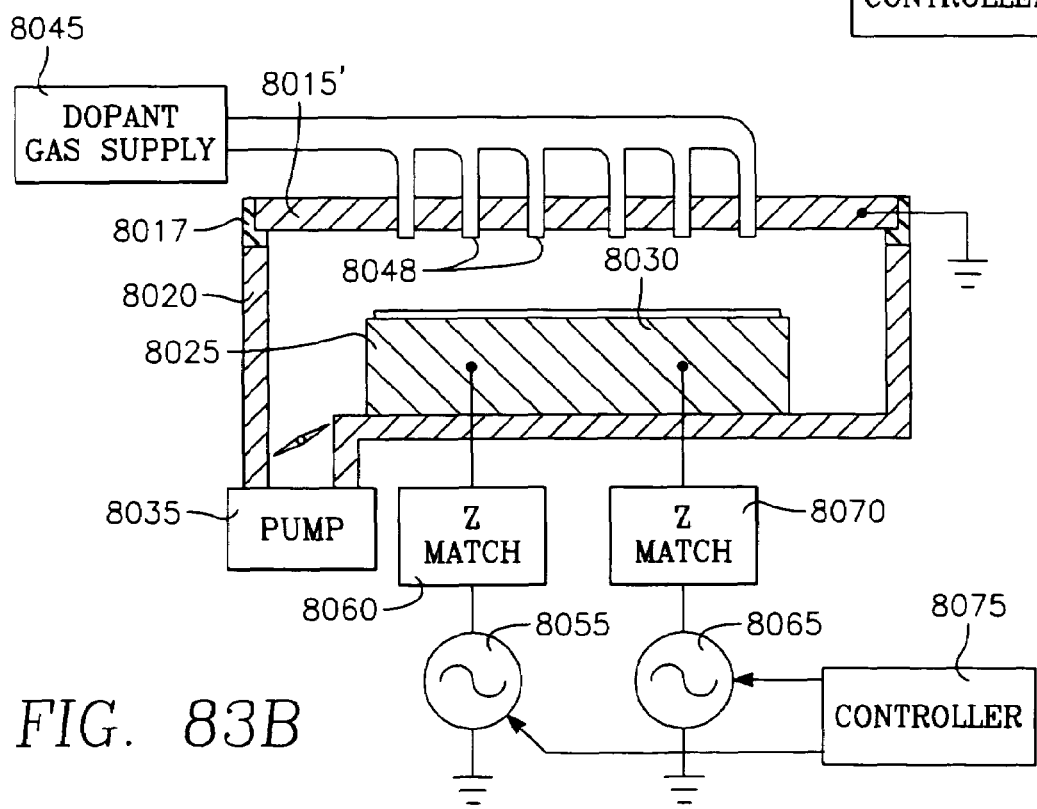

In the variation illustrated in FIG. 83B, the RF plasma source power generator 8055 is coupled to the wafer pedestal rather than being coupled to the ceiling 8015'. An advantage of this feature is that the ceiling 8015' is consumed (by plasma sputtering or etching) at a much lower rate than in the reactor of FIG. 83A, resulting in less wear and less metallic contamination of the plasma. A disadvantage is that isolation between the two RF generators 8055, 8065 from each other is inferior compared to the reactor of FIG. 83A, as they are both connected to the same electrode, so that control of ion flux and ion energy is not as independent as in the reactor of FIG. 83A.

In either of the reactors of FIG. 83A or 83B, the controller 8075 can operate in the manner described above with reference to FIGS. 82A through 82H, in which the respective RF power waveforms applied to the ceiling 8015' and the pedestal 8025 are in a push-pull mode (FIGS. 82A and B), or an in-synchronism mode (FIGS. 82C and D), or a symmetric mode (FIGS. 802E and F) or a non-symmetric mode (FIGS. 82G and H).

FIGS. 83A and 83B show that the RF source power generator 8055 can drive the ceiling 8015' (FIG. 83A) with the sidewall 8020 and/or the wafer support pedestal 8025 connected to the RF return terminal of the generator 8055, or, in the alternative, the RF source power generator 8055 can drive the wafer support pedestal 8025 with the ceiling 8015' and/or the sidewall 8020 connected to the RF return terminal of the generator 8055. Thus, the RF source power generator is connected across the wafer support pedestal 8025 and the sidewall 8020 or the ceiling 8015' (or both). The polarity of the connections to the source power generator 8055 may be reversed, so that it drives the sidewall 8020 and/or ceiling 8015' with the pedestal 8025 being connected to the RF return terminal of the generator 8055.

As set forth above, the plasma immersion ion implantation inductively coupled reactor of FIG. 79 has distinct advantages, including (a) the capability of a large ion flux/high plasma ion density, (b) independently controlled ion energy, and (c) low minimum ion energy (plasma potential). The plasma immersion ion implantation capacitively coupled reactor of FIG. 83A has the additional advantage of having more controllable dissociation of process gases and reactive byproducts as ion flux is increased, than the inductively coupled reactor of FIG. 79. However, the capacitively coupled reactor of FIG. 83A has a higher minimum ion energy/plasma potential than the inductively coupled reactor of FIG. 79. Thus, these two types of reactors provide distinct advantages, but neither provides all of the advantages.

Figure 84:
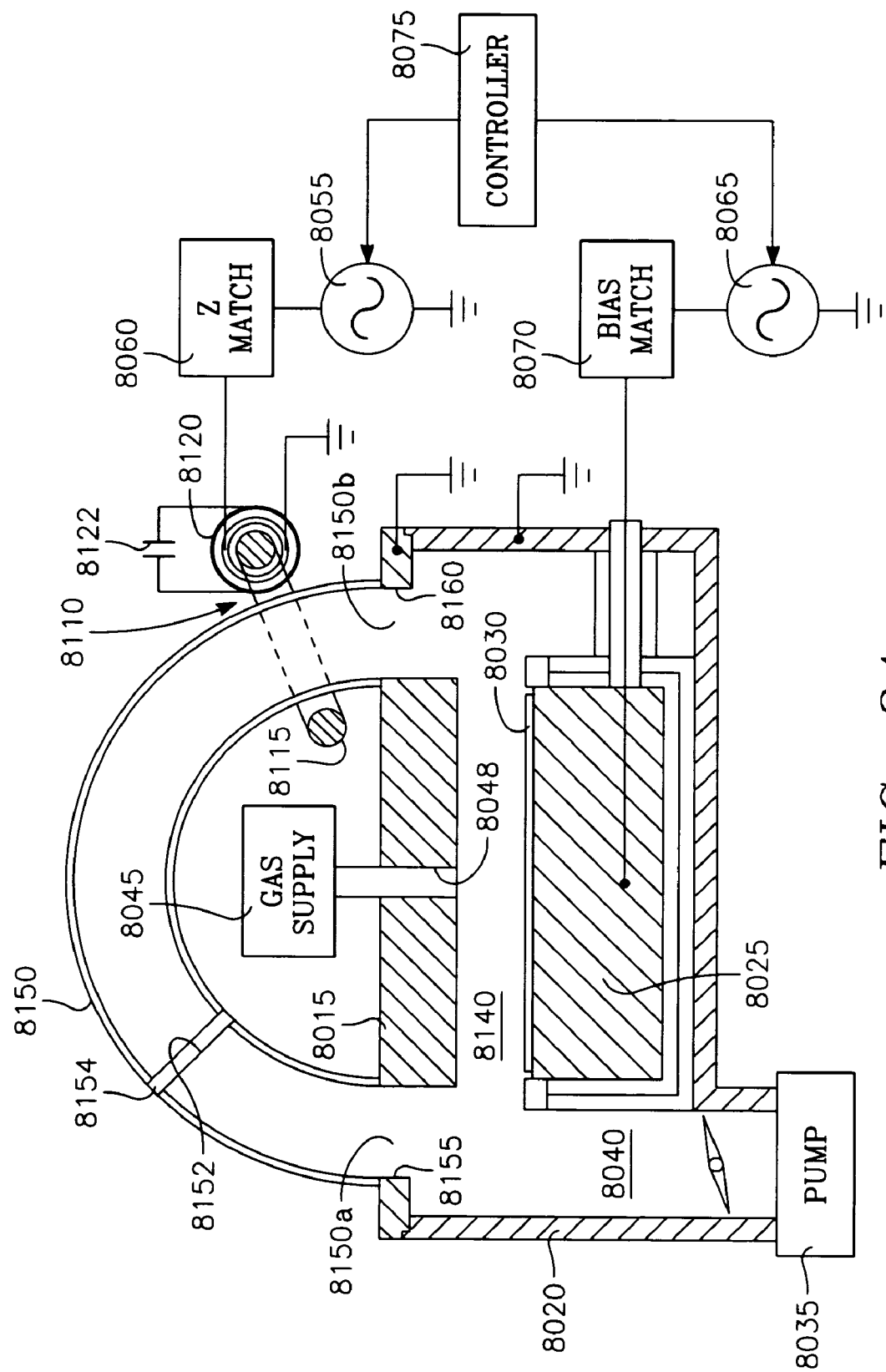
FIG. 84 illustrates a plasma immersion ion implantation reactor having a reentrant torroidal path plasma source.

A plasma immersion ion implantation reactor that provides all of the foregoing advantages, including low minimum ion energy and low process gas dissociation, is illustrated in FIG. 84. In FIG. 84, the inductively or capacitively coupled plasma sources of FIG. 79 or 83A are replaced by a toroidal plasma source of the type disclosed above in FIGS. 1-78. In the basic configuration of FIG. 84, the toroidal plasma source includes a reentrant hollow conduit 8150 over the ceiling 8015, corresponding to the conduit 150 of FIG. 1. The conduit 8150 of FIG. 84 has one open end 8150a sealed around a first opening 8155 in the ceiling 8015 and an opposite open end 8150b sealed around a second opening 8160 in the ceiling 8015. The two openings or ports 8155, 8160 are located in the ceiling over opposite sides of the wafer support pedestal 8025. While FIG. 84 illustrates the openings 8155, 8160 being in the ceiling, the openings could instead be in the base or floor of the chamber, as in FIG. 12, or in the sidewall of the chamber, as in FIG. 26, so that the conduit 8150 may pass over or under the chamber. RF plasma source power is coupled from the RF generator 8055 through the optional impedance match circuit 8060 to the reentrant conduit by an RF plasma source power applicator 8110. Various types of source power applicators for a reentrant hollow conduit are disclosed in FIGS. 1-78, any one of which may be employed in the plasma immersion ion implantation reactor of FIG. 84. In the implementation illustrated in FIG. 84, the RF plasma source power applicator 8110 is similar to that illustrated in FIG. 13, in which a magnetically permeable core 8115 having a torus shape surrounds an annular portion of the conduit 8150. The RF generator 8055 is coupled through the optional impedance match circuit to a conductive winding 8120 around the magnetic core 8115. An optional tuning capacitor 8122 may be connected across the winding 8120. The RF generator 8055 may be frequency-tuned to maintain an impedance match, so that the impedance match circuit 8060 may not be necessary.

The reactor chamber includes the process region 8140 between the wafer support pedestal 8025 and the ceiling 8015. The gas supply 8045 furnishes dopant gases into the reactor chamber 8140 through gas injection orifices 8048 in the ceiling 8015. Plasma circulates (oscillates) through the reentrant conduit 8150 and across the process region 8140 in response to the RF source power coupled by the source power applicator 8110. As in the reactor of FIG. 13, the reentrant conduit 8150 is formed of a conductive material and has a narrow gap or annular break 8152 filled with an insulator 8154. The dopant gases furnished by the gas supply 8045 contain a species that is either a donor (N-type) or acceptor (P-type) impurity when substituted into the semiconductor crystal structure of the wafer 8030. For example, if the wafer is a silicon crystal, then an N-type dopant impurity may be arsenic or phosphorous, for example, while a P-type dopant impurity may be boron, for example. The dopant gas furnished by the gas supply 8045 is a chemical combination of the dopant impurity with an at-least partially volatile species, such as fluorine for example. For example, if a P-type conductivity region is to be formed by ion implantation, then the dopant gas may be a combination of boron and fluorine, such as $BF_3$, for example. Or, for example, the dopant gas be a hydride, such as $B_2H_6$. Phosphorous doping may be accomplished using a fluoride such as $PF_3$ or $PF_5$ or a hydride such as $PH_3$. Arsenic doping may be accomplished using a fluoride such as $AsF_5$ or a hydride such as $AsH_3$.

The RF bias power generator provides an RF bias voltage, with the RF bias frequency selected as described above with reference to FIG. 81D. Good results are attained by restricting the RF bias power frequency to a low frequency range between 10 kHz and 10 MHz. Better results are obtained by limiting the RF bias power frequency to a narrower range of 50 kHz to 5 MHz. The best results are obtained in the even narrower bias power frequency range of 100 kHz to 3 MHz. We have found optimum results at about 2 MHz plus or minus 5%.

In the reactor of FIG. 84, both the RF source power generator 8055 and the RF bias power generator 8065 may apply continuous RF power to the inductive power applicator 8110 and the wafer pedestal 8025 respectively. However, either or both of the generators 8055, 8065 may be operated in burst modes controlled by a controller 8075. The RF signals produced by each of the generators 8055, 8065 may be pulse modulated to produce continuous wave (CW) RF power in bursts lasting, for example, one millisecond with a repetition rate on the order of 0.5 kHz, for example. Either one or both of the RF power generators 8055, 8065 may be operated in this manner. If both are operated in such a burst mode simultaneously, then they may be operated in a push-pull mode, or in an in-synchronism mode, or in a symmetrical mode or in a non-symmetrical mode, as will now be described for the reactor of FIG. 84.

A push-pull mode is illustrated in the contemporaneous time domain waveforms of FIGS. 82A and 82B, illustrating the RF power waveforms of the respective RF generators 8055 and 8065, in which the bursts of RF energy from the two generators 8055, 8065 occur during alternate time windows. FIGS. 82A and 82B illustrate the RF power waveforms of the generators 8055 and 8065, respectively, or vice versa.

An in-synchronism mode is illustrated in the contemporaneous time domain waveforms of FIGS. 82C and 82D, in which the bursts of RF energy from the two generators 8055, 8065 are simultaneous. They may not be necessarily in phase, however, particularly where the two generators 8055, 8065 produce different RF frequencies. For example, the RF plasma source power generator 8055 may have a frequency of about 13 MHz while the RF plasma bias power generator 8065 may have a frequency of about 2 MHz. FIGS. 82C and 82D illustrate the RF power waveforms of the generators 8055 and 8065, respectively, or vice versa.

In the foregoing examples, the pulse widths and pulse repetition rates of the two RF generators 8055, 8065 may be at least nearly the same. However, if they are different, then the temporal relationship between the bursts of the two generators 8055, 8065 must be selected. In the example of the contemporaneous time domain waveforms of FIGS. 82E and 82F, one of the generators 8055, 8065 produces shorter RF bursts illustrated in FIG. 82F while the other produces longer RF bursts illustrated in FIG. 82E. In this example, the bursts of the two generators 8055, 8065 are symmetrically arranged, with the shorter bursts of FIG. 82F centered with respect to the corresponding longer bursts of FIG. 82E. FIGS. 82E and 82F illustrate the RF power waveforms of the generators 8055 and 8065, respectively, or vice versa.

In another example, illustrated in the contemporaneous time domain waveforms of FIGS. 82G and 82H, the shorter bursts (FIG. 82H) are not centered relative to the corresponding longer bursts (FIG. 82G), so that they are asymmetrically arranged. Specifically, in this example the shorter RF bursts of FIG. 82H coincide with the later portions of corresponding ones of the long bursts of FIG. 82G. Alternatively, as indicated in dashed line in FIG. 82H, the short RF bursts of FIG. 82H may instead coincide with the earlier portions of corresponding ones of the long RF bursts of FIG. 82G. FIGS. 82G and 82H illustrate the RF power waveforms of the generators 8055 and 8065, respectively, or vice versa.

The toroidal plasma immersion ion implantation reactor of FIG. 84 can be operated with a pulsed D.C. bias voltage instead of an RF bias voltage. In this case, the bias power generator 8065 would be D.C. source rather than an RF source. Thus, in the different operational modes of FIGS. 82A through 82H discussed above, the pulsed RF bias voltage may be replaced by a pulsed D.C. bias voltage of the same pulse width, with only the source power generator 8055 producing an RF power burst.

Figure 85:
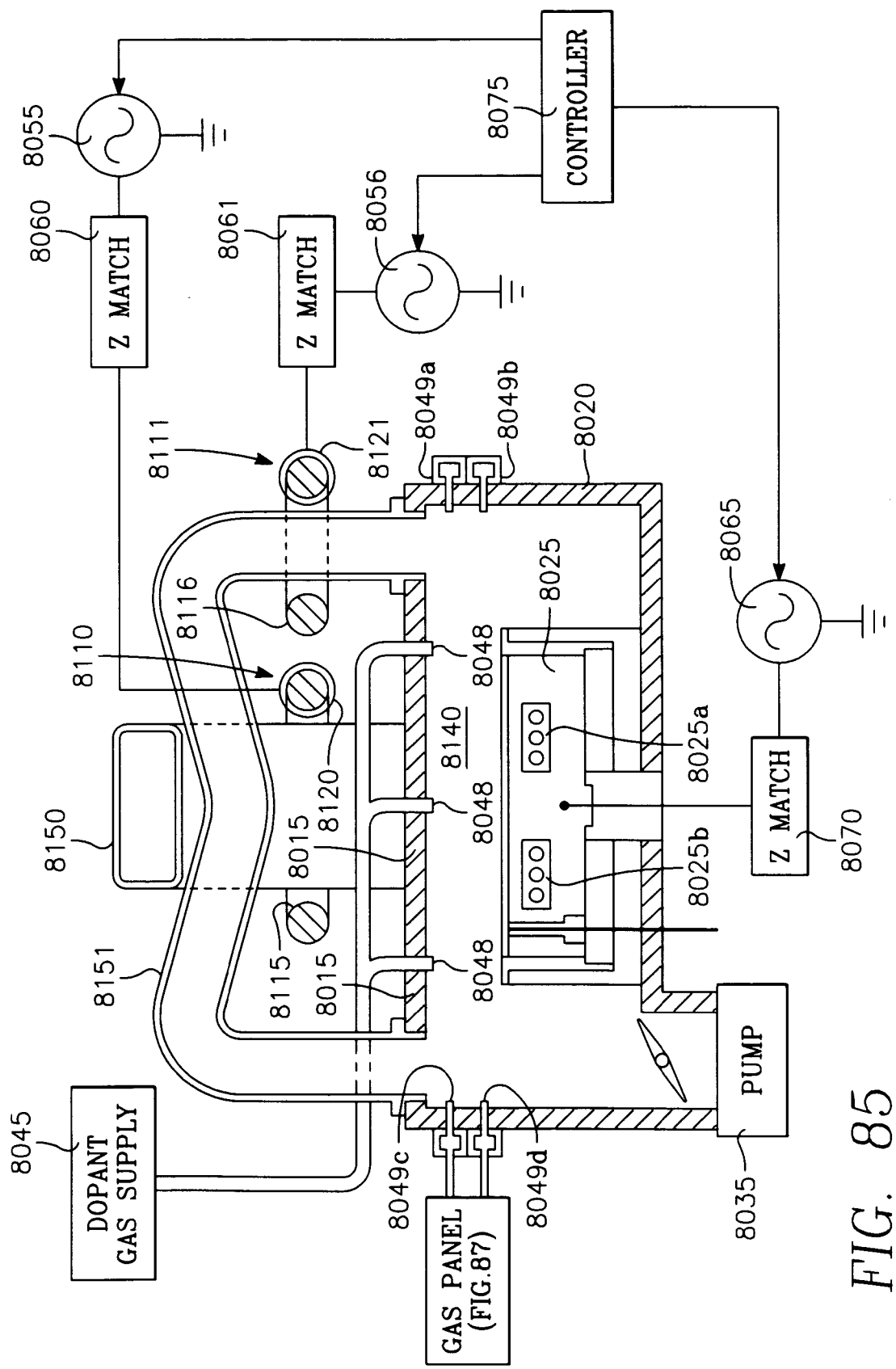
FIG. 85 illustrates a plasma immersion ion implantation reactor having a torroidal plasma source with two intersecting reentrant plasma paths.

FIG. 85 illustrates a modification of the plasma immersion ion implantation reactor of FIG. 84 having a second reentrant conduit 8151 crossing the first reentrant conduit 8150, in a manner similar to the reactor of FIG. 44. Plasma power is coupled to the second conduit 8151 from a second RF plasma source power generator 8056 through a second optional match circuit 8061 to a second source power applicator 8111 that includes a second magnetically permeable core 8116 and a second core winding 8121 driven by the second RF source power generator 8056. Process gas from the gas supply 8045 may be introduced into the chamber by a gas distribution plate or showerhead incorporated in the ceiling 8015 (as in the gas distribution plate 210 of FIG. 44). However, the plasma immersion ion implantation reactor of FIG. 85 is greatly simplified by using a small number of process gas injectors 8048 in the ceiling 8015 or in the sidewall 8020 or elsewhere, such as in the base of the chamber (not shown) coupled to the dopant gas supply, rather than a showerhead. Moreover, the gap between the ceiling 8015 and the wafer pedestal 8025 may be relatively large (e.g., two to six inches) and a gas distribution plate eliminated in favor of discrete gas injectors or diffuser 8048 in the ceiling 8015 or gas injectors or diffusers 8049 in the sidewall 8020 because there is no need to generate plasma close to the wafer surface. The gas injectors or diffusers 8049 may be joined in a ring 8049 on the sidewall 8020. Generally, the higher the maximum implant depth and ion energy requirement, the greater the gap between ceiling and wafer that is required. For example, for a peak-to-peak RF bias voltage of 10 kV, a gap of 4 inches is preferable over a 2 inch gap for best plasma uniformity across a wide range of gas species and plasma electron densities. The term diffuser is employed in the conventional sense as referring to a type of gas distribution device having a wide angle of gas flow distribution emanating from the device.

Figure 86:
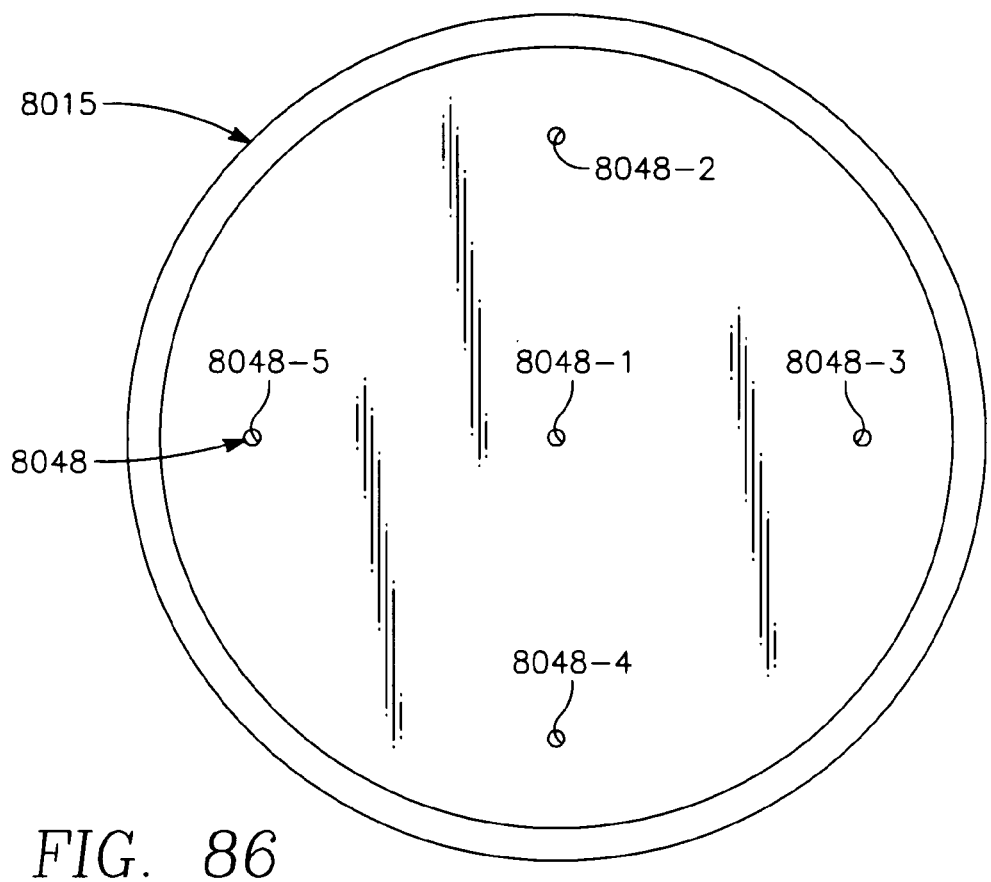
FIG. 86 illustrates an interior surface of the ceiling of the reactor of FIG. 85.
Figure 87:
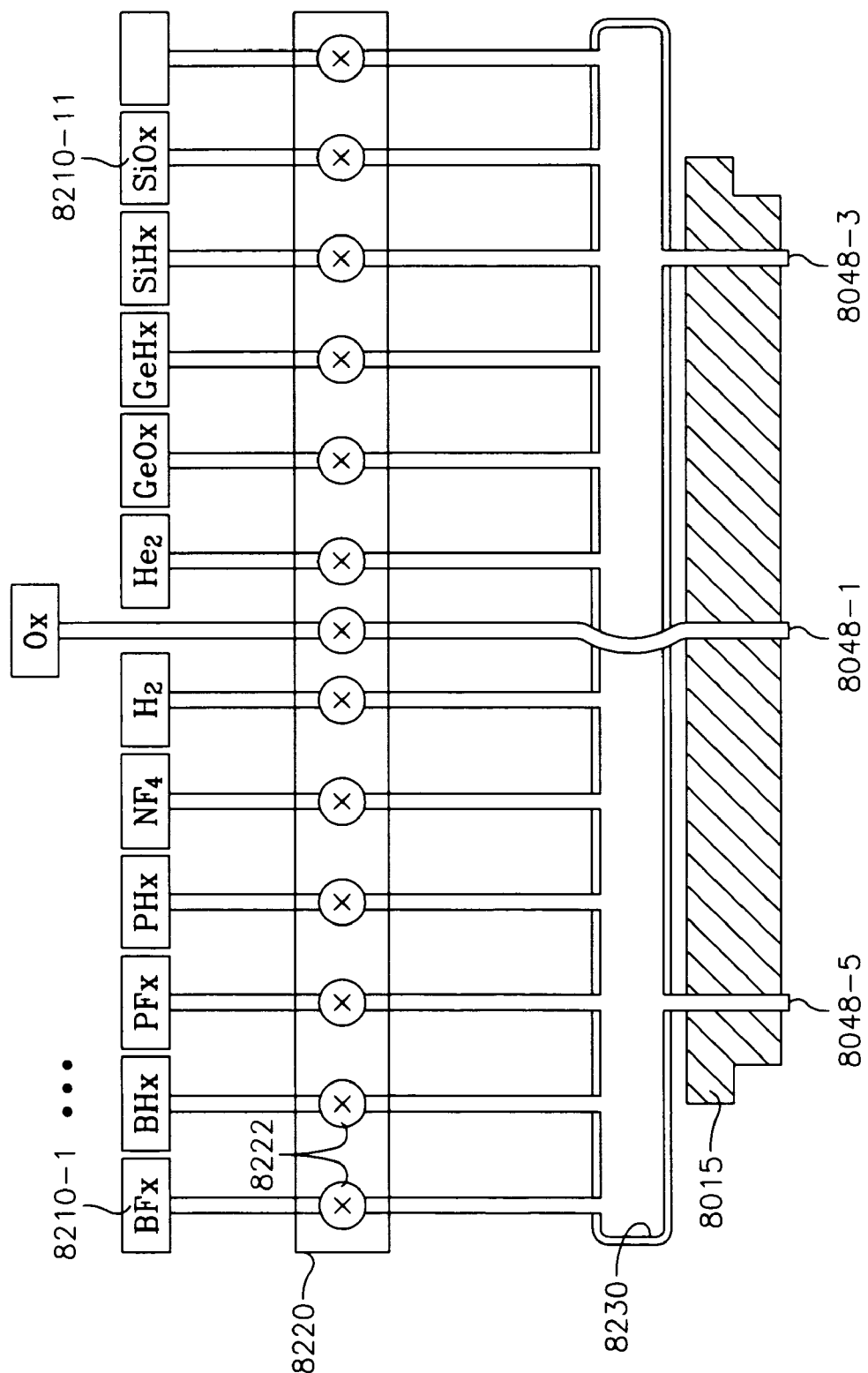
FIG. 87 illustrates a gas distribution panel of the reactor of FIG. 85.

FIG. 86 is a plan view of the interior surface of the ceiling 8015, showing one arrangement of the gas injection orifices 8048, in which there is one central orifice 8048-1 in the center of the ceiling 8015 and four radially outer orifices 8048-2 through 8048-5 uniformly spaced at an outer radius. FIG. 87 illustrates how the dopant gas supply 8045 may be implemented as a gas distribution panel. The gas distribution panel or supply 8045 of FIG. 87 has separate gas reservoirs 8210-1 through 8210-11 containing different dopant-containing gases including fluorides of boron, hydrides of boron, fluorides of phosphorous and hydrides of phosphorous. In addition, there are gas reservoirs for other gases used in co-implantation (hydrogen and helium), material enhancement (nitrogen), surface passivation or co-implantation (fluorides of silicon or germanium or carbon). In addition, the center orifice 8048-1 may be coupled to a reservoir oxygen gas, for use in photoresist removal and/or chamber cleaning. A control panel 8220 includes valves 8222 controlling gas flow from the respective reservoirs 8210 to the gas injection orifices. Preferably, the gases are mixed at or near the orifices, although a gas manifold 8230 may be provided to distribute the selected gases among the outer gas injection orifices 8048-2 through 8048-5. Alternatively, process gas may be injected at one or more locations in the sidewall 8020, using the nozzles 8049 of FIG. 85 or diffusers. FIG. 85 shows gas injectors 8049 located around the chamber sidewalls 8020 which inject gas radially inward. Gas may be injected parallel to the ceiling and/or wafer, or may be injected with some component toward ceiling and/or wafer. For some applications, it is advantageous to utilize multiple separate gas plenums, each with its own nozzle array. This can permit the use of chemistries which should not be combined except under vacuum, or may permit having several gas zones for neutral uniformity tuning. For this purpose, referring again to FIG. 85, a first ring 8049a joining a first set of sidewall injectors 8049c serves as a first plenum, while a second ring 8049b joining a second separate set of sidewall injectors 8049d serves as a second plenum. The two rings or plenums 8049a, 8049b are supplied by separate respective sets of valves 8222 of the gas panel of FIG. 87

Figure 88:
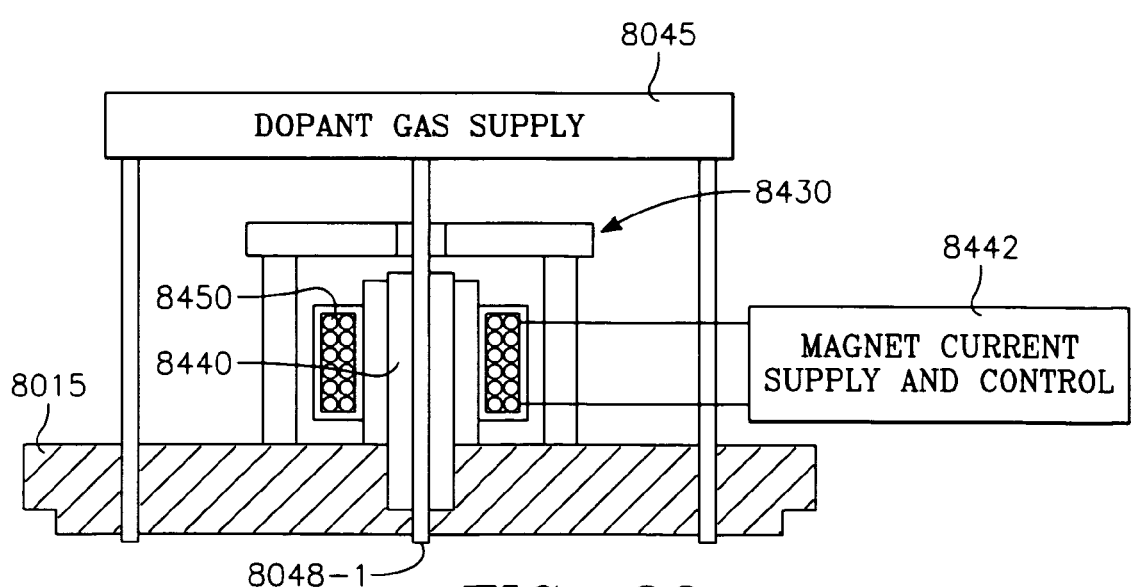
FIG. 88 is a partial view of the reactor of FIG. 85 modified to include a plasma control center electromagnet.

FIG. 88 illustrates a modification of the plasma immersion ion implantation reactor of FIG. 85 in which a central electromagnet assembly 8430 is mounted over the center of the ceiling 8015. Like the electromagnet assembly 4430 of FIG. 44, the electromagnet assembly 8430 of FIG. 88 controls plasma ion density uniformity and includes a narrow elongate cylindrical pole piece 8440 formed of a magnetizable material such as iron or steel and a coil 8450 of insulated conductive wire wrapped around the pole piece 8440. A magnetic current controller 8442 supplies an electrical current to the coil 8450. The controller 8442 controls the current through the coil 8450 so as to optimize uniformity of plasma ion density (ion flux) across the wafer surface.

Figure 89A:
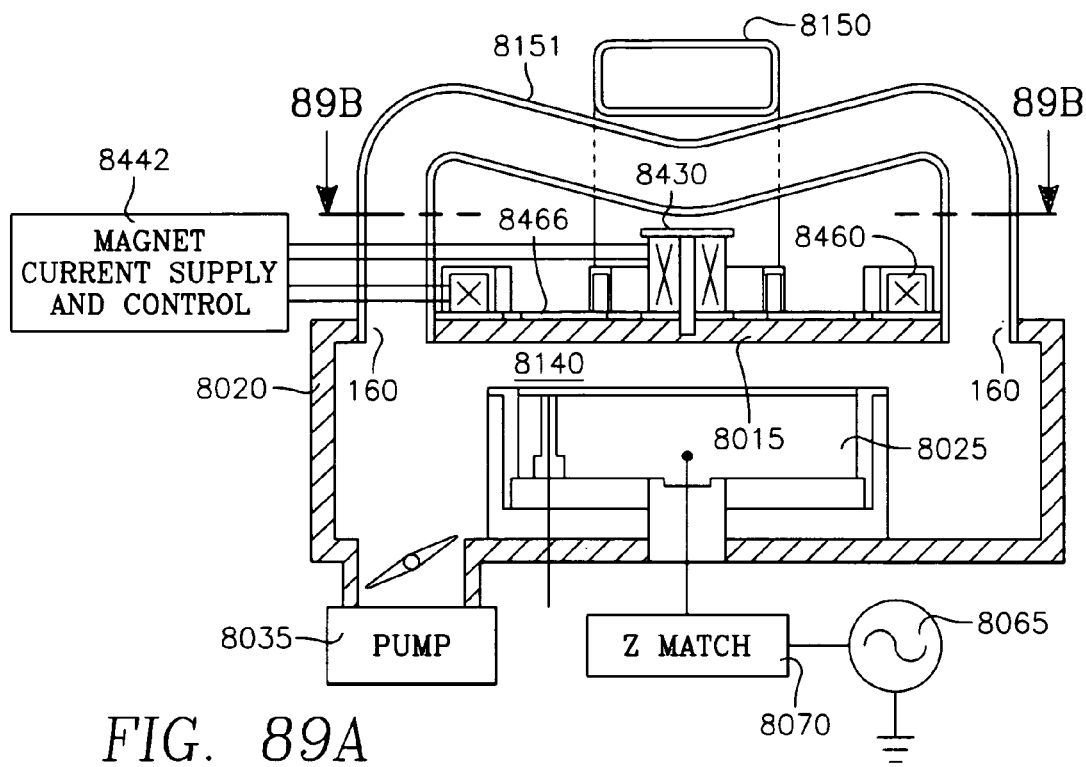
FIGS. 89A and 89B are side and top views, respectively, of a version of the reactor of FIG. 88 having, in addition, a plasma control outer electromagnet.
Figure 89B:
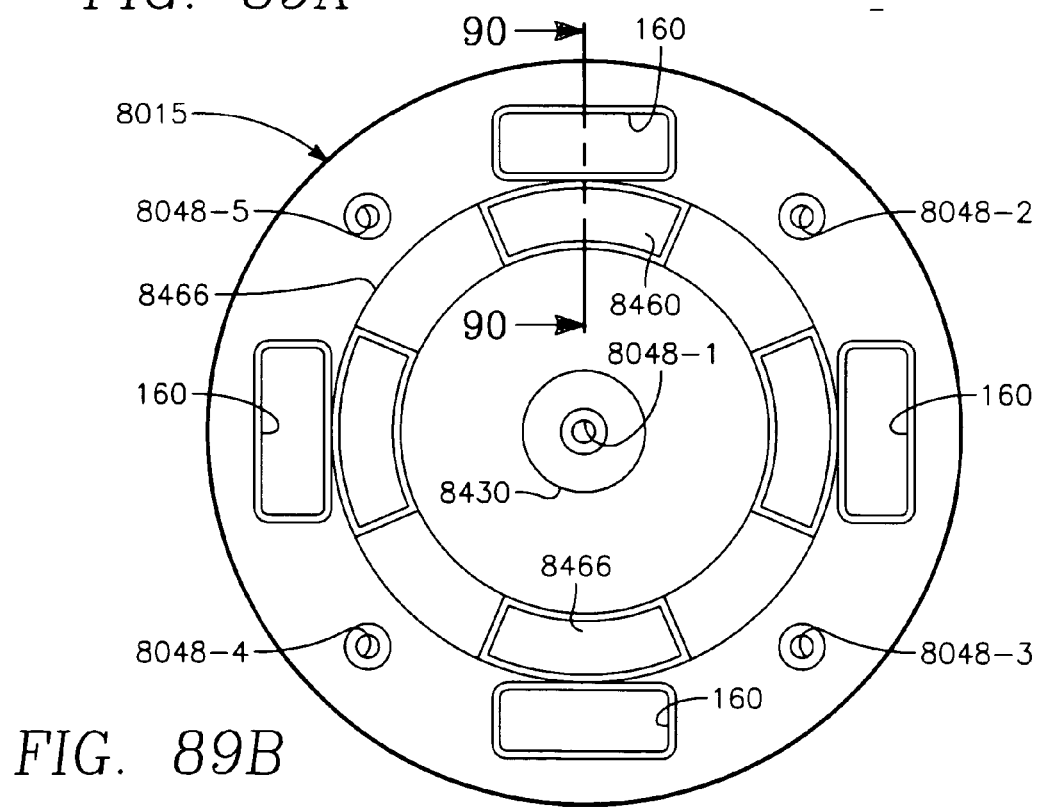

FIGS. 89A and 89B are side and top views, respectively, illustrating a further modification incorporating a radially outer electromagnet assembly 8460. The outer electromagnet assembly 8460 is in the shape of a torus and overlies an annular outer region of the ceiling 8015 near the circumferential edge of the ceiling 8015 and adjacent the ports pairs 150, 160 of the conduits 8150, 8151. Referring to the cross-sectional view of FIG. 90A, the outer electromagnet assembly 8460 includes a coil 8462 consisting of plural windings of a single conductor connected to the current controller 8442. In order to concentrate the magnetic field of the outer electromagnet assembly 8460 within the process region 8140, an overlying magnetic cover 8464 surrounding the sides and top of the coil 8462 but not the bottom of the coil 8462. The magnetic cover 8464 permits the magnetic field of the coil 8462 to extend downwardly below the ceiling into the process region 8140. Uniformity of the ion density and radial plasma flux distribution at the wafer surface is optimized by independently adjusting the currents in the inner and outer electromagnet assemblies 8430, 8460.

Figure 90A:
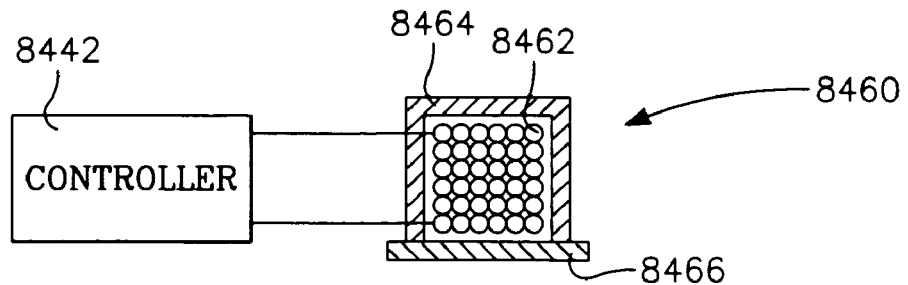
FIGS. 90A, 90B and 90C are cross-sectional side view of the outer electromagnet of FIG. 89A with different gap distances of a bottom plate for regulating magnetic flux.
Figure 90B:
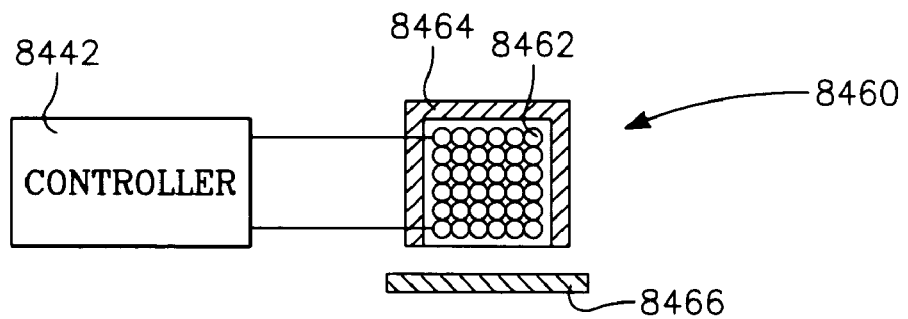
Figure 90C:
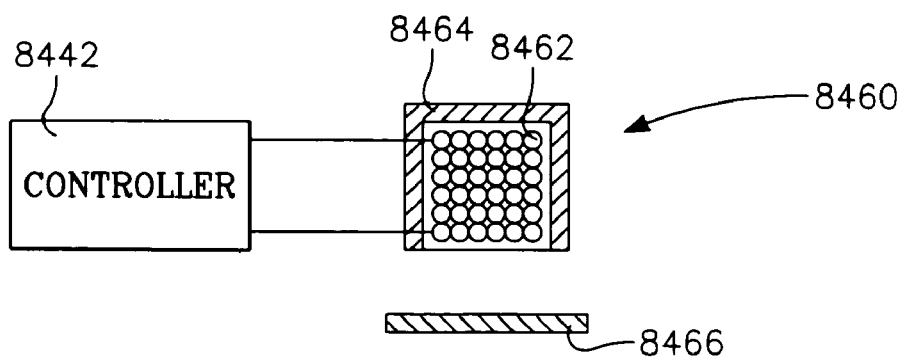

In order to avoid forming regions of very high plasma ion concentration near the ports 150, 160 of the two conduits 8150, 8151, individual plates 8466 of magnetically permeable material (e.g., iron or steel) are placed under the outer electromagnet assembly 8460 adjacent respective ones of the ports 150, 160. The circumferential extent of each plate 8466 is approximately equal to the width of each individual port 150, 160. FIGS. 90A, 90B and 90C are cross-sectional views taken along lines 90-90 of FIG. 89B. The distance between the plate 8466 and the bottom edge of the magnetic cover 8464 may be adjusted to control the amount of magnetic field coupled into portion of the process region near each individual one of the ports 150, 160. In FIG. 90A, the plate 8466 is in contact with the bottom edges of the cover 8464, so that the magnetic field near the corresponding port (150, 160) is almost completely confined within the enclosure defined by the cover 8464 and the plate 8466. In FIG. 90B, the plate 8466 is slightly displaced from the bottom edge of the cover 8464, creating a small gap therebetween that allows a small magnetic field to enter the process region 8140 near the corresponding port (150, 160). In FIG. 90C, there is a large gap between the plate 8466 and the cover 8464, permitting a larger magnetic field to exist in the process region near the corresponding port (150, 160).

Figure 91:
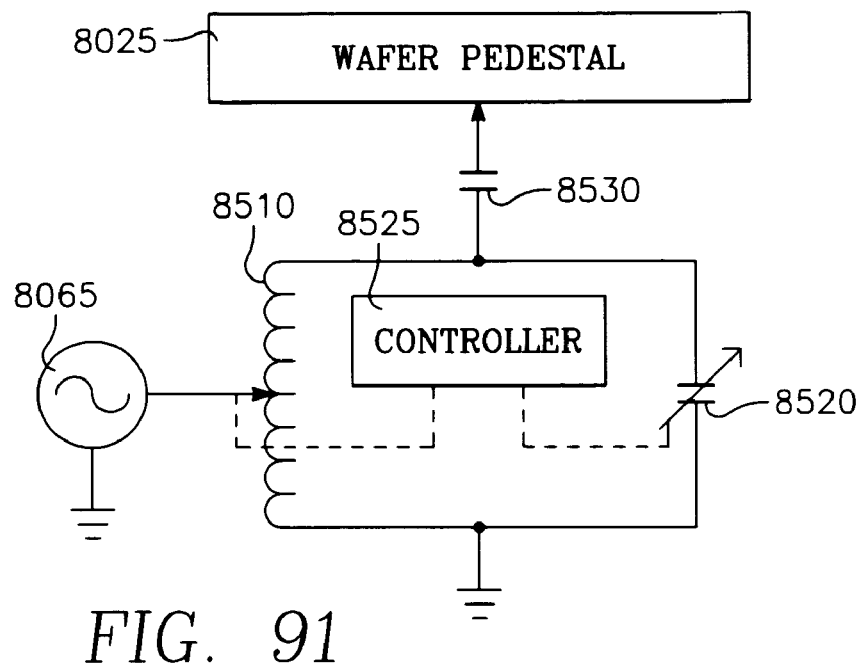
FIG. 91 illustrates an RF bias power coupling circuit in the reactor of FIG. 85.

FIG. 91 illustrates how the RF plasma bias power generator 8065 may be coupled to the wafer support pedestal 8025. An inductor 8510 and a variable capacitor 8520 are connected in parallel between one side of a series capacitor 8530 and ground, the other side of the series capacitor 8530 being connected to the wafer support pedestal 8025. The output of the bias power generator 8065 is connected to a tap 8560 of the inductor 8510. The position of the tap 8560 and the capacitance of the variable capacitor 8520 are selected to provide an impedance match between the bias power generator 8065 and the plasma load at the wafer pedestal 8065.

The variable capacitor 8520 may be controlled by a system controller 8525 to optimize matching. In this case, the circuit including the parallel inductor and capacitor 8510, 8520 serves as an impedance match circuit. In order to follow variations in the plasma load impedance during processing, frequency tuning of the bias power generator 8065 may be employed, although this may not be necessary. The position of the tap 8560 may be selectable either manually or by the system controller 8525 to optimize matching. Alternatively, a capacitor (not shown) may be connected between the tap position and ground or between RF bias generator and tap point as an alternative matching circuit topology. This optional capacitor may be controlled by the system controller 8525 to optimize matching.

Figure 92:
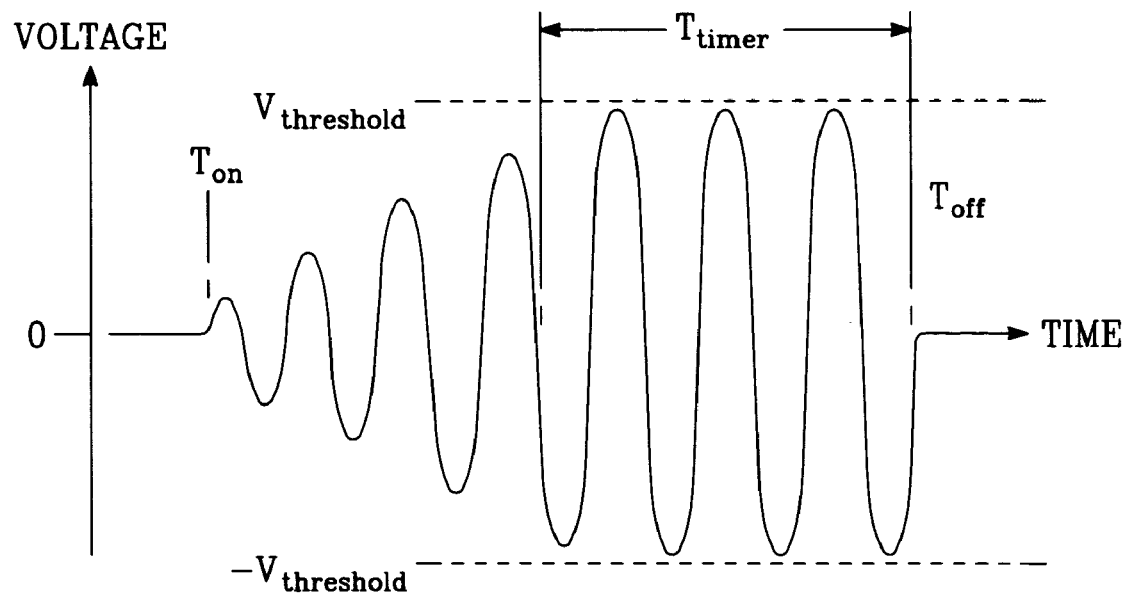
FIG. 92 depicts an RF bias voltage waveform in accordance with a bias voltage control feature.

One problem in selecting the bias voltage level is that large ion energy can be reached only with a high bias voltage level, which typically requires high power. High power contributes to the plasma flux (ion density or dose rate), and can cause too high a dose rate, making it difficult to control the conductivity of the implanted region. One way of controlling the dose rate at such a high power is to pulse the RF bias power. However, controlling the pulse rate and pulse width of repetitive pulses so as to achieve the required dose rate and conductivity is difficult. Part of the problem is that ion implantation at the desired junction depth is achieved only after the bias voltage has risen sufficiently (at the beginning of a pulse or RF burst) to reach a threshold voltage corresponding to the desired junction depth and ion energy. The solution to this problem is to avoid repetitive pulsing of the bias power, and instead use a single pulse of sufficient duration to complete ion implantation at the desired junction depth and conductivity in the implanted region. This is illustrated in the time domain waveform of FIG. 92. A timer can be employed to guarantee that the RF burst or pulse lasts the required duration (Ttimer). However, the timer must not begin until the sheath voltage has reached the threshold voltage (Vthreshold) at which ion implantation occurs at the required depth. Thus, FIG. 92 shows that the sheath voltage grows at the beginning of bias power RF burst (Ton) until it reaches Vthreshold after several cycles. At that point, the timer begins, and ends the RF burst at the expiration of Ttimer, i.e., at Toff. The problem, therefore, is how to ascertain the time at which the sheath voltage reaches Vthreshold, i.e., when to begin Ttimer.

Another problem is how to ascertain the requisite power level of the bias power generator 8065 at which Vthreshold is produced across the sheath.

Figure 93:
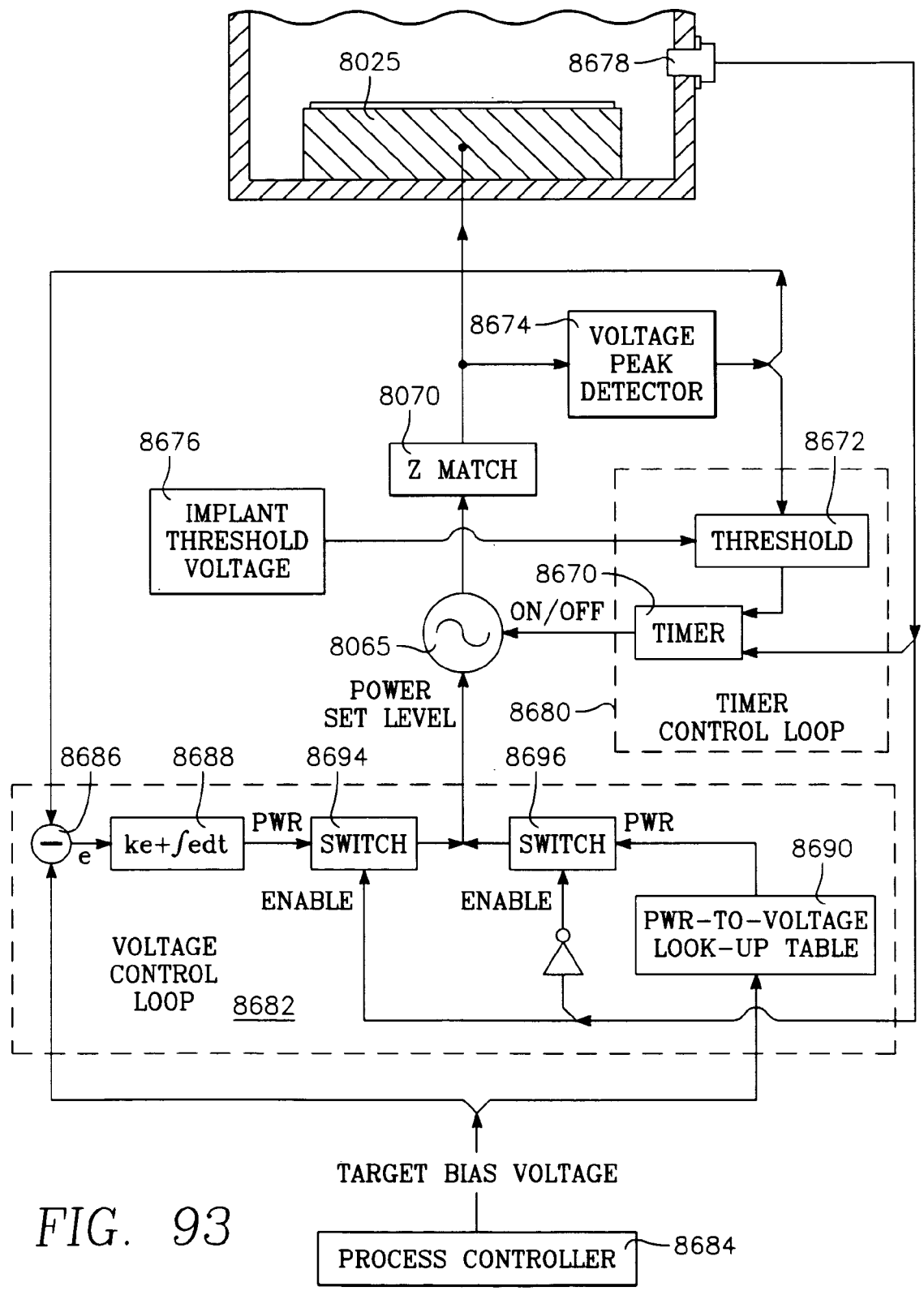
FIG. 93 is a block diagram illustrating a control system for controlling bias voltage in accordance with the feature illustrated in FIG. 92.

FIG. 93 illustrates a control circuit for determining the bias generator power level that produces the desired sheath voltage and for determining when the target sheath voltage has been reached for beginning the RF burst timer. In the following description, the target bias voltage corresponding to a desired junction depth, has already been determined. In addition, the threshold voltage for implantation has also been determined, and the threshold voltage may be synonymous with the target bias voltage. Finally, the duration time for applying RF bias power at the target bias voltage has already been determined. The RF bias power generator 8065 is controlled by a timer 8670 that begins counting sometime after the beginning of an RF burst and times out after a predetermined duration. A threshold comparator 8672 compares the peak-to-peak voltage as detected at the wafer pedestal 8025 by a peak detector 8674 with the desired threshold voltage 8676. The timer 8670 is enabled only when it receives an affirmative signal from an optical detector 8678 indicating that plasma is ignited within the reactor chamber. If the optical detector 8678 sends an affirmative signal, then the timer 8670 begins counting as soon as the comparator 8672 determines that the peak-to-peak bias voltage has reached the desired threshold. When the timer 8670 times out (after the predetermined duration), it turns off the output of the bias power generator, thus terminating the current burst of RF bias power. The timer 8670 and the threshold comparator 8672 constitute a timer control loop 8680.

The power level of the bias power generator 8065 is controlled by a voltage control loop 8682. A process controller 8684 (or the process designer) determines the desired or "target" bias peak-to-peak voltage. This may be synonymous with the threshold voltage of 8676. A subtractor 8686 computes an error value as the difference between the actual peak bias voltage measured by the detector 8674 and the target bias voltage. A proportional integral conditioner 8688 multiplies this error value by a constant of proportionality, k, and integrates the error value with prior samples. The result is an estimated correction to the power level of the bias power generator 8065 that will bring the measured bias voltage closer to the target bias voltage. This estimate is superimposed on the current power level, and the result is an estimated power level command that is applied to the power set input of the bias power generator 8065. This estimate is only valid while plasma is ignited (i.e., during an RF burst). For times between RF bursts, the bias power level is controlled in accordance with a look-up table 8690 that correlates target peak-to-peak bias voltages with estimated bias power levels. The look-up table receives the target bias voltage from the process controller 8684 and in response outputs an estimated bias power level. A pair of switches 8694, 8696 are enabled in complementary fashion by the output of the plasma ignition optical detector 8678. Thus, the switch 8694 receives the output of the sensor 8678 while the switch 8696 receives the inverted output of the sensor 8678. Thus, during an RF burst, when plasma is ignited in the chamber, the output of the proportional integral conditioner 8688 is applied to the power set input of the bias generator 8065 via the switch 8694. Between RF bursts, or when no plasma is ignited in the chamber, the output of the look-up table 8690 is applied via the switch 8696 to the power set input of the bias power generator 8065. The output of the look up table 8690 may be considered as a gross estimate that serves to initialize the RF bias power level at the beginning of each RF burst, while the output of the integral proportional conditioner is a more accurate estimate based upon actual measurement that serves to correct the bias power level during the RF burst.

Figure 94:
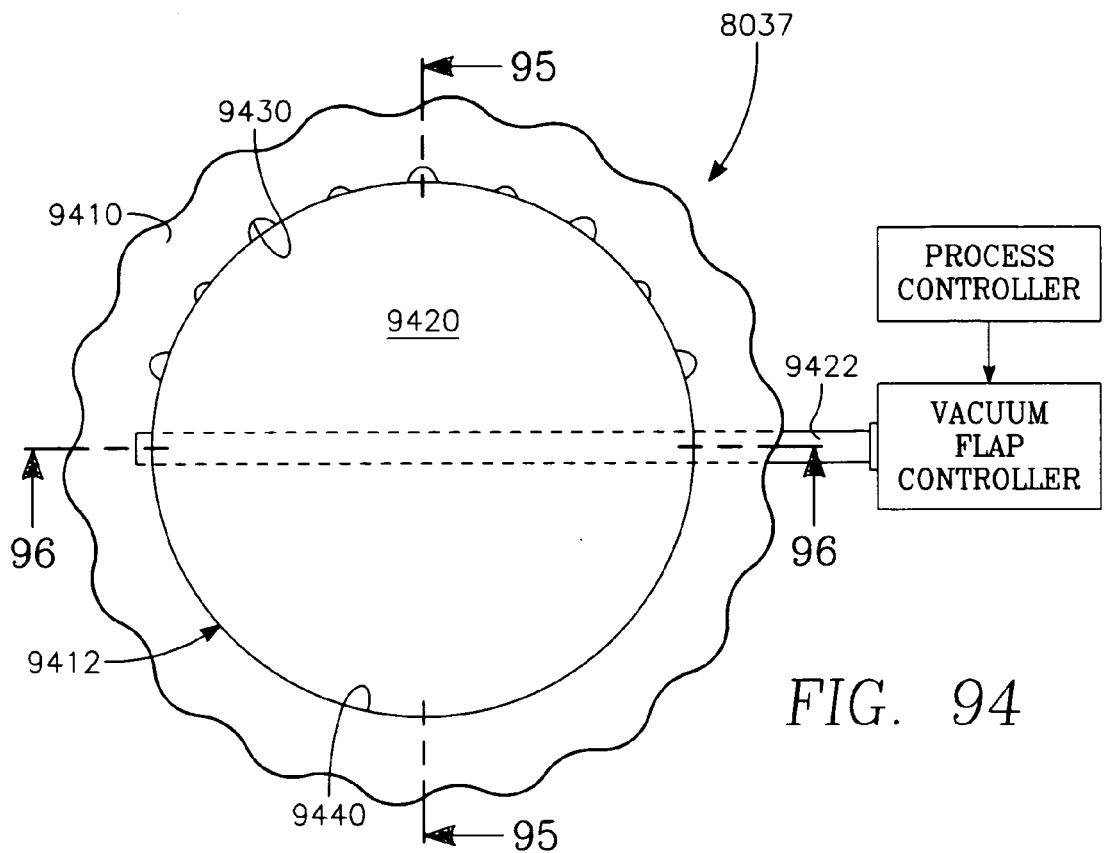
FIG. 94 is a top view of a vacuum control valve employed in the reactor of FIG. 85.
Figure 95:
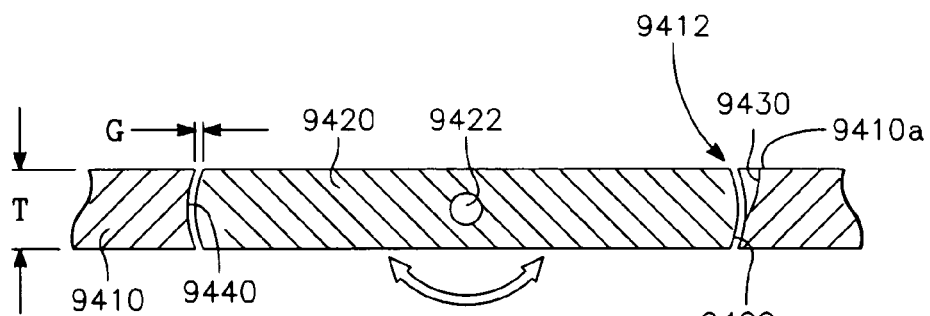
FIG. 95 is a cross-sectional side view of the valve of FIG. 94 in the closed position.
Figure 96:
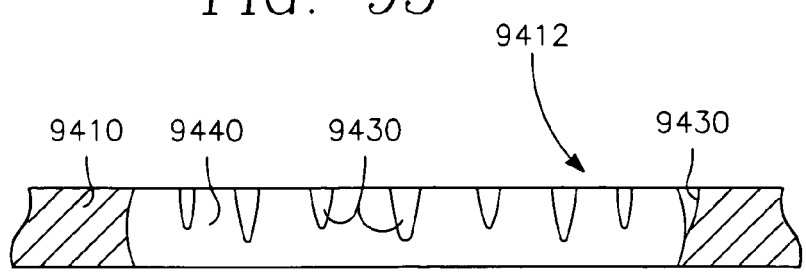
FIG. 96 is a side view of the interior surface of the housing of the valve of FIG. 95 with an orientation at right angles to that of FIG. 95.

One problem in the plasma immersion ion implantation reactor of FIG. 89A is that most ion implantation processes must be carried out with precise fine control over chamber pressure. This requires a relatively gradual change in chamber pressure over a given rotation of the control valve 8037 from its closed position. On the other hand, some processes, including chamber cleaning, require a very high gas flow rate (e.g., of cleaning gases) and a concomitantly high evacuation rate by the pump 8035. This requires that the vacuum control valve 8037 have a large area. The problem is that with such a large area, a vacuum control valve does not provide the gradual change in pressure for a given rotation from its closed position that is necessary for fine control of chamber pressure during ion implantation. In fact, with a large area opening and flap, the change in chamber pressure is very rapid as the flap is rotated from its closed position, so that fine control of pressure within a very low pressure range, where the flap must be nearly closed, is very difficult. This problem is solved with the vacuum control valve of FIGS. 94, 95 and 96. The valve includes a flat housing 9410 having a circular opening 9412 through it. A rotatable flap 9420 having a disk shape is supported within the circular opening 9412 by a hinge 9422 attached to the housing 9410. In its closed position, the flap 9420 is co-planar with the flat housing 9410. In order to prevent leakage of plasma through the valve, the gap G between the rotatable flap 9420 and the housing 9410 is narrow while the thickness T of the flap 9420 and housing 9410 is large, much greater than the gap G. For example, the ratio of the thickness T to the gap G is about 10:1. This feature provides the advantage of frictionless operation. In order to provide gradual control of chamber pressure at a very low pressure range (i.e., when the flap 9420 is near its closed position), conically-shaped openings 9430 are provided in the interior surface 9440 of the housing 9410 defining the edge of the opening 9412. Some of the openings 9430 have different axial locations (along the axis of the opening 9412) than others of the openings 9430. In its closed position, the flap 9420 permits virtually zero gas leakage, because the openings 9430 are not exposed. As the flap 9420 begins to rotate from its closed position (i.e., in which the flap 9420 is co-planar with the housing 9410), small portions of at least some of the openings 9430 begin to be exposed, and therefore allow a small amount of gas flow through the valve. As the flap 9420 continues to rotate, it exposes larger portions of the openings 9430. Moreover, it begins to expose others of the openings 9430 not exposed during the earlier phase of its rotation due to the different axial locations of different sets of the openings 9430, so that the gas flows through more of the openings 9430 in proportion to the rotation of the flap 9420. Thus, rotation of the flap 9430 from its fully closed (co-planar) position causes a continuous but relatively gradual increase in gas flow through the openings 9430 until the bottom edge 9420a of the flap 9420 reaches the top surface 9410a of the housing 9410. At this point, all of the openings 9430 are completely exposed so that gas flow through the openings 9430 is maximum and cannot increase further. Thus, a continuous gradual increase in gas flow is achieved (and therefore one that is readily controlled with a great deal of accuracy) as the flap 9420 rotates from its fully closed position to the point at which the flap bottom edge 9420a is aligned with the housing top surface 9410a. Within this range of flap rotational position, fine gradual adjustment of a small total chamber pressure is provided. Further rotation of the flap 9420 creates an annular gap between the periphery of the flap 9420 and the periphery of the large circular opening 9412, through which gas flow increases as the flap 9420 continues to rotate.

The plural openings 9430 in the opening interior surface 9440 are semi-circular openings that are tapered so as to increase in diameter toward the top housing surface 9410a. The tapered semi-circular openings 9430 thus define semi-conical shapes. However, other suitable shapes may be employed, such as semi-cylindrical, for example. However, one advantage of the semi-conical shape is that the rate of increase of gas flow with rotational flap position may be enhanced as the rotation progresses so that the rate continues to increase in a fairly smooth manner after the transition point at which the flap bottom edge 9420a passes the housing top surface 9410a.

Figure 97:
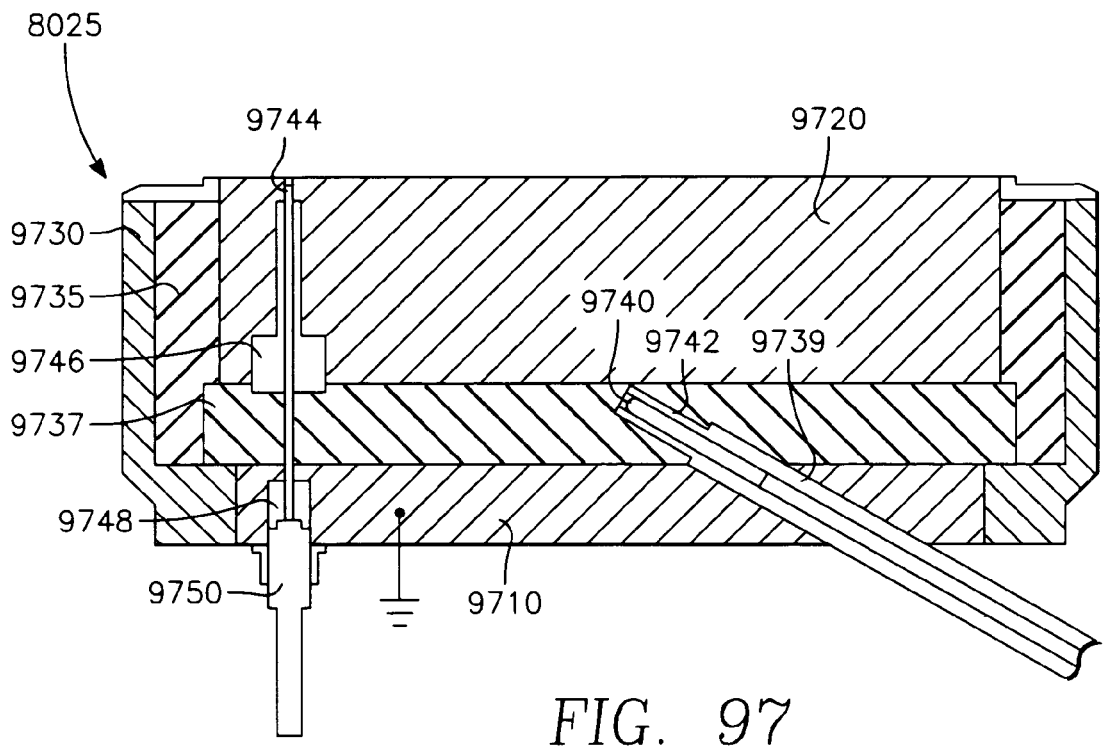
FIG. 97 is a cross-sectional side view of a high voltage wafer support pedestal useful in the reactor of FIG. 85.
Figure 98:
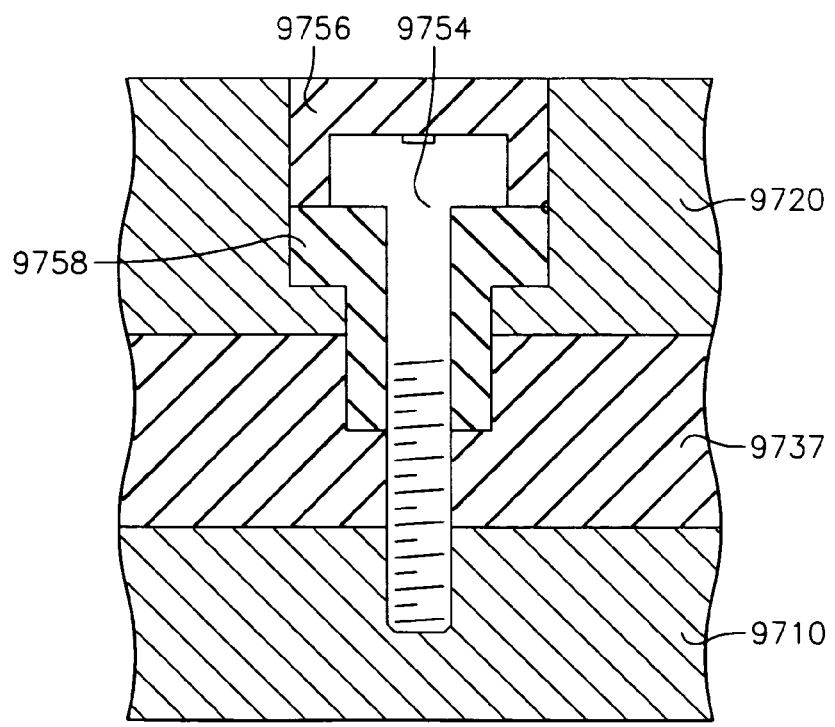
FIG. 98 is an enlarged cross-sectional view of the wafer support pedestal of FIG. 97 illustrating a fastener therein.

Depending upon the desired junction depth, the RF bias voltage applied to the wafer support pedestal 8025 may be relatively small (e.g., 500 volts) for a shallow junction or relatively large (e.g., 5,000 volts) for a deep junction. Some applications may require an RF bias voltage of over 10,000 volts. Such large voltages can cause arcing within the wafer support pedestal 8025. Such arcing distorts process conditions in the reactor. In order to enable the wafer support pedestal 8025 to withstand bias voltages as high a 10,000 volts, for example, without arcing, voids within the wafer support pedestal 8025 are filled with a dielectric filler material having a high breakdown voltage, such as Rexolite®, a product manufactured by C-Lec Plastics, Inc. As illustrated in FIG. 97, the wafer support pedestal 8025 consists of a grounded aluminum base plate 9710, an aluminum electrostatic chuck plate 9720 and a cylindrical sidewall 9730. Dielectric filler material 9735 fills voids between the sidewall 9730 and the electrostatic chuck plate 9720. Dielectric filler material 9737 fills voids between the electrostatic chuck plate 9720 and the base plate 9710. A coaxial RF conductor 9739 carrying the RF bias power from the RF generator 8065 (not shown in FIG. 97) is terminated in a narrow cylindrical conductive center plug 9740 that fits tightly within a matching conductive receptacle 9742 of the electrostatic chuck plate 9720. A wafer lift pin 9744 (one of three) extends through the pedestal 8025. The lift pin 9744 is tightly held within the electrostatic chuck plate 9720 by a surrounding blanket 9746 of the dielectric filler material. A void 9748 that accommodates a guide 9750 of the lift pin 9744 is located entirely within the base plate 9710 so as to minimize the risk of arcing within the void 9748. Referring to FIG. 98, bolt 9754 (one of several) holding the base plate 9710 and the electrostatic chuck plate 9720 together is completely encapsulated to eliminate any voids around the bolt 9754, with dielectric layers 9756, 9758 surrounding exposed portions of the bolt 9754. The foregoing features have been found to enable the wafer support pedestal to withstand an RF bias voltage of over 10,000 volts without experiencing arcing.

Figure 99:
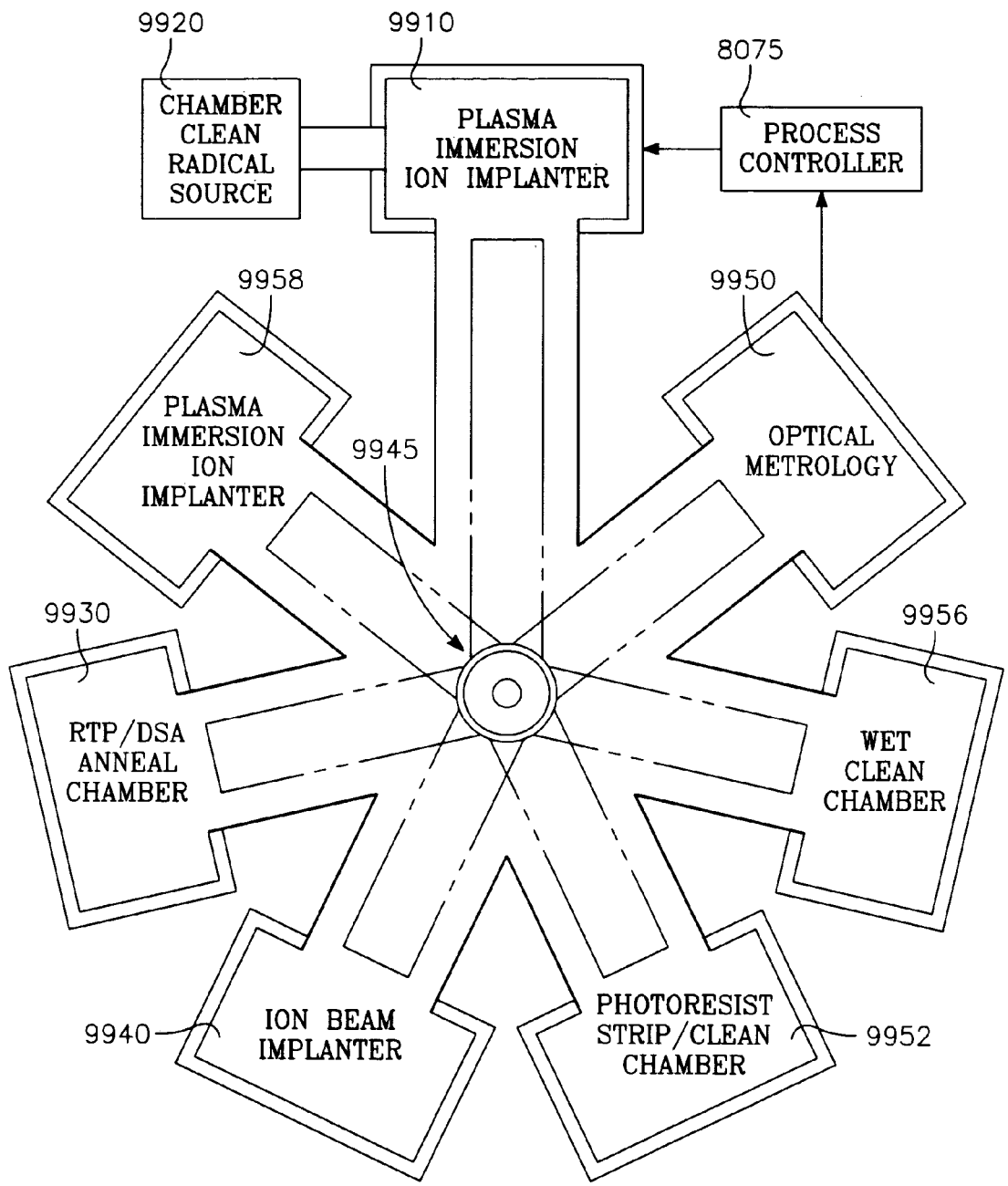
FIG. 99 is a block diagram illustrating an ion implantation processing system including a plasma immersion ion implantation reactor.

FIG. 99 illustrates an ion implantation system including a plasma immersion ion implantation reactor 9910 of the type illustrated in FIG. 79, 83A, 83B, 84, 85, 88, 89A or 93. An independent source 9920 of chamber-cleaning radicals or gases (such as fluorine-containing gases or fluorine-containing radicals like NF$_3$ and/or other cleaning gases such as hydrogen-containing gases (e.g., H$_2$ or compounds of hydrogen) to produce hydrogen-containing radicals or oxygen-containing gases (e.g., O$_2$) is coupled to the implant reactor 9910 for use during chamber cleaning operations. A post-implant anneal chamber 9930 and an ion beam implanter 9940 are also included in the system of FIG. 99. In addition, an optical metrology chamber 9950 may also be included. Furthermore, a photoresist pyrolization chamber 9952 may be included in the system for removal of the photoresist mask subsequently after implant and prior to anneal. Alternatively, this may be accomplished within the plasma immersion implantation reactor 9910 using the RF plasma source power and optional bias power with oxygen gas, and/or by using the independent self-cleaning source with oxygen gas.

The system of FIG. 99 may also include a wet clean chamber 9956 for carrying out wafer cleaning. The wet clean chamber 9956 may employ such well known wet cleaning species as HF, for example. The wet clean chamber 9956 may be employed for pre-implantation or post-implantation cleaning of the wafer. The pre-implantation cleaning use of the wet clean chamber 9956 may be for removing a thin native oxide that can accumulate on the wafer between processing operations. The post-implantation cleaning use of the wet clean chamber 9956 may be for removing photoresist from the wafer in lieu of the photoresist strip chamber 9952. The system of FIG. 99 may further include a second, (third, fourth or more) plasma immersion ion implantation reactor 9958 of the type illustrated in FIG. 79, 83A, 83B, 84, 85, 88, 89A or 93. In one example, the first PIII reactor 9910 may be configured to ion implant a first species while the second PIII reactor 9958 may be configured to implant a second species, so that a single PIII reactor need not be re-configured to implant the two species in each wafer. Furthermore, the first and second species may be dopant impurities for opposite semiconductor conductivity types (e.g., boron and phosphorus), in which case the second PIII reactor 9958 may be employed in lieu of the beam implantation tool 9940. Or, two N-type dopants (phosphorous and arsenic) may be implanted in addition to a P-type dopant (boron), in which case boron implantation is carried out by the first PIII reactor 9910, arsenic implantation is carried out in the ion beam tool 9940 and phosphorus implantation is carried out in the second PIII reactor 9958, for example. In another example, the 2 (or more) PIII reactors may be configured to implant the same species so as to increase the throughput of the system.

A wafer transfer robotic handler 9945 transfers wafers between the plasma ion implant reactor 9910, the anneal chamber 9930, the ion beam implanter 9940, the photoresist pyrolization chamber 9952, the optical metrology chamber 9950, the wet clean chamber 9956 and the second PIII reactor 9958. If the entire system of FIG. 99 is provided on a single tool or frame, the handler 9945 is a part of that tool and is supported on the same frame. However, if some of the components of the system of FIG. 99 are on separate tools located in separate places in a factory, then the handler 9945 is comprised of individual handlers within each tool or frame and a factory interface that transports wafers between tools within the factory, in the well-known manner. Thus, some or all of the components of the system of FIG. 99 may be provided on a single tool with its own wafer handler 9945. Alternatively, some or all of the components of the system of FIG. 99 may be provided on respective tools, in which case the wafer handler 9945 includes the factory interface.

The process controller 8075 can receive measurements of a previously implanted wafer from the optical metrology chamber 9950, and adjust the implant process in the plasma implant reactor 9910 for later wafers. The process controller 8075 can use established data mining techniques for process correction and control. The inclusion of the ion beam implanter 9940 permits the system to perform all of the ion implantation steps required in semiconductor fabrication, including implantation of light elements (such as boron or phosphorous) by the plasma ion implant reactor 9910 and implantation of heavier elements (such as arsenic) by the ion beam implanter 9940. The system of FIG. 99 may be simplified. For example, a first version consists of only the chamber cleaning radical source 9920, the PIII reactor 9910 and the process controller 8075. A second version includes the foregoing elements of the first version and, in addition, the optical metrology tool 9950. A third version includes the foregoing elements of the second version and, in addition, the ion beam implanter 9940 and/or the second PIII reactor 9958. A fourth version includes the foregoing elements of the third version and, in addition, the anneal chamber 9930.

Ion Implantation Performance of the Torroidal Source:

The plasma immersion ion implantation (PIII) reactor of FIG. 85 realizes many advantages not found heretofore in a single reactor. Specifically, the PIII reactor of FIG. 85 has low minimum ion implant energy (because it has a low plasma potential), low contamination (because the re-circulating plasma generally does not need to interact with chamber surfaces to provide a ground return), very good control over unwanted etching (because it exhibits low fluorine dissociation), and excellent control over ion implant flux (because it exhibits a nearly linear response of plasma electron density to source power).

Figure 100:
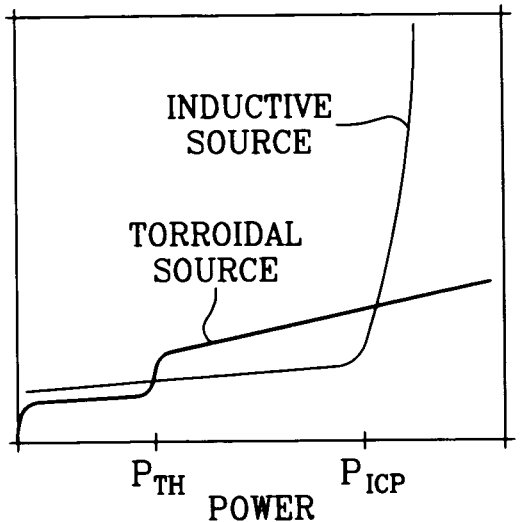
FIG. 100 is a graph illustrating electron density as a function of applied plasma source power for the inductively coupled plasma immersion ion implantation reactor of FIG. 79 and the torroidal source plasma immersion ion implantation reactor of FIG. 85.

The advantage of excellent control over ion implant flux is illustrated in the graph of FIG. 100, in which electron density is plotted as a function of source power level for the torroidal source PIII reactor of FIG. 85 and for an inductively coupled PIII reactor of the type illustrated in FIG. 79. Electron density is an indicator of plasma ion density and therefore of the ion implant flux or implant dose to the wafer. The inductively coupled source of the PIII reactor of FIG. 79 tends to have a highly non-linear response of electron density to applied source power, exhibiting a sudden increase in electron density at a threshold power level, PICP, below which the slope (response) is negligible and above which the slope (response) is so steep that electron density (and therefore ion implant flux or dose) is nearly impossible to control to any fine degree. In contrast the torroidal source PIII reactor of FIG. 85 has a generally linear and gradual response of electron density to source power level above a threshold power level PTH, so that ion implant flux (dose) is readily controlled to within a very fine accuracy even at very high source power level. It should be noted here that the plasma source power level of the torroidal source PIII reactor of FIG. 85 is a function of the two different source power generators 8055, 8056 coupled to the respective reentrant conduits 8150, 8151. The source power frequency may be about 13.56 MHz, although the frequency of each of the two source power generators 8055, 8056 are offset from this frequency (13.56 MHz) by +100 kHz and −100 kHz, respectively, so that the two torroidal plasma current paths established by the sources 8110 and 8111 are decoupled from one another by being de-tuned from one another by about 200 kHz. However, their power levels may be generally about the same. Operating frequencies are not limited to the regime described here, and another RF frequency and frequency offset may be selected for the pair of RF source power generators 8055, 8056.

Figure 101:
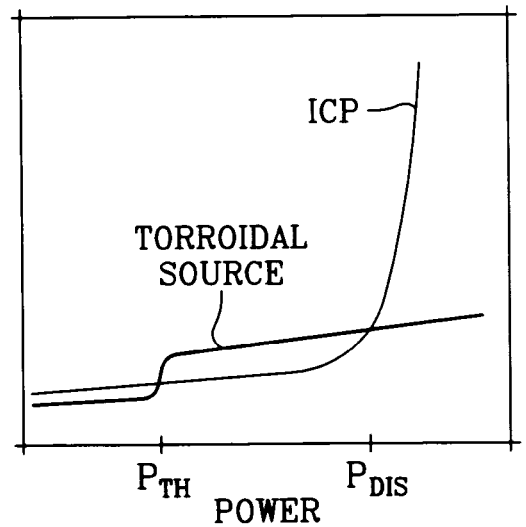
FIG. 101 is a graph illustrating free fluorine density as a function of applied plasma source power for the inductively coupled plasma immersion ion implantation reactor of FIG. 79 and the torroidal source plasma immersion ion implantation reactor of FIG. 85.

The advantage of low fluorine dissociation of the PIII reactor of FIG. 85 is important in preventing unwanted etching that can occur when a fluorine-containing dopant gas, such as BF3, is employed. The problem is that if the BF3 plasma by-products are dissociated into the simpler fluorine compounds, including free fluorine, the etch rate increases uncontrollably. This problem is solved in the PIII reactor of FIG. 85 by limiting the fluorine dissociation even at high power levels and high plasma density. This advantage is illustrated in the graph of FIG. 101, in which free fluorine density (an indicator of fluorine dissociation) is plotted as a function of source power for the PIII reactor of FIG. 85 and for the inductively coupled reactor of FIG. 79 for the sake of comparison. The inductively coupled reactor of FIG. 79 exhibits an extremely sudden increase in free fluorine density above a particular source power level, PDIS, above which the dissociation increases at a very high rate of change, and is therefore difficult to control. In contrast, the PIII reactor of FIG. 85 exhibits generally linear and nearly negligible (very gradual) increase in free fluorine density above a threshold source power PTH. As a result, there is very little unwanted etching during ion implantation with fluorine-containing dopant gases in the torroidal source PIII reactor of FIG. 85. The etching is further minimized if the temperature of the wafer is held to a low temperature, such as below 100 degrees C., or more preferably below 60 degrees C., or most preferably below 20 degrees C. For this purpose, the wafer pedestal 8025 may be an electrostatic chuck that holds and releases the wafer electrostatically with thermal control cooling apparatus 8025a and/or heating apparatus 8025b that control the temperature of a semiconductor wafer or workpiece held on the top surface of the wafer support pedestal 8025. Some small residual etching (such as may be realized with the torroidal source PIII reactor of FIG. 85) is acceptable and may actually prevent the deposition of unwanted films on the wafer during ion implantation. During ion implantation, some plasma by-products may deposit as films on the wafer surface during ion implantation. This is particularly true in cases where the implantation process is carried out at a very low ion energy (low bias voltage) and particularly with a dopant gas consisting of a hydride of the dopant species (e.g., a hydride of boron or a hydride of phosphorous). In order to further reduce unwanted depositions that normally occur with hydride dopants (e.g., $B_2H_6$, $PH_3$), one aspect of the process is to add hydrogen and/or helium to the dopant gas to eliminate the deposition on the surface of the wafer. However, the requisite etch rate to compete with such an unwanted deposition is very low, such as that exhibited by the torroidal source PIII reactor of FIG. 85.

Figure 102:
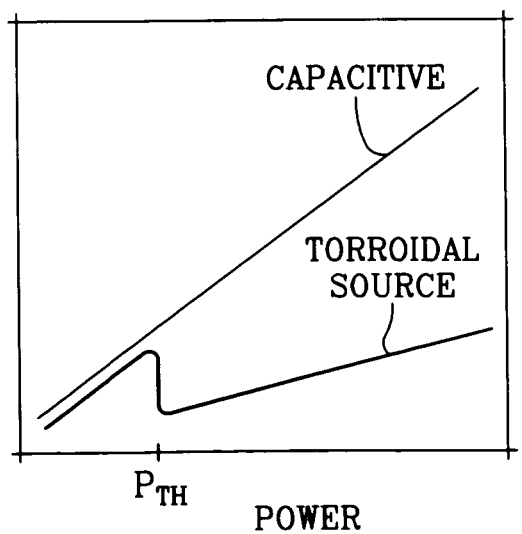
FIG. 102 is a graph illustrating electron density as a function of applied plasma source power for the capacitively coupled plasma immersion ion implantation reactor of FIG. 83A and the torroidal source plasma immersion ion implantation reactor of FIG. 85.

The advantage of a low minimum ion implant energy increases the range of junction depths of which the PIII reactor of FIG. 85 is capable (by reducing the lower limit of that range). This advantage is illustrated in the graph of FIG. 102, in which plasma potential is plotted as a function of plasma source power for the torroidal source PIII reactor of FIG. 85 and for the capacitively coupled PIII reactor of FIG. 83A, for the sake of comparison. The plasma potential is the potential on ions at the wafer surface due to the plasma electric field in the absence of any bias voltage on the wafer, and therefore is an indicator of the minimum energy at which ions can be implanted. FIG. 102 shows that the plasma potential increases indefinitely as the source power is increased in the capacitively coupled PIII reactor of FIG. 83A, so that in this reactor the minimum implant energy is greatly increased (the implant energy/depth range is reduced) at high plasma density or ion implant flux levels. In contrast, above a threshold power PTH, the torroidal source PIII reactor of FIG. 85 exhibits a very gradual (nearly imperceptible) increase in plasma potential as source power is increased, so that the plasma potential is very low even at high plasma source power or ion density (high ion implant flux). Therefore, the range of plasma ion energy (ion implant depth) is much larger in the PIII reactor of FIG. 85 because the minimum energy remains very low even at high ion flux levels.

The plasma potential in the capacitively coupled PIII reactor of FIG. 83A can be reduced by increasing the source power frequency. However, this becomes more difficult as the junction depth and corresponding ion energy is reduced. For example, to reach a plasma potential that is less than 500 eV (for a 0.5 kV boron implant energy), the source power frequency would need to be increased well into the VHF range and possibly above the VHF range. In contrast, the source power frequency of the torroidal source PIII reactor of FIG. 85 can be in the HF range (e.g., 13 MHz) while providing a low plasma potential.

A further advantage of the torroidal source PIII reactor of FIG. 85 over the capacitively coupled source PIII reactor of FIG. 83A is that the torroidal source PIII reactor has a thinner plasma sheath in which proportionately fewer inelastic collisions of ions occur that tend to skew the ion implant energy distribution. This thinner sheath may be nearly collision-less. In contrast, the capacitively coupled source PIII reactor of FIG. 83A generates plasma ions in the sheath by an HF or VHF RF source that tends to produce a much thicker sheath. The thicker sheath produces far more collisions that significantly skew ion energy distribution. The result is that the ion implanted junction profile is far less abrupt. This problem is more acute at lower ion energies (shallower implanted junctions) where the skew in energy produced by the collisions in the thicker sheath represent a far greater fraction of the total ion energy. The torroidal source PIII reactor of FIG. 85 therefore has more precise control over ion implant energy and is capable of producing implanted junctions with greater abruptness, particularly for the more shallow junctions that are needed for the more advanced (smaller feature size) technologies.

A related advantage of the torroidal source PIII reactor of FIG. 85 is that it can be operated at much lower chamber pressures than the capacitively coupled PIII reactor of FIG. 83A. The capacitively coupled PIII reactor of FIG. 83A requires a thicker sheath to generate plasma ions in the sheath, which in turn requires higher chamber pressures (e.g., 10-100 mT). The torroidal source PIII reactor of FIG. 85 does not need to generate plasma near the sheath with bias power and for many applications therefore is best operated with a thinner (nearly collision-less) sheath, so that chamber pressures can be very low (e.g., 1-3 mT). This has the advantage of a wider ion implantation process window in the torroidal source PIII reactor. However, as will be discussed with reference to doping of a three dimensional structure such as a polysilicon gate having both a top surface and vertical sidewalls, velocity scattering of dopant ions in the sheath enables ions to implant not only the top surface of the polysilicon gate but also implant its sidewalls. Such a process may be referred to as conformal ion implanting. Conformal ion implanting has the advantage of doping the gate more isotropically and reducing carrier depletion at the gate-to-thin oxide interface, as will be discussed below. Therefore, some sheath thickness is desirable in order to scatter a fraction of the dopant ions away from a purely vertical trajectory so that the scattered fraction implants into the sidewalls of the polysilicon gate. (In contrast, in an ion beam implanter, such scattering is not a feature, so that only the gate top surface is implanted.) Another advantage of a plasma sheath of finite thickness (and therefore finite collisional cross-section) is that some very slight scattering of all the ions from a purely vertical trajectory (i.e., a deflection of only a few degrees) may be desirable in some cases to avoid implanting along an axis of the wafer crystal, which could lead to channeling or an implant that is too deep or a less abrupt junction profile. Also, scattering of the ions leads to placement of dopants under the polysilicon gate. This can be very useful in optimizing CMOS device performance by controlling the dopant overlap under the polysilicon gate and source-drain extension areas, as will be discussed later in this specification in more detail.

The low contamination exhibited by the torroidal source PIII reactor of FIG. 85 is due primarily to the tendency of the plasma to not interact with chamber surfaces and instead oscillate or circulate in the torroidal paths that are generally parallel to the chamber surfaces rather than being towards those surfaces. Specifically, the pair torroidal paths followed by the plasma current are parallel to the surfaces of the respect reentrant conduits 8150, 8151 of FIG. 85 and parallel to the interior surface of the ceiling 8015 and of the wafer support pedestal 8025. In contrast, the plasma source power generates electric fields within the capacitively coupled PIII reactor of FIG. 83A that are oriented directly toward the ceiling and toward the chamber walls.

In the torroidal source PIII reactor of FIG. 85, the only significant electric field oriented directly toward a chamber surface is produced by the bias voltage applied to the wafer support pedestal 8025, but this electric field does not significantly generate plasma in the embodiment of FIG. 85. While the bias voltage can be a D.C. (or pulsed D.C.) bias voltage, in the embodiment of FIG. 85 the bias voltage is an RF voltage. The frequency of the RF bias voltage can be sufficiently low so that the plasma sheath at the wafer surface does not participate significantly in plasma generation. Thus, plasma generation in the torroidal source PIII reactor of FIG. 85 produces only plasma currents that are generally parallel to the interior chamber surfaces, and thus less likely to interact with chamber surfaces and produce contamination.

Further reduction of metal contamination of ion implantation processes is achieved by first depositing a passivation layer on all chamber surfaces prior to performing the ion implantation process. The passivation layer may be a silicon-containing layer such as silicon dioxide, silicon nitride, silicon, silicon carbide, silicon hydride, silicon fluoride, boron or phosphorous or arsenic doped silicon, boron or phosphorous or arsenic doped silicon carbide, boron or phosphorous or arsenic doped silicon oxide. Alternatively, the passivation may be a fluorocarbon or hydrocarbon or hydrofluorocarbon film. Compounds of germanium may also be used for passivation. Alternatively, the passivation layer may be a dopant-containing layer such as boron, phosphorous, arsenic or antimony formed by decomposition of a compound of the dopant precursor gas, such as $BF_3$, $B_2H_6$, $PF_3$, $PF_5$, $PH_3$, $AsF_3$, of $AsH_3$. It may be advantageous to form a passivation layer with a source gas or source gas mixture using gas(es) similar to that or those that are to be used in the subsequent plasma immersion implantation process step. (This may reduce unwanted etching of the passivation layer by the subsequent implant process step.) Alternatively, it may be advantageous to combine the fluoride and the hydride of a particular gas to minimize the fluorine and/or hydrogen incorporated in the passivation layer, for example, $BF_3+B_2H_6$, $PH_3+PF_3$, $AsF_3+AsH_3$, $SiF_4+SiH_4$, or $GeF_4+GeH_4$.

While the RF bias frequency of the torroidal source PIII reactor of FIG. 85 is sufficiently low to not affect plasma generation by the plasma source power applicators 8110, 8111, it is also sufficiently low to permit the ions in the plasma sheath to follow the sheath oscillations and thereby acquire a kinetic energy of up to the equivalent to the full peak-to-peak voltage of the RF bias power applied to the sheath, depending upon pressure and sheath thickness. This reduces the amount of RF bias power required to produce a particular ion energy or implant depth. On the other hand, the RF bias frequency is sufficiently high to avoid significant voltage drops across dielectric layers on the wafer support pedestal 8025, on chamber interior walls and on the wafer itself. This is particularly important in ion implantation of very shallow junctions, in which the RF bias voltage is correspondingly small, such as about 150 volts for a 100 Angstrom junction depth (for example). An RF voltage drop of 50 volts out of a total of 150 volts across the sheath (for example) would be unacceptable, as this would be a third of the total sheath voltage. The RF bias frequency is therefore sufficiently high to reduce the capacitive reactance across dielectric layers so as to limit the voltage drop across such a layer to less than on the order of 10% of the total RF bias voltage. A frequency sufficiently high meet this latter requirement while being sufficiently low for the ions to follow the sheath oscillations is in the range of 100 kHz to 10 MHz, and more optimally in the range of 500 kHz to 5 MHz, and most optimally about 2 MHz. One advantage of reducing capacitive voltage drops across the wafer pedestal is that the sheath voltage can be more accurately estimated from the voltage applied to the pedestal. Such capacitive voltage drops can be across dielectric layers on the front or back of the wafer, on the top of the wafer pedestal and (in the case of an electrostatic chuck) the dielectric layer at the top of the chuck.

Figure 103:
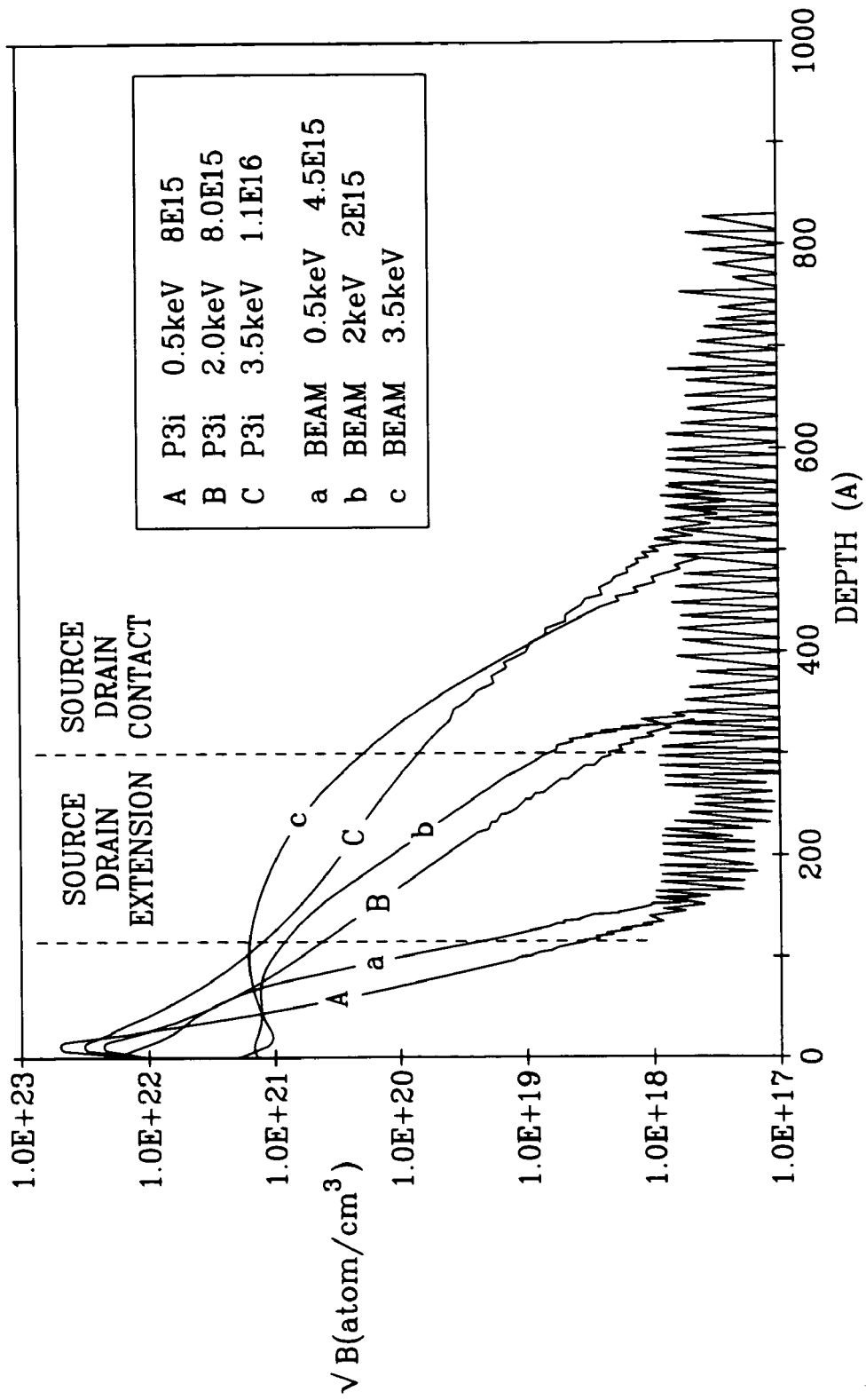
FIG. 103 is a graph illustrating dopant concentration as a function of junction depth for different ion energies in the reactor of FIG. 85 and in a convention ion beam implant machine.

Ion implantation results produced by the torroidal source PIII reactor of FIG. 85 compare favorably with those obtained with a conventional beam implanter operated in drift mode, which is much slower than the PIII reactor. Referring to FIG. 103, the curves "A" and "a" are plots of dopant (boron) volume concentration in the wafer crystal as a function of depth for boron equivalent energies of 0.5 keV. (As will be discussed below, to achieve the same ion energy as the beam implanter, the bias voltage in the PIII reactor must be twice the acceleration voltage of the beam implanter.) Even though the PIII reactor (curve "A") is four times faster than the beam implanter (curve "B"), the implant profile is nearly the same, with the same junction abruptness of about 3 nanometers (change in junction depth) per decade (of dopant volume concentration) and junction depth (about 100 angstroms). Curves "B" and "b" compare the PIII reactor results ("B") with those of a conventional beam implanter ("b") at boron equivalent energies of 2 keV, showing that the junction abruptness and the junction depth (about 300 angstroms) is the same in both cases. Curves "C" and "c" compare the PIII reactor results ("C") with those of a conventional beam implanter ("c") at boron equivalent energies of 3.5 keV, showing that the junction depth (about 500 angstroms) is the same in both cases.

Figure 104:
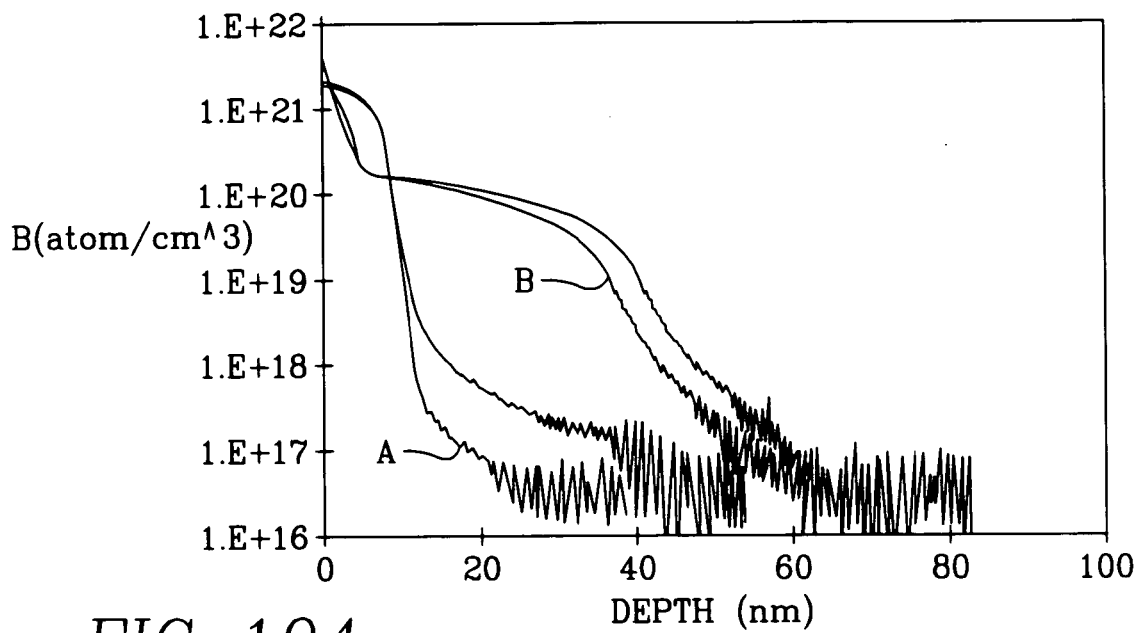
FIG. 104 is a graph illustrating dopant concentration before and after post-implant rapid thermal annealing.
Figure 105:
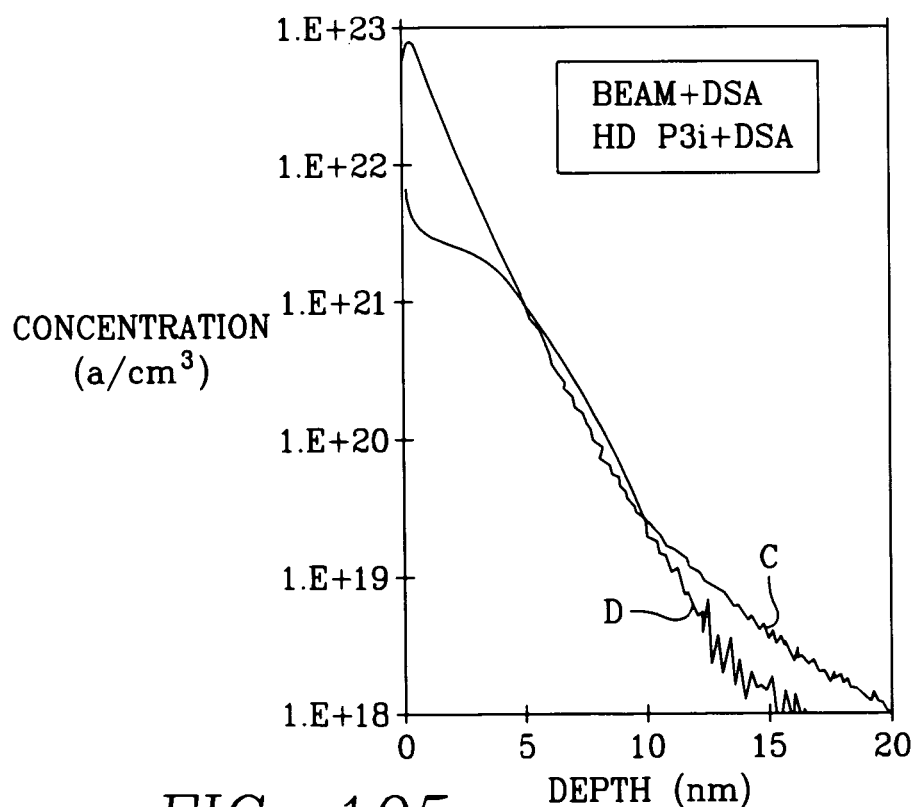
FIG. 105 is a graph illustrating dopant concentration before and after dynamic surface annealing in the torroidal source plasma immersion ion implantation reactor of FIG. 85 and in a convention ion beam implant machine.

FIG. 103 compares the PIII reactor performance with the conventional beam implanter operated in drift mode (in which the beam voltage corresponds to the desired junction depth). Drift mode is very slow because the beam flux is low at such low beam energies. This can be addressed by using a much higher beam voltage and then decelerating the beam down to the correct energy before it impacts the wafer. The deceleration process is not complete, and therefore leaves an energy "contamination" tail (curve "A" of FIG., 104) which can be reduced by rapid thermal annealing to a better implant profile with greater abruptness (curve "B" of FIG. 104). Greater activated implanted dopant concentration, however, can be achieved using a dynamic surface annealing process employing localized melting or nearly melting temperatures for very short durations. The dynamic surface annealing process does not reduce energy contamination tails, such as the energy contamination tail of curve "C" of FIG. 105. In comparison, the torroidal source PIII reactor of FIG. 85 needs no deceleration process since the bias voltage corresponds to the desired implant depth, and therefore has no energy contamination tail (curve "D" of FIG. 105). Therefore, the PIII reactor can be used with the dynamic surface anneal process to form very abrupt ultra shallow junction profile, while the conventional beam implanter operating in deceleration mode cannot. The dynamic surface annealing process consists of locally heating regions of the wafer surface to nearly (e.g., within 100 to 50 degrees of) its melting temperature for very short durations (e.g., nanoseconds to tens of milliseconds) by scanning a laser beam or a group of laser beams across the wafer surface.

Figure 106:
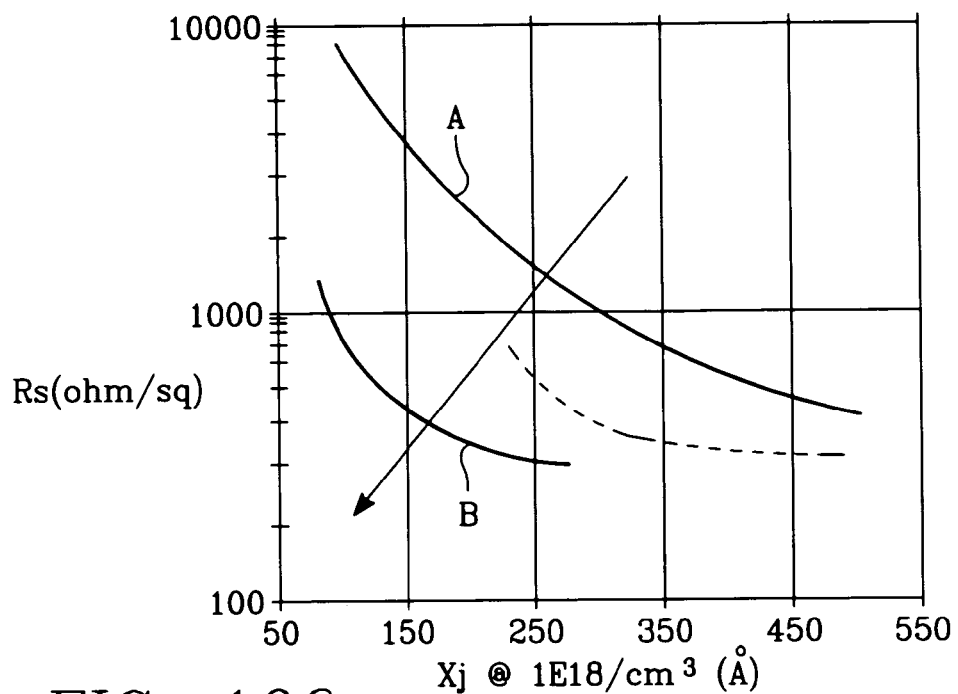
FIG. 106 is a graph depicting wafer resistivity after ion implantation and annealing as a function of junction depth obtained with the reactor of FIG. 85 using dynamic surface annealing and with a conventional ion beam implant machine using rapid thermal annealing.
Figure 107:
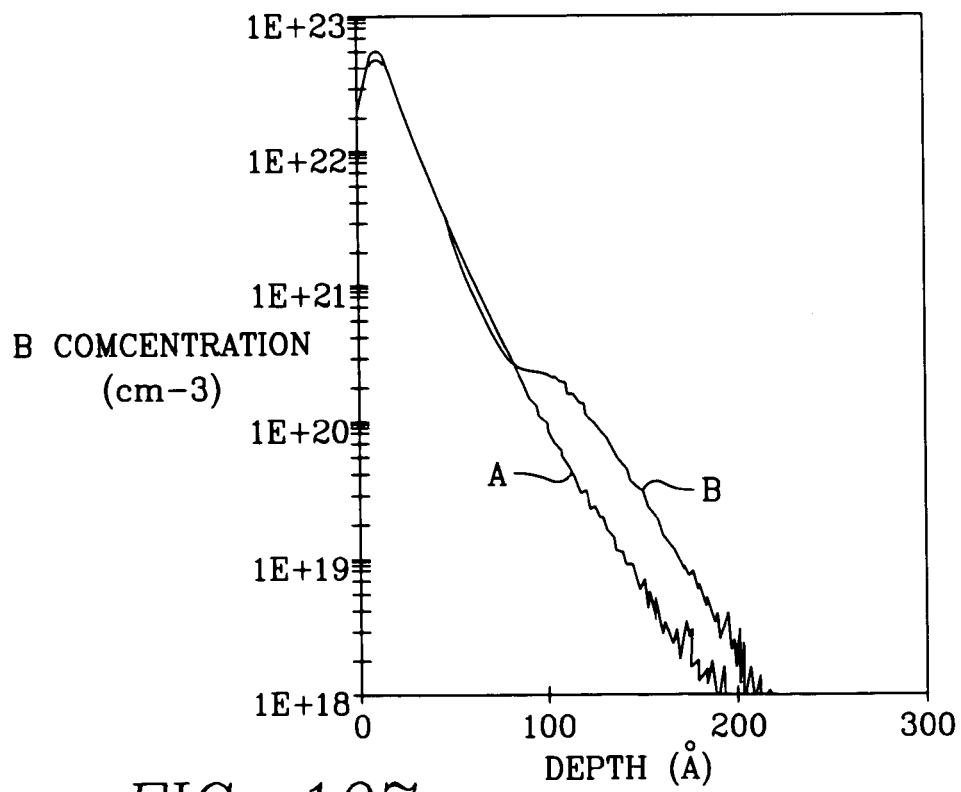
FIG. 107 is a graph depicting implanted dopant concentration obtained with the reactor of FIG. 85 before and after dynamic surface annealing.

FIG. 106 illustrates how much greater a dopant concentration can be attained with the dynamic surface annealing process. Curve "A" of FIG. 106 illustrates the wafer resistivity in Ohms per square as a function of junction depth using a beam implanter and a rapid thermal anneal of the wafer at 1050 degrees C. The concentration of dopant reached 10E20 per cubic centimeter. Curve "B" of FIG. 106 illustrates the wafer resistivity in Ohms per square as a function of junction depth using the torroidal source PIII reactor of FIG. 85 and a dynamic surface anneal process after implanting at a temperature of 1300 degrees C. The concentration of the dopant reached $5 \times 10^{20}$ following the dynamic surface annealing, or about five times that achieved with rapid thermal annealing. FIG. 107 illustrates how little the implanted dopant profile changes during dynamic surface annealing. Curve "A" of FIG. 107 is the dopant distribution prior to annealing while curve "B" of FIG. 107 is the dopant distribution after annealing. The dynamic surface annealing process causes the dopant to diffuse less than 10 Å, while it does not adversely affect the junction abruptness, which is less than 3.5 nm/decade. This tendency of the dynamic surface annealing process to minimize dopant diffusion facilitates the formation of extremely shallow junctions. More shallow junctions are required (as source-to-drain channel lengths are decreased in higher speed devices) in order to avoid source-to-drain leakage currents. On the other hand, the shallower junction require much higher active dopant concentrations (to avoid increased resistance) that can best be realized with dynamic surface annealing. As discussed elsewhere in this specification, junction depth can be reduced by carrying out a wafer amorphization step in which the wafer is bombarded with ions (such as silicon or germanium ions) to create lattice defects in the semiconductor crystal of the wafer. We have implanted and annealed junctions having a high dopant concentration corresponding to a low resistivity (500 Ohms per square), an extremely shallow junction depth (185 Å) and a very steep abruptness (less than 4 nm/decade). In some cases, the depth of the amorphizing or ion bombardment process may extend below the dopant implant junction depth. For example, amorphization using SiF4 gas and a 10 kV peak-to-peak bias voltage in the PIII reactor of FIG. 85 forms an amorphized layer to a depth of about 150 angstroms, while dopant (boron) ions accelerated across a 1000 peak-to-peak volt sheath (bias) voltage implant to a depth of only about 100 angstroms.

Figure 108:
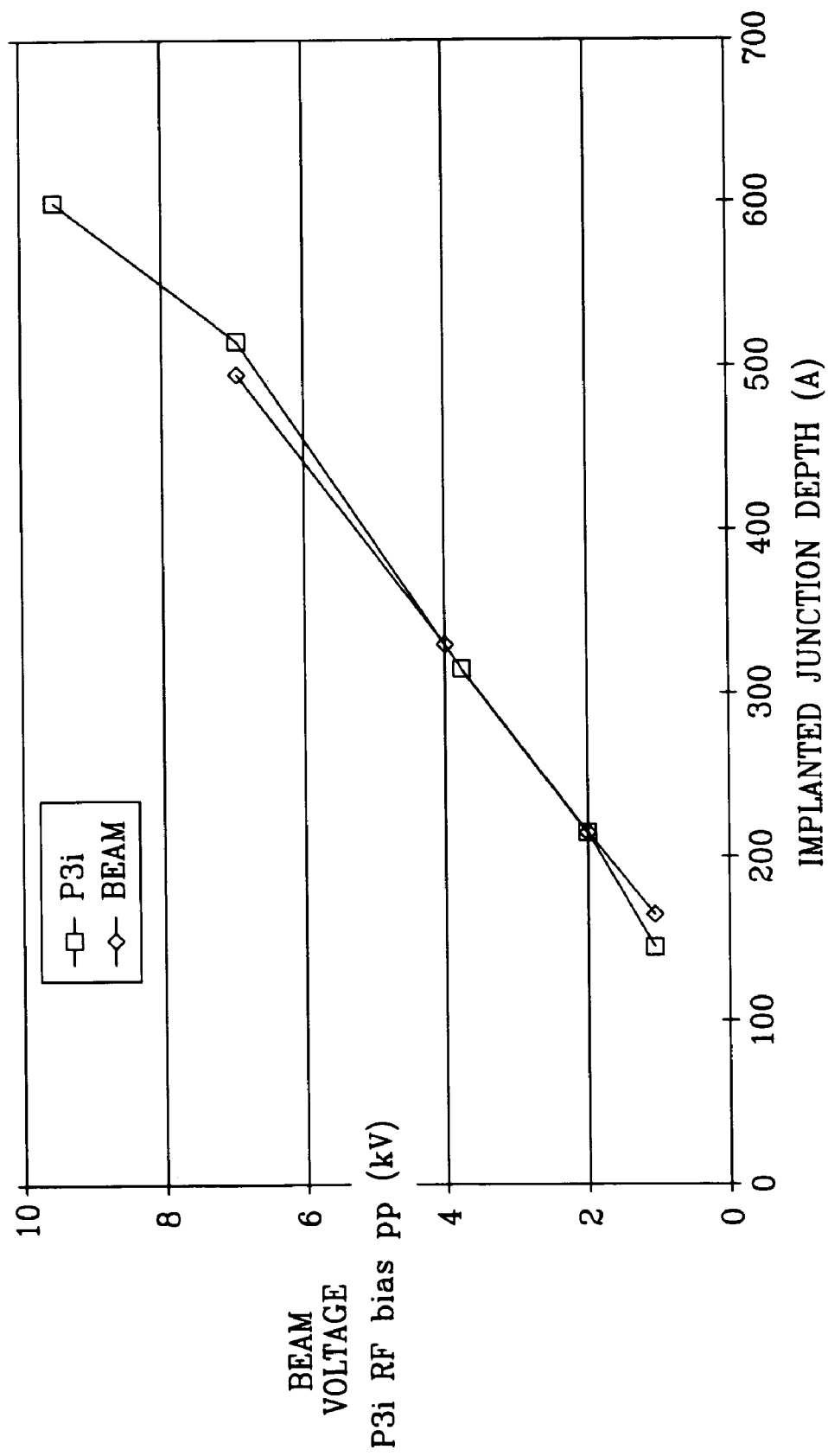
FIG. 108 is a graph of RF bias voltage in the reactor of FIG. 85 (left ordinate) and of beamline voltage in a beamline implant machine (right ordinate) as a function of junction depth.

FIG. 108 illustrates the bias voltage for the torroidal source PIII reactor (left hand ordinate) and the beam voltage for the ion beam implanter (right hand ordinate) as a function of junction depth. The PIII reactor and the beam implanter produce virtually identical results provided the PIII reactor bias voltage is twice the beam voltage.

Figure 109:
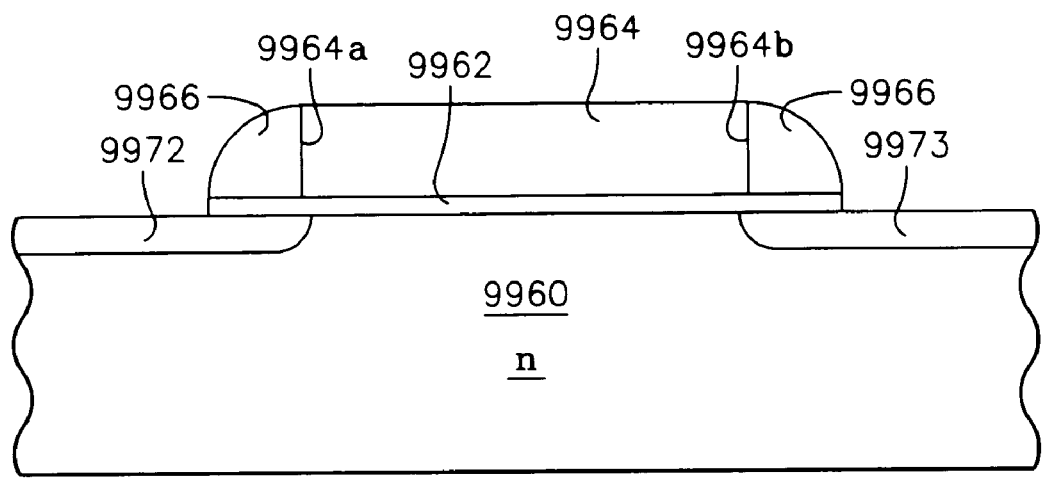
FIG. 109 is a cross-sectional view of the surface of a wafer during ion implantation of source and drain-contacts and of the polysilicon gate of a transistor.
Figure 110:
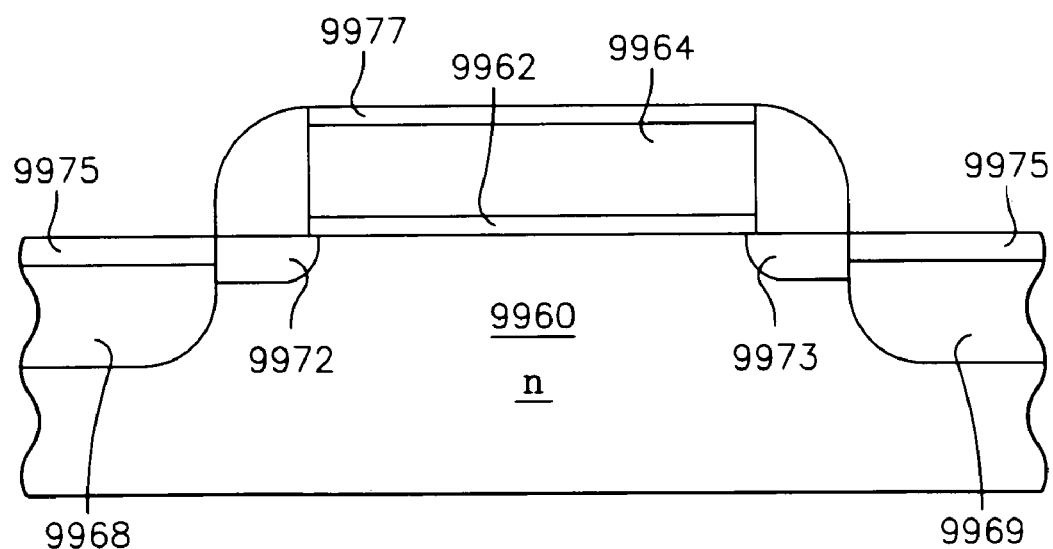
FIG. 110 is a cross-sectional view of the surface of a wafer during ion implantation of the source and drain extensions of a transistor.

Working Examples:

A principal application of a PIII reactor is the formation of PN junctions in semiconductor crystals. FIGS. 109 and 110 illustrate different stages in the deposition of dopant impurities in the fabrication of a P-channel metal oxide semiconductor field effect transistor (MOSFET). Referring first to FIG. 109, a region 9960 of a semiconductor (e.g., silicon) wafer may be doped with an N-type conductivity impurity, such as arsenic or phosphorus, the region 9960 being labeled "n" in the drawing of FIG. 109 to denote its conductivity type. A very thin silicon dioxide layer 9962 is deposited on the surface of the wafer including over n-type region 9960. A polycrystalline silicon gate 9964 is formed over the thin oxide layer 9962 from a blanket polysilicon layer that has been doped with boron in the PIII reactor. After formation of the gate 9964, p-type dopant is implanted in the PIII reactor to form source and drain extensions 9972 and 9973. Spacer layers 9966 of a dielectric material such as silicon dioxide and/or silicon nitride (for example) are formed along two opposite vertical sides 9964a, 9964b of the gate 9964. Using the PIII reactor of FIG. 85 with a process gas consisting of BF3 or B2H6 (for example), boron is implanted over the entire N-type region 9960. The spacer layers mask their underlying regions from the boron, so that P-type conductivity source and drain contact regions 9968, 9969 are formed on either side of the gate 9964, as shown in FIG. 110. This step is carried out with a boron-containing species energy in the range of 2 to 10 kVpp on the RF bias voltage (controlled by the RF bias power generator 8065 of FIG. 85). In accordance with the example of FIG. 108, the RF bias voltage on the wafer pedestal 8025 in the PIII reactor of FIG. 85 is twice the desired boron energy. The implantation is carried out for a sufficient time and at a sufficient ion flux or ion density (controlled by the RF source power generators 8055, 8056 of FIG. 85) to achieve a surface concentration of boron exceeding $5 \times 10^{15}$ atoms per square centimeter. The concentration of boron in the gate 9964 is then increased to $1 \times 10^{16}$ atoms per square centimeter by masking the source and drain contacts 9968, 9969 (by depositing a layer of photoresist thereover, for example) and carrying out a further (supplementary) implantation step of boron until the concentration of boron in the gate 9964 reaches the desired level ($1 \times 10^{16}$ atoms/cubic centimeter). The source and drain contacts 9968, 9969 are not raised to the higher dopant concentration (as is the gate 9964) because the higher dopant concentration may be incompatible with formation of a metal silicide layer (during a later step) over each contact 9968, 9969. However, the gate 9964 must be raised to this higher dopant concentration level in order to reduce carrier depletion in the gate 9964 near the interface between the gate 9964 and the thin silicon dioxide layer 9962. Such carrier depletion in the gate would impede the switching speed of the transistor. The dopant profile in the gate must be highly abrupt in order attain a high dopant concentration in the gate 9964 near the thin oxide layer 9962 without implanting dopant into the underlying thin oxide layer 9962 or into the source-to-drain channel underlying the thin oxide layer 9962. Another measure that can be taken to further enhance gate performance and device speed is to raise the dielectric constant of the thin silicon dioxide layer 9962 by implanting nitrogen in the thin silicon dioxide layer 9962 so that (upon annealing) nitrogen atoms replace oxygen atoms in the layer 9962, as will be described later in this specification. A further measure for enhancing gate performance is conformal implanting in which dopant ions that have been deflected from their vertical trajectory by collisions in the plasma sheath over the wafer surface are able to implant into the vertical sidewalls of the gate 9964. This further increases the dopant concentration in the gate 9964 near the interface with the thin oxide layer 9962, and provide a more uniform and isotropic dopant distribution within the gate. A yet further measure for enhancing gate performance for gates of N-channel devices implanted with arsenic is to implant phosphorus during the supplementary implant step using the PIII reactor. The phosphorus is lighter than arsenic and so diffuses more readily throughout the semiconductor crystal, to provide less abrupt junction profile in the source drain contact areas.

The depth of the ion implantation of the source and drain contacts 9968, 9969 may be in the range of 400 to 800 Å. If the gate 9964 is thinner than that, then the gate 9964 must be implanted in a separate implantation step to a lesser depth to avoid implanting any dopant in the thin oxide layer 9962 below the gate 9964. In order to avoid depletion in the region of the gate 9964 adjacent the thin oxide layer 9962, the implantation of the gate must extend as close to the gate/oxide interface as possible without entering the thin oxide layer 9962. Therefore, the implant profile of the gate must have the highest possible abruptness (e.g., 3 nm/decade or less) and a higher dopant dose (i.e., $1 \times 10^{16}$ atoms/cm$^2$).

Referring now to FIG. 110, source and drain extensions 9972, 9973 are typically formed before depositing and forming the spacer layers 9966 of FIG. 109. The extensions layers are formed by carrying out a more shallow and light implant of boron over the entire region 9960. Typically, the junction depth of the source and drain extensions is only about 100 to 300 angstroms and the implant dose is less than $5 \times 10^{15}$ atoms/square centimeter. This implant step, therefore, has little effect on the dopant profiles in the gate 9964 or in the source and drain contacts 9968, 9969, so that these areas need not be masked during the implantation of the source and drain extensions 9972, 9973. However, if masking is desired, then it may be carried out with photoresist. The source and drain extensions are implanted at an equivalent boron energy of 0.5 kV, requiring a 1.0 kVpp RF bias voltage on the wafer pedestal 8025 of FIG. 85.

The same structures illustrated in FIGS. 109 and 110 are formed in the fabrication of an N-channel MOSFET. However, the region 9960 is initially doped with a P-type conductivity such as boron and is therefore a P-type conductivity region. And, the implantation of the gate 9964 and of the source and drain contacts 9968, 9969 (illustrated in FIG. 109) is carried out in a beam implanter (rather than in a PIII reactor) with an N-type conductivity impurity dopant such as arsenic. Furthermore, the supplementary implantation of the gate 9964 that raises its dopant dose concentration to $1 \times 10^{16}$ atoms/cm$^2$ is carried out in the PIII reactor with phosphorus (rather than arsenic) using a phosphorus-containing process gas. Phosphorus is preferred for this latter implantation step because it diffuses more uniformly than arsenic, and therefore enhances the quality of the N-type dopant profile in the gates 9964 of the N-channel devices. The ion beam voltage is in the range of 15-30 kV for the arsenic implant step (simultaneous implanting of the N-channel source and drain contacts 9968, 9969 and of the N-channel gates 9964), and is applied for a sufficient time to reach a dopant surface concentration exceeding $5 \times 10^{15}$ atoms per cubic centimeter. The supplementary gate implant of phosphorus is carried out at an ion beam voltage in the range of only 2-5 kV for a sufficient time to raise the dopant surface concentration in the N-channel gates to $1 \times 10^{16}$ atoms/cubic cm.

The implantation steps involving phosphorus and boron are advantageously carried out in the PIII reactor rather than an ion beam implanter because the ion energies of these light elements are so low that ion flux in a beam implanter would be very low and the implant times would be inordinately high (e.g., half and hour per wafer). In the PIII reactor, the source power can be 800 Watts at 13.56 MHz (with the 200 kHz offset between the two torroidal plasma currents as described above), the implant step being carried out for only 5 to 40 seconds per wafer.

The sequence of ion implantation steps depicted in FIGS. 109 and 110 may be modified, in that the light shallow source and drain extension implant step of FIG. 110 may be carried out before or after formation of the spacer layer 9966 and subsequent heavy implantation of the contacts 9968, 9969 and gate 9964. When extension implants are done after the spacer layer 9966 is formed, the spacer layer 9966 must be removed before the extension implants are performed.

Figure 111:
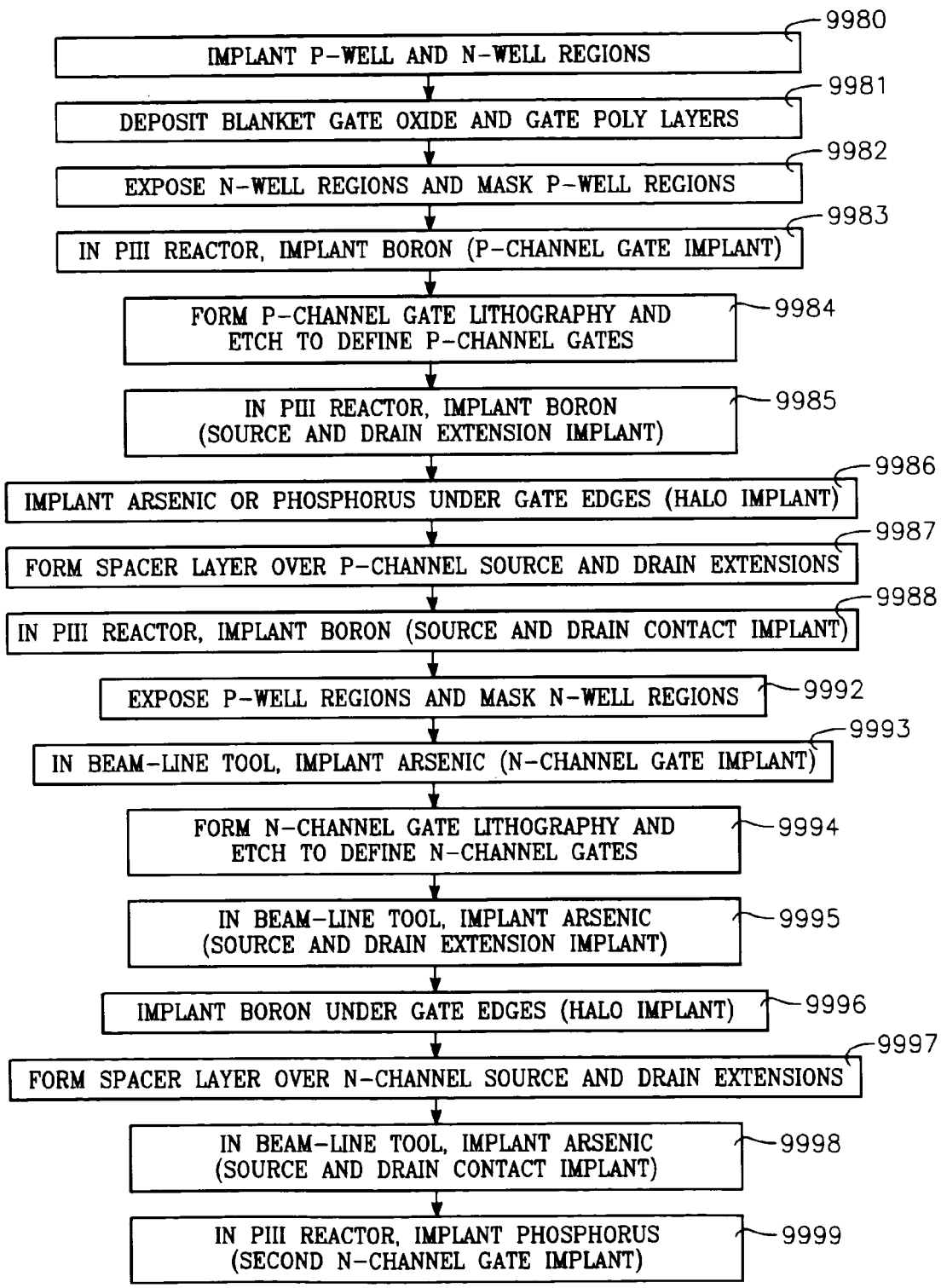
FIG. 111 is a flow diagram illustrating an ion implantation process carried out using the reactor of FIG. 85.

One example of a process for fabricating complementary MOSFETS (CMOS FETs) is illustrated in FIG. 111. In the first step (block 9980), the P-well and N-well regions of the CMOS device are implanted in separate steps. Then, a blanket thin gate oxide layer and an overlying blanket polysilicon gate layer are formed over the entire wafer (block 9981 of FIG. 111). The P-well regions are masked and the N-well regions are left exposed (block 9982). The portions of the polysilicon gate layer lying in the N-well regions are then implanted with boron in a PIII reactor (block 9983). The P-channel gates (9964 in FIG. 109) are then photolithographically defined and etched, to expose portions of the silicon wafer (block 9984). Source and drain extensions 9972, 9973 of FIG. 109 self-aligned with the gate 9964 are then formed by ion implantation of boron using the PIII reactor (block 9985). A so-called "halo" implant step is then performed to implant an N-type dopant under the edges of each P-channel gate 9964 (block 9986). This is done by implanting arsenic using an ion beam tilted at about 30 degrees from a vertical direction relative to the wafer surface and rotating the wafer. Alternatively, this step may be accomplished by implanting phosphorus in the PIII reactor using a chamber pressure and bias voltage conducive to a large sheath thickness to promote collisions in the sheath that divert the boron ions from a vertical trajectory. Then, the spacer layers 9986 are formed over the source drain extensions 9972, 9973 (block 9987) and boron is then implanted at a higher energy to form the deep source drain contacts 9969 (block 9988), resulting in the structure of FIG. 110. The reverse of step 9982 is then performed by masking the N-well regions (i.e., the P-channel devices) and exposing the P-well regions (block 9992). Thereafter steps 9993 through 9998 are performed that correspond to steps 9983 through 9988 that have already been described, except that they are carried out in the P-well regions rather than in the N-well regions, the dopant is arsenic rather than boron, and a beam line ion implanter is employed rather than a PIII reactor. And, for the N-channel device halo implant of block 9996 (corresponding to the P-channel device halo implant of block 9986 described above), the dopant is a P-type dopant such as boron. In the case of the N-channel devices implanted in steps 9993 through 9998, a further implant step is performed, namely a supplemental implant step (block 9999) to increase the dose in the polysilicon gate as discussed above in this specification. In the supplemental implantation step of block 9999, phosphorus is the N-type dopant impurity and is implanted using a PIII reactor rather than a beam implanter (although a beam implanter could be employed instead).

As noted above, the process may be reversed so that the gate 9964 and source and drain contacts 9968, 9969 are implanted before the source and drain extensions 9972, 9973.

After all ion implantations have been carried out, the wafer is subjected to an annealing process such as spike annealing using rapid thermal processing (RTP) and/or the dynamic surface annealing (DSA) process discussed earlier in this specification. Such an annealing process causes the implanted dopant ions, most of which came to rest in interstitial locations in the crystal lattice, to move to atomic sites, i.e., be substituted for silicon atoms originally occupying those sites. More than one annealing step can be used to form the pmos and nmos devices and these steps can be inserted in the process flow as appropriate from activation and diffusion point of view.

The foregoing ion implantation processes involving the lighter atomic elements (e.g., boron and phosphorus) are carried out using a PIII reactor in the modes described previously. For example, the bias power frequency is selected to maximize ion energy while simultaneously providing low impedance coupling across dielectric layers. How this is accomplished is described above in this specification.

The ion implantation processes described above are enhanced by other processes. Specifically, in order to prevent channeling and in order to enhance the fraction of implanted ions that become substitutional upon annealing, the semiconductor wafer crystal may be subjected to an ion bombardment process that partially amorphizes the crystal by creating crystal defects. The ions employed should be compatible with the wafer material, and may be formed in the PIII reactor in a plasma generated from one or more of the following gases: silicon fluoride, silicon hydride, germanium fluoride, germanium hydride, xenon, argon, or carbon fluoride (i.e., tetrafluoromethane, octafluorocyclobutane, etc.) or carbon hydride (ie. methane, acetylene, etc.) or carbon hydride/fluoride (i.e., tetrafluoroethane, difluoroethylene, etc.) gases. One advantage of the PIII reactor is that its implant processes are not mass selective (unlike an ion beam implanter). Therefore, during ion implantation of a dopant impurity such boron, any other element may also be implanted simultaneously, regardless of ion mass in the PIII reactor. Therefore, unlike an ion beam implanter, the PIII reactor is capable of simultaneously implanting a dopant impurity while carrying out an amorphizing process. This may be accomplished using a BF3 gas (to provide the dopant ions) mixed with an SiF4 gas (to provided the amorphizing bombardment ion species). Such a simultaneous ion implantation process is referred to as a co-implant process. The amorphization process may also be carried out sequentially with the doping process. In addition to amorphization, simultaneous implants of dopant and non-dopant atoms such as fluorine, germanium, carbon or other elements are done to change the chemistry of the silicon wafer. This change in chemistry can help in increasing dopant activation and reducing dopant diffusion.

Another process that can be carried out in the PIII reactor is a surface enhancement process in which certain ions are implanted in order to replace other elements in the crystal. One example of such a surface enhancement process is nitrodization. In this process, the dielectric constant of the thin silicon dioxide layer 9962 is increased (in order to increase device speed) by replacing a significant fraction of the oxygen atoms in the silicon dioxide film with nitrogen atoms. This is accomplished in the PIII reactor by generating a plasma from a nitrogen-containing gas, such as ammonia, and implanting the nitrogen atoms into the silicon dioxide layer 9962. This step may be performed at any time, including before, during and/or after the implantation of the dopant impurity species. If the nitrodization process is performed at least partially simultaneously with the dopant ion implant step, then the nitrodization process is a co-implant process. Since the ion implantation process of the PIII reactor is not mass selective, the co-implant process may be carried out with any suitable species without requiring that it atomic weight be the same as or related to the atomic weight of the dopant implant species. Thus, for example, the dopant species, boron, and the surface enhancement species, nitrogen, have quite different atomic weights, and yet they are implanted simultaneously in the PIII reactor. Typically nitrodization is performed without implanting dopant atoms.

A further process related to ion implantation is surface passivation. In this process, the interior surfaces of the reactor chamber, including the walls and ceiling, are coated with a silicon-containing passivation material (such as silicon dioxide or silicon nitride or silicon hydride) prior to the introduction of a production wafer. The passivation layer prevents the plasma from interacting with or sputtering any metal surfaces within the plasma reactor. The deposition the passivation layer is carried out by igniting a plasma within the reactor from a silicon containing gas such as silane mixed with oxygen, for example. This passivation step, combined with the low-contamination torroidal source PIII reactor of FIG. 85, has yielded extremely low metal contamination of a silicon wafer during ion implantation, about 100 times lower than that typically obtained in a conventional beam implanter.

Upon completion of the ion implantation process, the passivation layer is removed, using a suitable etchant gas such as NF3 which may be combined with a suitable ion bombardment gas source such as argon oxygen, or hydrogen. During this cleaning step, the chamber surfaces may be heated to 60 degrees C. or higher to enhance the cleaning process. A new passivation layer is deposited before the next ion implantation step.

Alternatively, a new passivation layer may be deposited before implanting a sequence of wafers, and following the processing of the sequence, the passivation layer and other depositions may be removed using a cleaning gas.

Figure 112:
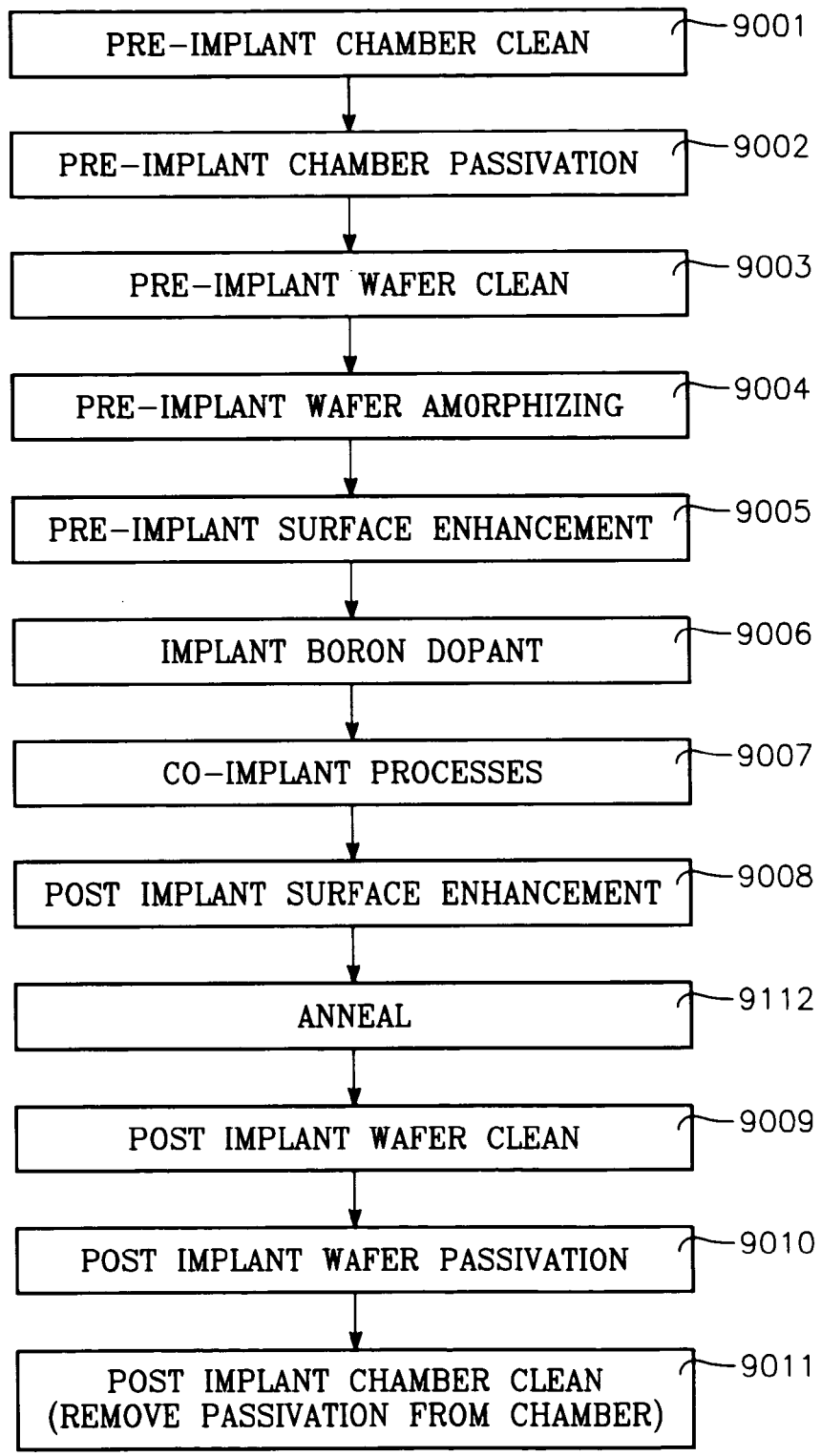
FIG. 112 is a flow diagram illustrating a sequence of possible pre-implant, ion implant and possible post implant processes carried using the reactor of FIG. 85 in the system of FIG. 99.

FIG. 112 is a flow diagram showing the different options of combining the foregoing ion implantation-related processes with the dopant implantation processes of FIG. 111. A first step is cleaning the chamber to remove contamination or to remove a previously deposited passivation layer (block 9001 of FIG. 112). Next, a passivation layer of silicon dioxide, for example, is deposited over the interior surfaces of the chamber (block 9002) prior to the introduction of the wafer to be processed. Next, the wafer is introduced into the PIII reactor chamber and may be subjected to a cleaning or etching process to remove thin oxidation layers that may have accumulated on the exposed semiconductor surfaces in the brief interim since the wafer was last processed (block 9003). A pre-implant wafer amorphizing process may be carried out (block 9004) by ion-bombarding exposed surfaces of the wafer with silicon ions, for example. A pre-implant surface enhancement process may also be carried out (block 9005) by implanting a species such as nitrogen into silicon dioxide films. The dopant implantation process may then be carried out (block 9006). This step is an individual one of the boron or phosphorus implant steps illustrated in the general process flow diagram of FIG. 111. During the dopant implant process of block 9006, other ions in addition to the dopant ions may be implanted simultaneously in a co-implant process (block 9007). Such a co-implant process (9007) may be an amorphizing process, a light etch process that prevents accumulation of plasma by-products on the wafer surface, enhancing dopant activation and reducing dopant diffusion, or surface enhancement process. After completion of the dopant ion implant process (9006) and any co-implant process (9007), various post implant processes may be carried out. Such post implant processes may include a surface enhancement process (block 9008). Upon completion of all implant steps (including the step of block 9008), an implant anneal process is carried out (block 9012) after removing any photo-resist mask layers on the wafer in the preceding wafer clean step of block 9009. This anneal process can be a dynamic surface anneal in which a laser beam (or several laser beams) are scanned across the wafer surface to locally heat the surface to nearly melting temperature (about 1300 degrees C.) or to melting temperature, each local area being heated for an extremely short period of time (e.g., on the order of nano-seconds to tens of milliseconds). Other post implant processes carried out after the anneal step of block 9112 may include a wafer cleaning process (block 9009) to remove layers of plasma by-products deposited during the ion implantation process, deposition of a temporary passivation coating on the wafer to stabilize the wafer surface (block 9010) and a chamber cleaning process (block 9011), carried out after removal of the wafer from the PIII reactor chamber, for removing a previously deposited passivation layer from the chamber interior surfaces.

Low Temperature CVD Process:

A low-temperature chemical vapor deposition process employs the torroidal source reactor of the type illustrated, for example, in FIG. 17A, in which the minimum plasma source power level at which a plasma is ignited and maintained is extremely low (e.g., 100 Watts). As a result, plasma ion density is sufficiently low to minimize plasma heating of the wafer, thereby permitting the wafer to remain at a very low temperature (e.g., below 100 degrees C.) during a plasma CVD process. At the same time, the plasma ion density combined with wafer bias are sufficiently high to provide sufficient plasma ion energy to enable the CVD deposition chemical reaction (bonding between plasma ion species and the workpiece surface). This obviates any requirement for heating the workpiece to provide the needed energy for the chemical reaction. Thus, the wafer temperature can remain at a very low temperature (e.g., below 100 degrees C.) during the entire plasma CVD process.

In addition, the chamber pressure is reduced to a very modest level (e.g., about 15 mTorr) that is sufficiently low to avoid an extremely high CVD layer deposition rate that would otherwise require a high temperature (e.g., 400 degrees C.) to avoid a defective (e.g., flaky) CVD layer. Moreover, the low chamber pressure avoids excessive ion recombination that would otherwise depress plasma ion density below that required to sustain the CVD chemical reaction without heating the workpiece. The maintenance of a moderate plasma ion density in the process region obviates the need for any heating of the wafer, so that a high quality CVD film can be deposited at very low temperature (less than 100 degrees C.), unlike the PECVD reactor. The fact that the plasma density is not very high and the plasma source power level need not be high prevents unwanted plasma heating of the wafer (so that its temperature can remain below 100 degrees C.) unlike the HDPCVD reactor.

The fact that the CVD reaction can be carried out in the torroidal source reactor at a very low source power level, if desired, implies a large window in which source power can be varied, from the minimum level up to a maximum level (e.g., 1000 Watts) at which plasma heating of the wafer is still minimal at the relatively low chamber pressure. This window is sufficiently large to vary the conformality of the CVD deposited layer between non-conformal (0.1 conformality ratio) and conformal (>0.5 conformality ratio). At the same time, the stress level of the CVD deposited layer may be varied by varying the plasma bias power applied to the wafer between a low level for tensile stress in the deposited layer (e.g., 500 Watts) and a high level for compressive stress in the deposited layer (e.g., 3 kWatts). As a result, the conformality and stress of each plasma CVD deposited layer are independently adjusted by adjusting the source and bias power levels, respectively, to different layers which are either conformal or non-conformal and having either tensile or compressive stress. Non-conformal films are useful for deep trench filling and for creating removable layers over photoresist. Conformal layers are useful for etch stop layers and passivation layers. Layers with compressive stress enhance carrier mobility in underlying or adjacent P-channel MOSFETs, while layers with tensile stress enhance carrier mobility in underlying or adjacent N-channel MOSFETs.

The low minimum plasma source power of the toroidal source plasma reactor of FIG. 17A and the highly controllable plasma ion density that the reactor provides as source power is increased follows from the unique reactor structure of the toroidal source plasma reactor. Plasma source power is applied in a region outside of the chamber (remote from the wafer) in a reentrant external conduit through which the toroidal RF plasma current circulates, so that the wafer is far from the plasma ion generation region. This feature makes plasma ion density at the wafer surface highly controllable and not subject to excessive increases with plasma source power, in contrast to the HDPCVD plasma reactor. Moreover, the highly efficient coupling of the RF source power applicator to the process gases within the external reentrant conduit makes the minimum plasma source power for plasma ignition much smaller than a conventional reactor (such as the HDPCVD reactor).

The low temperature CVD process solves the problem of providing a plasma CVD process for 65 nm devices (for example) where the device temperature cannot exceed 100-200 degrees C. for any significant amount of time without destroying the device structure. It also permits plasma CVD deposition over photoresist layers without disrupting or destroying the underlying photoresist. This possibility opens up an entirely new class of processes described below that are particularly suited for nm-sized design rules and can be carried out without disturbing photoresist masking on the device.

Post-CVD ion implantation processes can be carried out in the same toroidal source reactor that was used to perform the low temperature CVD process. The post CVD ion implantation processes include processes for enhancing adhesion between an amorphous or polycrystalline CVD deposited layer and its base layer, for raising the proportion of a species in the CVD layer beyond a stochiometric proportion, for implanting into the CVD layer a species not compatible with plasma CVD processes, or for implanting into the CVD layer a species that alters a particular material quality of the layer, such as dielectric constant or stress.

The low temperature plasma CVD process is useful for CVD formation of silicon films, silicon nitride films, silicon-hydrogen films, silicon-nitrogen-hydrogen films, and versions of the foregoing films further containing oxygen or fluorine. The films exhibit excellent quality, being free of cracking, peeling, flaking, etc., despite the very low temperature at which the CVD process is carried out. For application to CMOS devices, passivation layers are deposited over P- and N-channel devices with compressive and tensile stresses, respectively, using high non-conformality to enable selective etching and photoresist masking and removal, and etch stop layers with zero (neutral) stress can be deposited over all devices with high conformality.

Figure 113:
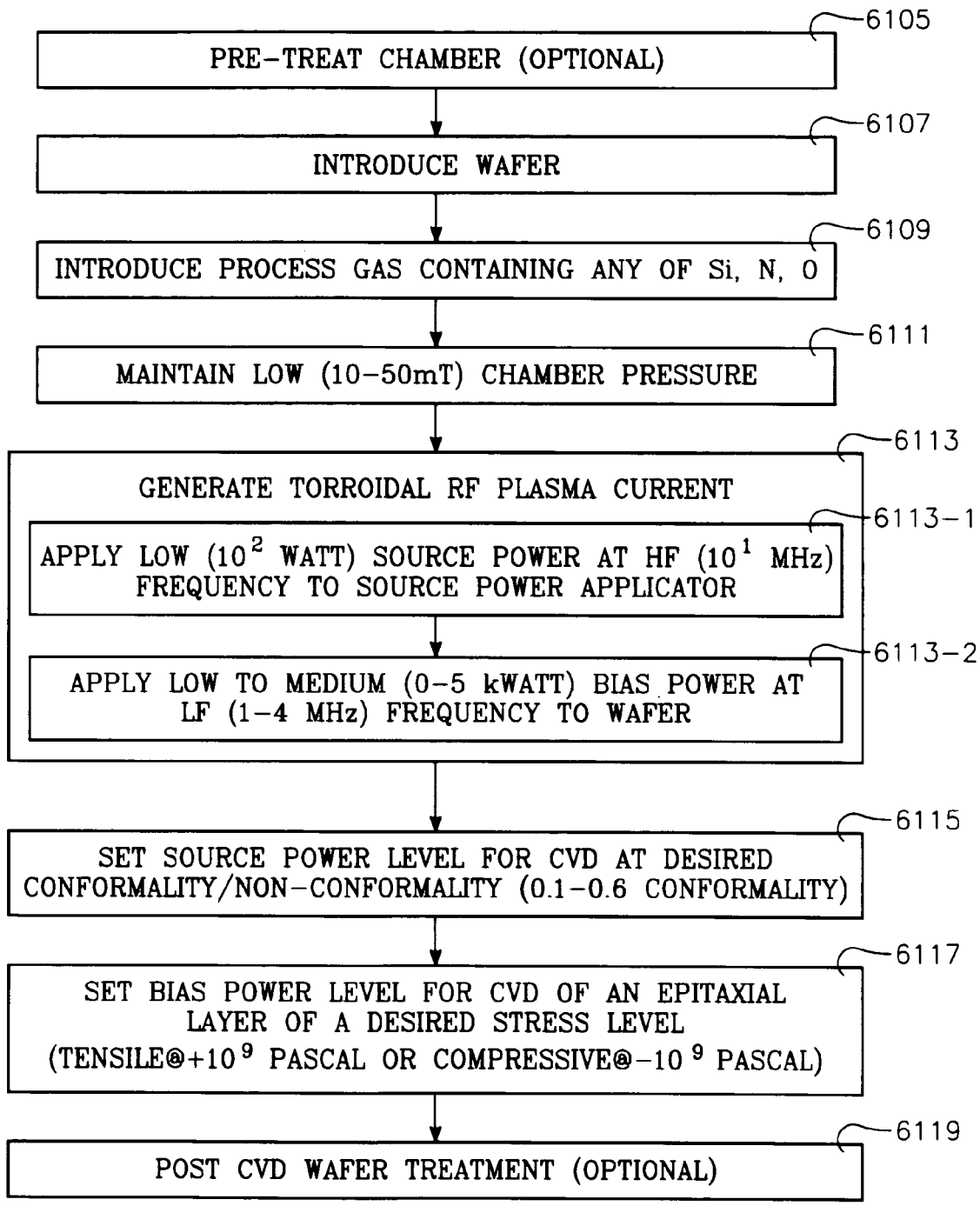
FIG. 113 is a block diagram illustrating a low temperature CVD process that can employ the torroidal source reactor of FIG. 1.

A low temperature plasma CVD process employing the toroidal reactor of FIG. 1 is illustrated in FIG. 113. A first step (block 6105 of FIG. 113), which is optional, is to coat the interior surfaces of the chamber with a passivation layer to prevent or minimize metal contamination on the wafer. The passivation layer may, for example, be of the same material as the CVD film that is to be deposited (e.g., a material containing silicon and nitrogen). The passivation coating on the chamber interior surfaces is carried out by introducing a suitable process gas mixture (e.g., silane and nitrogen if a silicon nitride film is to be deposited), and applying plasma source power to generate a toroidal RF plasma current, as in the above-described embodiments. This step is carried out until a suitable thickness of the passivation material has been deposited on interior chamber surfaces. Then, a production workpiece or semiconductor wafer is placed on the wafer support pedestal (block 6107 of FIG. 113). Process gases are introduced (block 6109) containing silicon and other species such as hydrogen, nitrogen or oxygen. The chamber pressure is maintained at a low or modest level, e.g., from about 10 to about 50 mTorr (block 6111 of FIG. 113). A reentrant toroidal plasma current is generated in the toroidal source reactor (block 6113). The toroidal plasma current is produced by applying a low to modest amount of RF plasma source power (e.g., 100 Watts to 1 kW) from the RF generators 180 to the source power applicators 170, 1015 of FIG. 17A (block 6113-1 of FIG. 113), and applying RF plasma bias power between 0 and 5 kWatts from the RF generator 162 to the wafer support pedestal 115 (block 6113-2 of FIG. 113). The source power is preferably at an HF frequency on the order of 10 MHz (e.g., such as 13.56 MHz), which is very efficient for producing plasma ions. The bias power is preferably at an LF frequency on the order of a MHz (e.g., such as 2 MHz), which is very effective for producing a relatively large plasma sheath voltage for a given amount of bias power.

The magnitude of the source power delivered by the RF generators 180 is adjusted to deposit by chemical vapor deposition a film on the wafer with the desired conformality (block 6115). The magnitude of the bias power delivered by the RF generator 162 is adjusted so that the deposited film has the desired stress, compressive or tensile (block 6117 of FIG. 113).

The foregoing process is carried out until the desired deposited film thickness is reached. Thereafter, certain optional post-CVD ion implant processes may be performed (block 6119 of FIG. 113). These post-CVD ion implant processes will be described later in this specification with reference to FIG. 117.

Figure 114A:
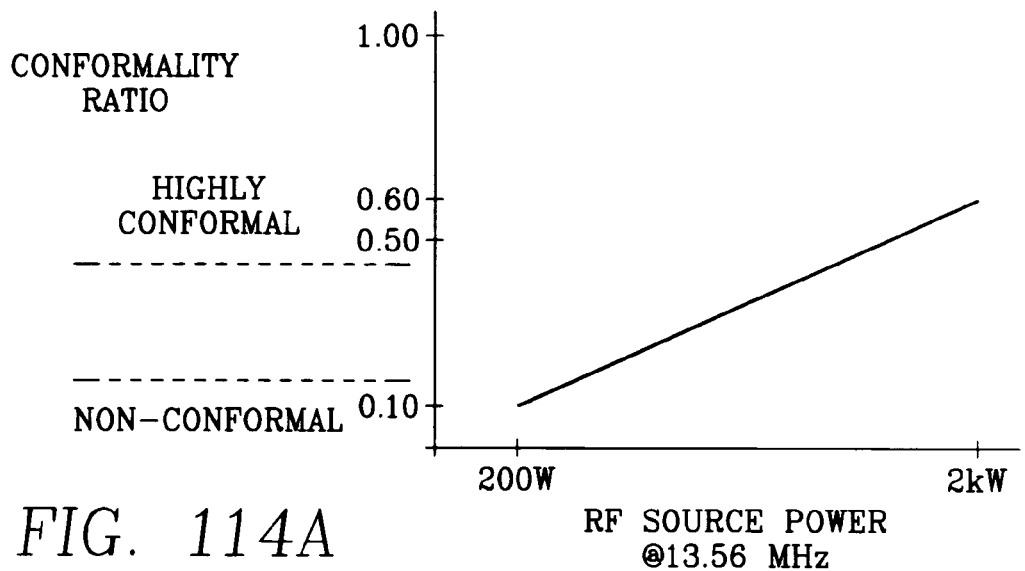
FIG. 114A is a graph of conformality ratio of the deposited layer (vertical axis) as a function of the applied RF source power (horizontal axis) in the process of FIG. 113.
Figure 114B:
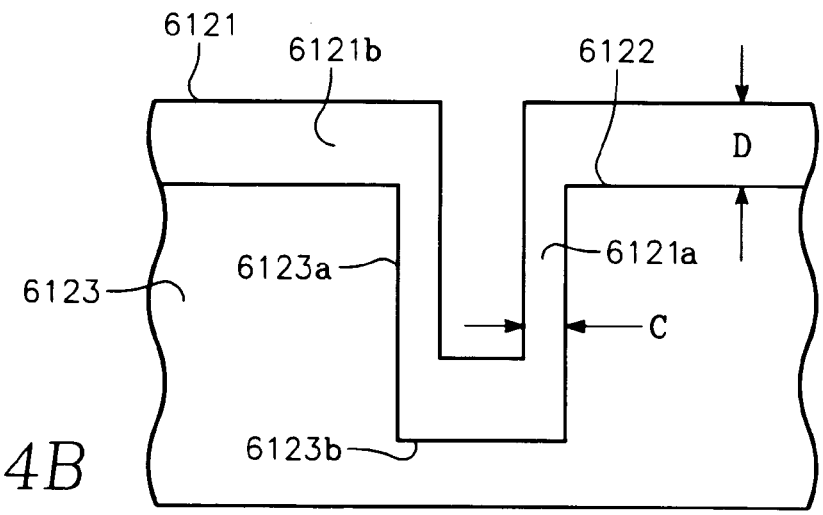
FIG. 114B is a diagram of a semiconductor structure illustrating the meaning of the term "conformality".

FIG. 114A is a graph of conformality ratio of the deposited layer (vertical axis) as a function of the applied RF source power (horizontal axis). As shown in FIG. 114B, the conformality ratio of a layer 6121 deposited by a CVD process on a base layer or substrate 6123 (to define an interface 6122) is the ratio C/D of the thickness C of a vertical section 6121a of the layer 6121 (deposited on a vertical face 6123a of the base layer 6123) to the thickness D of a horizontal section 6121b of the layer 6121 (deposited on a horizontal section 6123b of the base layer 6123). A conformality ratio exceeding 0.5 indicates a highly conformal CVD-deposited film. A conformality ratio of about 0.1 indicates a non-conformal CVD-deposited film. FIG. 114A illustrates how the wide source power window of the toroidal source reactor of FIG. 17A spans the conformality ratio range from non-conformal (at about 100 Watts source power) to highly conformal (at about 1 kW source power). FIG. 114A shows that the same toroidal source reactor can be used for plasma CVD deposition of both conformal and non-conformal films containing combinations of silicon, nitrogen, hydrogen or oxygen, for example.

Figure 115:
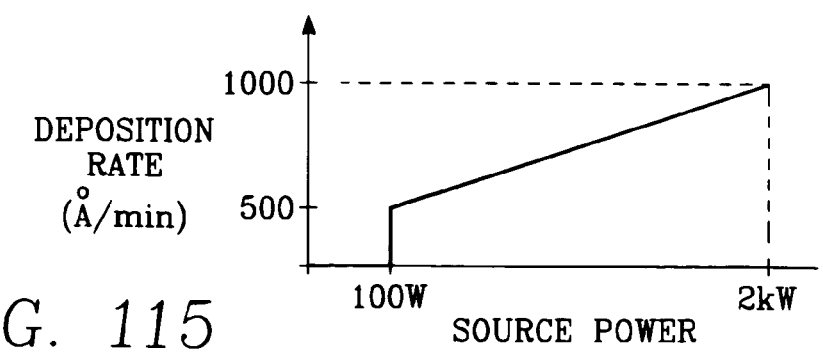
FIG. 115 is a graph illustrating the CVD deposition rate (vertical axis) as a function of applied source power (horizontal axis).

FIG. 115 is a graph illustrating the CVD deposition rate (vertical axis) as a function of applied source power (horizontal axis). From zero up to 100 Watts of RF source power, no plasma is ignited in the toroidal source reactor of FIG. 17A, and the deposition rate is zero. Starting at about 100 Watts of source power at about 13.56 MHz with a constant bias voltage of about 5 kV at about 2 MHz, the deposition rate starts at about 500 angstroms per minute (at 100 Watts source power) and reaches about 1000 angstroms per minute (at about 2 kW of source power). The advantage is that the deposition rate is sufficiently low so that a high quality defect-free CVD film is formed without requiring any heating or annealing to cure defects that would otherwise form at high deposition rates (e.g., 5,000 angstroms per minute). Therefore, the source power of the torroidal source reactor can be varied anywhere within the range required to switch the conformality ratio between non-conformal and conformal (i.e., from 200 Watts to 2 kW) without requiring heating of the wafer, so that the wafer can remain at a low processing temperature, i.e., below 100 degrees C. The fact that the torroidal source reactor source power may be so increased (to attain a high degree of conformality) without causing excessive CVD deposition rates follows from the structure of the torroidal source reactor (e.g., FIG. 17A) which avoids excessive increases in ion density in the process region overlying the wafer 120. Such excessive ion density is avoided in part because each plasma source power applicator (i.e., each core 1015 surrounding a respective reentrant conduit 150 and the corresponding primary winding 170) applies plasma source power to a section of a reentrant conduit 150 that is external of the reactor chamber 100 defined by the sidewall 105 and ceiling 110, and is remote from the process region overlying the wafer 120. Fortunately, the low and therefore, highly controllable increase in plasma ion density with source power of the torroidal plasma reactor of FIG. 17A is accompanied by a very low minimal source power for plasma ignition (e.g., only 100 Watts), which results in the wide source power window spanning the entire conformality range. This minimal source power level for plasma ignition is a result of the efficient manner in which the unique combination of source power applicator 170, 1015 and reentrant conduit 150 of FIG. 17A generates the torroidal RF plasma current at HF frequencies such as 13.65 MHz.

Figure 116:
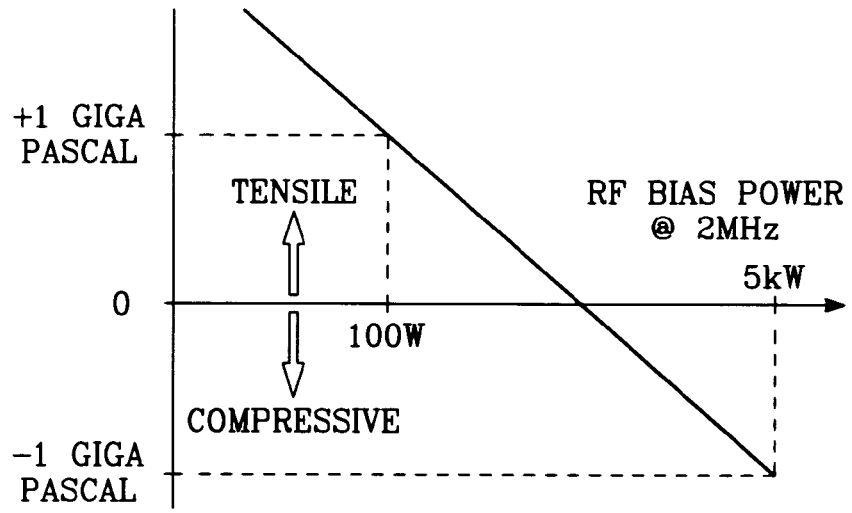
FIG. 116 is a graph illustrating stress in the layer deposited by the process of FIG. 113 as a function of bias power.

Another feature of the torroidal plasma reactor of FIG. 17A is the wide range of RF plasma bias (sheath) voltage with which the reactor may be operated (e.g., from zero to 10 kV). One aspect of this feature is illustrated in the graph of FIG. 116: the bias voltage operating range (horizontal axis of FIG. 116) spans the range of stress in the CVD deposited film (vertical axis in the graph of FIG. 116), from tensile stress (+1 gigaPascal) to compressive stress (−1 gigaPascal). Another aspect of the feature of a wide plasma bias voltage operating range is the fact that ion energy may be adjusted to suit a particular process or application, such as the use of a high ion energy (large bias voltage) for plasma immersion ion implantation in the post-CVD ion implantation processes 6119 of FIG. 113 in the same torroidal source reactor used to perform the low temperature plasma CVD process of FIG. 113. Such post-CVD ion implantation treatments will be described later in this specification. The large range in RF plasma bias (sheath) voltage is attained by using a low frequency (LF) plasma bias source, such as a 2 MHz RF source as the RF bias power generator 162. Such a low frequency translates to a high impedance across the plasma sheath over the surface of the wafer 120, with a proportionately higher sheath voltage. Thus, a relatively small amount of plasma bias power (5 kW) can produce a very large sheath voltage (10 kV) at the wafer surface. Such a relatively low bias power level reduces the heating load on the wafer 120 and reduces the heat and electric field load on the wafer support pedestal 115. Of course, the torroidal source reactor of FIG. 17A does not require such a large sheath voltage in order to ignite or sustain a plasma, and the bias power can be reduced well below 5 kW, to nearly zero, if desired, without extinguishing the plasma.

The conformality selection (between non-conformal and highly conformal) illustrated in FIG. 114A and the stress selection (between tensile and compressive) illustrated in FIG. 116 are performed independently using the very wide source power and bias power operating windows of the torroidal source reactor of FIG. 17A. As a result, the torroidal source reactor of FIG. 17A performs a low temperature CVD process of FIG. 113 in which different layers may be deposited with different selections of stress (tensile, zero, or compressive) and different selections of conformality ratio (non-conformal or highly conformal).

Figure 117:
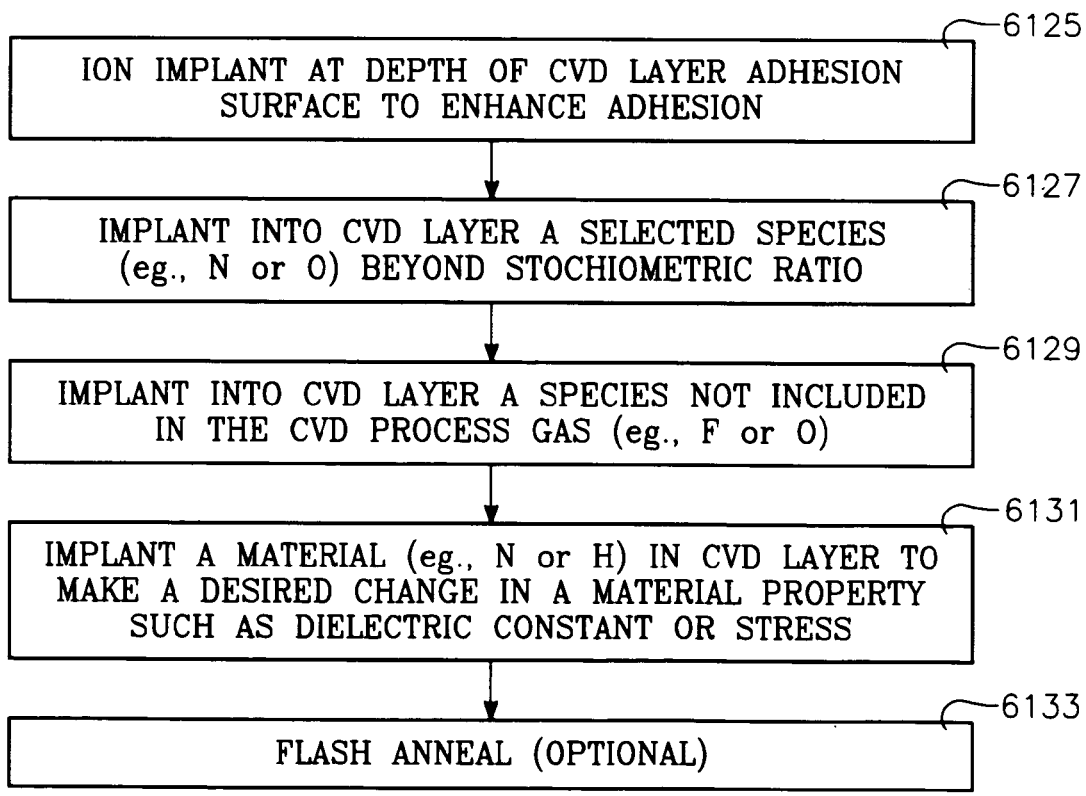
FIG. 117 is a block diagram illustrating steps in a series of post-CVD ion implant treatments of the wafer following the steps of FIG. 113.

FIG. 117 illustrates steps in a series of post-CVD ion implant treatments of the wafer. Each of the steps illustrated in FIG. 117 may be performed as the only post-CVD ion implant treatment or in combination with the other steps of FIG. 117, in which case the steps may be performed in an order different from that illustrated in FIG. 117. However, the following discussion will describe the steps of FIG. 117 in the order illustrated in the drawing. Each of the ion implantation steps may be carried out in the same torroidal source plasma reactor of FIG. 17A used to carry out the plasma CVD process of FIG. 113. Use of the torroidal source plasma reactor of FIG. 17A as a plasma immersion ion implantation (PIII) reactor has already been described in this specification.

In block 6125 of FIG. 117, the adhesion or bonding between the layer deposited by the low temperature plasma CVD process and the underlying base layer or substrate is enhanced by ion implantation. Such a step is particularly useful where the deposited layer tends to have an amorphous or polycrystalline structure, and/or differs in composition from the underlying base layer. In such cases, the CVD deposited layer cannot replicate the structure or crystal pattern (if any) of the underlying base layer and is therefore not a truly epitaxial layer. Such a deposited layer may be either polycrystalline or amorphous and is not as strongly bonded to the underlying layer as an epitaxial layer would be, and the interface between the two layers may be subject to some cleavage. Such weak adhesion may also be attributable to the tendency of silicon atoms in the base layer 6123 located at the interface 6122 to have saturated bonds that are unavailable to bond with atoms in the deposited layer 6121. Such saturation arises prior to the CVD deposition process, because silicon atoms at the surface of the substrate 6123 have some of their orbital electrons facing open space, and such unbonded electrons can become shared with neighboring unbonded electrons (e.g., of neighboring silicon atoms). As a result, silicon atoms at the surface may tend to become self-saturated and therefore unavailable for bonding with the deposited layer.

Figure 118A:
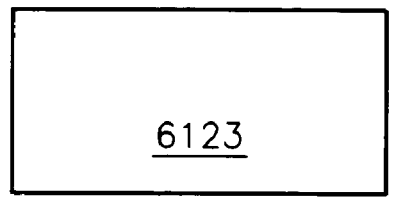
FIG. 118A is a cross-sectional view of a crystalline silicon wafer prior to the CVD deposition process of FIG. 113.
Figure 119A:
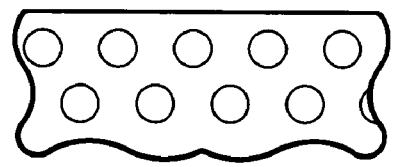
FIGS. 119A, 119B and 119C depict in simplified manner the thin film crystal structure corresponding to FIGS. 118A, 118B and 118C, respectively.
Figure 118B:
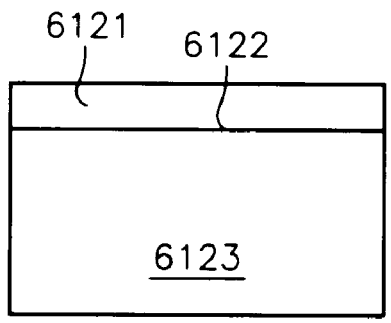
FIG. 118B is a cross-sectional view to FIG. 118A illustrating after performance of the process of FIG. 113 in which a CVD deposited layer overlies the base layer.
Figure 119B:
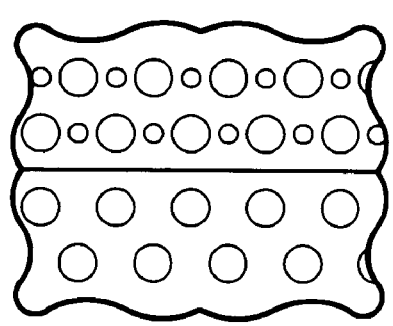
Figure 118C:
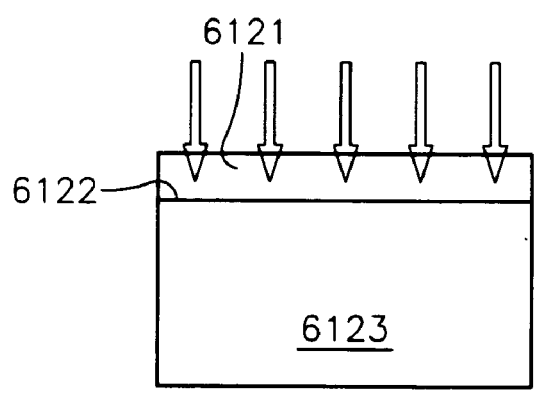
FIG. 118C is a cross-sectional view corresponding to FIG. 118A illustrating an ion implantation step following the process of FIG. 113.
Figure 120A:
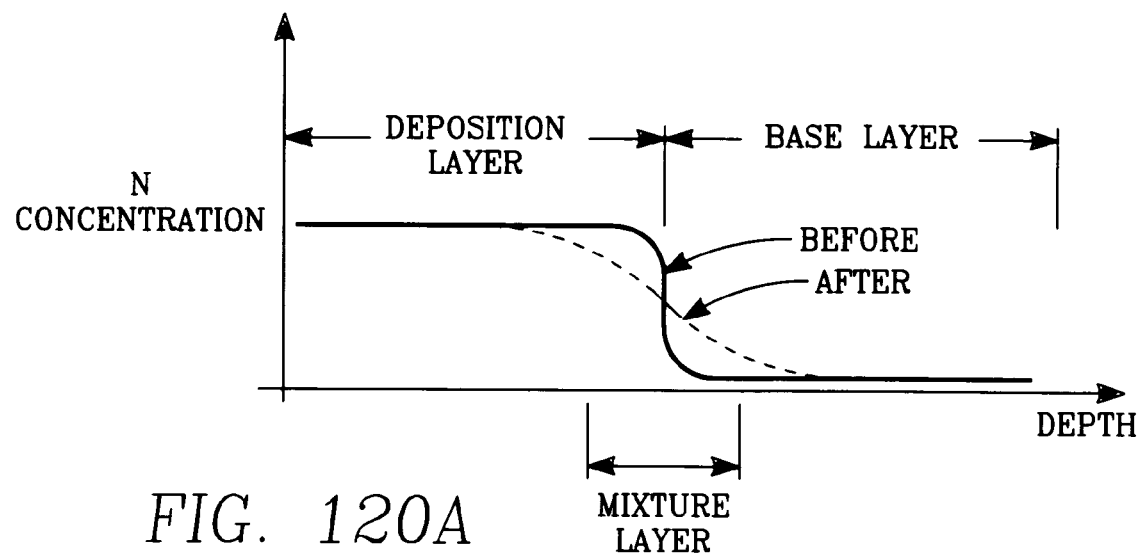
FIG. 120A illustrates the depth profile of a CVD-deposited species, such as nitrogen, before and after the ion implantation step of FIG. 118A.

In order to solve the problem of weak adhesion between the deposited and base layers, the adhesion enhancement ion implantation step of block 6125 is carried out in the manner illustrated in FIGS. 118A-C. A crystalline silicon wafer 6123 prior to the CVD deposition process of FIG. 113 is illustrated in cross-section in FIG. 118A. Its crystalline structure is depicted in simplified manner in FIG. 119A, in which each circle represents a silicon atom bonded to four neighboring silicon atoms. Deposition of a film by the low temperature plasma CVD process of FIG. 113 results in the structure of FIG. 118B in which a CVD deposited layer 6121 overlies the base layer 6123. In the present example, the deposited film is silicon nitride. The resulting structure is depicted in simplified manner in FIG. 119B, in which the larger circles denote silicon atoms and the smaller circles denote nitrogen atoms. Below the interface 6122 between the deposited and base layers 6121, 6123 exists a pure silicon crystal while above the interface 6122 is a pure silicon nitride amorphous film. There is, therefore, an abrupt transition in the material structure, giving rise to inferior adhesion across the interface 6122. This abrupt transition is illustrated in the solid-line graph of FIG. 120A in which nitrogen concentration (vertical axis) is plotted as a function of depth. At the depth of the interface 6122, the nitrogen concentration makes a nearly instantaneous transition from zero to about 50%.

Figure 119C:
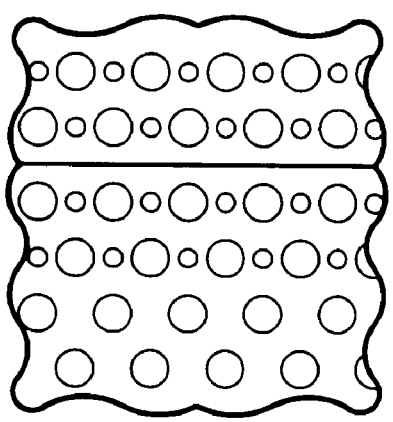
Figure 120B:
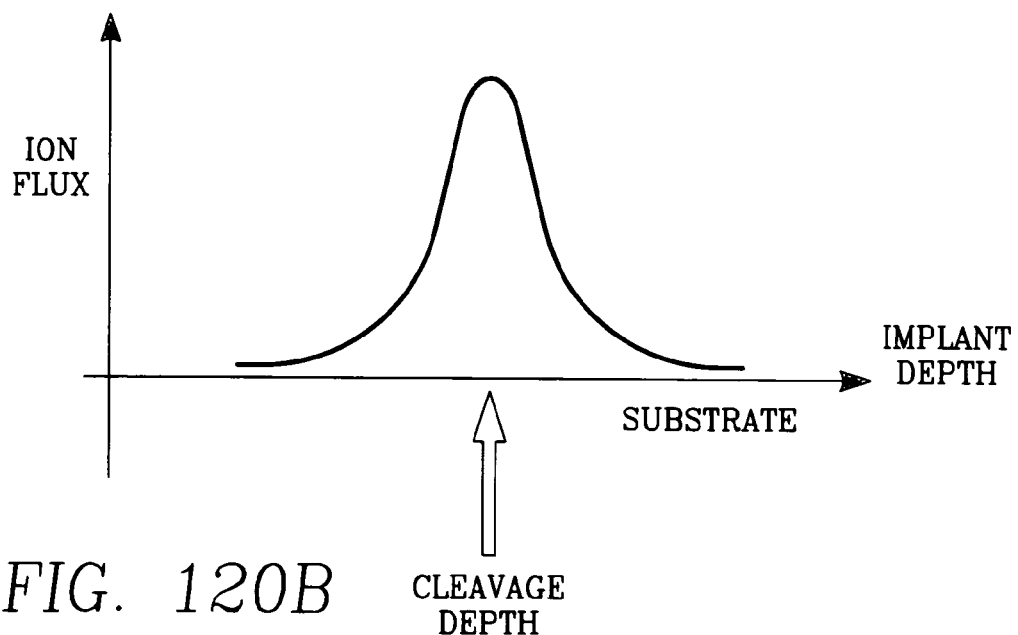
FIG. 120B illustrates a desired ion implantation depth profile for the step of FIG. 118C for enhancing adhesion of the CVD-deposited layer.

The ion implantation step is illustrated in FIG. 118C, in which the structure of FIG. 118B is subjected to ion bombardment. The ion energy is selected so that the implantation profile (FIG. 120B) peaks at the depth of the interface 6122. The result is that both nitrogen and silicon atoms are forced to move across the interface 6122, the net result being that there is a net loss of nitrogen atoms above the interface 6122 and a net gain of nitrogen atoms below the interface 6122, the net loss or gain being proportional to the distance from the interface 6122. In addition, the self-saturated bonds of silicon atoms at the surface 6122 of the base layer 6123 are broken by the ion bombardment, so that more atoms are available for bonding. The resulting material structure is illustrated in FIG. 119C, which shows that some nitrogen atoms in the deposited layer 6121 have moved into the base layer 6123 and have been replaced in the deposited layer 6121 by silicon atoms from the base layer 6123. The interface is therefore distributed over a thicker region with a smoother transition in the nitrogen concentration across the interface (dashed line curve of FIG. 120A). Greater adhesion is attained because in the thicker mixture layer or transition region thus formed, there is greater opportunity for atomic bonding and therefore a greater number of bonds and stronger adhesion between the layers 6121, 6123.

Figure 121:
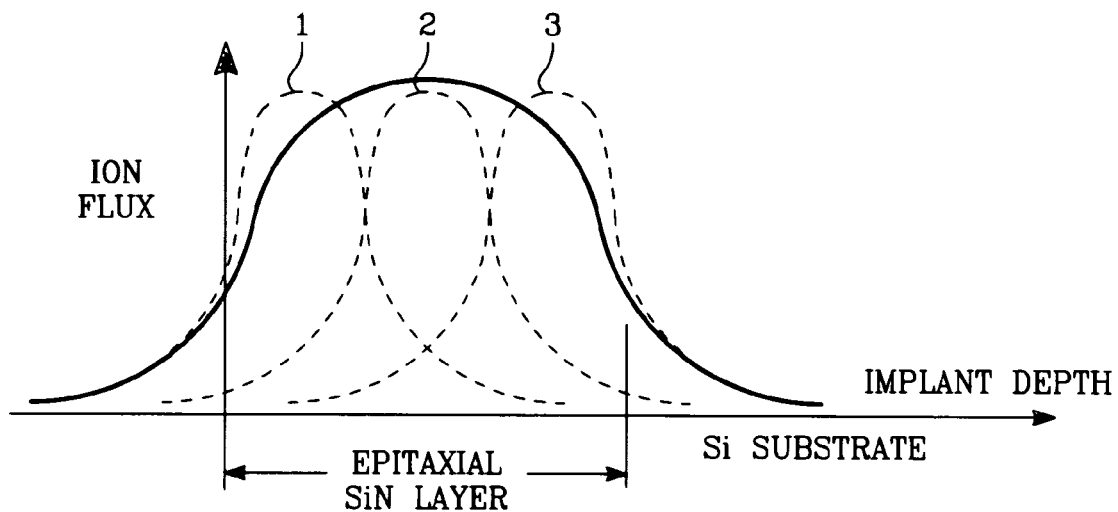
FIG. 121 illustrates a desired ion implantation depth profile for enriching the content in the CVD-deposited layer of a selected species such a nitrogen, for example.

In block 6127 of FIG. 117, a post-CVD ion implantation step is performed in which the content of a selected species within the CVD-deposited layer 6121 is enriched. This enrichment may, if desired, be carried out so that the content of the selected species is beyond a typical stochiometric ratio. For example, if the CVD-deposited layer is silicon nitride, nitrogen atoms may be implanted in the deposited layer 6121 so that the nitrogen content in the deposited layer is enriched above the stochiometric ratio of 50%. The ion implantation profile for the step of block 6127 of FIG. 117 is illustrated in FIG. 121, in which the ion flux of the implanted species as a function of implantation depth is plotted on the vertical axis and the implantation depth is plotted on the horizontal axis. The implantation profile or distribution spans the thickness of the CVD-deposited layer 6121. This may be accomplished by carrying out a single implantation step whose profile essentially spans the deposited layer thickness (solid line curve of FIG. 121). Alternatively, the same result may be obtained by performing three implantations with narrow distributions (corresponding to the dashed line curves of FIG. 121 labeled "1", "2" and "3") whose depths are offset so that the accumulated implantation profile nearly matches the solid line curve of FIG. 121.

Figure 122A:
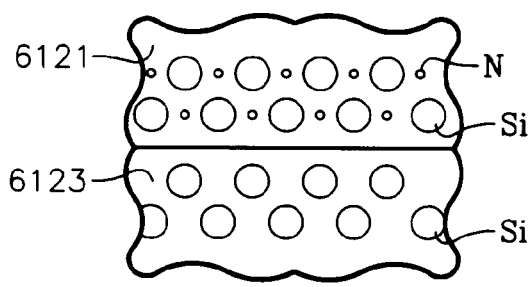
FIG. 122A depicts the structure of the CVD-deposited layer and the base layer before the implantation step corresponding to FIG. 121.
Figure 122B:
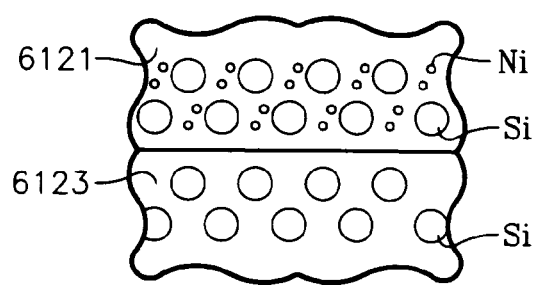
FIG. 122B depicts the structure of the deposited and base layers after the implantation step.

FIG. 122A illustrates the structure of the two layers 6121, 6123 before the implantation step of block 6127 of FIG. 117 and FIG. 122B illustrates the structure of the two layers 6121, 6123 after the implantation step of block 6127. As in the preceding example, the underlying layer or substrate 6123 is silicon and the CVD deposited layer 6121 is silicon nitride, the large circles denote silicon atoms and the small circles denote nitrogen atoms. FIG. 122B shows the extra nitrogen atoms in the deposited silicon nitride layer 6121, so that the nitride content could exceed 50% in the deposited layer 6121.

The ion implantation enrichment process is not confined to the materials of the foregoing example. For instance, the deposited layer may comprise any combination of species including silicon, nitrogen, hydrogen, and/or oxygen, etc. The underlying layer may be silicon or any combination of the foregoing species.

In block 6129 of FIG. 117, species not included in the plasma-CVD process gas during the low temperature CVD process of FIG. 113 are added after completion of the CVD process by ion implantation of those species. For example, in some applications it may be desirable to deposit a layer that includes extremely active species such as oxygen or fluorine. The desired deposited layer may be (for example) a material which is a combination of silicon, nitrogen and fluorine. By ion implanting fluorine atoms into the CVD-deposited layer 6121 after completion of the CVD process, the deposited layer can be made to include fluorine. The fluorine ion implantation profile would be similar to that illustrated in FIG. 121 so that fluorine atoms would be distributed in a fairly uniform manner throughout the deposited layer 6121.

In block 6131 of FIG. 117, a post-CVD ion implantation step is carried out so as to change a particular property (or properties) of the CVD-deposited layer 6121. The implantation step implants a selected species in the CVD-deposited layer such as nitrogen (for changing the dielectric constant of the deposited layer) or hydrogen (for changing the stress in the CVD-deposited layer 6121). The implantation profile is the same as that illustrated in FIG. 121 so that the implanted species is distributed fairly uniformly throughout the CVD-deposited layer 6121.

Optionally, the ion implantation steps of blocks 6125, 6127, 6129 and 6131 may be followed by a very brief post-implant annealing step (block 6133), in which the wafer is heated for a very brief duration (microseconds or milliseconds) to an elevated temperature, the duration being sufficiently short so as to not violate the extremely low thermal budget of nanometer-design rule devices. Alternatively, the anneal temperature may be very low (e.g., a few hundred degrees C.). The requirement is that the diffusion length be less than several nanometer. The diffusion length is proportional to the square root of the product of the temperature and the time or duration of the elevated temperature condition, and is cumulative over all process steps. Thus, by restricting the anneal time to milliseconds in a flash anneal process (or a dynamic surface anneal process), the diffusion length can be kept below the tolerated diffusion length for 65 nm design rules (for example).

FIGS. 123A through 123H illustrate the results of a sequence of steps in a low temperature plasma CVD process for forming carrier mobility-enhancing passivation layers over complementary metal oxide semiconductor (CMOS) devices consisting of p-channel and n-channel field effect transistors (FETs). The sequence of steps for this process is illustrated in FIG. 124. The process begins with a wafer on which CMOS transistors are formed including sources, drains, a thin gate oxide layer and gates, but lacking overlying passivation and etch stop layers. The low temperature CVD process forms those overlying layers as will be described below.

Figure 123A:
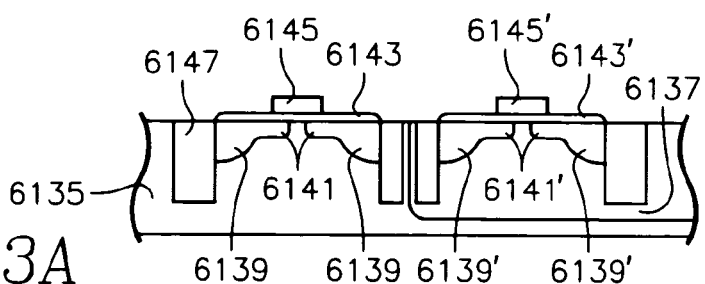
FIGS. 123A through 123H are sequential cross-sectional views of a semiconductor structure illustrating the results of a sequence of steps in a low temperature plasma CVD process for forming carrier mobility-enhancing passivation layers over complementary metal oxide semiconductor (CMOS) devices consisting of p-channel and n-channel field effect transistors (FETs).
Figure 124:
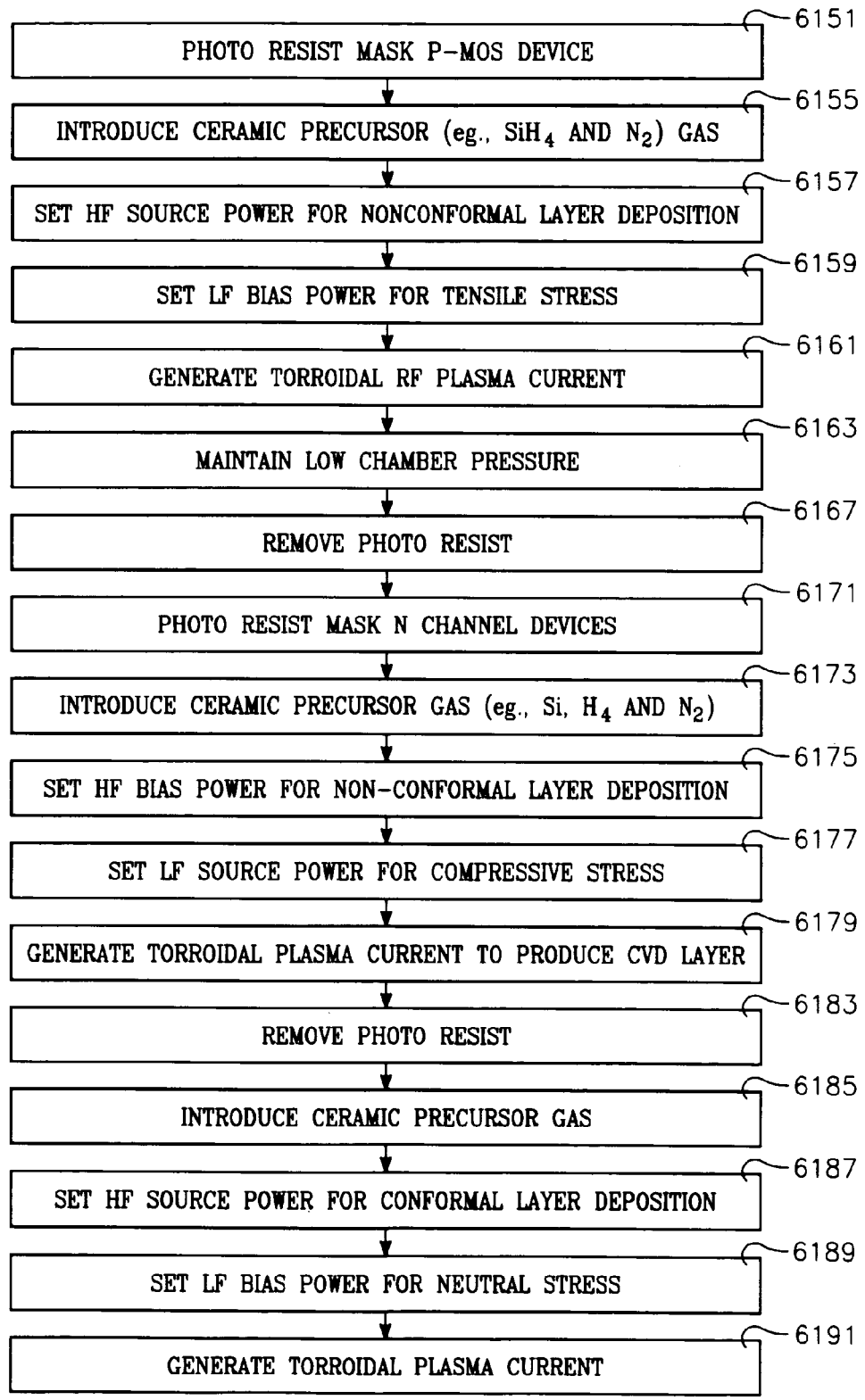

FIG. 123A illustrates the essentials of the CMOS structure at the start of the low temperature plasma CVD deposition process. The CMOS structure is formed on a wafer or semiconductor substrate 6135 of p-type conductivity on which n-channel FET devices may be formed. Wells 6137 of n-type conductivity are formed in various locations on the substrate in which p-channel FET devices may be formed. Each n-channel device includes n-type source and drain deep contacts 6139 in the substrate surface, n-type source and drain extensions 6141 in the substrate surface, a thin gate oxide layer 6143 over the substrate surface and a metal gate 6145 over the thin gate oxide layer 6143. Narrow isolation trenches 6147 surrounding the n-channel devices are formed by etching silicon from the substrate 6135. Each p-channel device is formed inside an n-type well 6137 and includes p-type source and drain deep contacts 6139' in the substrate surface, p-type source and drain extensions 6141' in the substrate surface, a thin gate oxide layer 6143' over the substrate surface and a metal gate 6145' over the thin gate oxide layer 6143'. Narrow isolation trenches 6147' surrounding the p-channel devices are formed by etching silicon from the substrate 6135.

Figure 123B:
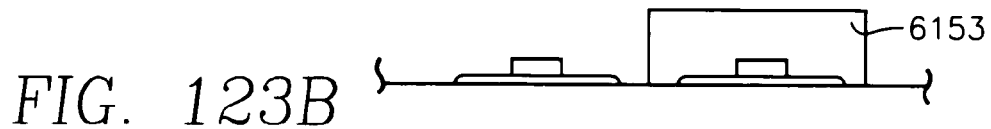
Figure 123C:
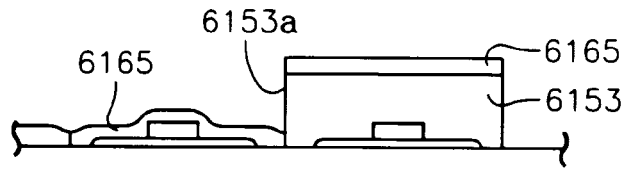

The first step in FIG. 124 is to place a photoresist mask over all p-channel devices (block 6151 of FIG. 124). FIG. 123B illustrates a photoresist mask 6153 overlying the p-channel devices. The next group of steps are for depositing a tensile stressed layer (or dielectric layer) on the n-channel devices to enhance their n-channel carrier (electron) mobility. These steps are as follows: in the torroidal source plasma reactor, introduce the wafer and a process gas containing precursor species for the film to be deposited. If the film is to contain silicon and nitrogen and, possibly, hydrogen, the process gases may be a mixture of silane with either nitrogen and/or ammonia and, optionally hydrogen (block 6155 of FIG. 124). The HF source power in the torroidal source plasma reactor is set to a suitable magnitude for non-conformal CVD film deposition, in accordance with the graph of FIG. 114A (block 6157 of FIG. 124). The LF bias power in the torroidal source plasma reactor is set to a level suitable for CVD deposition of a tensile stressed layer (block 6159 of FIG. 124) in accordance with the graph of FIG. 116. An RF torroidal plasma current is generated as a result of the application of RF plasma source power (block 6161) while the chamber pressure is maintained at a low or moderate level such as about 15 mTorr (block 6163). The RF torroidal plasma current is maintained until a tensile stressed non-conformal layer 6165 (FIG. 123C) of a suitable thickness has been deposited over the wafer. The tensile stressed layer 6165 is simultaneously deposited onto or into the n-channel device isolation trenches 6147. The isolation trenches 6147 may, during deposition of the layer 6165, be completely filled (so that the layer 6165 lies on top of the trench) or partially filled (so that the layer 6165 lies between the top and bottom of the trench 6147) or empty (so that the layer 6165 lies on the floor of the trench 6147).

Figure 123D:

The foregoing deposition steps correspond generally to the process of FIG. 113 in which a very low (<100 degrees C.) wafer temperature is maintained, so that the photoresist layer 6153 is undisturbed. The non-conformal nature of the deposited film 6165 leaves the vertical sidewalls 6153*a* of the photoresist layer 6153 fully exposed or partially covered. This enables the photoresist layer 6153 and the portion of the layer 6165 overlying the photoresist 6153 to be removed in the next step (block 6167 of FIG. 124) by introduction of a photoresist removal agent such as a solvent or fluorine, for example. This last step leaves intact the portion of the layer 6165 directly overlying the n-channel devices while exposing the p-channel devices, as shown in FIG. 123D.

Figure 123E:
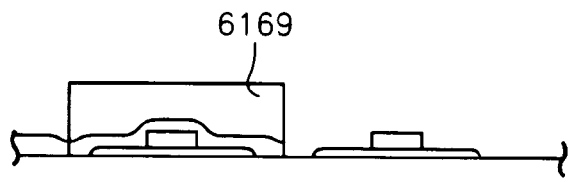
Figure 123F:
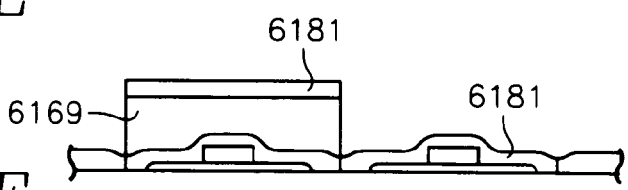
Figure 123G:
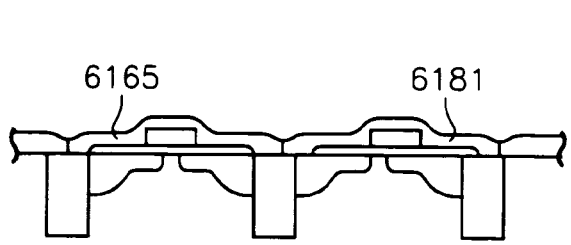

The next group of steps deposit a compressively-stressed non-conformal layer on the p-channel devices. First, as shown in FIG. 123E, a photoresist mask 6169 is placed over the n-channel devices (block 6171 of FIG. 124). Next, the wafer is placed in the same torroidal source plasma reactor and a precursor gas is introduced into the reactor chamber (block 6173 of FIG. 124). The HF plasma source power of the torroidal source plasma reactor is set to a suitable level for non-conformal CVD layer deposition (block 6175) and the plasma bias power is set to a suitable level for CVD deposition of a compressively-stressed layer (block 6177). Application of the plasma source power generates an RF torroidal plasma current (block 6179) causing CVD deposition of a compressively stressed non-conformal layer 6181 over the entire wafer, as illustrated in FIG. 123F. The compressively stressed layer 6181 is simultaneously deposited onto or into the p-channel device isolation trenches 6147'. The isolation trenches 6147' may, during deposition of the layer 6181, be completely filled (so that the layer 6181 lies on top of the trench) or partially filled (so that the layer 6181 lies between the top and bottom of the trench 6147') or empty (so that the layer 6181 lies on the floor of the trench 6147'). The photoresist mask 6169 is then removed (block 6183 of FIG. 124), thereby exposing the n-channel devices with their overlying coating 6165, as illustrated in FIG. 123G.

The tensile-stressed passivation layer 6165 overlying the n-channel devices and the tensile-stressed deposition filling the n-channel isolation trenches 6147 enhance carrier (electron) mobility in the n-channel devices. The compressive-stressed passivation layer 6181 overlying the p-channel devices and the compressive-stressed deposition filling the p-channel isolation trenches 6147' enhance carrier (hole) mobility in the p-channel devices.

In another version of this process, the steps depicted in FIGS. 123A through 123G (i.e., steps 6151 through 6183 of FIG. 124) may be simplified by depositing the tensile stressed layer 6165 (with no photoresist) over all devices (both P-channel and N-channel) by omitting the photoresist lithography step 6151 of FIG. 124 but performing the CVD steps 6155 through 6167. The one photolithography step that is performed is step 6171 of masking the N-channel devices. Then, CVD steps 6173 through 6179 are replaced by the step of ion implanting hydrogen or helium (for example) into the unmasked portion of the tensile-stressed film 6165 (that overlies the P-channel devices) to transform the stress in that portion from tensile to compressive. This ion implant step is carried out with a 4 kV bias voltage and an implant dose of about $5 \times 10^{16}$ cm$^{-2}$. This version of the process is simpler because only one photoresist masking step is required, rather than two. Since only a single layer 6165 is deposited in this version of the process, there is no removal of portions of the layer during photoresist removal, so that it is not critical that the film 6165 be non-conformal in this version of the process.

Figure 123H:
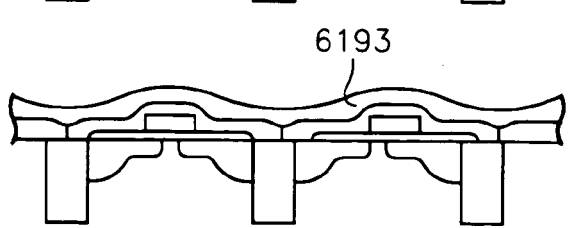

The last group of steps in the low temperature plasma CVD process of FIG. 124 are for depositing an etch stop layer over the stressed passivation layers 6165, 6181 of the n-channel and p-channel devices. Steps 6185, 6187, 6189 and 6191 correspond to steps 6155, 6157, 6159 and 6161, except that in step 6187 the source power level is set for deposition of a highly conformal layer, and in step 6189 the bias power is set for neutral (zero) stress in the CVD deposited layer. The result illustrated in FIG. 123H is a highly conformal passivation layer 6193 coating the wafer with excellent step coverage and having zero (neutral) stress.

If the composition of at least some or all of the layers 6165, 6181, 6193 is the same, then one option is to leave the torroidal source plasma reactor continuously operating in the state established in steps 6155, 6157, 6159 and 6161 for at least a portion or all of the process of FIG. 124, while changing only the plasma bias power (e.g., as in steps 6177 and/or 6189) to switch the deposited layer stress between tensile and compressive and/or neutral. In such a case, the wafer would be temporarily removed from the toroidal source plasma reactor only for the deposition of the photoresists masks 6153 and 6169 in steps 6151 and 6171, respectively, and, optionally, for the removal of those masks in steps 6167 and 6183. The toroidal source plasma reactor could therefore be operated continuously in a CVD deposition mode. Alternatively, the toroidal source plasma reactor itself could be used for the photoresist removal steps 6167, 6183 by removing the precursor process gases temporarily while briefly introducing a resist removal species to perform steps 6167 and 6183 in the toroidal source plasma reactor.

The n-channel isolation trenches 6147 are filled in a separate process corresponding to a suitable implementation of FIG. 113. In such an implementation of the process of FIG. 113, the conformality ratio could be set to a very low level by minimizing source power (in accordance with FIG. 114A), guaranteeing a non-conformal CVD layer to prevent pinch-off near the top of each of the narrow isolation trenches 6147. (As employed herein, the term pinch-off refers to a phenomenon in which complete filling of a high aspect ratio opening such as a narrow trench or narrow contact hole is prevented when CVD-deposited material accumulates near the top of the sidewall of the opening and closes off the opening so as to block deposition in the bottom or center region of the opening.)

Similarly, the p-channel isolation trenches 6147' are filled in a separate process corresponding to a suitable implementation of FIG. 113. As already stated, in such an implementation of the process of FIG. 113, the conformality ratio could be set to a very low level, guaranteeing a non-conformal CVD layer to prevent pinch-off near the top of each of the narrow isolation trenches 6147'.

The filling of high aspect ratio openings such as the isolation trenches 6147, 6147' has been described as an implementation of the process of FIG. 113 in which the source power level is reduced to a level at which the deposited layer is non-conformal, in accordance with FIG. 114A. This is because a non-conformal CVD-deposited layer generally has little or no accumulation on vertical sidewalls, such as the vertical sidewalls of the isolation trenches 6147, 6147'. As a result, there is little or no tendency for accumulation of CVD-deposited film near the top of the vertical sidewalls of the trenches 6147, 6147' that would otherwise pinch off the top of the opening and prevent deposition and the bottom of the opening or trench. This problem of pinch-off during CVD deposition in high aspect ratio openings is particularly noticeable in the deposition of oxygen-containing materials, such as combinations of silicon and oxygen with or without hydrogen or nitrogen, so that maintaining non-conformal CVD deposition profile is important when depositing such materials in high aspect ratio openings.

We have discovered that the problem of pinch-off during plasma-CVD deposition or filling of high aspect ratio openings is avoided in the low temperature toroidal plasma CVD process of FIG. 113 if the deposited material is a compound containing silicon and nitrogen and (optionally) hydrogen, and is free of active species such as oxygen or fluorine. We have found that this is true whether the source power level is low (for non-conformal layer deposition) or high (for conformal layer deposition). Therefore, one optional aspect of the process of FIG. 113 is to fill high aspect ratio openings (such as the isolation trenches 6147, 6147' of FIG. 123G) using a process gas mixture containing, for example, silicon and nitrogen (e.g., silane and nitrogen gases) but which is free of oxygen. This permits the source power to be set at any suitable level including a high level corresponding to a highly conformal CVD layer deposition. This aspect increases the versatility of the process by removing the need to restrict the source power to a low level to achieve non-conformality in the deposited layer, so that the source power window is greatly widened for applications of the low temperature toroidal plasma CVD process of FIG. 113 to the filling of high aspect ratio openings.

In a related aspect, the problem of pinch-off during CVD deposition in high aspect ratio openings with conformal films, which is avoided above by employing oxygen-free silicon-nitrogen compounds, may still be avoided even if the deposited materials contain oxygen. This surprising result is achieved in another version of the process of FIG. 113 by increasing the oxygen content of the process gas (starting at 0%) after the high aspect ratio openings are mostly (or nearly) filled. Thus, the plasma CVD deposition process of FIG. 113 begins with a process gas that is oxygen-free, and after the high aspect ratio openings have been filled to some percentage (e.g., 80% filled), a small amount of oxygen is introduced in to the process gas and its proportion is increased until, when the opening is almost completely filled (e.g., when it is about 95% filled so that the risk of pinch-off has faded to zero), the oxygen content is very high. In one implementation, the nitrogen content may be continuously reduced as the oxygen content is continuously increased, so that the top of the deposited layer filling the high aspect ratio openings is basically an oxide such as silicon dioxide. This latter aspect enables the filling of high aspect ratio openings with a highly conformal CVD layer consisting of an oxide (or a fluoride) while avoiding the pinch-off problem.

Figure 125:
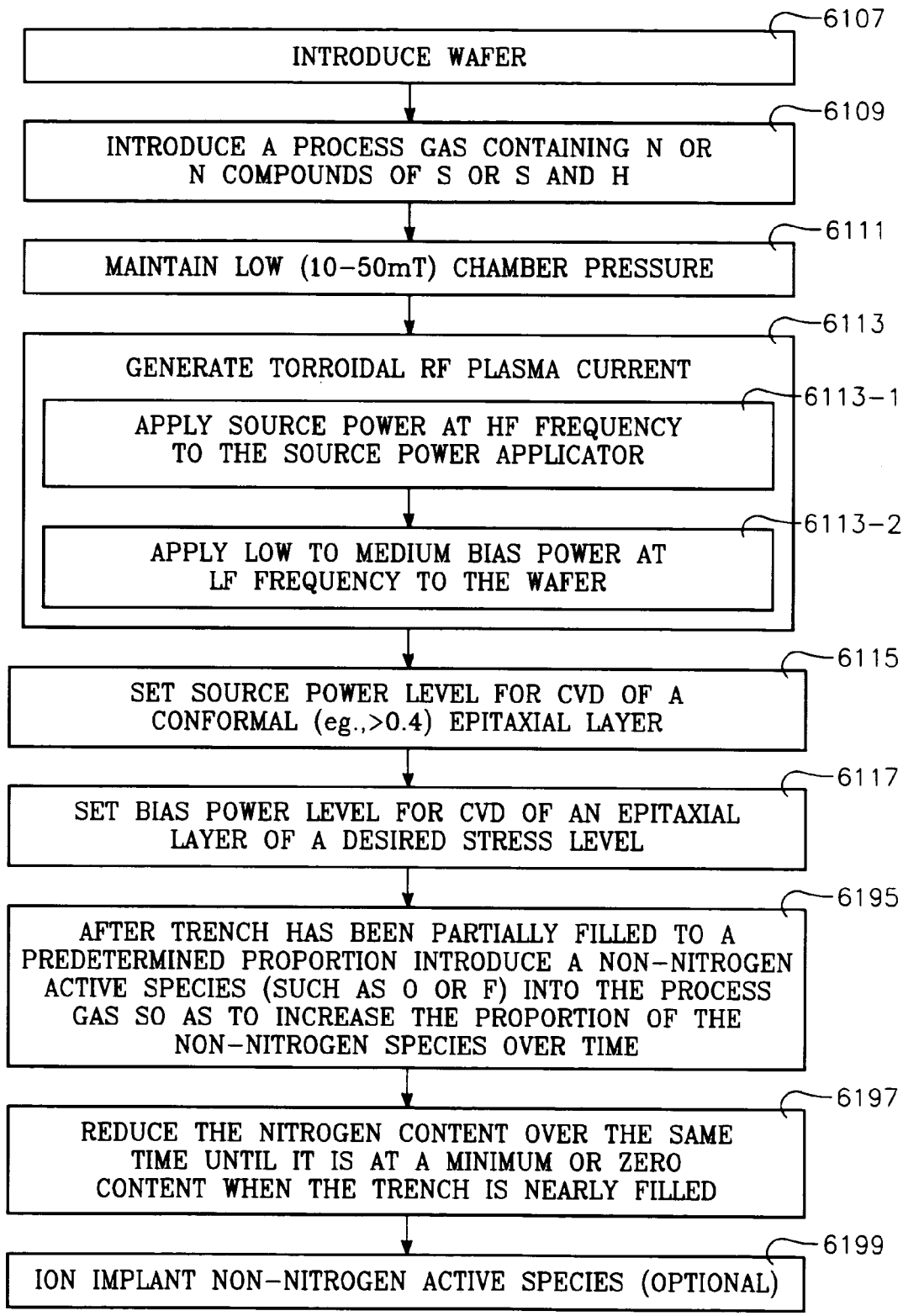

Such a process is illustrated in FIG. 125. This process includes all of the steps of the process of FIG. 113, namely steps 6107, 6109, 6111, 6113, 6115 and 6117. These steps are performed in the manner described above with reference to FIG. 113, except that the wafer introduced in the step of block 6107 has high aspect ratio openings (such as isolation trenches) that are to be filled in the CVD process. Moreover, in the step of block 6109, the process gas that is initially introduced is free of oxygen or other active species such as fluorine. And, in the step of block 6115, the source power may be set to a high level (for a conformal coating) if desired without risk of pinch-off in high aspect ratio openings.

Figure 126:
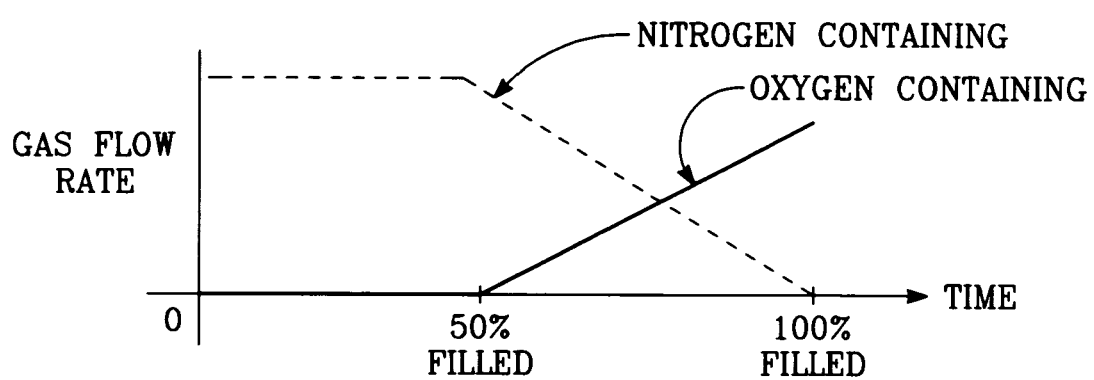
Figure 127:
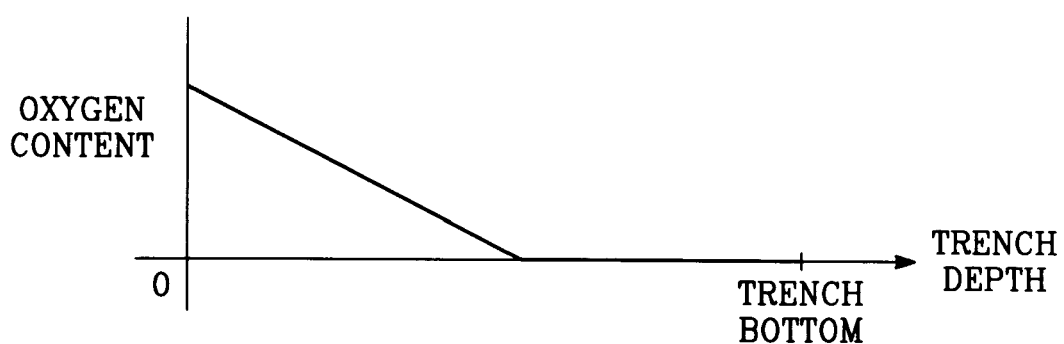

After the high aspect ratio openings have been filled by some percentage (e.g., 70% or 80%, or at least over 50%), the active species (such as oxygen) is introduced into the process gas beginning with a small amount and increasing as the opening continuous to be filled (block 6195 of FIG. 125). Additionally (and optionally), the flow rate of the nitrogen-containing gas is reduced as the oxygen content is increased, so that the oxygen begins to replace the nitrogen in the process gas mixture (block 6197 of FIG. 125). If desired, the rate at which the changes of steps 6195 and 6197 are made may be sufficiently high so that after the openings are almost completely filled (e.g., 95% filled), the nitrogen has been completely replaced by the oxygen, and the top of the deposited layer is an oxide such as silicon dioxide. FIG. 126 depicts the gas flow rates of oxygen (solid line) and nitrogen (dashed line) as a function of time over the duration of time required to fill the openings. In FIG. 126, after the openings are 50% filled, oxygen is begun to be introduced while the nitrogen flow rate is begun to be reduced in proportion. By the time the process is completed (when the openings are 100% filled), oxygen has completely replaced nitrogen in the process gas mixture. FIG. 127 illustrates the oxygen content profile in the deposited layer as a function of depth. At the bottom of the opening (or isolation trench), the oxygen content is zero, and at half depth oxygen content begins to increase, while at the top of the opening the oxygen content is maximum.

The content of the CVD-deposited film in the processes of FIGS. 113, 124 or 125 can be controlled by controlling the process gas mixture. To deposit a plasma CVD layer of silicon nitride (SiN), the process gas can consist of silane gas and either N2 gas or ammonia gas. If the deposited layer is to include a significant amount of hydrogen, then hydrogen gas (H2) is added to the process gas mixture. The hydrogen content of the deposited layer is controlled by controlling the hydrogen content of the process gas. The hydrogen-content of the deposited layer affects the type of stress in the layer, where the stress may vary between compressive and tensile. If the deposited layer is to contain oxygen, then oxygen may be injected into the reactor chamber in a path separate from the silane injection. Moreover, in order to avoid a rapid reaction between the silane and the oxygen, the reactor chamber pressure must be kept at a low (e.g., 15 mTorr) level. For this purpose, a separate process gas injector may inject the oxygen gas through a separate injection port such as one of the side injection ports 130 of FIG. 1. The main process gas mixture (i.e., the silane and nitrogen and/or ammonia or hydrogen) may be fed through an overhead gas distribution plate in the ceiling, such as the gas distribution plate 210 of FIG. 45. The radial distribution of the gas mixture may be controlled by independently adjusting the gas flow rates of the inner and outer gas supply inlets 4490, 4492 of FIG. 45, for example, to assure a uniform process gas distribution over the wafer.

The process gas mixture may consist of any of the following:
  silane and nitrogen gases;
  silane and ammonia gases;
  silane, nitrogen and hydrogen gases;
  silane, ammonia and hydrogen gases;
  silane and oxygen gases;
  silane, nitrogen and oxygen gases;
  silane, ammonia and oxygen gases;
  silane, nitrogen, hydrogen and oxygen gases;
  silane, ammonia, hydrogen and oxygen gases.

The foregoing process gas mixtures, in addition to being useful for CVD deposition on the wafer, are also useful for deposition of a passivation coating on the interior plasma reactor chamber surfaces.

As previously mentioned in this specification, the silicon nitride layers deposited by the low temperature CVD process can be enhanced by implanting nitrogen (or other species) into the deposited layer after completion of the CVD process. Ion implantation can be performed using the torroidal source reactor as a plasma immersion ion implantation reactor, as described above.

Ion implantation of three-dimensional structures for enhancing their physical characteristics (such as a layer deposited by the foregoing low temperature CVD process) can be accomplished while minimizing the disparity between ion implantation depth in the horizontal surfaces of the structure and ion implantation depth in the vertical surfaces of the structure. The structure may, for example, be a thin oxide gate overlying a source-to-drain channel of a transistor. Such a three dimensional structure has a horizontal top surface and four vertical side surfaces. Or, the structure may be a high aspect ratio opening (such as a deep trench) with an aspect ratio as high as 10:1 or greater. Plasma immersion ion implantation produces an ion flux in the vertical direction, so that the angle of incidence—and therefore the ion implantation depth—is greatest at the horizontal surface and least in the vertical surfaces of the structure. Plasma bias power is selected to set the ion implantation depth. Disparity between ion implantation depths in the horizontal and vertical surfaces is reduced by increasing the angular distribution of the ion trajectories near the wafer surface. The greater the angular spread (or standard deviation) of ion trajectories from the vertical direction, the greater the ion implantation depth in the vertical surface, and therefore the smaller the disparity between ion implantation depth in the vertical and horizontal surfaces. The angular distribution of ion trajectories near the workpiece surface is proportional to the plasma sheath thickness and to the chamber pressure. The plasma sheath thickness decreases with plasma RF source power, increases with chamber pressure and increases with plasma RF bias power. Therefore, bias power may be selected to achieve an overall average ion implantation depth, while the chamber pressure and RF plasma source power are adjusted to increase the spread or deviation in ion trajectory angular distribution so as to reduce the disparity between ion implantation depths in the horizontal and vertical surfaces to a desired threshold. Thus, the RF plasma source power and chamber pressure are set to values at which the angular spread in ion trajectory is sufficient to achieve a desired minimum ion implantation depth in the vertical surfaces of the implanted structure without exceeding a certain maximum ion implantation depth in the horizontal surface(s).

In a working example, the ion implantation depth in the vertical surfaces was at least 100 angstroms and in the horizontal surfaces did not exceed 400 angstroms. The RF bias voltage may be about 4 kV, the source power may be about 500 Watts, the chamber pressure may be about 25 mT. The implantation dose is set by the implant time, which may be on the order of about 20-30 seconds.

Plasma Process Doping of Vertical Transistors:

Vertical transistors are uniformly doped in a torroidal source plasma reactor of the type disclosed in the above-referenced parent application. The large range in source power, bias power and chamber pressure such a reactor affords is exploited to uniformly dope all regions of a vertical transistor. In one embodiment, a conformal plasma immersion ion implantation of a dopant species is performed by the torroidal source plasma reactor, in which dopant ions are implanted through every face of the vertical transistor without requiring any movement of the wafer. In one embodiment, ion implantation is performed at wafer temperatures below 100° C., i.e. below the temperature at which photoresist is damaged. In another embodiment, ion implantation is performed at an elevated wafer temperature of ~500-600 C, to prevent radiation damage and formation of amorphous material in the vertical transistor.

In another embodiment, a conformal plasma enhanced chemical vapor deposition process is performed, in which a film or layer containing the dopant species is deposited on every face of the vertical transistor, after which a heating step causes the dopant atoms in the deposited dopant-containing layer to diffuse throughout the source, drain and gate of the vertical transistor structure.

The dopant-containing layer may be a dielectric material (such as SiO2) mixed with a dopant species (such as boron), or it may consist only of the dopant species (e.g., a pure or predominantly boron layer). After annealing and diffusion of dopants has been completed, the dopant-containing dielectric layer is removed from the devices.

In one embodiment, the deposition of a pure dopant film and the implantation of dopant ions is performed simultaneously, after which the wafer is heated to drive dopant atoms into the transistor from the dopant-containing film.

FIGS. 128A through 128E depict a process for doping a 3-dimensional or vertical transistor. FIGS. 129 through 132 depict alternatives for the step of FIG. 128E.

Figure 128A:
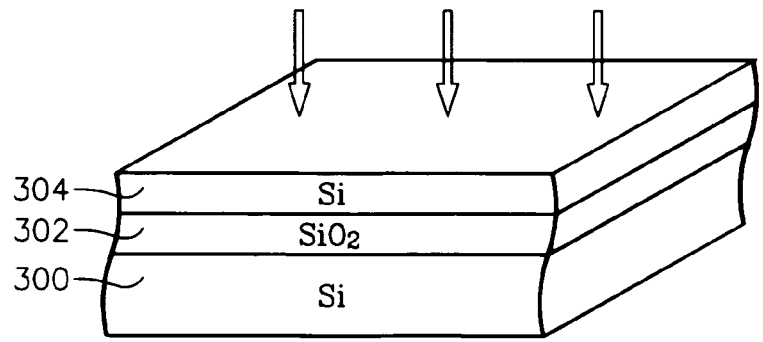

Referring to FIG. 128A, an SOI structure consisting of a semiconductor (silicon) substrate 300, an intermediate insulator (silicon dioxide) layer 302 and a top active semiconductor (silicon) layer 304 is subject to a doping process such as a plasma immersion ion implantation process in order to lightly dope the active layer 304. Typically, the active layer 304 is between 0.05 and 0.1 microns thick. In a planar CMOS FET fabrication process, the doping step of FIG. 128A corresponds to the well implant step. If a P-channel transistor is to be formed, then this implant step implants a light dose (e.g., 1E17/cc) of an N-type dopant, such as As.

Figure 128B:
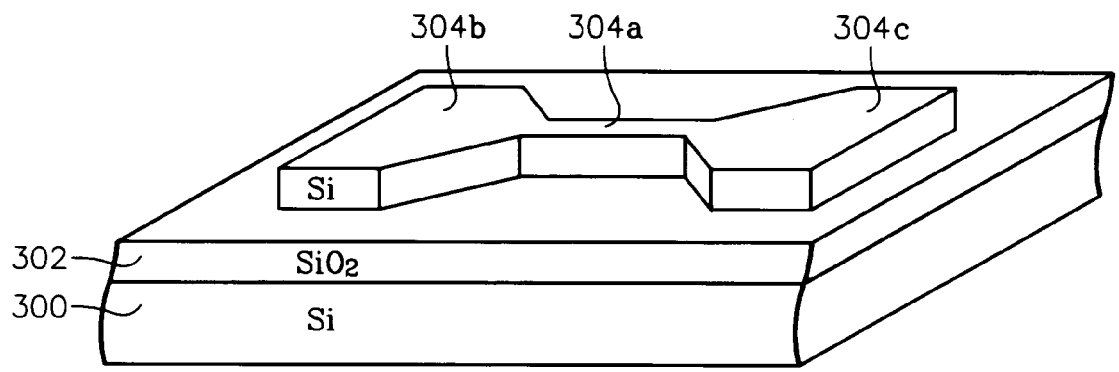
Figure 128C:
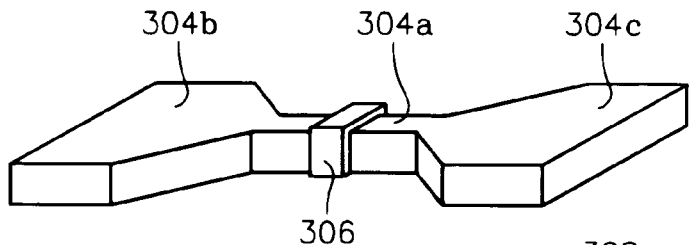
Figure 128D:
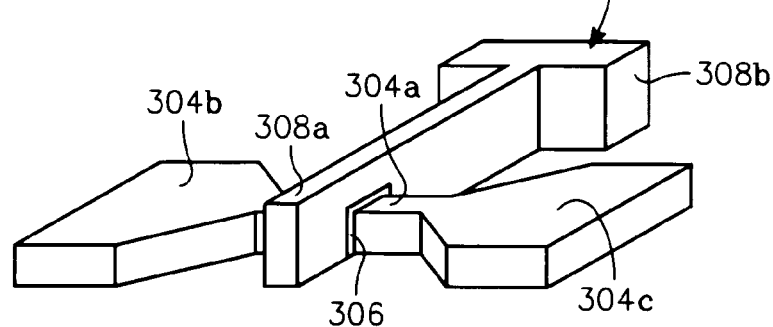

In FIG. 128B, the active layer is etched down to the insulator layer 302 to sculpt a source-channel-drain 3-dimensional structure from the active layer 304, consisting of an elongate channel membrane 304a with a source fin 304b at one end and a drain fin 304c at the other end of the channel membrane 304a. The configuration of the 3-dimensional source-channel-drain structure 304a, 304b, 304c is photolithographically defined prior to the etching. The channel membrane is about 0.05 to 0.10 microns thick and its width about the same as its thickness. In FIG. 128C, a thin gate oxide film 306 is deposited over the vertical side walls and top surface of a section of the channel membrane 304a. The gate oxide film 306 is between about 10 and 20 angstroms in thickness. In FIG. 128D, a gate 308 of polycrystalline silicon is formed on the thin gate oxide film 306. The gate 308 consists of an elongate 3-dimensional gate membrane 308a and a gate fin 308b. The gate membrane 308a is nearly twice as tall as the channel membrane 304a and about twice as thick. The thickness of the gate membrane 308a corresponds to the channel length of the transistor. The gate oxide film 306 and the gate 308 are formed by conformal deposition processes in which a thin gate oxide film is deposited conformally on all surfaces of the source-channel-drain structure 304a, 304b, 304c, a polysilicon film is deposited over the thin gate oxide film, and the two films are sculpted in an etch process to form the gate structure 308a, 308b.

Figure 133:
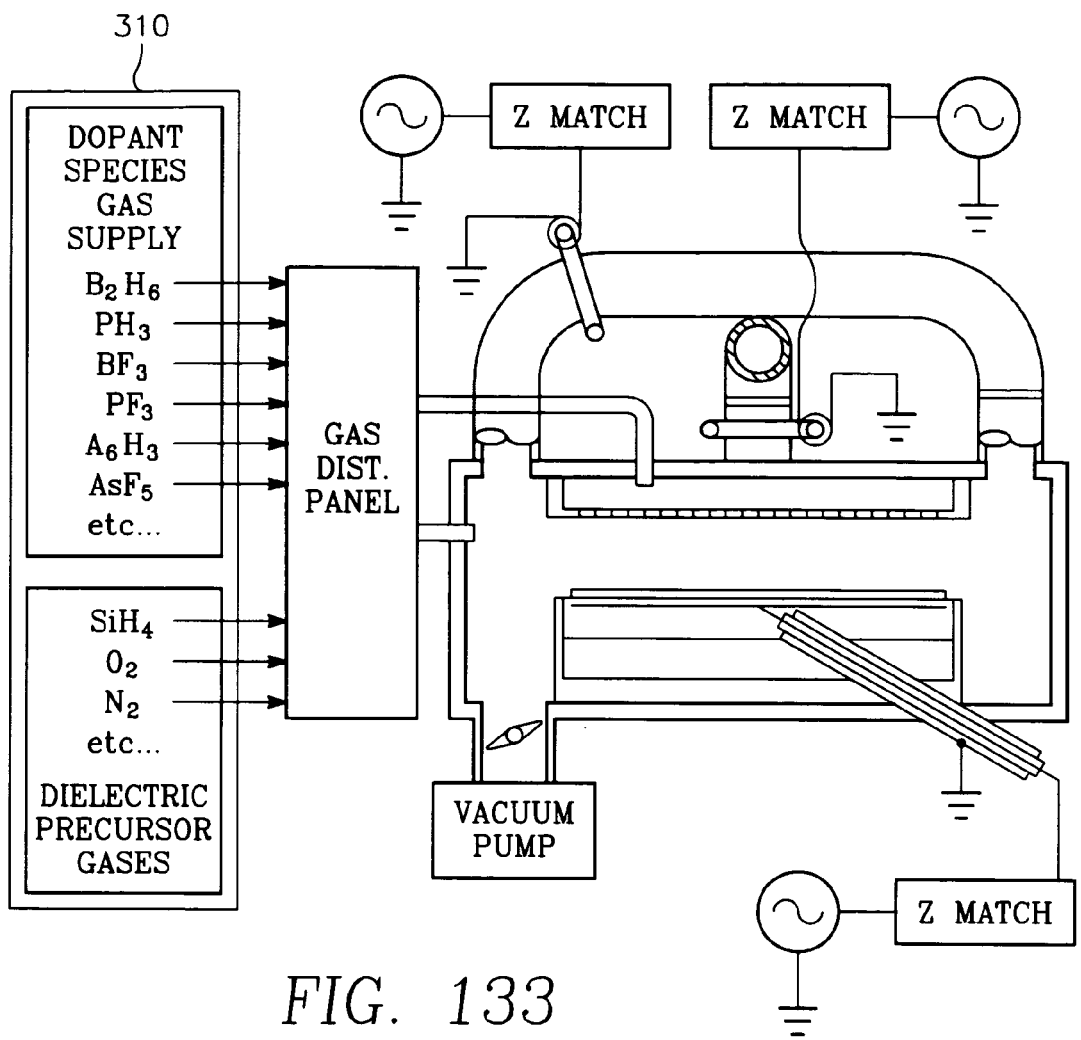

The source and drain structure 304a, 304b, 304c and the gate 308 are doped to a high level (e.g., 1E20/cc to 1E21/cc) with a dopant species by a highly conformal plasma immersion ion implantation process using the torroidal source plasma reactor of FIG. 133, which is similar to the plasma immersion ion implantation reactor of FIG. 85. The process exploits the wide range of bias power and source power in which the reactor can operate to render the ion implantation process so conformal that a large implant dose is delivered to every vertical face of the vertical transistor of FIG. 128E while simultaneously delivering a large implant dose to the horizontal top surface.

Such a highly conformal plasma immersion ion implantation step is made possible in the torroidal source reactor of FIG. 133 (FIG. 85) by operating the reactor at a high pressure (e.g. >80 mTorr) and at a very low level of source power (e.g., about 500 Watts or even as low as 100 Watts). High voltage results in more conformal doping than lower voltage. However, the bias voltage is selected to achieve the required junction depth for a particular transistor structure or process. The high voltage wafer support pedestal of FIG. 97 makes it possible to maintain such a high bias voltage level without arcing. The torroidal source can be operated at a power level as low as 100 Watts and still maintain a plasma.

The torroidal source plasma reactor of FIG. 133 has the chamber and source elements as the reactor of FIG. 85 and the high voltage wafer support pedestal of FIG. 97. Furthermore, its gas distribution panel, which is illustrated in FIG. 87, has a gas supply 310 that furnishes a selection of process gases particularly suitable for processing the vertical transistor of FIG. 128, including dopant species gases and dielectric film precursor gases. As described previously in this specification, the torroidal source plasma reactor establishes RF oscillating torroidal plasma currents through its external reentrant conduits, the currents passing through the process region above the wafer.

Figure 134:
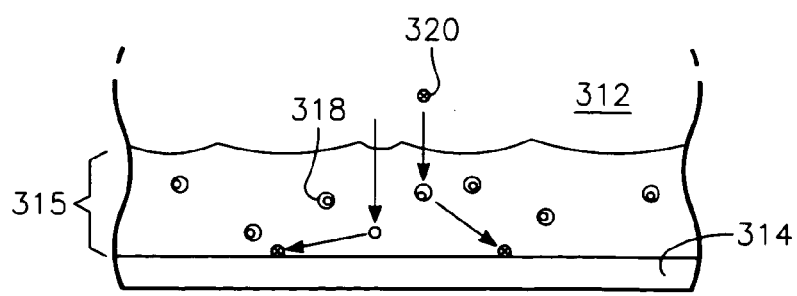

FIG. 134 illustrates plasma 312 above a wafer 314 and a plasma sheath 316 formed in the reactor of FIG. 133. Neutrals and radicals 318 predominate in the plasma sheath 316. The high bias voltage referred to above (5 kV) increases the thickness of the plasma sheath 316, and the low source power referred to above (100-500 Watts) decreases the tendency of plasma to push against the sheath, thereby cooperating to enlarge the sheath thickness. (Junction depth requirements limit the maximum bias voltage that can be used). In addition, the low source power tends to reduce dissociation of species in the plasma, so that the neutrals and radicals in the sheath tend to be, on the average, larger with a larger collision cross section. The thicker sheath corresponds to a greater number of radical-ion collisions. As a result, scattering of dopant ions 320 by radicals 318 is more frequent, causing more ions to have trajectories that are not in the direction of the sheath electric field (i.e., perpendicular to the wafer surface). As a result, more ions strike the wafer at nearly horizontal trajectories so that the ion implantation dose on vertical surfaces begins to approach the ion implant dose on horizontal surfaces. The term "conformal ion implant dose" refers to a conformality ratio of ion implant dose on vertical surfaces to the ion implant dose on horizontal surfaces. The more conformal the dose, the higher the conformality, the ion dose on vertical surfaces at least approximating the ion dose on horizontal surfaces at a conformality of nearly 100%. Although the ion implantation need not be 100% conformal, it is desirable that the conformality be such that the implant dose on the vertical surfaces is on the order of about 10% (or more) of the implant dose on the horizontal surfaces.

The rate of ion-neutral collisions in the sheath 316 may be enhanced to increase the ion implant dose conformality by supplementing the dopant containing process gas (e.g., B2H6) with a "large" gaseous species having a much greater collision cross section, such as xenon for example. By increasing the gas flow rate of the large gaseous species relative to the gas flow rate of the dopant containing gas into the chamber, the ion implant dose conformality is increased. The large gaseous species flow rate may be between about 5% and 50% of the gas flow rate of the dopant containing process gas, for example. It should be noted smaller species such as He or H2 can also be used to increase chamber pressure and ion-neutral scattering at the sheath.

Figure 128E:
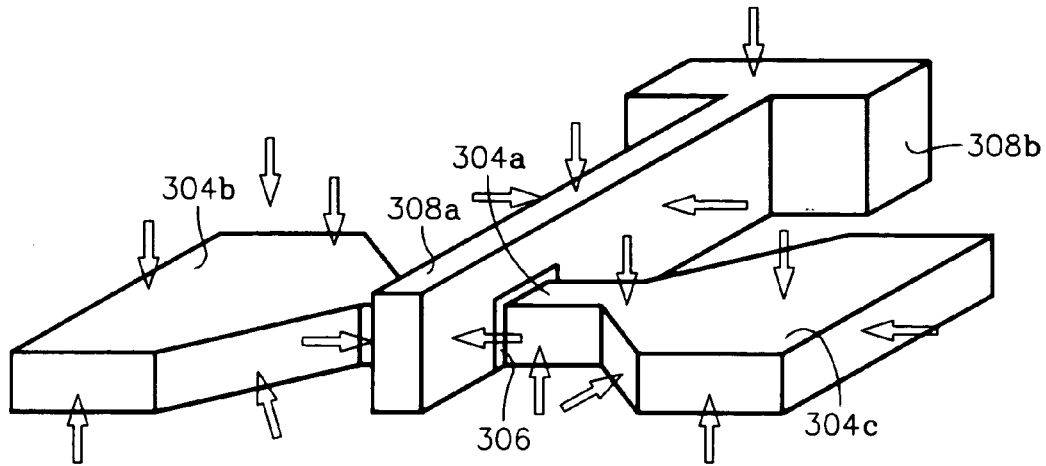

Following the conformal plasma immersion ion implantation step of FIG. 128E, the wafer is subject to photoresist ashing/cleaning and post-implant anneal step, in which the wafer is heated to provide sufficient energy for the implanted ions to be substituted into the silicon crystal lattice. In addition, the wafer may be heated for a sufficient time to drive the implanted dopant atoms deeper into the active layer 304. In either case, the gate width is sufficiently large to establish an initial source-drain channel length that allows for the inevitable shrinking of that length by diffusion of the implanted ions during the anneal or heating step. It should be noted that advanced annealing such as millisecond laser annealing or millisecond flash annealing can be used to activate the dopant atoms with negligible diffusion (activation with negligible diffusion).

In accordance with another embodiment, the conformal plasma immersion ion implantation step of FIG. 128E is replaced by the steps illustrated in FIGS. 129A and 129B. In the steps of FIGS. 129A and 129B, all vertical and horizontal surfaces of the vertical transistor (FIG. 128D) are covered with a highly conformal film (such as a dielectric film) of about 200 angstroms in thickness and containing dopant atoms. The density of the dopant atoms in the conformal dielectric film is in excess of 1E20/cc, and exceeds the target or desired dopant density in the vertical transistor (i.e., the desired dopant density in the source-channel-drain structure 304 and gate structure 308).

After deposition of the dopant-containing layer, the wafer is heated to drive in the dopant atoms from the deposited film into the semiconductor lattice of the vertical transistor. First, in FIG. 129A, the torroidal source reactor of FIG. 133 performs a chemical vapor deposition process in which a dielectric film 320 containing dopant atoms is deposited. This is accomplished by the gas supply 310 furnishing to the gas distribution panel both a precursor gas for dielectric film deposition (e.g., a mixture of O2 and SiH4 for silicon dioxide deposition) and a dopant containing gas (e.g., B2H6). The desired film thickness is on the order of about 200 angstroms. The film is rendered highly conformal with the vertical and horizontal surfaces by selecting a relatively high source power level in accordance with the graph of FIG. 114 (e.g., about 2 kW) and a chamber pressure of about 10 mTorr. Although 100% conformality is not required, it is felt that a conformality of at least on the order of 10% is desireable. The gas flow rates of the process gas are set individually at the gas panel so that a relatively high concentration of dopant atoms in the dielectric film is attained (e.g., on the order of about 10E20/cc). For example, in the process gas recipe mentioned above, the gas flow rate of SiH4 may be 70 sccm, the gas flow rate of O2 may be 200 sccm and the gas flow rate of B2H6 may be 50 sccm. The dopant concentration in the deposited film is increased by increasing the flow rate of the B2H6 gas.

If the dielectric film 320 (or a portion thereof) is to be left in place permanently, then it can be a stressed passivation film that enhances transistor performance. The film 320 can have tensile or compressive stress to enhance transistor performance, depending upon whether the transistor is an N-channel device or a P-channel device, as described previously in this specification. The stress in the dielectric film 320 is rendered compressive by performing the film deposition step at a high bias power (about 5 kW) or is rendered tensile by setting the bias power to a low level (about 100 Watts) in accordance with the graph of FIG. 116.

The foregoing step deposits the dielectric film 320 with a rich proportion of dopant atoms. The concentration of dopant atoms in the dielectric film 320 should exceed the desired dopant concentration in the underlying silicon lattice of the vertical transistor (e.g., greater than 1E20/cc). The film 320 lies on all vertical and horizontal surfaces of the source-channel-drain structure 304a, 304b, 304c and the gate 308a, 308b, as shown in FIG. 129A. In FIG. 129B, the wafer is heated to a sufficiently high temperature for a sufficient amount of time to cause the dopant atoms in the dielectric layer 320 to diffuse into the source-channel-drain layer 304 and into the gate 308. As indicated in FIG. 129B, the dopant atoms diffuse through all vertical and horizontal surfaces of the vertical transistor, removing from the deposited dielectric layer many (or most) of the dopant atoms that it originally contained. Depending upon the time and temperature of this heating step, the dopant atoms become uniformly distributed throughout the vertical transistor structure 304, 308. For example, this heating step may raise the wafer temperature to 1050 degrees C. for 20 sec.

While the example given above involves a silicon dioxide film containing boron atoms, other materials may be used instead. For example, the film may be silicon nitride, which is deposited with a process gas of SiH4 and N2. The dopant may be As (using a process gas of AsH3 or AsF5) or P (using a process gas of PH3 or PF3). Boron may be deposited using BF3 or B2H6. These are the gases that may be stored in the gas supply 310 of FIG. 133.

The step of FIG. 128E may also be replaced by the steps of FIGS. 130A and 130B in which a conformal pure dopant film is deposited as a dopant source. In FIG. 130A, a process gas containing only a dopant-compound gas (such as B2H6 or BF3, for example) is introduced into the chamber of the torroidal source reactor of FIG. 133. The reactor is operated in the same deposition mode described above with reference to FIGS. 129A and 129B, except that no bias power is applied. As shown in FIG. 130A, a pure dopant film 324 is deposited conformally over all vertical and horizontal surfaces of the vertical transistor of FIG. 128D. For this purpose, the wafer temperature is maintained at a relatively cool level, about 20 degrees C. If, for example, the process gas is B2H6, then the film 324 is essentially pure boron. In FIG. 130B, the wafer is heated to cause many (or most) of the boron atoms in the boron film 324 to diffuse into the silicon lattice of the vertical transistor (the crystalline lattice of the silicon active layer 304 and the polycrystalline material of the gate 308). FIG. 130B indicates that the dopant atoms diffuse through all vertical and horizontal surfaces of the vertical transistor.

In yet another embodiment, the processes of FIGS. 128E and 130A, 130B are combined into a single process in which dopant ions are ion implanted simultaneously with the deposition of a pure dopant film, as shown in FIG. 131A. The bias voltage in the reactor of FIG. 133 is set so that the ion implantation profile peaks at or near (either slightly above or slightly below) the wafer surface. As a result, some of the plasma ions incident on the wafer are implanted below the surface to form a shallow implanted layer 326. The remaining plasma ions incident on the wafer (or at least some of them) accumulate on the surfaces of the vertical transistor to form a dopant film 328. The bias power is set to a sufficiently high level for the ion implantation to be conformal while the source power is set to a sufficiently high level so that the dopant film 328 is highly conformal. During the implant step, the wafer temperature may be maintained as high as 600 degrees C. to prevent damage of the active layer crystal. After the implantation step, the wafer is heated (FIG. 131B), so that the dopant atoms in the dopant film 328 are driven into the vertical transistor, which drives the shallow implanted layer 326 deeper beneath the surface for more uniform distribution of dopant atoms. FIG. 131B indicates that the dopant atoms are diffused from the dopant layer through all vertical transistor surfaces as well as horizontal surfaces. As a result, the source-channel-drain structure 304 and the gate 308 are uniformly doped.

Figure 131C:
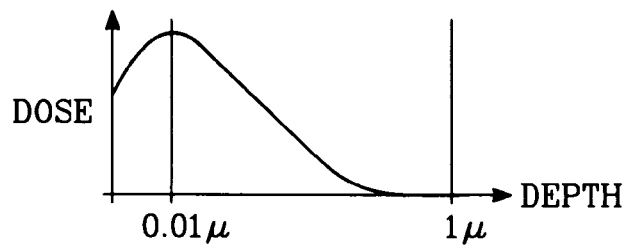

FIG. 131C illustrates one example of a desired ion implantation depth profile that provides simultaneous ion implantation and dopant film deposition (e.g., by plasma enhanced chemical vapor deposition). The vertical axis is the implanted atom volume density and the horizontal axis is depth beneath one of the surfaces of the vertical transistor. The bias power is set so that the peak of the implanted atom distribution very close to the surface (for example, within about 10 nm).

FIGS. 132A through 132C illustrate a further alternative procedure to be performed instead of the process of FIG. 128E. The procedure of FIGS. 132A through 132C is to perform the conformal implant step of FIG. 128E (which is the step of FIG. 132A) and then to perform the dopant-containing dielectric layer deposition steps of FIGS. 129A and 129B (corresponding to FIGS. 132B and 132C). The wafer temperature during implant may be as high as 600 C to prevent any damage of the silicon crystal. These steps may all be performed in the same torroidal source reactor of FIG. 133, for example, without removing the wafer from the reactor. The anneal step of FIG. 132C serves to diffuse the dopant ions into the vertical transistor from the dopant-containing film and also serves to drive the ion implanted dopant atoms more deeply beneath the surface. This phenomenon may be called dopant enhanced diffusion.

In FIG. 132A, the ion implantation step produces an implanted region 340 beneath the surface. In FIG. 132B, the deposition step forms a dielectric layer 342 that is rich in dopant atoms. The heating step of FIG. 132C diffuses dopant atoms from the dielectric film 342 into the vertical transistor while forcing dopant atoms from the implanted layer 340 to diffuse more deeply into the structure. As a result, dopant atoms are uniformly distributed throughout the volume of the source-channel-drain structure 304a, 304b, 304C and the gate 308.

Figure 135:
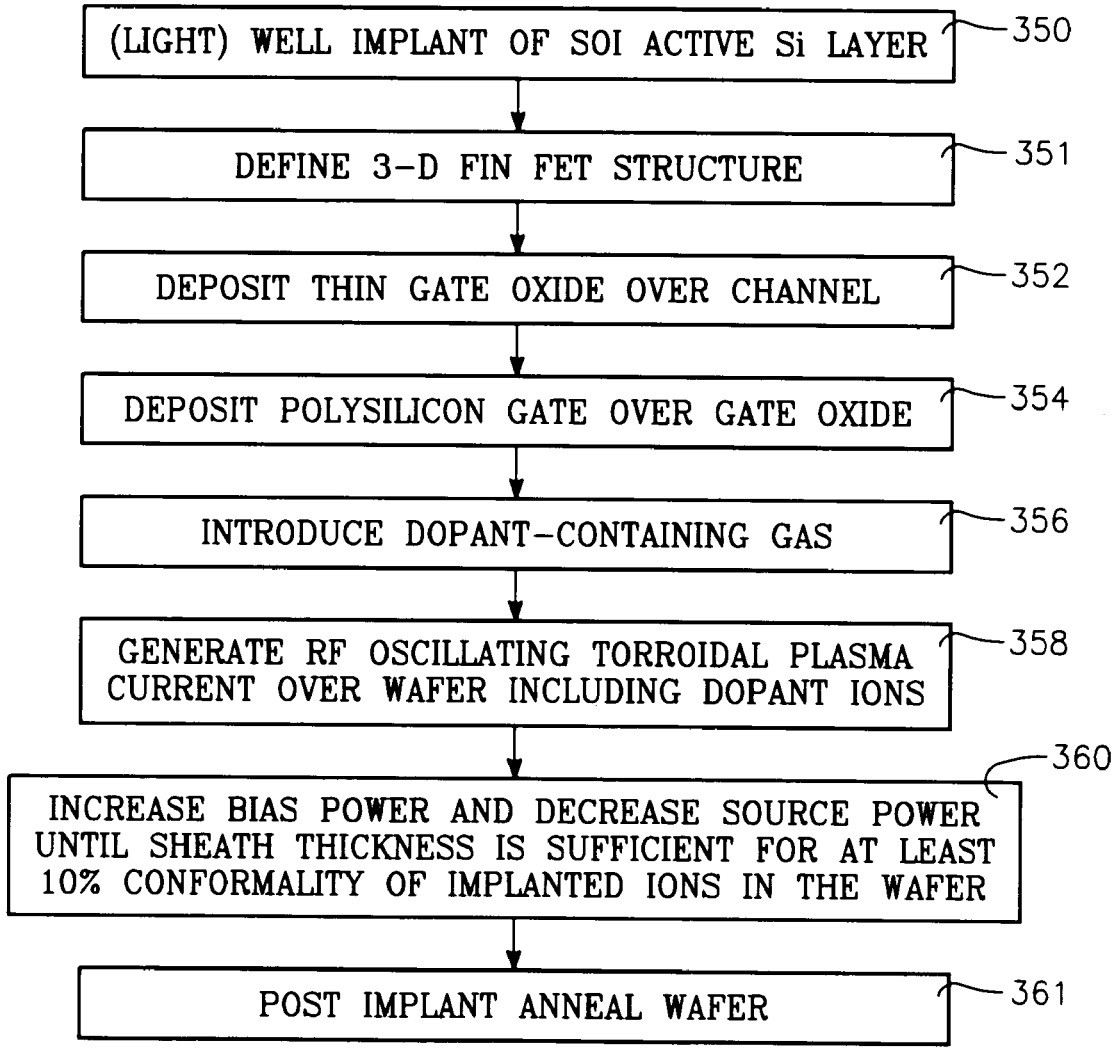

FIG. 135 is a flow diagram of the vertical transistor fabrication process including the conformal plasma immersion ion implantation doping step of FIG. 128E. First, a well ion implantation of the SOI structure is performed (block 350 of FIG. 135). The silicon active layer 304 is etched to form the three-dimensional source-channel-drain structure 304a-c of FIG. 128B (block 351) and the gate oxide layer 306 of FIG. 128C is deposited (block 352). In the step of block 354, the polysilicon gate 308 is formed by polysilicon deposition, a photolithographic masking step and etching of the polysilicon material. A dopant containing gas is introduced into the torroidal source reactor (block 356) and an RF oscillating torroidal plasma current is generated flowing through the process region above the wafer (block 358). The implantation process is rendered conformal by increasing the bias power while decreasing the source power (block 360) and increasing chamber pressure. Ion implantation may be carried out at a wafer temperature of ~600 C to prevent Si lattice damage. Upon completion of the plasma immersion ion implantation process, a post-implant anneal step (block 361) is performed by heating the wafer to a temperature sufficient to repair ion bombardment damage in the silicon crystal lattice and to cause at least a large proportion of the implanted atoms to become substituted into atomic site in the crystal lattice. Either spike annealing or millisecond laser annealing (non-melt or melt) or both can be used.

FIG. 136 is a flow diagram of a vertical transistor fabrication process employing the alternative doping process of FIGS. 129A and 129B, in which a dopant-containing dielectric layer is conformally deposited on the vertical transistor for subsequent doping of the vertical transistor. The process of FIG. 136 includes the steps of blocks 350-354 of FIG. 135. The next step (block 362) is to introduce a process gas including a dielectric precursor gas (such as $SiH_4+O_2$) and a dopant precursor gas (such as $B_2H_6$). Then, an RF oscillating torroidal plasma current is generated that flows through the process zone overlying the wafer (block 364). The wafer is maintained at a sufficiently cool temperature (e.g., 20 degrees C.) to deposit a dielectric layer containing the dopant (block 366). The source power is maintained at a sufficiently high level for the dielectric film to be deposited conformally (block 368). If the dielectric layer is to be a permanent passivation layer over the transistor, then transistor performance can be enhanced by forming the dielectric film with a mechanical stress, either compressive or tensile, by setting the bias power high or low (block 370). Following deposition, a wafer heating step is performed to drive dopant atoms from the film into the interior volume of the vertical transistor (block 372).

FIG. 137 is a flow diagram of a vertical transistor fabrication process employing the alternative doping process of FIGS. 130A and 130B, in which a layer consisting of a pure (or predominantly) dopant species is conformally deposited on the vertical transistor of FIG. 128D, and the dopants driven into the transistor by a heating step. In FIG. 137, the first four steps are the same blocks 350-354 of FIG. 135. A dopant precursor gas (such as $B_2H_6$) is introduced into the torroidal source plasma reactor of FIG. 133 (block 374) and an RF oscillating torroidal plasma current in generated over the wafer from the precursor gas (block 376). The wafer is maintained at a sufficiently low temperature in the step of block 378 to promote deposition of the dopant species (e.g., boron, if the process gas is $B_2H_6$). The plasma source power is maintained at a sufficiently high level to ensure an adequate degree of conformality of the deposited dopant film (block 380). For example, referring to the graph of FIG. 114, a highly conformal film is deposited if the source power is maintained around 2 kwatts, for example. The bias power level may be zero, or a very low power level. After the dopant layer has been formed to a desired thickness (e.g., 1 micron), the wafer is heated (block 382) to drive the dopant in from the deposited layer into the crystal lattice of the source-channel-drain structure 304a, 304b, 304c and into the polycrystalline lattice of the polysilicon gate structure 308a, 308b.

FIG. 138 is a flow diagram of a vertical transistor fabrication process employing the alternative doping process of FIGS. 131A and 131B, in which a layer consisting of a pure (or predominantly) dopant species is conformally deposited on the vertical transistor of FIG. 128D while at the simultaneously the same dopant species is ion implanted in the vertical transistor. The dopants driven into the transistor by a heating step. In FIG. 138, the process begins with the steps of blocks 350-354 and 374-380 of FIG. 137. The process of FIG. 138 includes, in addition, the step of block 384 in which the bias power level in the reactor of FIG. 133 is set to maintain a wafer bias voltage corresponding to an implant depth profile that peaks at or near the surfaces of the vertical transistor. The bias power required for this may be zero or only a few watts, for example. The result is that some of the ions incident on the vertical transistor are implanted beneath its horizontal and vertical surfaces while others conformally deposit on those surfaces, so that a surface layer of the dopant atoms accumulates on the surface and a shallow layer is implanted beneath each of the horizontal and vertical surfaces of the vertical transistor.

After deposition of the dopant film and implantation of the shallow layer, the wafer is heated (block 386) to drive dopant atoms from the deposited dopant film into the vertical transistor. Diffusion of ions from the dopant film into the interior of the vertical transistor drives the previously implanted dopant atoms in the shallow layer deeper into the interior volume of the vertical transistor. This phenomenon is referred to as dopant enhanced diffusion, and can provide a more uniform distribution of implanted dopant atoms throughout the interior of the vertical transistor.

FIG. 139 is a flow diagram of a vertical transistor fabrication process employing the alternative doping process of FIGS. 132A, 132B and 132C, in which the conformal plasma immersion ion implantation process of FIG. 128E is performed followed by the deposition of a conformal dopant source dielectric film of FIGS. 129A and 129B. The process of FIG. 138 includes the initial steps of blocks 350-354 of FIG. 137, followed by a conformal ion implantation step (block 388) and then deposition of a conformal dielectric layer containing the dopant species (block 390). The last step (block 392) is to heat the wafer to a sufficient temperature and for a sufficient amount of time to drive dopant atoms from the deposited layer into the vertical transistor, while at the same time repairing crystal lattice damage from the ion implantation and causing some (or all) of the implanted atoms to become substitutional in the crystal lattice of the source-channel-drain structure 304a, 304b, 304c of the vertical transistor. The conformal ion implantation step of block 388 consists of steps 356, 358 and 360 of FIG. 135, while the dielectric layer deposition step of block 390 consists of steps 362-370 of FIG. 136.

In each of the foregoing processes involving deposition of a dopant-containing film on the vertical transistor structure, the dopant containing film is either a pure dopant material or a dielectric material containing the dopant species or a semiconductor material containing the dopant species. The dielectric films deposited on the 3-dimensional source-drain structures in the processes described above may be of various dielectric materials. For example, SiO2 films may be deposited in a plasma using a process gas consisting of SiH4 and O2; SiN films may be deposited using a process gas consisting of SiH4 and N2; SiON films may be deposited using a process gas consisting of SiH4, O2 and N2; CN films may be deposited using a process gas consisting of CH4 and N2 or C3H8 and N2, or C2H2 and N2; SiC films may be deposited using a process gas consisting of SiH4 and CH4. The semiconducting films deposited on the 3-dimensional source-drain structures in the processes described above may be of various semiconductor materials. For example, Si films may be deposited using a process gas consisting of SiH4; Ge films may be deposited using a process gas consisting of GeH4. In addition, a carbon film can be deposited and may contain some hydrogen, using a process gas containing any one of CH4, C3H8, C2H2, C4F6.

The foregoing description has been made with reference to drawings illustrating a single transistor or device, it being understood that many such transistors are fabricated simultaneously on a single wafer. In most cases, complementary vertical transistor structures (having both PFET and NFEET transistors) are fabricated. The dopant containing process gas for doping such structures by plasma immersion ion implantation may be any one of B2H6, BF3, PH3, PF3, AsH3, AsF5, PF5, AsF3. In fabricating such complementary structures, all the transistors of one type (PFET or NFET) are implanted/doped simultaneously (i.e., with dopants of one conductivity type) while all the transistors of the other type are covered with a hard mask, such as SiO2 or SiN. After doping of the transistors of the one type is completed, the hard mask is removed, and all the implanted transistors are covered with another hard mask and the remaining transistors are implanted with dopants of the other conductivity type. Preferably, N-type doping by As using AsH3 or AsF5 or by P using PH3 or PF3 is performed first on all the NFET devices, followed by P-type doping by B using B2H6 or BF3 of all the PFET devices. During the post-implant heating step, either spike or millisecond laser annealing or both can be implemented. If photoresist is employed instead of a hardmask, then the implantation/doping must be carried out below photoresist operating temperature threshold (e.g., 100 degrees C.), and the photoresist mask must be removed prior to any post-implant heating steps such as drive-in diffusion or annealing. The advantage of the hardmask layer is that it may be kept in place during drive-in diffusion steps.

FIG. 140 depicts how any of the processes of FIGS. 135 through 138 may be adapted to such a complementary MOS process. In the step of block 393 of FIG. 140, the 3-D physical shape of the transistors is defined in accordance with the steps of blocks 350 through 354 of the foregoing drawings. The light well implant of block 350 actually is carried out in two different steps in which a P-type well is provided for N-type devices and an N-type well is provided for P-type devices. Then, a mask layer (preferably a hard mask layer) is deposited on all the transistors of one conductivity type leaving the remaining transistor of the other conductivity type (preferably N-type) exposed (block 394 of FIG. 140). The exposed transistors are then doped (block 395) according to the doping steps of a selected one of the processes of FIGS. 135 through 138. Specifically, either steps 356-360 of FIG. 135 or steps 362 through 372 of FIG. 136 or steps 374 through 382 of FIG. 137 or steps 374-380 and 384 through 386 are performed.

The first hardmask is then removed and a second hardmask is deposited on the previously exposed transistors, leaving the un-doped transistors exposed (block 396). In block 397, the doping steps previously peformed in block 395 are repeated, except that the dopant used this time is of the opposite conductivity type. The second hard mask layer is removed (block 398). If the doping processes of blocks 395 and 397 were carried out at 100 degrees C. or below (e.g., using the ion implantation process of FIG. 135), then photoresist could have been employed in the masking steps of blocks 394 and 396. If this is the case, then the post-implant anneal step of block 361 of FIG. 153 is postponed until after removal of the last mask layer in block 398.

While the invention has been described in detail by specific reference to preferred embodiments, it is understood that variations and modifications thereof may be made without departing from the true spirit and scope of the invention.

What is claimed is:

1. A process for fabricating a vertical transistor on a semiconductor-on-insulator wafer consisting of an underlying substrate, an intermediate insulator layer and a top crystalline semiconductor active layer, said process comprising:

sculpting from said active layer a 3-dimensional source-channel-drain structure having horizontal and vertical surfaces and comprising a channel with a source and drain at either end of the channel;

forming a thin gate oxide layer over a section of the channel;

forming a 3-dimensional gate structure over said thin gate oxide layer;

while supporting the wafer in a plasma immersion ion implantation reactor chamber, introducing into the chamber a dopant-containing process gas and applying RF plasma source power into the chamber to generate from said process gas a plasma; and applying RF plasma bias power or voltage to the wafer to draw ions from the plasma toward the wafer across a plasma sheath at a sufficient energy to implant the ions in the source-drain-channel structure.

2. The process of claim 1 further comprising:
setting said bias power or voltage at a sufficiently high level to attain a threshold conformality of ion implant dose on the horizontal and vertical surfaces of the source-channel-drain structure.

3. The process of claim 2 wherein:
the step of forming a 3-dimensional gate structure comprises forming a polycrystalline semiconductor gate; and
a threshold conformality of ion implant dose is attained on the horizontal and vertical surfaces of the 3-dimensional gate structure.

4. The process of claim 1 wherein the level of said RF plasma bias power or voltage is sufficient to promote scattering of the ions in the plasma sheath of the plasma by enhancing the thickness of the plasma sheath.

5. The process of claim 1 wherein the level of said RF plasma bias power is sufficient to establish a wafer bias voltage on the order of a sub-kilovolt to several kiloVolts.

6. The process of claim 1 further comprising maintaining the RF plasma source power at a sufficiently low level to enhance the conformality of the ion implant dose.

7. The process of claim 6 wherein the level of the RF plasma source power is on the order of hundreds of Watts.

8. The process of claim 1 further comprising maintaining a sufficiently high pressure over the wafer to enhance the conformality of the ion implant dose.

9. The process of claim 8 wherein the pressure over the wafer is on the order of about 80 milliTorr.

10. The process of claim 1 further comprising enhancing the conformality of the ion implant dose by supplementing the dopant containing process gas with a second gas species having a collision cross-section that is greater than the collision cross section of the dopant containing process gas.

11. The process of claim 10 wherein the supplementing step comprises supplying into the chamber said second gas species at a gas flow rate that is between about 5% and 95% of the gas flow rate of the dopant containing gas.

12. The process of claim 10 wherein said second gas species comprises Xenon, Kr, Ar, Ne, He or H2.

13. The process of claim 1 further comprising:
maintaining the RF plasma source power at a sufficiently low level to enhance the conformality of the ion implant dose; and
maintaining a sufficiently high pressure over the wafer to enhance the conformality of the ion implant dose.

14. The process of claim 13 wherein:
the level of said RF plasma bias power is sufficient to establish a wafer bias voltage on the order of sub-kV to kiloVolts;
the level of the RF plasma source power is on the order of hundreds of Watts; and
the pressure over the wafer is on the order of about 80 milliTorr.

15. The process of claim 14 further comprising:
supplementing the dopant containing process gas with a second gas species having a collision cross-section that is greater than the collision cross section of the dopant containing process gas.

16. The process of claim 15 wherein:
said second gas species comprises xenon, Kr, Ar, Ne, He or H2.

17. The process of claim 1 wherein said dopant containing process gas comprises one of B2H6, BF3, PH3, PF3, AsH3, AsF5, PF5, AsF3.

18. The process of claim 1 further comprising performing a post-implant anneal process on the wafer.

19. The process of claim 1 wherein the threshold conformality is on the order of magnitude of about 10%.

20. The process of claim 1 wherein:
said reactor comprises an external reentrant conduit having a pair of openings into said chamber defining a toroidal path extending across a processing zone overlying said workpiece; and
the step of generating a plasma comprises generating an RF oscillating plasma current along said toroidal path.

21. The process of claim 1 further comprising maintaining a bias voltage on the wafer corresponding to an ion implantation depth profile that peaks at or near the surfaces of the vertical transistor.

22. The process of claim 21 wherein the ion implantation depth profile peak is within a fraction of a micron of each surface of the vertical transistor.

23. The process of claim 1 further comprising maintaining said wafer at a sufficiently high temperature to prevent accumulation of ion bombardment damage or amorphization of the source-channel-drain structure.

24. The process of claim 23 wherein said temperature is on the order of 500 to 600 degrees C. or more.

* * * * *